(12) United States Patent
Ahn et al.

(10) Patent No.: US 12,391,715 B2
(45) Date of Patent: Aug. 19, 2025

(54) ORGANOMETALLIC COMPOUND, LIGHT-EMITTING DEVICE INCLUDING THE SAME, AND ELECTRONIC APPARATUS INCLUDING THE LIGHT-EMITTING DEVICE

(71) Applicant: Samsung Display Co., Ltd., Yongin-si (KR)

(72) Inventors: Eunsoo Ahn, Yongin-si (KR); Soobyung Ko, Yongin-si (KR); Sungbum Kim, Yongin-si (KR); Eunyoung Lee, Yongin-si (KR); Jaesung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 686 days.

(21) Appl. No.: 17/446,819

(22) Filed: Sep. 2, 2021

(65) Prior Publication Data

US 2022/0177503 A1    Jun. 9, 2022

(30) Foreign Application Priority Data

Dec. 3, 2020 (KR) ........................ 10-2020-0167831

(51) Int. Cl.
*B82Y 20/00* (2011.01)
*B82Y 30/00* (2011.01)
(Continued)

(52) U.S. Cl.
CPC ...... *C07F 15/0086* (2013.01); *H10K 85/1135* (2023.02); *H10K 85/324* (2023.02);
(Continued)

(58) Field of Classification Search
CPC .. H10K 85/341; H10K 85/346; H10K 85/371; C07F 1/08; C07F 1/10; C07F 1/12; C07F 15/006; C07F 15/0086; C07F 15/04
See application file for complete search history.

(56) References Cited

U.S. PATENT DOCUMENTS

| | | |
|---|---|---|
| 7,381,479 B2 | 6/2008 | Lamansky et al. |
| 7,393,599 B2 | 7/2008 | Thompson et al. |

(Continued)

FOREIGN PATENT DOCUMENTS

| | | | |
|---|---|---|---|
| CN | 104370974 A | 2/2015 | |
| EP | 3109253 A1 * | 12/2016 | ................ C07F 5/02 |

(Continued)

OTHER PUBLICATIONS

Prokhorov, Anton M. et al. "Triazines, Tetrazines, and Fused Ring Polyaza Systems", *Progress in Heterocyclic Chemistry*, vol. 23, 2011, pp. 403-425.

*Primary Examiner* — Jennifer A Boyd
*Assistant Examiner* — Rachel Simbana
(74) *Attorney, Agent, or Firm* — Womble Bond Dickinson (US) LLP

(57) ABSTRACT

A light-emitting device includes a first compound represented by Formula 1, for example, in an emission layer of the device as a dopant or emitter. An electronic apparatus includes the light-emitting device, and the first compound represented by Formula 1 is an organometallic compound, in which M is platinum (Pt), palladium (Pd), gold (Au), nickel (Ni), silver (Ag), or copper (Cu):

(Continued)

Formula 1

19 Claims, 3 Drawing Sheets

(51) Int. Cl.
| | |
|---|---|
| C07F 5/02 | (2006.01) |
| C07F 7/08 | (2006.01) |
| C07F 15/00 | (2006.01) |
| C09K 11/06 | (2006.01) |
| H10K 50/11 | (2023.01) |
| H10K 50/115 | (2023.01) |
| H10K 50/12 | (2023.01) |
| H10K 50/15 | (2023.01) |
| H10K 85/10 | (2023.01) |
| H10K 85/30 | (2023.01) |
| H10K 85/40 | (2023.01) |
| H10K 85/60 | (2023.01) |
| H10K 101/00 | (2023.01) |
| H10K 101/10 | (2023.01) |
| H10K 101/40 | (2023.01) |

(52) U.S. Cl.
CPC ......... *H10K 85/342* (2023.02); *H10K 85/346* (2023.02); *H10K 85/40* (2023.02); *H10K 85/622* (2023.02); *H10K 85/624* (2023.02); *H10K 85/626* (2023.02); *H10K 85/633* (2023.02); *H10K 85/636* (2023.02); *H10K 85/654* (2023.02); *H10K 85/6572* (2023.02); *H10K 85/6574* (2023.02); *H10K 85/6576* (2023.02); *H10K 85/658* (2023.02); *B82Y 20/00* (2013.01); *H10K 50/11* (2023.02); *H10K 50/115* (2023.02); *H10K 50/12* (2023.02); *H10K 50/15* (2023.02); *H10K 2101/10* (2023.02); *H10K 2101/40* (2023.02)

(56) References Cited

U.S. PATENT DOCUMENTS

| | | | |
|---|---|---|---|
| 7,585,573 | B2 | 9/2009 | Lee et al. |
| 7,776,458 | B2 | 8/2010 | Ragini et al. |
| 8,106,199 | B2 | 1/2012 | Jabbour et al. |
| 8,389,725 | B2 | 3/2013 | Li et al. |
| 8,669,364 | B2 | 3/2014 | Li et al. |
| 8,680,760 | B2 | 3/2014 | Cheng et al. |
| 8,816,080 | B2 | 8/2014 | Li et al. |
| 8,846,940 | B2 | 9/2014 | Li et al. |
| 8,946,417 | B2 | 2/2015 | Jian et al. |
| 9,048,442 | B2 | 6/2015 | Asada et al. |
| 9,051,344 | B2 | 6/2015 | Lin et al. |
| 9,076,974 | B2 | 7/2015 | Li et al. |
| 9,203,039 | B2 | 12/2015 | Li et al. |
| 9,221,857 | B2 | 12/2015 | Li et al. |
| 9,224,963 | B2 | 12/2015 | Li et al. |
| 9,238,668 | B2 | 1/2016 | Li et al. |
| 9,312,502 | B2 | 4/2016 | Li et al. |
| 9,324,957 | B2 | 4/2016 | Li et al. |
| 9,382,273 | B2 | 7/2016 | Li et al. |
| 9,425,415 | B2 | 8/2016 | Li et al. |
| 9,698,359 | B2 | 7/2017 | Li et al. |
| 9,899,614 | B2 | 2/2018 | Li et al. |
| 2005/0236970 | A1* | 10/2005 | Matsudate ........... H10K 59/122 313/500 |
| 2005/0287394 | A1 | 12/2005 | Yang et al. |
| 2008/0018221 | A1 | 1/2008 | Egen et al. |
| 2014/0309428 | A1 | 10/2014 | Egen et al. |
| 2016/0013431 | A1* | 1/2016 | Choi .................... H10K 85/346 546/4 |
| 2016/0141517 | A1 | 5/2016 | Yang |
| 2019/0119312 | A1 | 4/2019 | Chen et al. |
| 2020/0119289 | A1 | 4/2020 | Lin et al. |
| 2020/0140471 | A1* | 5/2020 | Chen .................... C07F 15/0086 |

FOREIGN PATENT DOCUMENTS

| | | |
|---|---|---|
| JP | 2007-045742 A | 2/2007 |
| KR | 10-0730115 B1 | 6/2007 |
| KR | 10-1626170 B1 | 5/2016 |
| WO | WO 2012/121936 A4 | 9/2012 |
| WO | WO 2018/108110 A1 | 6/2018 |

* cited by examiner

ORGANOMETALLIC COMPOUND, LIGHT-EMITTING DEVICE INCLUDING THE SAME, AND ELECTRONIC APPARATUS INCLUDING THE LIGHT-EMITTING DEVICE

CROSS-REFERENCE TO RELATED APPLICATION

This application claims priority to and the benefit of Korean Patent Application No. 10-2020-0167831, filed on Dec. 3, 2020, in the Korean Intellectual Property Office, the entire content of which is hereby incorporated by reference.

BACKGROUND

1. Field

One or more aspects of embodiments of the present disclosure relate to an organometallic compound, a light-emitting device including the same, and an electronic apparatus including the light-emitting device.

2. Description of the Related Art

Self-emissive light-emitting devices may have wide viewing angles, excellent or suitable contrast, short response times, and/or excellent or suitable brightness, driving voltage, and/or response speed characteristics.

In a light-emitting device, a first electrode may be located on a substrate, and a hole transport region, an emission layer, an electron transport region, and a second electrode may be sequentially formed on the first electrode. Holes provided from the first electrode may move toward the emission layer through the hole transport region, and electrons provided from the second electrode may move toward the emission layer through the electron transport region. Carriers (such as holes and electrons) may recombine in the emission layer to produce excitons. These excitons may transition from an excited state to the ground state to thereby generate light.

SUMMARY

One or more aspects of embodiments of the present disclosure are directed toward a light-emitting device having high luminescence efficiency and/or long lifespan, an electronic apparatus including the same, and an organometallic compound (e.g., that is used in the same).

Additional aspects will be set forth in part in the description that follows, and will be apparent in part from the description, or may be learned by practice of the presented embodiments of the disclosure.

One or more embodiments of the present disclosure provide an organometallic compound represented by Formula 1:

Formula 1

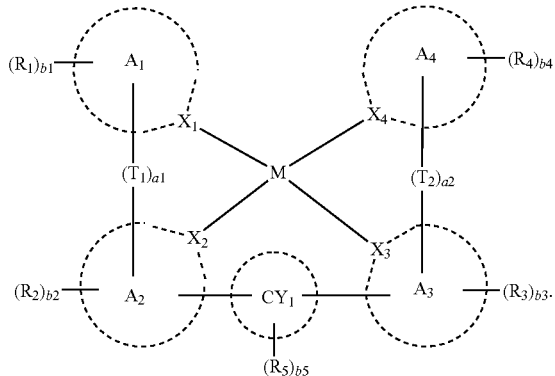

In Formula 1,
M may be platinum (Pt), palladium (Pd), gold (Au), nickel (Ni), silver (Ag), or copper (Cu),
$X_1$ to $X_4$ may each independently be C or N,
$A_1$ to $A_4$ may each independently be a $C_3$-$C_{60}$ carbocyclic group or a $C_1$-$C_{60}$ heterocyclic group,
$CY_1$ may be a π electron-deficient nitrogen-containing $C_1$-$C_{60}$ cyclic group,
$T_1$ and $T_2$ may each independently be a single bond, a double bond, *—N[($L_1$)$_{c1}$-($Z_{11}$)]—*', *—B($Z_{11}$)—*', *—P($Z_{11}$)—*', *—C($Z_{11}$)($Z_{12}$)*', *—Si($Z_{11}$)($Z_{12}$)—*, *—Ge($Z_{11}$)($Z_{12}$)—*, *—S*', *—Se—*', *—O—*', *—C(=O)—*', *—S(=O)—*', *—S(=O)$_2$—*', *—C($Z_{11}$)=*, *=C($Z_{11}$)—*, *—C($Z_{11}$)=C($Z_{12}$)—*', *—C(=S)*', or *—C≡C—*', where * and *' each indicate a binding site to a neighboring atom,
$L_1$ may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$,
c1 may be an integer from 0 to 5,
a1 and a4 may each independently be an integer from 0 to 3,
$R_1$ to $R_5$, $Z_{11}$, and $Z_{12}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$),
b1 to b5 may each independently be an integer from 0 to 10,
two or more groups of $R_1$ to $R_5$, $Z_{11}$, and $Z_{12}$ may optionally be linked to form a $C_5$-$C_{30}$ carbocyclic group unsubstituted or substituted with at least one $R_{10a}$ or a $C_2$-$C_{30}$ heterocyclic group unsubstituted or substituted with at least one $R_{10a}$, $R_{10a}$ may be:

deuterium (-D), —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

One or more embodiments of the present disclosure provide a light-emitting device including:

a first electrode, a second electrode facing the first electrode, and an interlayer located between the first electrode and the second electrode and including an emission layer, wherein the interlayer includes:

i) a first compound which is the organometallic compound as described above, and ii) a second compound including at least one π electron-deficient nitrogen-containing $C_1$-$C_{60}$ cyclic group, a third compound including a group represented by Formula 3, a fourth compound capable of emitting delayed fluorescence, or any combination thereof, and the first compound and the second compound, and the third compound and the fourth compound are different from each other:

Formula 3

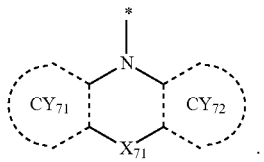

In Formula 3, ring $CY_{71}$ and ring $CY_{72}$ may each independently be a π electron-rich $C_3$-$C_{60}$ cyclic group or a pyridine group, in Formula 3, $X_{71}$ may be a linking group including a single bond, O, S, N, B, C, Si, or any combination thereof, in Formula 3, * indicates a binding site to a neighboring atom in the third compound, and the compounds below are excluded from being the third compound.

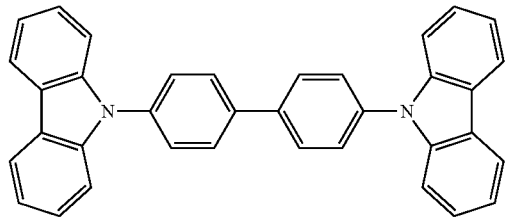

CBP

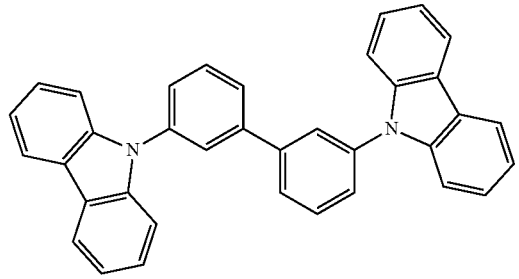

mCBP

One or more embodiments of the present disclosure provide an electronic apparatus including the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
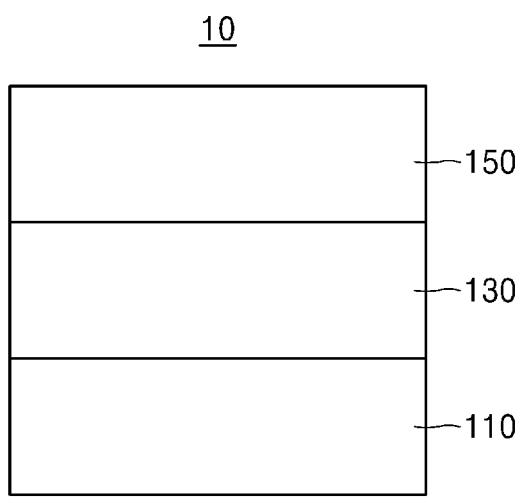
FIG. 1 is a schematic cross-sectional view of a light-emitting device according to an embodiment.

Reference will now be made in more detail to embodiments, examples of which are illustrated in the accompanying drawings, wherein like reference numerals refer to like elements throughout the specification, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present description. As utilized herein, the term "and/or" includes any and all combinations of one or more of the associated listed items. Throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variations thereof.

An organometallic compound is represented by Formula 1:

Formula 1

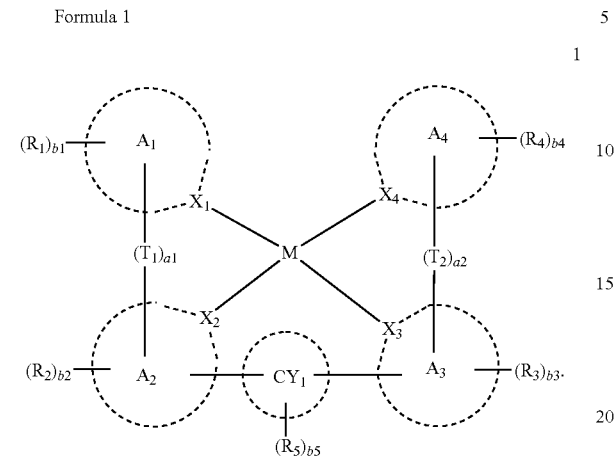

In Formula 1, M may be platinum (Pt), palladium (Pd), gold (Au), nickel (Ni), silver (Ag), or copper (Cu).

$X_1$ to $X_4$ in Formula 1 may each independently be C or N.

In an embodiment, $X_1$ in Formula 1 may be C, and C may be carbon or a carbene moiety.

In an embodiment, in Formula 1, $X_1$ to $X_3$ may each be C, and $X_4$ may be N.

In an embodiment, in Formula 1, a bond between $X_1$ and M and a bond between $X_4$ and M may each be a coordinate bond, and a bond between $X_2$ and M and a bond between $X_3$ and M may each be a covalent bond.

$A_1$ to $A_4$ in Formula 1 may each independently be a $C_3$-$C_{60}$ carbocyclic group or a $C_1$-$C_{60}$ heterocyclic group.

In an embodiment, in Formula 1, $A_1$ may be i) an $X_1$-containing 5-membered ring, ii) the $X_1$-containing 5-membered ring, to which at least one 6-membered ring is condensed, or iii) an $X_1$-containing 6-membered ring, and $A_4$ may be an $X_4$-containing 6-membered ring. In an embodiment, in Formula 1, $A_1$ may be i) the $X_1$-containing 5-membered ring or ii) the $X_1$-containing 5-membered ring to which at least one 6-membered ring is condensed, and $A_4$ may be a 6-membered ring. Thus, $A_1$ may include a 5-membered ring linked to M in Formula 1 via $X_1$ and $A_4$ may include a 6-membered ring linked to M in Formula 1 via $X_4$.

In an embodiment, the $X_1$-containing 5-membered ring in $A_1$ of Formula 1 may be a pyrrole group, a pyrazole group, an imidazole group, a triazole group, an oxazole group, an isoxazole group, a thiazole group, an isothiazole group, an oxadiazole group, or a thiadiazole group.

In an embodiment, the $X_1$-containing 6-membered ring, the 6-membered ring condensed to the $X_1$-containing 5-membered ring in $A_1$, the 6-membered ring in $A_1$, and/or the $X_4$-containing 6-membered ring in $A_4$ may each independently be a benzene group, a pyridine group, or a pyrimidine group.

In one or more embodiments, a group represented by

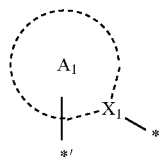

in Formula 1 may be a group represented by one of Formulae A1(1) to A1(6):

A1(1)

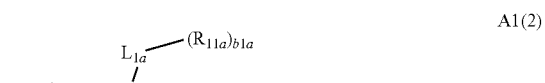
A1(2)

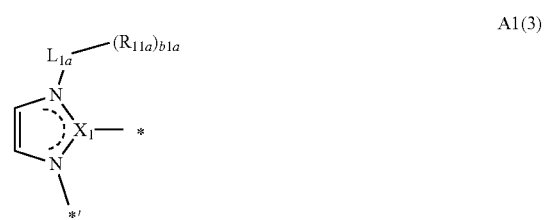
A1(3)

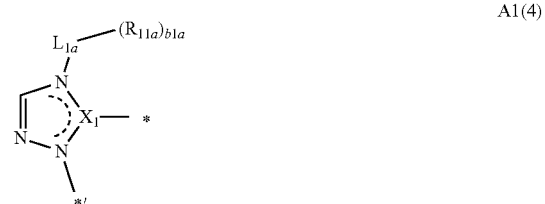
A1(4)

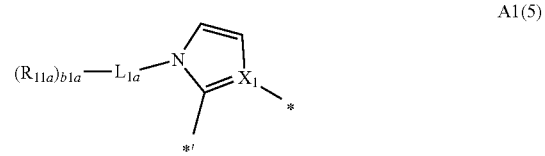
A1(5)

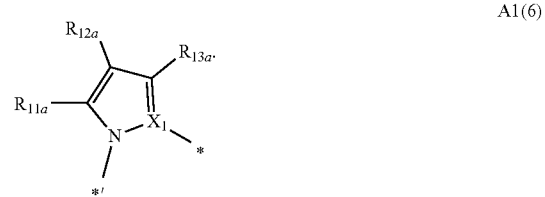
A1(6)

In Formulae A1(1) to A1(6),
$X_1$ may be the same as described herein,
$L_{1a}$ and b1a may each independently be the same as described in connection with $L_1$ and b1,
$R_{11a}$ to $R_{13a}$ may each independently be the same as described in connection with $R_1$, and each of $R_{11a}$ to $R_{13a}$ is not hydrogen,
* indicates a binding site to M in Formula 1, and
*' is a binding site to a neighboring atom in Formula 1.

$CY_1$ in Formula 1 may be a π electron-deficient nitrogen-containing $C_1$-$C_{60}$ cyclic group.

In an embodiment, $CY_1$ in Formula 1 may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, an acridine group, or a pyridopyrazine group.

In an embodiment, group

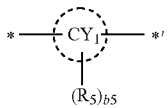

in Formula 1 may be a group represented by Formula 1a:

Formula 1a

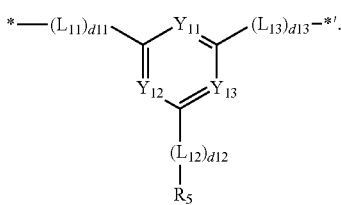

In Formula 1a,
$R_5$ may be the same as described herein,
$Y_{11}$ may be N or $C(R_{11})$, $Y_{12}$ may be N or $C(R_{12})$, $Y_{13}$ may be N or $C(R_{13})$, and at least one of $Y_{11}$ to $Y_{13}$ may be N,
$R_{11}$ to $R_{13}$ may each independently be the same as described in connection with $R_1$,
$L_{11}$ to $L_{13}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$,
d11 to d13 may each independently be an integer from 1 to 5,
* indicates a binding site to $A_2$ in Formula 1, and
*' indicates a binding site to $A_3$ in Formula 1.

In an embodiment, $Y_{11}$ to $Y_{13}$ in Formula 1a may all (each) be N.

$T_1$ and $T_2$ in Formula 1 may each independently be a single bond, a double bond, *—N[($L_1$)$_{c1}$-($Z_{11}$)]—*', *—B($Z_{11}$)—*', *—P($Z_{11}$)—*', *—C($Z_{11}$)($Z_{12}$)—*', *—Si($Z_{11}$)($Z_{12}$)—*', *—Ge($Z_{11}$)($Z_{12}$)—*', *—S—*', *—Se—*', *—O—*', *—C(=O)—*', *—S(=O)—*', *—S(=O)$_2$—*', *—C($Z_{11}$)=*', *=C($Z_{11}$)*', *—C($Z_{11}$)=C($Z_{12}$)—*', *—C(=S)—*', or *—C≡C—*', where * and *' may each indicate a binding site to a neighboring atom. $L_1$ and c1 may each independently be the same as described herein.

In an embodiment, $T_1$ and $T_2$ in Formula 1 may each be a single bond.

$L_1$ in $T_1$ or $T_2$ of Formula 1 may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

c1 in $T_1$ or $T_2$ of Formula 1 indicates the number of $L_1$(s), and may be an integer from 0 to 5. When c1 is 2 or more, the two or more $L_1$(s) may be identical to or different from each other. For example, c1 may be 0 or 1.

In Formula 1, a1 indicates the number of $T_1$(s) and a2 indicates the number of $T_2$(s), and may each independently be an integer from 0 to 3. When a1 is 2 or more, the two or more $T_1$(s) may be identical to or different from each other. When a2 is 2 or more, the two or more $T_2$(s) may be identical to or different from each other. In an embodiment, a1 and a2 may each independently be 0 or 1.

$R_1$ to $R_5$, $Z_{11}$, and $Z_{12}$ in Formula 1 may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), In an embodiment, $R_1$ to $R_5$, $Z_{11}$, and $Z_{12}$ in Formula 1 may each independently be:
hydrogen, deuterium, —F, —Cl, —Br, —I, a hydroxyl group, a cyano group, or a nitro group;
a $C_1$-$C_{20}$ alkyl group, a $C_1$-$C_{20}$ alkenyl group, a $C_1$-$C_{20}$ alkynyl group, or a $C_1$-$C_{20}$ alkoxy group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a cyclopentyl group, a cyclohexyl group, a cycloheptyl group, a cyclooctyl group, a cyclopentenyl group, a cyclohexenyl group, a cycloheptenyl group, a phenyl group, a terphenyl group, a naphthyl group, a pyrimidinyl group, or any combination thereof; or
a cyclopentyl group, a cyclohexyl group, a cycloheptyl group, a cyclooctyl group, a cyclopentenyl group, a cyclohexenyl group, a cycloheptenyl group, a phenyl group, a terphenyl group, a naphthyl group, or a pyrimidinyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a $C_2$-$C_{20}$ alkenyl group, a $C_2$-$C_{20}$ alkynyl group or a $C_1$-$C_{20}$ alkoxy group, a cyclopentyl group, a cyclohexyl group, a cycloheptyl group, a cyclooctyl group, a cyclopentenyl group, a cyclohexenyl group, a cycloheptenyl group, a phenyl group, a terphenyl group, a naphthyl group, or a pyrimidinyl group.

b1 to b5 in Formula 1 each respectively indicate the number of $R_1$(s) to $R_5$(s), and may each independently be an integer from 0 to 10. When b1 is 2 or more, the two or more $R_1$(s) may be identical to or different from each other. b2 to b5 and $R_2$ to $R_5$ may each independently be the same as described above. In an embodiment, b1 to b5 may each independently be 0 or 1.

Two or more of $R_1$ to $R_5$, $Z_{11}$, and $Z_{12}$ in Formula 1 may be optionally linked to form a $C_5$-$C_{30}$ carbocyclic group unsubstituted or substituted with at least one $R_{10a}$ or a $C_2$-$C_{30}$ heterocyclic group unsubstituted or substituted with at least one $R_{10a}$, In an embodiment, Formula 1 may be a group represented by Formula 1-1:

Formula 1-1

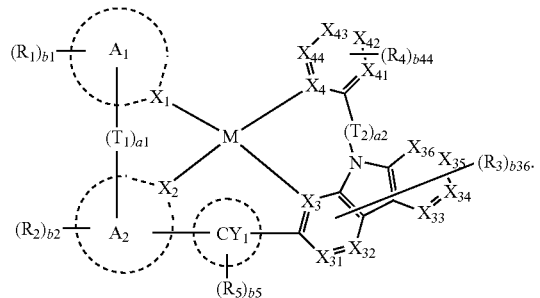

1-1

In Formula 1-1,

M, $X_1$ to $X_4$, $A_1$, $A_2$, $CY_1$, $T_1$, $T_2$, a1, a2, $R_1$ to $R_5$, b1, b2, and b5 may each independently be the same as described herein, $X_{31}$ to $X_{36}$ may each independently be the same as described in connection with $X_3$, $X_{43}$ to $X_{44}$ may each independently be the same as described in connection with $X_4$, b36 may be an integer from 0 to 6, and b44 may be an integer from 0 to 4.

In an embodiment, $X_{31}$ to $X_{36}$ and $X_{41}$ to $X_{44}$ in Formula 1-1 may all (each) be C.

In an embodiment, a group represented by

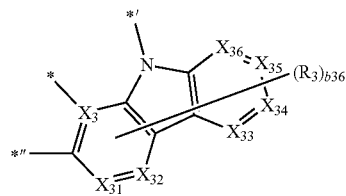

in Formula 1-1 may be a group represented by one of Formulae A3(1) to A3(7):

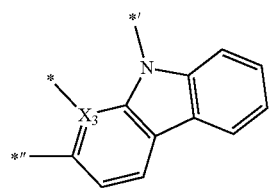

A3(1)

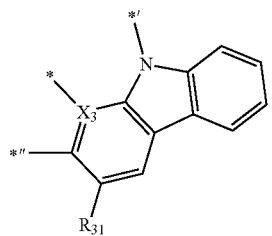

A3(2)

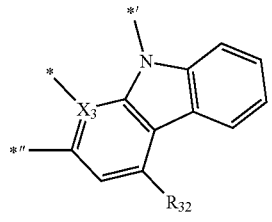

A3(3)

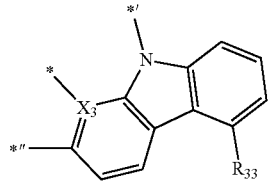

A3(4)

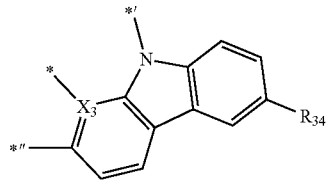

A3(5)

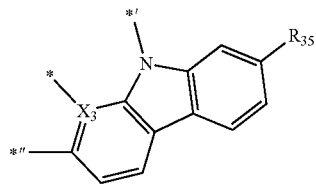

A3(6)

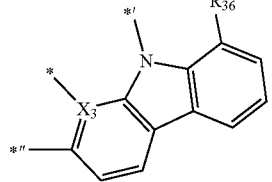

A3(7)

In Formulae A3(1) to A3(7), $X_3$ may be the same as described herein, $R_{31}$ to $R_{36}$ may each independently be the same as described in connection with $R_3$, and each of $R_{31}$ to $R_{36}$ may not be hydrogen,

* indicates a binding site to M in Formula 1-1, and

*' and *" may be a binding site to a neighboring atom in Formula 1-1.

In the organometallic compound represented by Formula 1, because $CY_1$ is a π electron-deficient nitrogen-containing $C_1$-$C_{60}$ cyclic group, electron mobility may be improved, and thus low driving voltage may be decreased and/or a long lifespan effect may be obtained. In addition, the $CY_1$ moiety may correspond to the highest occupied molecular orbital (HOMO) of the organometallic compound, which may have (e.g., emit) deep blue light, and the moiety may sterically inhibit intermolecular accumulation (e.g., aggregation). Accordingly, formation of an excimer or an exciplex may be inhibited when the device is driven, so that the full width at half maximum (FWHM) value of the organometallic compound in photoluminescence (PL) or electroluminescence (EL) may be lowered.

Accordingly, a light-emitting device including the organometallic compound represented by Formula 1 may have high color purity, high efficiency, low driving voltage, and/or long lifespan.

Suitable synthesis methods of the organometallic compound represented by Formula 1 may be recognizable by one of ordinary skill in the art by referring to the Synthesis Examples and/or Examples provided below.

In an embodiment, at least one organometallic compound represented by Formula 1 may be utilized in a light-emitting device (for example, an organic light-emitting device). Therefore, a light-emitting device may include:
 a first electrode;
 a second electrode facing the first electrode; and
 an interlayer located between the first electrode and the second electrode and including an emission layer,
 wherein the interlayer includes:
 i) a first compound, the first compound being the organometallic compound represented by Formula 1; and
 ii) a second compound including at least one π electron-deficient nitrogen-containing $C_1$-$C_{60}$ cyclic group, a third compound including a group represented by Formula 3, a fourth compound to emit delayed fluorescence, or any combination thereof, and
 the first compound and the second compound, and the third compound and the fourth compound different from each other:

Formula 3

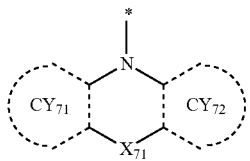

In Formula 3, ring $CY_{71}$ and ring $CY_{72}$ may each independently be a π electron-rich $C_3$-$C_{60}$ cyclic group or a pyridine group,
 in Formula 3, $X_{71}$ may be a single bond, O, S, N, B, C, Si, or any combination thereof,
 in Formula 3, * indicates a binding site to a neighboring atom in the third compound, and
 the third compound may exclude the compounds below.

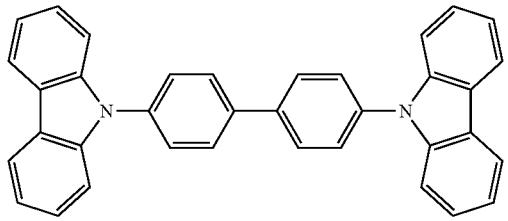

CBP

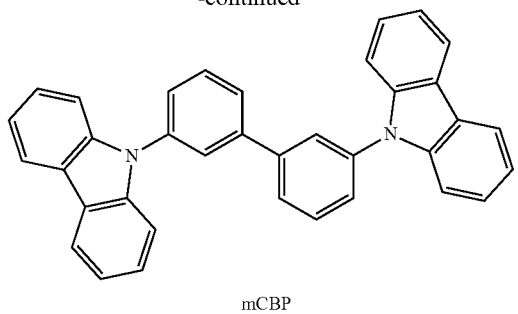

mCBP

Description of Second Compound and Fourth Compound

The second compound may include a pyridine group, a pyrimidine group, a pyrazine group, a pyridazine group, a triazine group, or any combination thereof.

In an embodiment, the light emitting device may further include at least one of a second compound and a third compound in addition to the first compound.

In an embodiment, the light-emitting device may further include a fourth compound in addition to the first compound.

In an embodiment, the light-emitting device may include all of the first to fourth compounds.

In an embodiment, the interlayer may include the second compound. The interlayer may further include the third compound, the fourth compound, or a combination thereof, in addition to the first compound and the second compound.

The difference between a triplet energy level (eV) of the fourth compound and a singlet energy level (eV) of the fourth compound may be 0 eV or more and 0.5 eV or less (or for example, 0 eV or more and 0.3 eV or less).

In an embodiment, the fourth compound may be a compound including at least one cyclic group including a B (boron) atom and a N (nitrogen) atom each (e.g., simultaneously) as a ring-forming atom.

In an embodiment, the fourth compound may be a $C_8$-$C_{60}$ polycyclic group-containing compound including two or more condensed cyclic groups sharing a boron (B) atom.

In an embodiment, the fourth compound may include a condensed cyclic group, in which at least one third ring and at least one fourth ring are condensed with each other, where:
 the third ring may be a cyclopentane group, a cyclohexane group, a cycloheptane group, a cyclooctane group, a cyclopentene group, a cyclohexene group, a cycloheptene group, a cyclooctene group, an adamantane group, norbornene group, a norbornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and
 the fourth ring may be a 1,2-azaborinine group, a 1,3-azaborinine group, a 1,4-azaborinine group, a 1,2-dihydro-1,2-azaborinine group, a 1,4-oxaborinine group, a 1,4-oxaborinine group, a 1,4-thiaborinine group, or a 1,4-dihydroborinine group.

In an embodiment, the interlayer may include the fourth compound. The interlayer may further include the second compound, the third compound, or a combination thereof, in addition to the first compound and the fourth compound.

In an embodiment, the interlayer may include the third compound. In an embodiment, the third compound may not include compounds represented by CBP and mCBP described herein.

i) The first compound; and ii) the second compound, the third compound, the fourth compound, or any combination thereof may be included in an emission layer in the interlayer.

The emission layer may be to emit phosphorescence or fluorescence, as emitted from the first compound. In an embodiment, the phosphorescence or fluorescence emitted from the first compound may be blue light.

In an embodiment, the emission layer of the light-emitting device may include the first compound and the second compound, and the first compound and the second compound may be to form an exciplex.

In an embodiment, the emission layer of the light-emitting device may include the first compound, the second compound, and the third compound, and the first compound and the second compound may be to form an exciplex.

In an embodiment, the emission layer of the light-emitting device may include the first compound and the fourth compound, and the fourth compound may improve the color purity, emission efficiency, and/or lifespan characteristics of the light-emitting device.

In an embodiment, the second compound may be a compound represented by Formula 2:

Formula 2

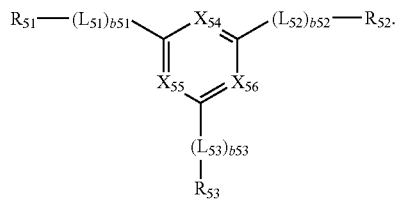

In Formula 2,

L$_{51}$ to L$_{53}$ may each independently be a single bond, a C$_3$-C$_{60}$ carbocyclic group unsubstituted or substituted with at least one R$_{10a}$, or a C$_1$-C$_{60}$ heterocyclic group unsubstituted or substituted with at least one R$_{10a}$, b51 to b53 may each independently be an integer from 1 to 5, X$_{54}$ may be N or C(R$_{54}$), X$_{55}$ may be N or C(R$_{55}$), X$_{56}$ may be N or C(R$_{56}$), and at least one of X$_{54}$ to X$_{56}$ may be N, R$_{51}$ to R$_{56}$ may each independently be the same as described herein, and R$_{10a}$ may be the same as described herein.

In an embodiment, the third compound may include a compound represented by Formula 3-1, a compound represented by Formula 3-2, a compound represented by Formula 3-3, a compound represented by Formula 3-4, a compound represented by Formula 3-5, or any combination thereof:

Formula 3-1

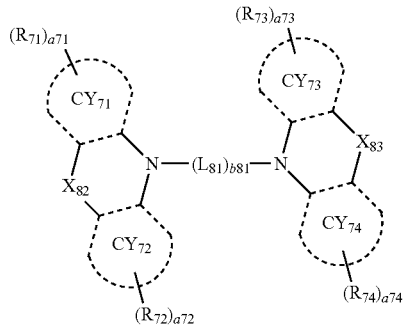

Formula 3-2

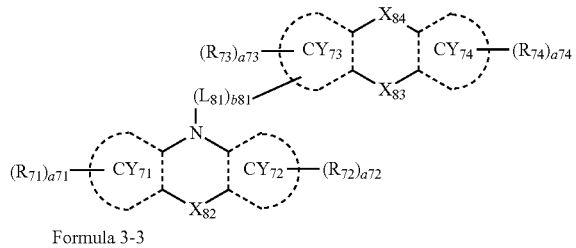

Formula 3-3

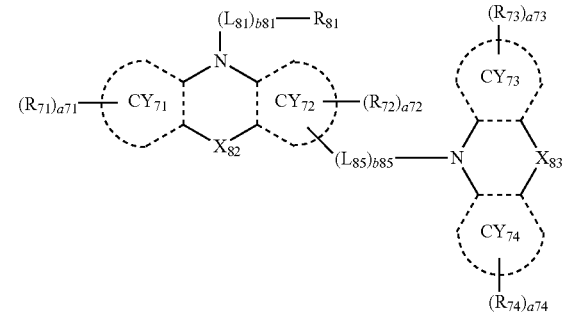

Formula 3-4

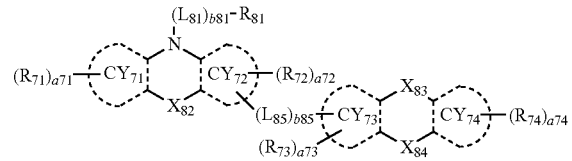

Formula 3-5

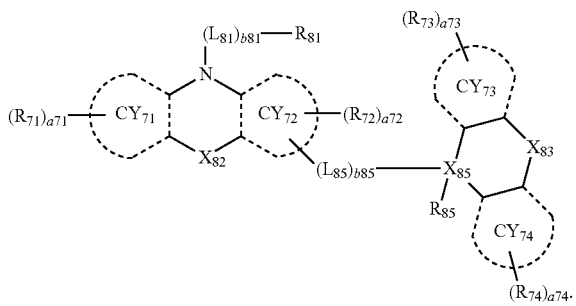

In Formulae 3-1 to 3-5, ring CY$_{71}$ and ring CY$_{74}$ may each independently be a π electron-rich C$_3$-C$_{60}$ cyclic group or a pyridine group, X$_{82}$ may be a single bond, O, S, N-[(L$_{82}$)$_{b82}$-R$_{82}$], C(R$_{82a}$)(R$_{82b}$), or Si(R$_{82a}$)(R$_{82b}$), X$_{83}$ may be a single bond, O, S, N—[(L$_{83}$)$_{b83}$-R$_{83}$], C(R$_{83a}$)(R$_{83b}$), or Si(R$_{83a}$)(R$_{83b}$), $X_{84}$ may be O, S, N—[$(L_{84})_{b84}$-$R_{84}$], $C(R_{84a})(R_{84b})$, or $Si(R_{84a})(R_{84b})$, $X_{85}$ may be C or Si, $L_{81}$ to $L_{85}$ may each independently be a single bond, *—$C(Q_4)(Q_5)$-*', *—$Si(Q_4)(Q_5)$-*', a $C_3$-$C_{60}$ cyclic group unsubstituted or substituted with at least one $R_{10a}$, or a pyridine group unsubstituted or substituted with at least one $R_{10a}$, and $Q_4$ and $Q_5$ may each independently be the same as described in connection with $Q_1$, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may each independently be the same as described herein, a71 to a74 may each independently be an integer from 0 to 20, and $R_{10a}$ may be the same as described herein.

In an embodiment, the fourth compound may include a compound represented by Compound 502, a compound represented by Compound 503, or any combination thereof:

Formula 502

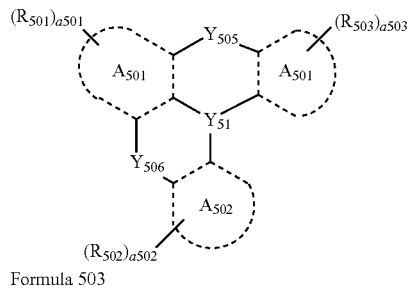

Formula 503

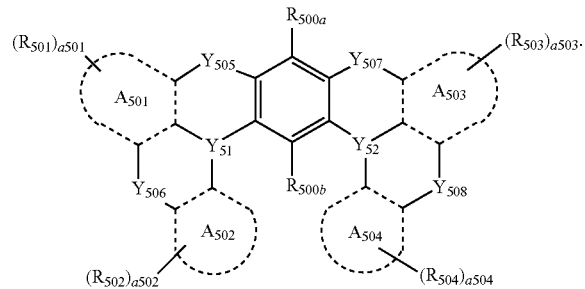

In Formulae 502 and 503, ring $A_{501}$ to ring $A_{504}$ may each independently be a $C_3$-$C_{60}$ carbocyclic group or a $C_1$-$C_{60}$ heterocyclic group, $Y_{505}$ may be O, S, $N(R_{505})$, $B(R_{505})$, $C(R_{505a})(R_{505b})$, or $Si(R_{505a})(R_{505b})$, $Y_{506}$ may be O, S, $N(R_{506})$, $B(R_{506})$, $C(R_{506a})(R_{506b})$, or $Si(R_{506a})(R_{506b})$, $Y_{507}$ may be O, S, $N(R_{507})$, $B(R_{507})$, $C(R_{507a})(R_{507b})$, or $Si(R_{507a})(R_{507b})$, $Y_{508}$ may be O, S, $N(R_{508})$, $B(R_{508})$, $C(R_{508a})(R_{508b})$, or $Si(R_{508a})(R_{508b})$, $Y_{51}$ and $Y_{52}$ may each independently be B, P(=O), or S(=O), $R_{50a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may each independently be the same as described herein, a501 to a504 may each independently be an integer from 0 to 20, and $R_{10a}$ may be the same as described herein.

Description of Formulae 1 to 4 b51 to b53 in Formula 2 may each indicate the number of $L_{51}(s)$ to $L_{53}(s)$, and may each independently be an integer from 1 to 5. When b51 is 2 or more, the two or more $L_{51}(s)$ may be identical to or different from each other, and when b52 is 2 or more, the two or more $L_{52}(s)$ may be identical to or different from each other, and when b53 is 2 or more, the two or more $L_{53}(s)$ may be identical to or different from each other. In an embodiment, b51 to b53 may each independently be 1 or 2.

In Formulae 1 and 2, $L_1$, $L_7$, and $L_{51}$ to $L_{53}$ may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzoxasiline group, a dibenzothiasiline group, a dibenzodihydroazasiline group, a dibenzodihydrodisiline group, a dibenzodihydrosyline group, a dibenzodioxine group, a dibenzooxathiine group, a dibenzooxazine group, a dibenzopyran group, a dibenzodithiine group, a dibenzothiazine group, a dibenzothiopyran group, a dibenzocyclohexadiene group, a dibenzodihydropyridine group, or a dibenzodihydropyrazine group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof, $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In an embodiment, in Formula 2, a bond between $L_{51}$ and $R_{51}$, a bond between $L_{52}$ and $R_{52}$, a bond between $L_{53}$ and $R_{53}$, a bond between two or more $L_{51}(s)$, a bond between two or more $L_{52}(s)$, a bond between two or more $L_{53}(s)$, a bond between $L_{51}$ and the carbon atom between $X_{54}$ and $X_{55}$ of Formula 2, a bond between $L_{52}$ and the carbon atom between $X_{54}$ and $X_{56}$ of Formula 2, and a bond between $L_{53}$ and the carbon atom between $X_{55}$ and $X_{56}$ of Formula 2 may each be a carbon-carbon single bond.

In Formula 2, $X_{54}$ may be N or $C(R_{54})$, $X_{55}$ may be N or $C(R_{55})$, $X_{56}$ may be N or $C(R_{56})$, and at least one of $X_{54}$ to $X_{56}$ may be N. $R_{54}$ to $R_{56}$ may each independently be the same as described above. For example, two or three of $X_{54}$(s) to $X_{56}$(s) may be N.

$R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may each independently be hydrogen, deuterium, —F, —Cl, —Br, —I, hydroxyl group, cyano group, nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R10_a$, a $C_1$-$C_{60}$ alkoxy group unsubstituted or substituted with at least one $R10_a$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R10_a$, $C_6$-$C_{60}$ arylthio group unsubstituted or substituted with at least one $R10_a$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$. $Q_1$ to $Q_3$ may each independently be the same as described herein.

In an embodiment, i) $R_1$ to $R_5$, $Z_{11}$, and $Z_{12}$ in Formula 1, ii) $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, and iii) $R_{10a}$ may each independently be:

hydrogen, deuterium, —F, —Cl, —Br, —I, a hydroxyl group, a cyano group, a nitro group, a $C_1$-$C_{20}$ alkyl group, or $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof; or —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, wherein $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

Formula 91

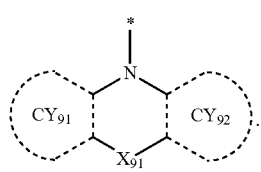

In Formula 91,
ring $CY_{91}$ and ring $CY_{92}$ may each independently be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$,
$X_{91}$ may be a single bond, O, S, $N(R_{91})$, $B(R_{91})$, $C(R_{91a})(R_{91b})$, or $Si(R_{91a})(R_{91b})$,
$R_{91}$, $R_{91a}$, and $R_{91b}$ may each independently be the same as described in connection with $R_{82}$, $R_{82a}$, and $R_{82b}$,
$R_{10a}$ may be the same as described herein, and
* indicates a binding site to a neighboring atom.
For example, in Formula 91,
ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$,
$R_{91}$, $R_{91a}$, and $R_{91b}$ may each independently be selected from:
hydrogen or a $C_1$-$C_{20}$ alkyl group; or
a phenyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In an embodiment, i) $R_1$ to $R_5$, $Z_{11}$, and $Z_{12}$ in Formula 1, ii) $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, and iii) $R_{10a}$ may each independently be:
hydrogen, deuterium, —F, a cyano group, a nitro group, —CH$_3$, —CD$_3$, —CD$_2$H, —CDH$_2$, —CF$_3$, —CF$_2$H, —CFH$_2$, a group represented by one of Formulae 9-1 to 9-19, a group represented by one of Formulae 10-1 to 10-246, —C(Q$_1$)(Q$_2$)(Q$_3$), —Si(Q$_1$)(Q$_2$)(Q$_3$), or —P(=O)(Q$_1$)(Q$_2$)(Q$_1$ to Q$_3$ may each independently be the same as described herein):

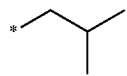 9-1

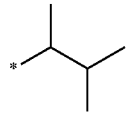 9-2

9-3

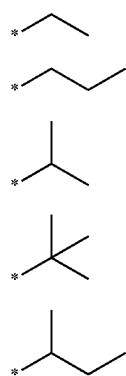

9-4

9-5

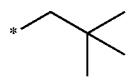 9-6

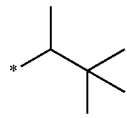 9-7

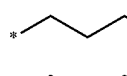 9-8

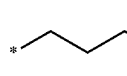 9-9

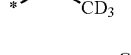 9-10

 9-11

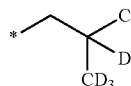 9-12

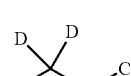 9-13

 9-14

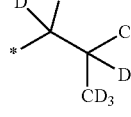 9-15

9-16

9-17

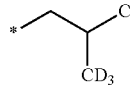 9-17

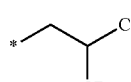 9-18

 9-19

10-1

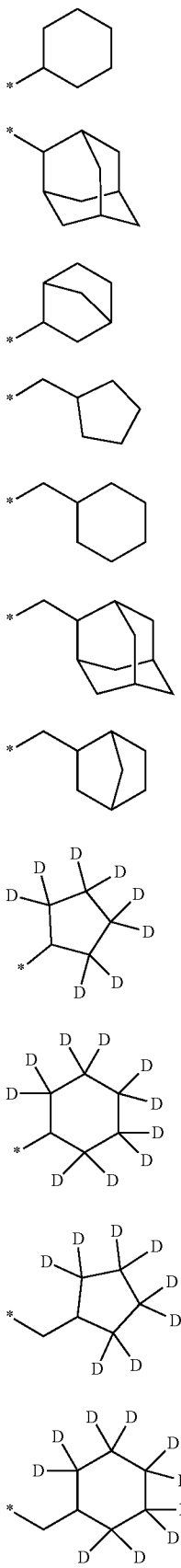
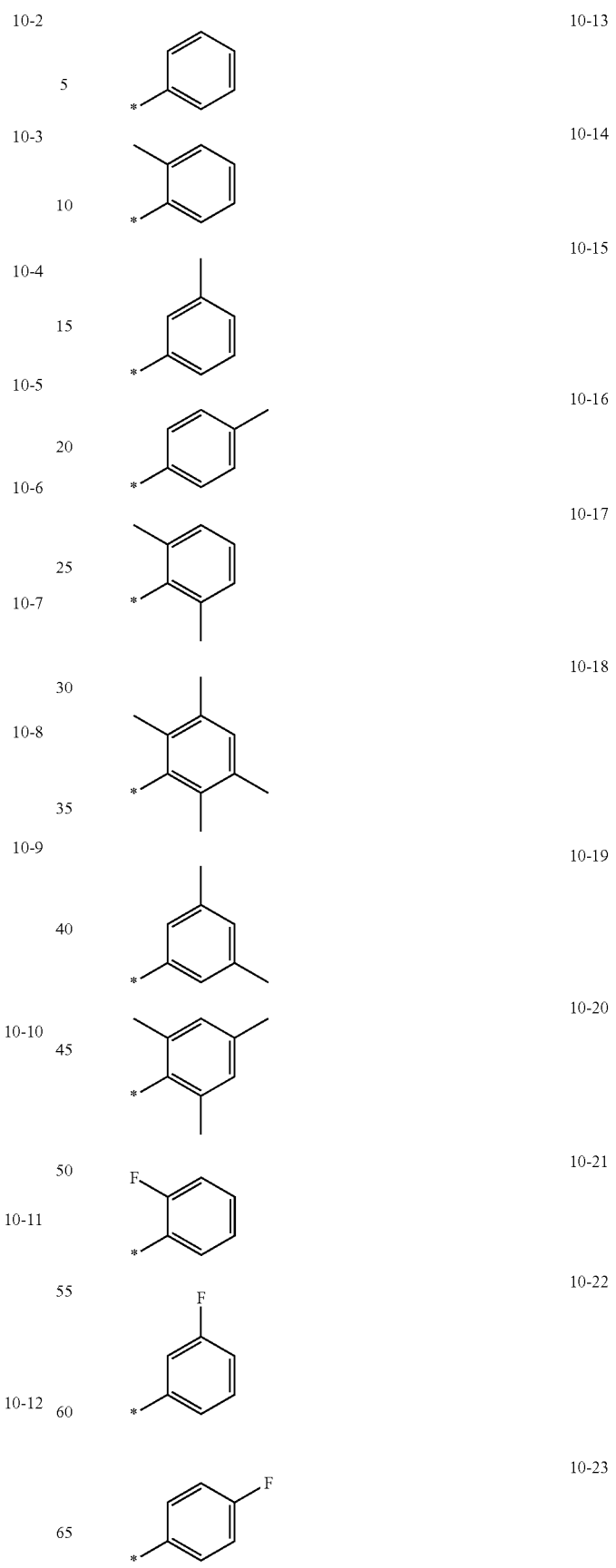

10-24 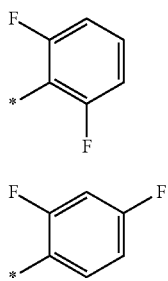
10-25 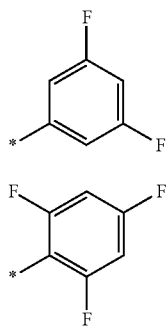
10-26 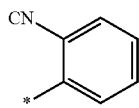
10-27 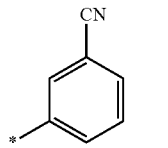
10-28 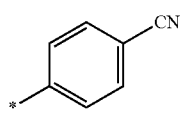
10-29 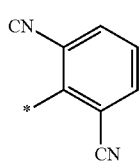
10-30 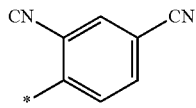
10-31 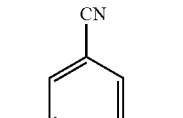
10-32 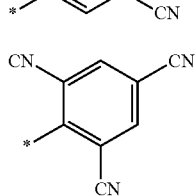
10-33 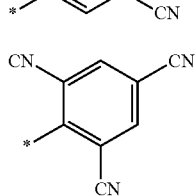
10-34 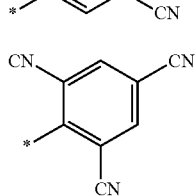
10-35 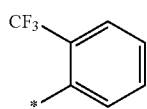
10-36 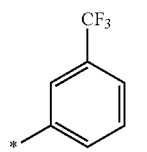
10-37 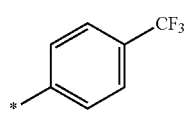
10-38 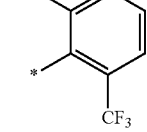
10-39 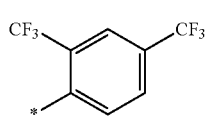
10-40 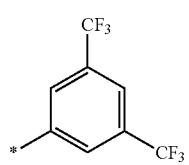
10-41 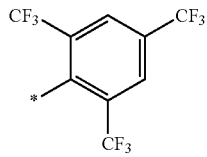
10-42 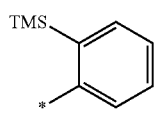
10-43 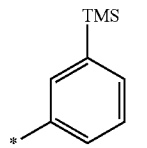
10-44 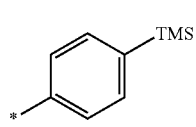
10-45 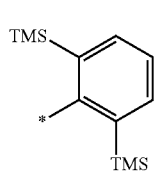

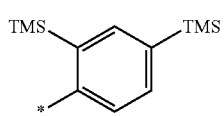
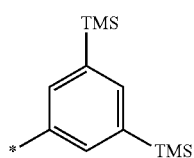
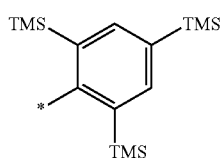
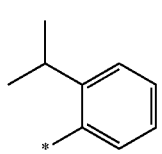
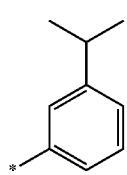
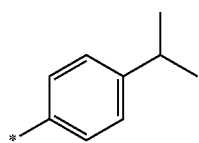
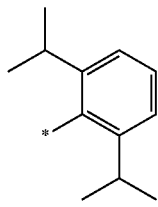
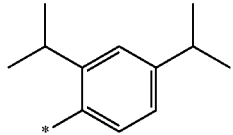
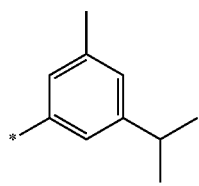
10-46
10-47
10-48
10-49
10-50
10-51
10-52
10-53
10-54
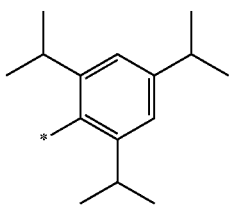
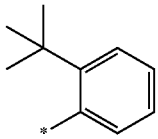
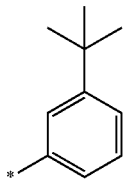
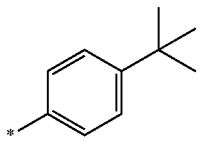
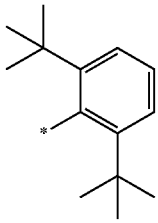
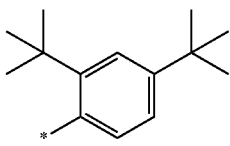
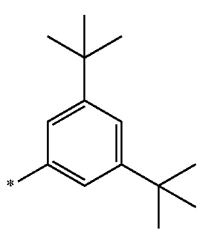
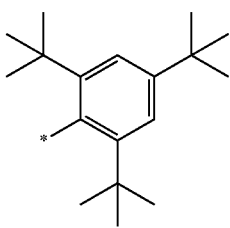
10-55
10-56
10-57
10-58
10-59
10-60
10-61
10-62

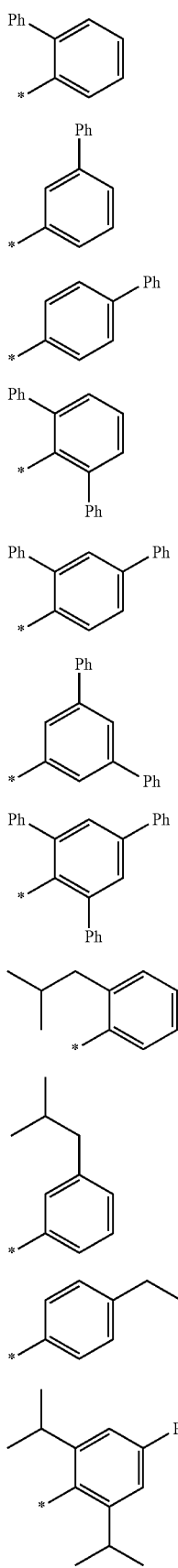
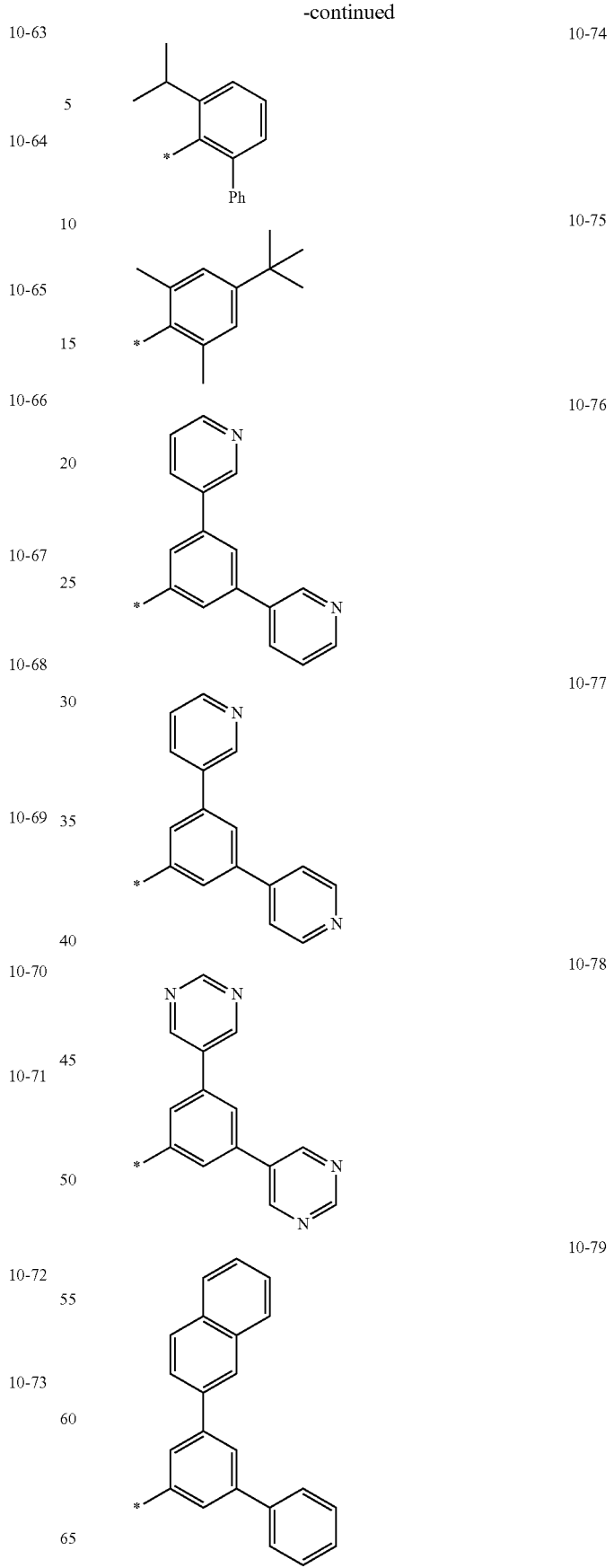

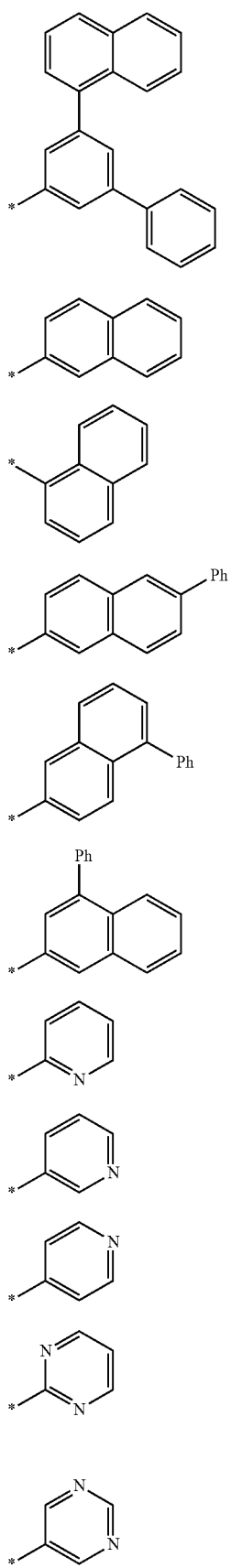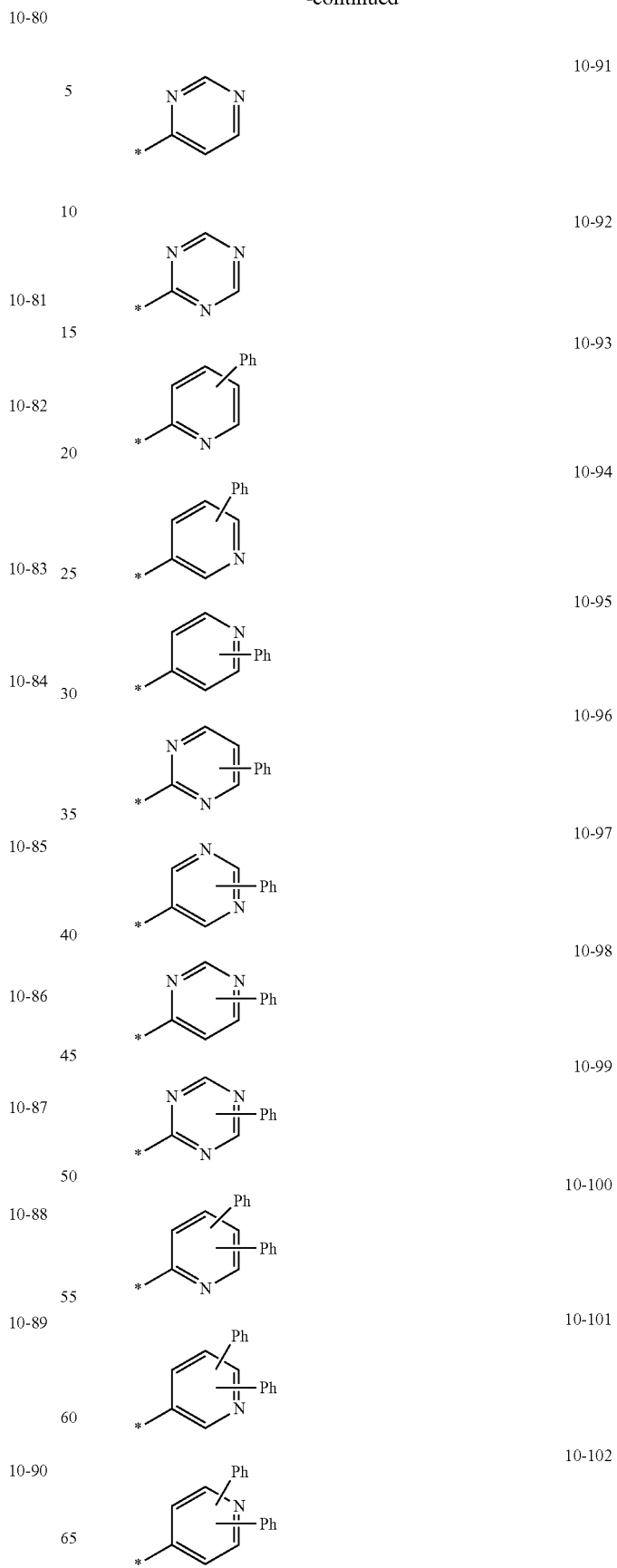

-continued
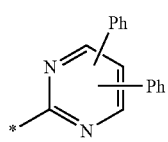 
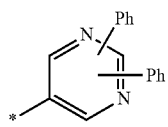 
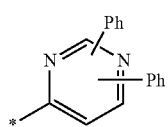 
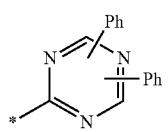 
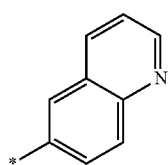 
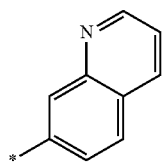 
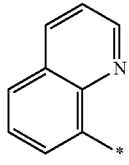 
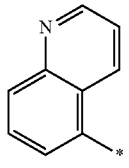 
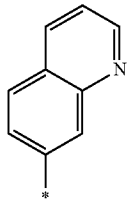
-continued
10-103
10-104
10-105
10-106
10-107
10-108
10-109
10-110
10-111
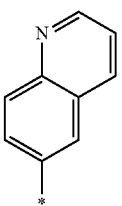 10-112
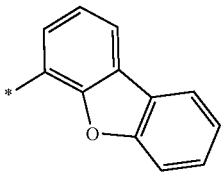 10-113
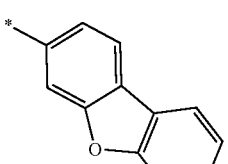 10-114
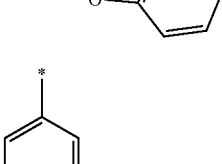 10-115
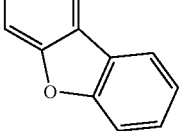 10-116
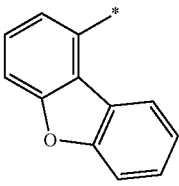 10-117
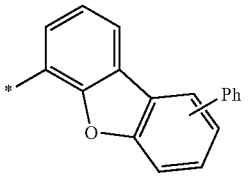 10-118
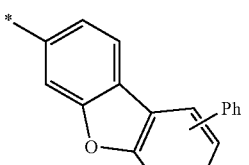 10-119
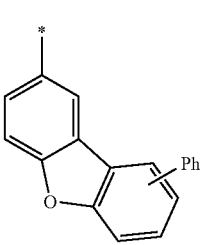

-continued
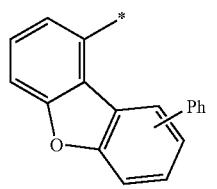
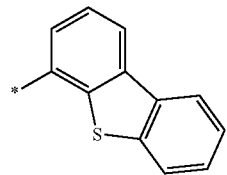
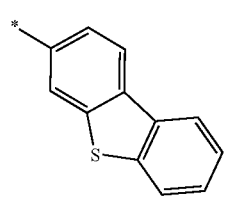
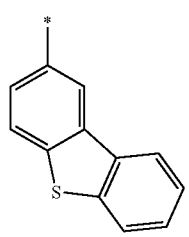
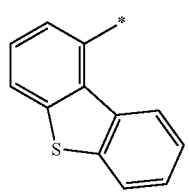
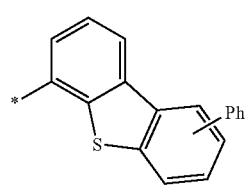
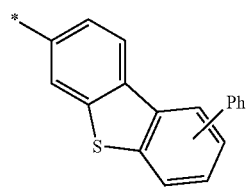
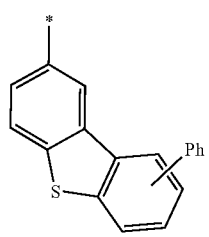
-continued
10-120
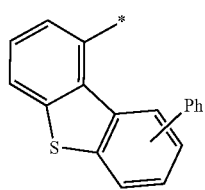
10-121
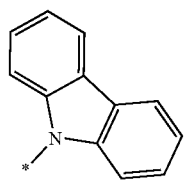
10-122
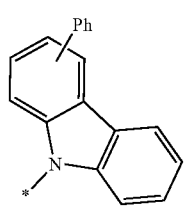
10-123
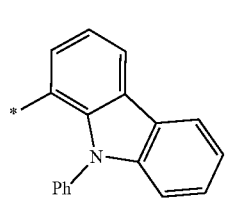
10-124
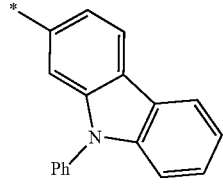
10-125
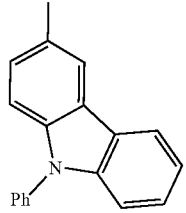
10-126
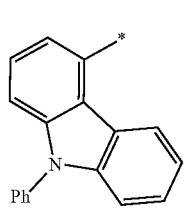
10-127
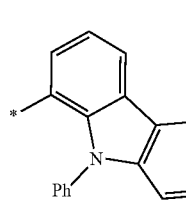
10-128
10-129
10-130
10-131
10-132
10-133
10-134
10-135

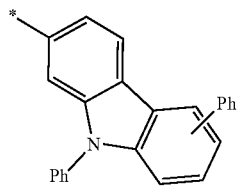
10-136
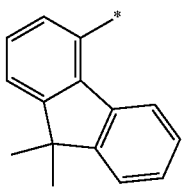
10-143
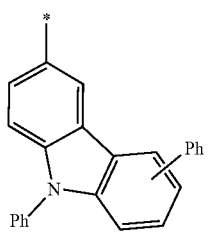
10-137
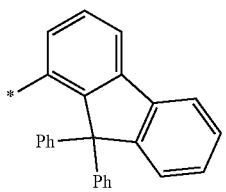
10-144
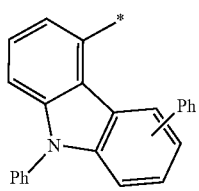
10-138
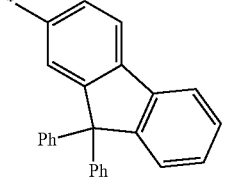
10-145
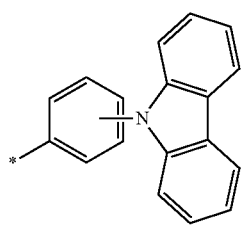
10-139
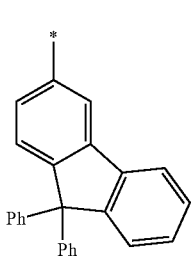
10-146
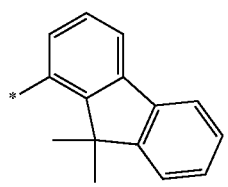
10-140
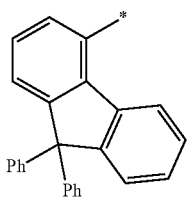
10-147
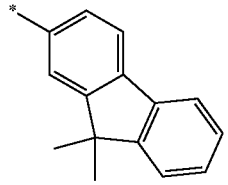
10-141
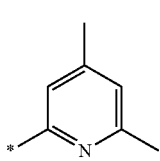
10-148
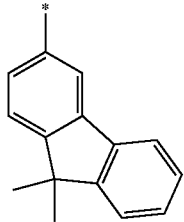
10-142
10-149
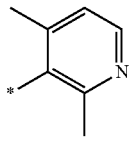
10-150

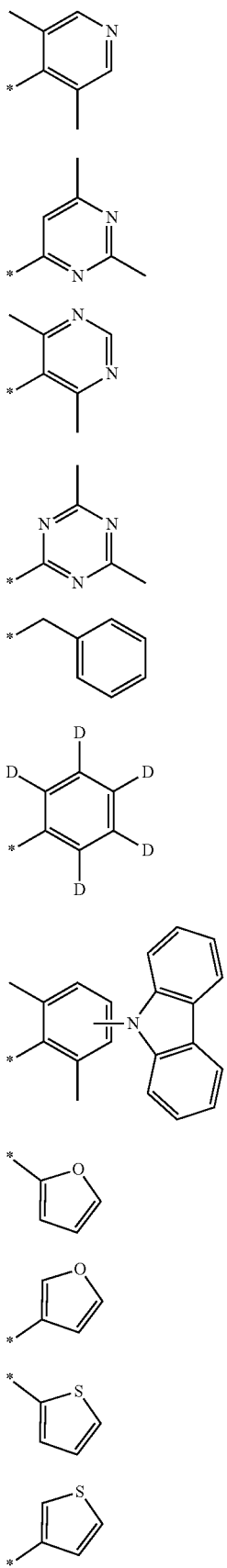
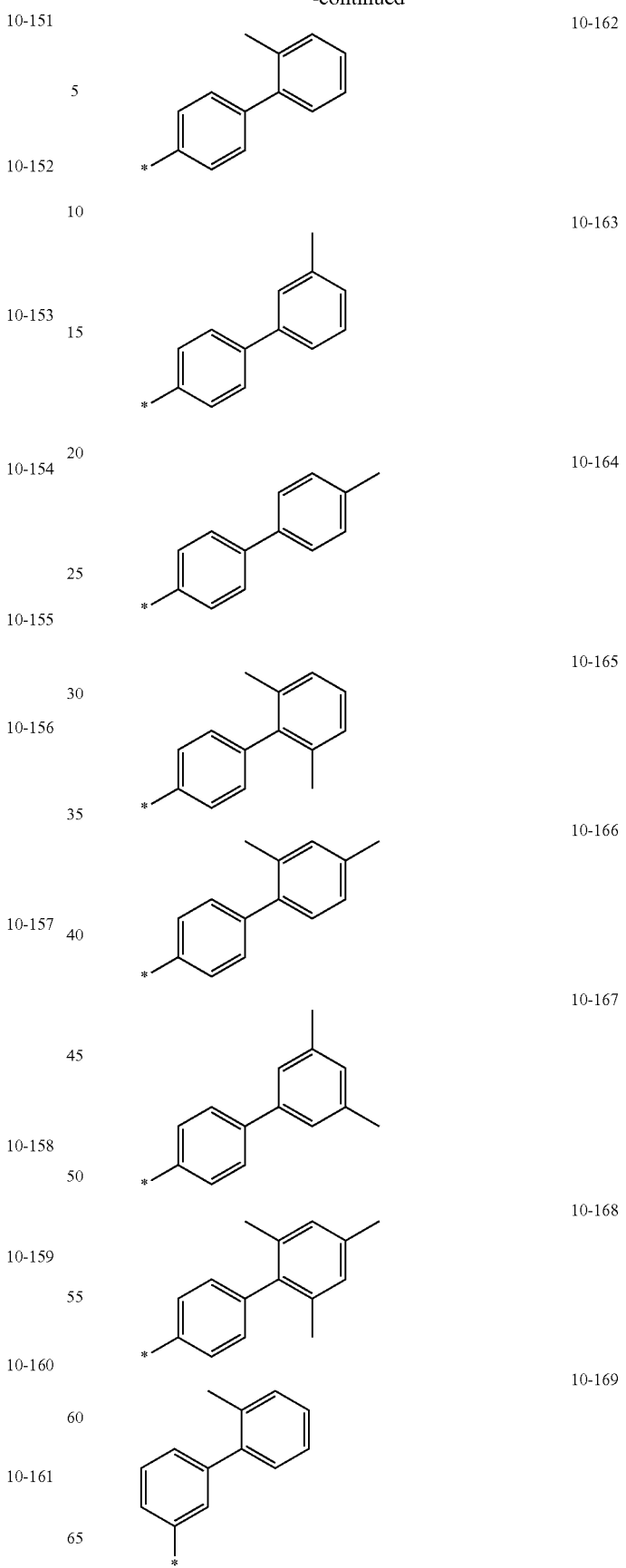

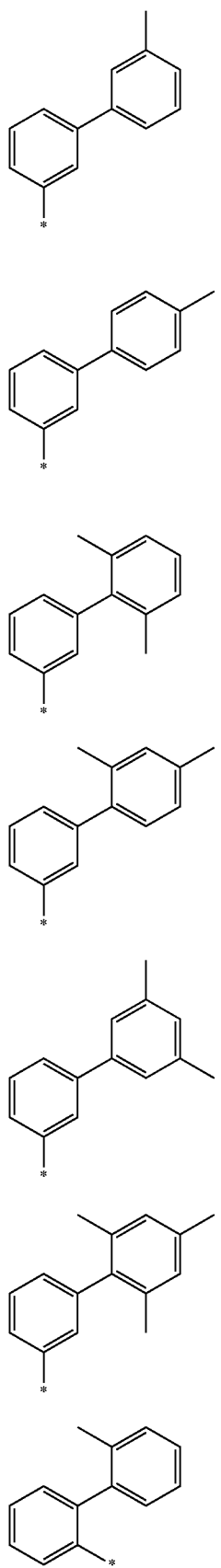
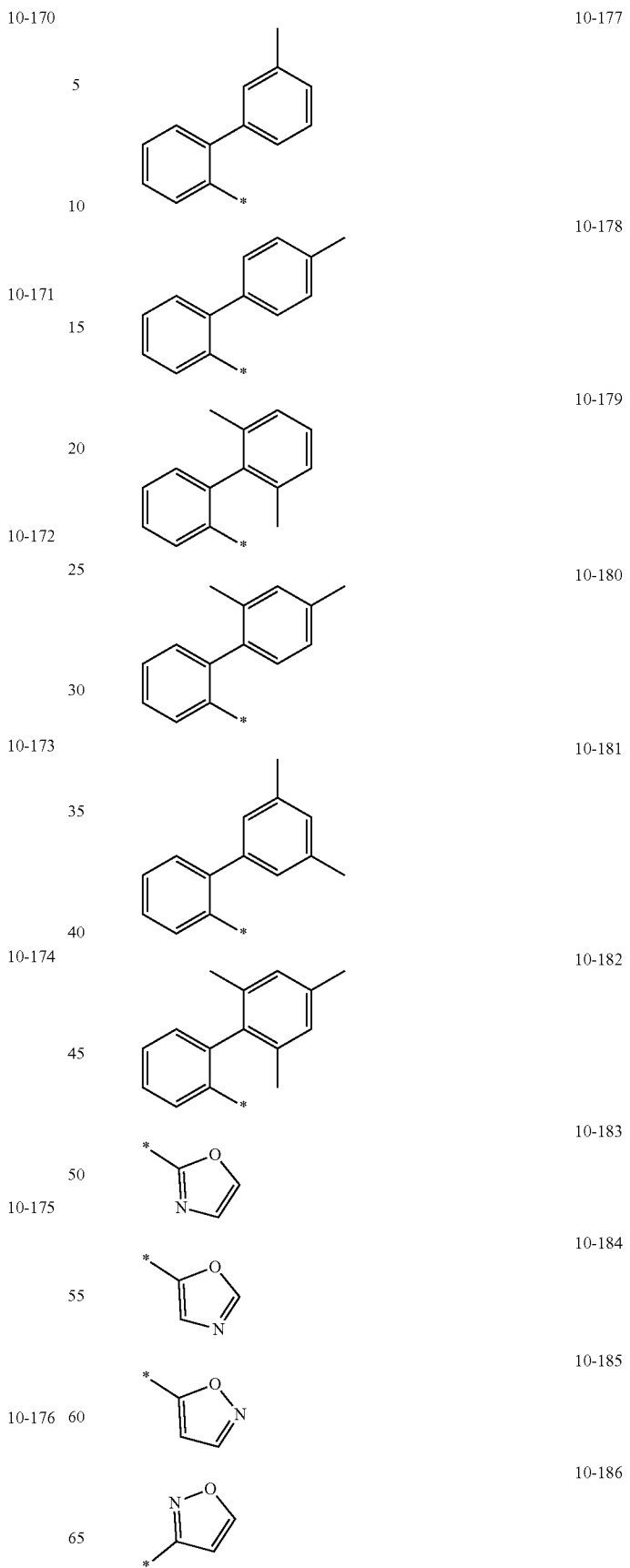

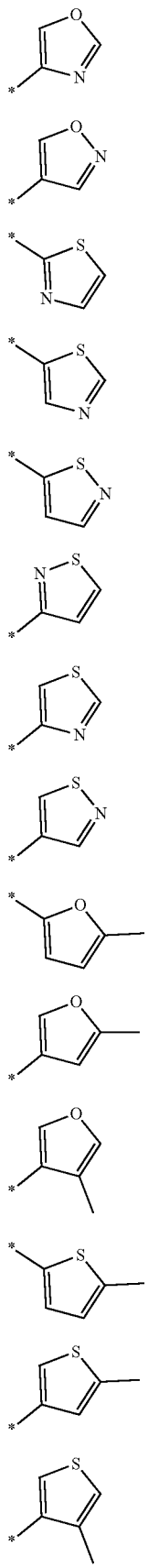
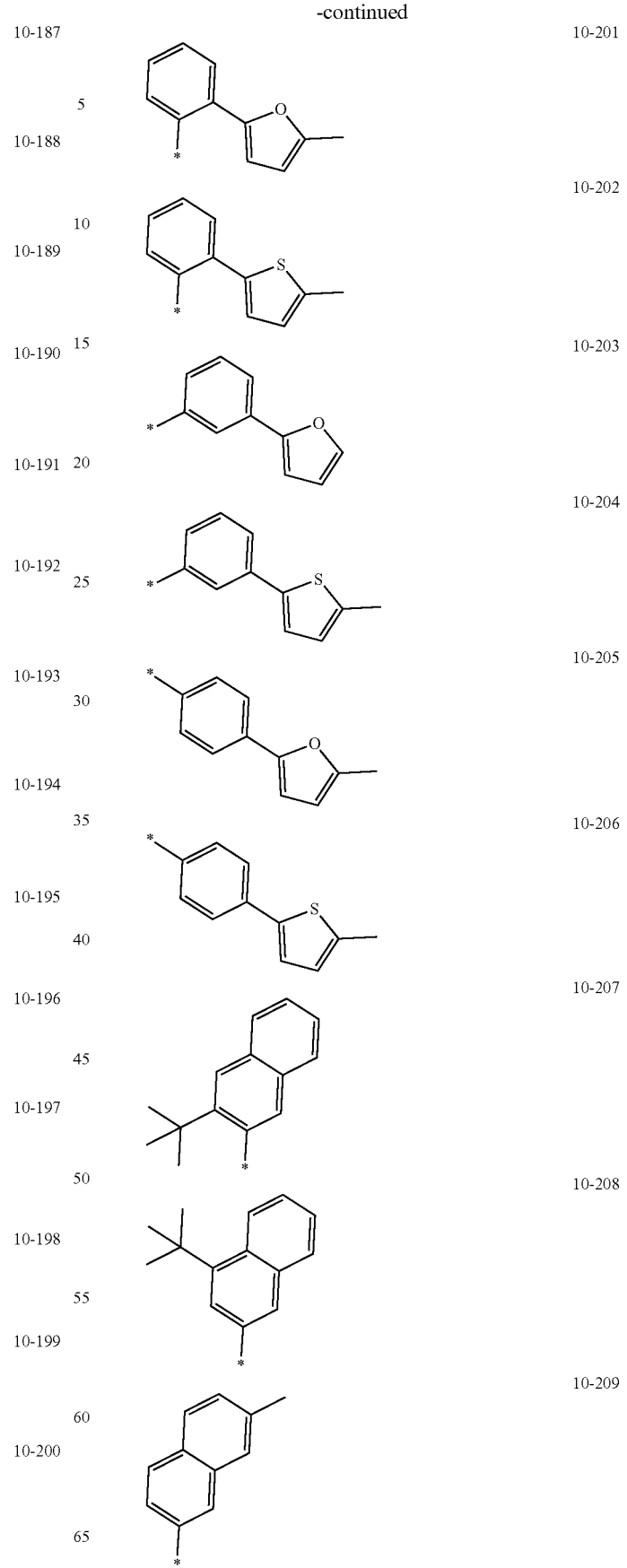

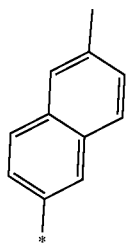
10-210
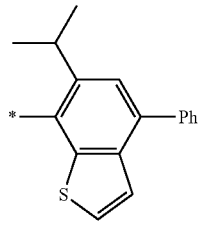
10-217
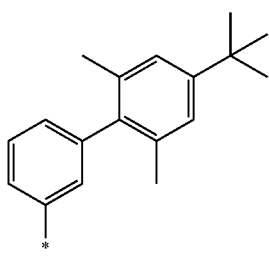
10-211
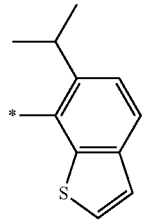
10-218
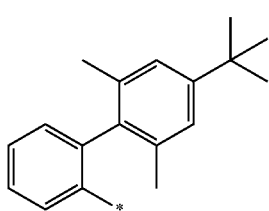
10-212
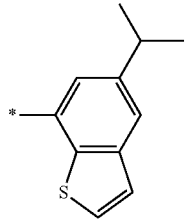
10-219
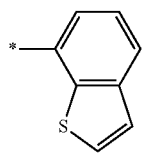
10-213
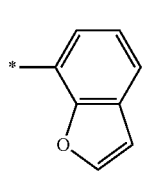
10-220
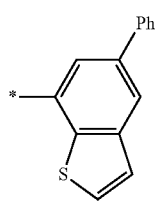
10-214
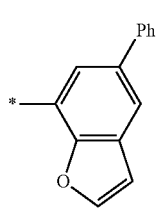
10-221
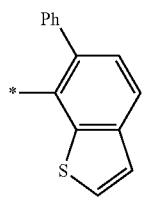
10-215
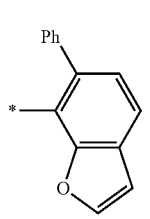
10-222
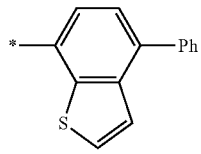
10-216
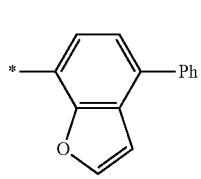
10-223

10-224 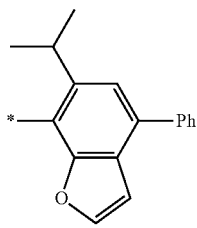
10-225 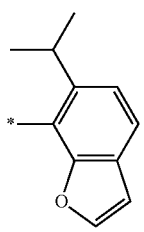
10-226 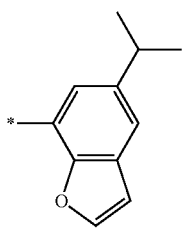
10-227 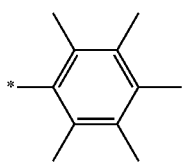
10-228 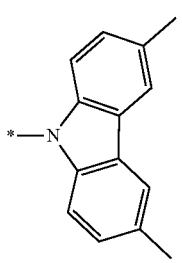
10-229 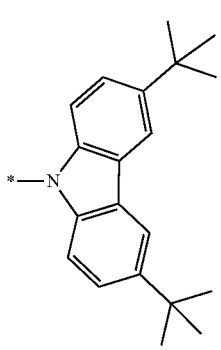
10-230 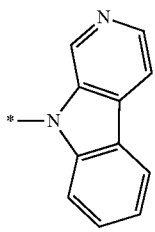
10-231 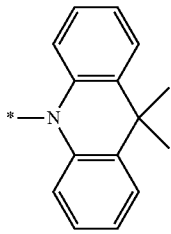
10-232 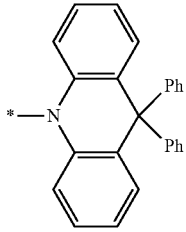
10-233 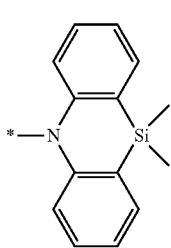
10-234 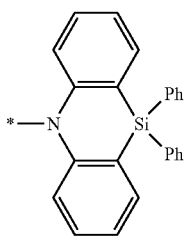
10-235 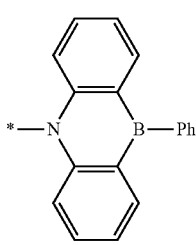
10-236 

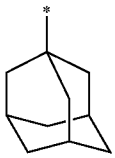
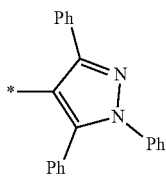
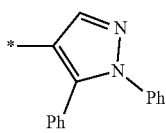
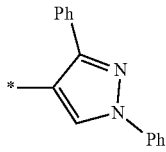
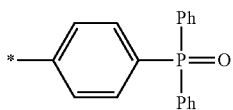
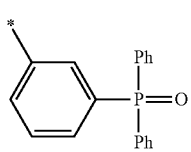
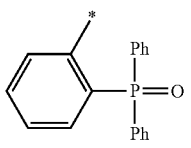
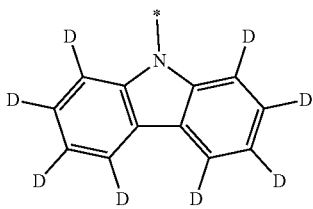
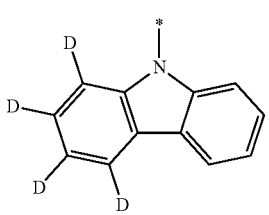
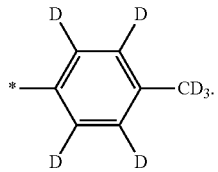

In Formulae 9-1 to 9-19 and 10-1 to 10-246, * indicates a binding site to a neighboring atom, Ph may be a phenyl group, and TMS may be a trimethylsilyl group.

In Formulae 3-1 to 3-5, 502, and 503, a71 to a74 and a501 to a504 each indicate the number of $R_{71}(s)$ to $R_{74}(s)$ and $R_{501}(s)$ to $R_{504}(s)$, and may each independently be an integer of 0 to 20. When a71 is 2 or more, two or more $R_{71}(s)$ may be identical to or different from each other, when a72 is 2 or more, two or more $R_{71}(s)$ may be identical to or different from each other, when a73 is 2 or more, two or more $R_{73}(s)$ may be identical to or different from each other, when a74 is 2 or more, two or more $R_{74}(s)$ may be identical to or different from each other, when a501 is 2 or more, two or more $R_{501}(s)$ may be identical to or different from each other, when a502 is 2 or more, two or more $R_{502}(s)$ are identical to or different from each other, when a503 is 2 or more, two or more $R_{503}(s)$ may be identical to or different from each other, and when a504 is 2 or more, two or more $R_{504}(s)$ may be identical to or different from each other. a71 to a74 and a501 to a504 may each independently be an integer of 0 to 8.

In Formula 2, a group represented by $*-(L_{51})_{b51}-R_{51}$ and a group represented by $*-(L_{52})_{b52}-R_{52}$ may not be a phenyl group.

In an embodiment, in Formula 2, a group represented by $*-(L_{51})_{b51}-R_{51}$ and a group represented by $*-(L_{52})_{b52}-R_{52}$ may be identical to each other.

In an embodiment, in Formula 2, a group represented by $*-(L_{51})_{b51}-R_{51}$ and a group represented by $*-(L_{52})_{b52}-R_{52}$ may be different from each other.

In an embodiment, in Formula 2, b51 and b52 may be 1, 2 or 3, and $L_{51}$ and $L_{52}$ may each independently be a benzene group, a pyridine group, a pyrimidine group, a pyridazine group, a pyrazine group, or a triazine group, each unsubstituted or substituted with at least one $R_{10a}$.

In an embodiment, in Formula 2, $R_{51}$ and $R_{52}$ may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $-C(Q_1)(Q_2)(Q_3)$, or $-Si(Q_1)(Q_2)(Q_3)$, and $Q_1$ to $Q_3$ may each independently be a $C_3$-$C_{60}$ carbocyclic group or a $C_1$-$C_{60}$ heterocyclic group unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment,
the group represented by $*-(L_{51})_{b51}-R_{51}$ in Formula 2 may be a group represented by one of Formulae CY51-1 to CY51-26, and/or
the group represented by $*-(L_{52})_{b52}-R_{52}$ in Formula 2 may be a group represented by one of Formulae CY52-1 to CY52-26, and/or the group represented by *-(L$_{53}$)$_{b53}$-R$_{53}$ in Formula 2 may be a group represented by one of Formulae CY53-1 to CY53-27, —C(Q$_1$)(O$_2$)(O$_3$), or —Si(Q$_1$)(Q$_2$)(Q$_3$):
CY51-1
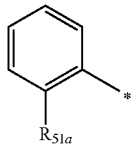
CY51-2
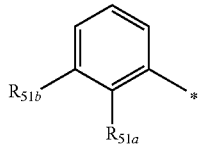
CY51-3
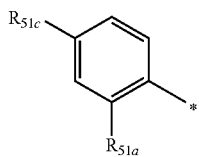
CY51-4
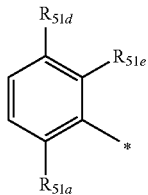
CY51-5
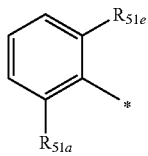
CY51-6
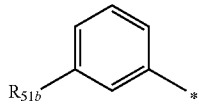
CY51-7
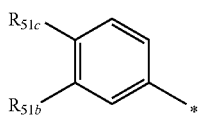
CY51-8
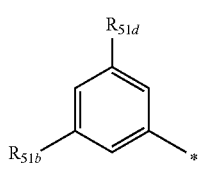
CY51-9
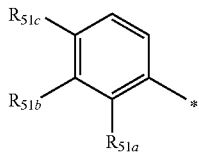
-continued
CY51-10
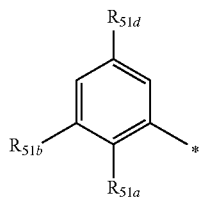
CY51-11
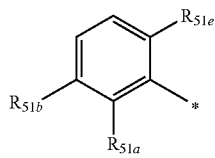
CY51-12
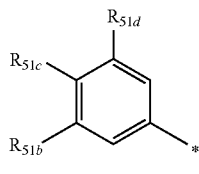
CY51-13
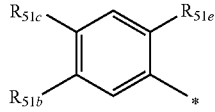
CY51-14
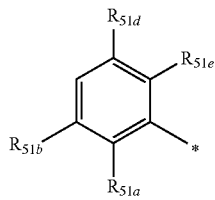
CY51-15
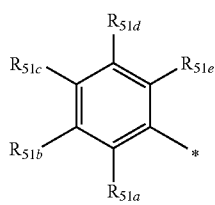
CY51-16
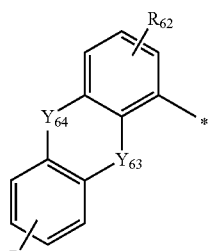
CY51-17
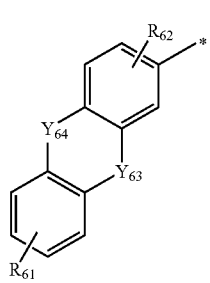

-continued
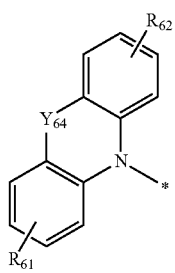
CY51-18
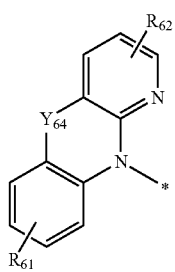
CY51-19
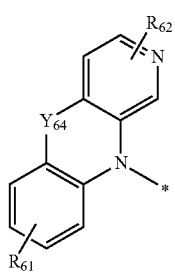
CY51-20
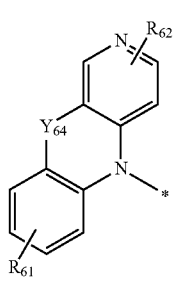
CY51-21
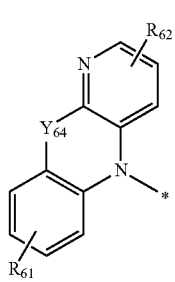
CY51-22
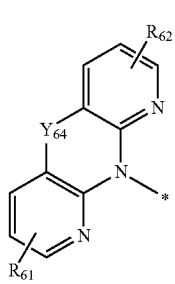
CY51-23
-continued
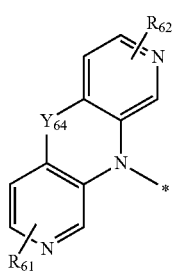
CY51-24
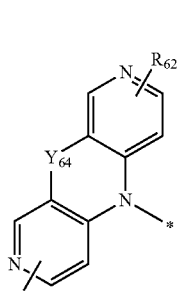
CY51-25
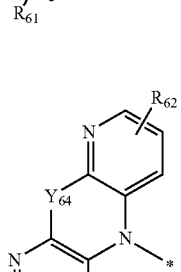
CY51-26
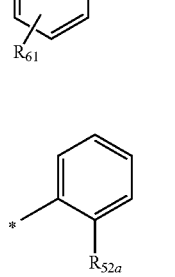
CY52-1
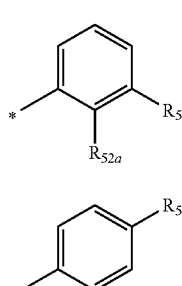
CY52-2
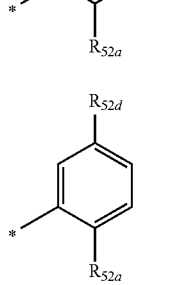
CY52-3
CY52-4

-continued
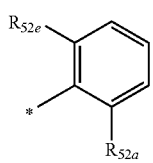
CY52-5
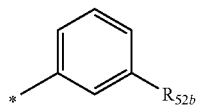
CY52-6
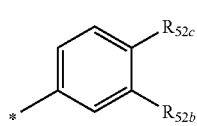
CY52-7
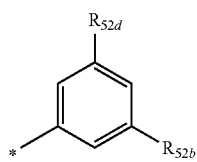
CY52-8
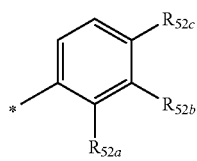
CY52-9
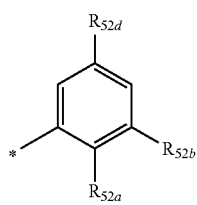
CY52-10
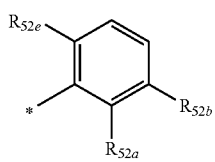
CY52-11
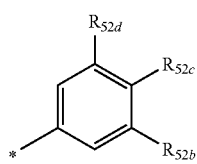
CY52-12
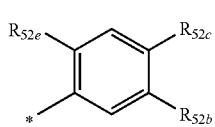
CY52-13
-continued
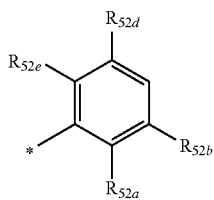
CY52-14
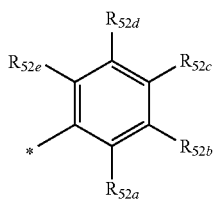
CY52-15
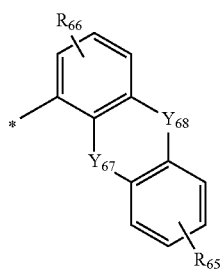
CY52-16
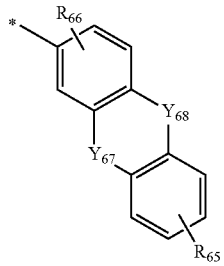
CY52-17
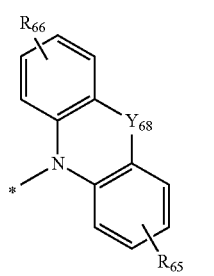
CY52-18
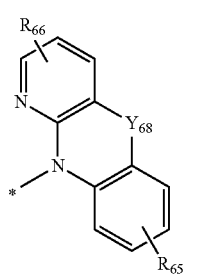
CY52-19

-continued
CY52-20
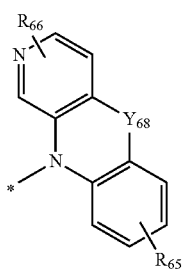
CY52-21
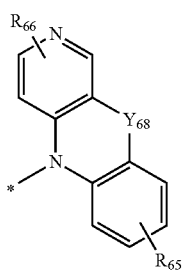
CY52-22
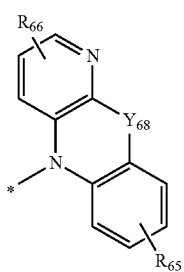
CY52-23
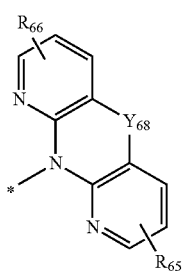
CY52-24
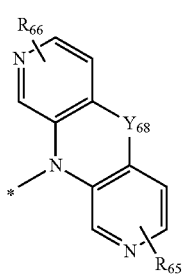
CY52-25
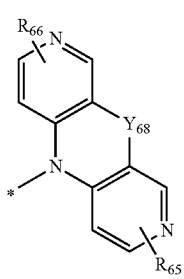
-continued
CY52-26
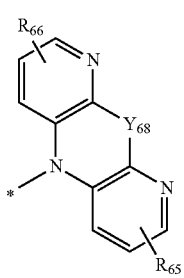
CY53-1
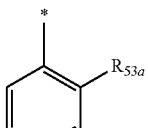
CY53-2
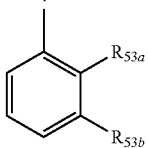
CY53-3
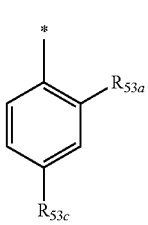
CY53-4
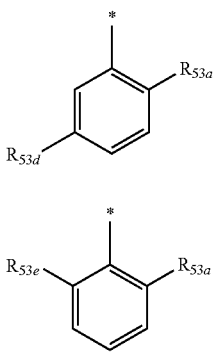
CY53-5
CY53-6
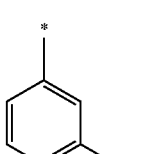
CY53-7
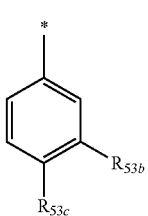

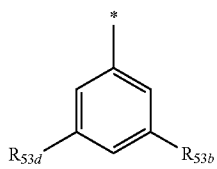
CY53-8
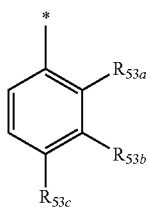
CY53-9
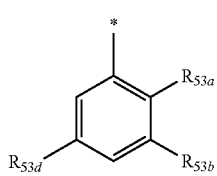
CY53-10
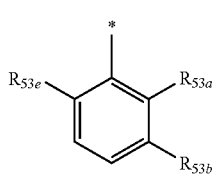
CY53-11
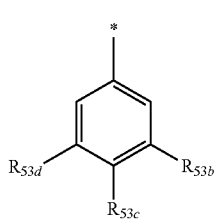
CY53-12
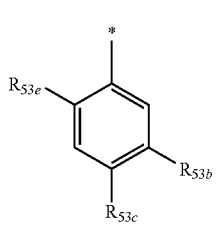
CY53-13
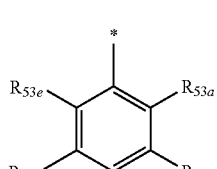
CY53-14
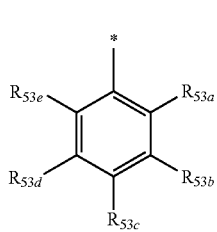
CY53-15
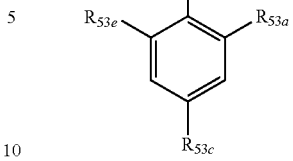
CY53-16
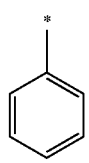
CY53-17
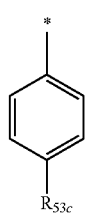
CY53-18
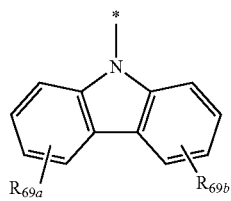
CY53-19
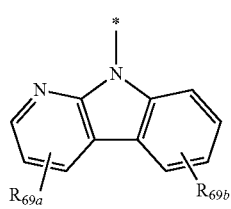
CY53-20
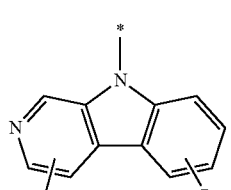
CY53-21
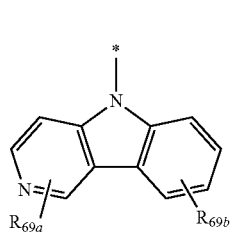
CY53-22

-continued

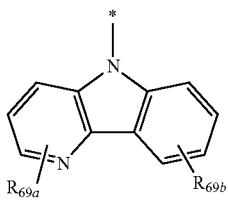
CY53-23

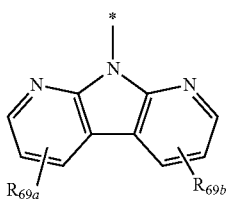
CY53-24

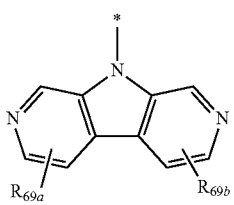
CY53-25

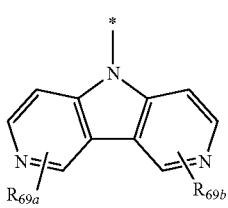
CY53-26

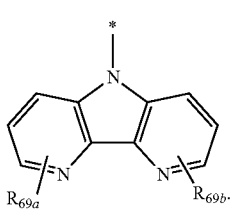
CY53-27

In Formulae CY51-1 to CY51-26, CY52-1 to CY52-26, and CY53-1 to CY53-27, $Y_{63}$ may be a single bond, O, S, $N(R_{63})$, $B(R_{63})$, $C(R_{63a})(R_{63b})$, or $Si(R_{63a})(R_{63b})$, $Y_{64}$ may be a single bond, O, S, $N(R_{64})$, $B(R_{64})$, $C(R_{64a})(R_{64b})$, or $Si(R_{64a})(R_{64b})$, $Y_{67}$ may be a single bond, O, S, $N(R_{67})$, $B(R_{67})$, $C(R_{67a})(R_{67b})$, or $Si(R_{67a})(R_{67b})$, $Y_{68}$ may be a single bond, O, S, $N(R_{68})$, $B(R_{68})$, $C(R_{68a})(R_{68b})$, or $Si(R_{68a})(R_{68b})$, each of $Y_{63}$ and $Y_{64}$ in Formulae CY51-16 and CY51-17 may not be a single bond, each of $Y_{67}$ and $Y_{68}$ in Formulae CY52-16 and CY52-17 may not be a single bond, $R_{51a}$ to $R_{51e}$, $R_{61}$ to $R_{64}$, $R_{63a}$, $R_{63b}$, $R_{64a}$, and $R_{64b}$ may each independently be the same as described in connection with $R_{51}$, and each of $R_{51a}$ to $R_{51e}$ may not be hydrogen, $R_{52a}$ to $R_{52e}$, $R_{65}$ to $R_{68}$, $R_{67a}$, $R_{67b}$, $R_{68a}$, and $R_{68b}$ may each independently be same as described in connection with $R_{52}$, and each of $R_{52a}$ to $R_{52e}$ is not hydrogen, $R_{53a}$ to $R_{53e}$, $R_{69a}$ and $R_{69b}$ may each independently be the same as described in connection with $R_{53}$, and each of $R_{53a}$ to $R_{53e}$ may not be hydrogen, and

* indicates a binding site to a neighboring atom.

For example, $R_{51a}$ to $R_{51e}$ and $R_{52a}$ to $R_{52e}$ in Formulae CY51-1 to CY51-26 and Formulae CY52-1 to 52-26 may each independently be:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or —C($Q_1$)($Q_2$)($Q_3$) or —Si($Q_1$)($Q_2$)($Q_3$), wherein $Q_1$ to $Q_3$ may each independently be a phenyl group, a naphthyl group, a pyridinyl group, a pyrimidinyl group, a pyridazinyl group, a pyrazinyl group, or triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof, in Formulae CY51-16 and CY51-17, i) $Y_{63}$ may be O or S and $Y_{64}$ may be Si($R_{64a}$)($R_{64b}$), or ii) $Y_{63}$ may be Si($R_{63a}$)($R_{63b}$) and $Y_{64}$ may be O or S, and in Formulae CY52-16 and CY52-17, i) $Y_{67}$ may be O or S and $Y_{68}$ may be Si($R_{68a}$)($R_{68b}$), or ii) $Y_{67}$ may be Si($R_{67a}$)($R_{67b}$) and $Y_{68}$ may be O or S.

In Formulae 3-1 to 3-5, $L_{81}$ to $L_{85}$ may each independently be:

a single bond;

*—C($Q_4$)($Q_5$)*' or *—Si($Q_4$)($Q_5$)*'; or a benzene group, a naphthalene group, an anthracene group, a phenanthrene group, a triphenylene group, a pyrene group, a chrysene group, cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), —P(=O)($Q_{31}$)($Q_{32}$), or any combination thereof, wherein $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In an embodiment, the group represented by

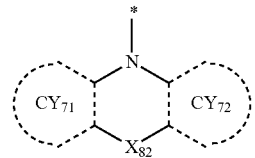

in Formulae 3-1 and 3-2 may be a group represented by one of Formulae CY71-1(1) to CY71-1(8), and/or the group represented by

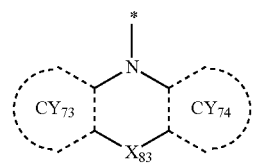

in Formulae 3-1 and 3-3 may be a group represented by one of Formulae CY71-2(1) to CY71-2(8), the group represented by

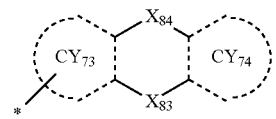

in Formulae 3-2 and 3-4 may be a group represented by one of Formulae CY71-3(1) to CY71-3(32), and/or the group represented by

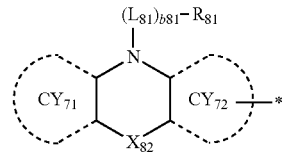

in Formulae 3-3 to 3-5 may be a group represented by one of Formulae CY71-4(1) to CY71-4(32), and/or the group represented by

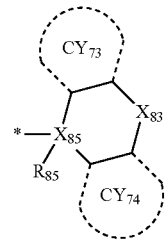

in Formula 3-5 may be a group represented by one of Formulae CY71-5(1) to CY71-5(8):

CY71-1(1)
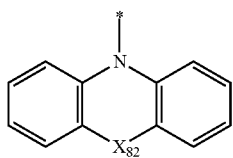
CY71-1(2)
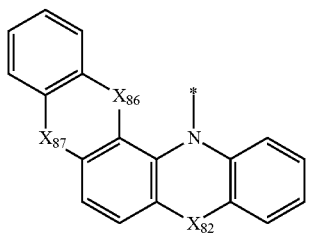
CY71-1(3)
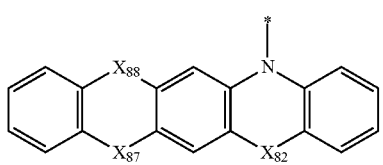
CY71-1(4)
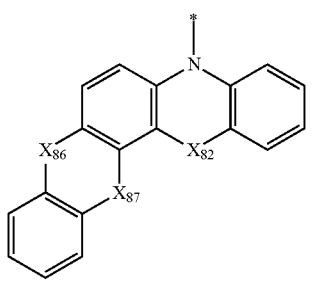
CY71-1(5)
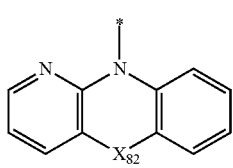
CY71-1(6)
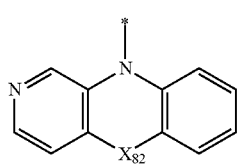
CY71-1(7)
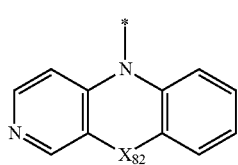
CY71-1(8)
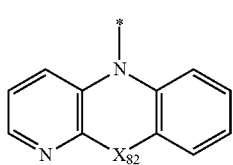
CY71-2(1)
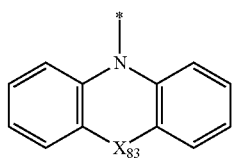
CY71-2(2)
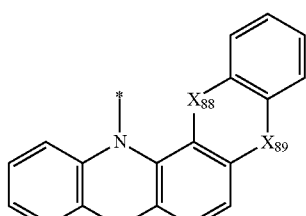
CY71-2(3)
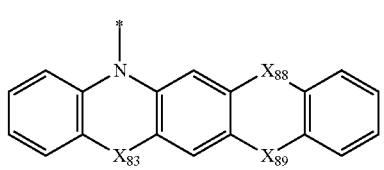
CY71-2(4)
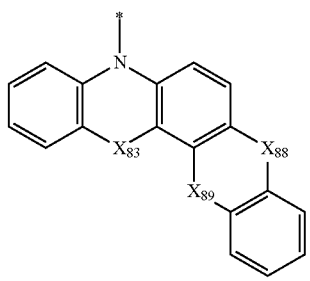
CY71-2(5)
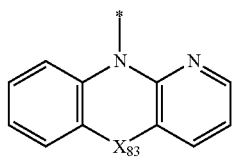
CY71-2(6)
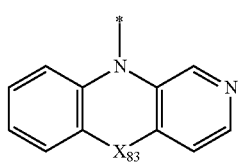
CY71-2(7)
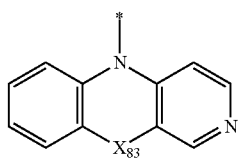
CY71-2(8)
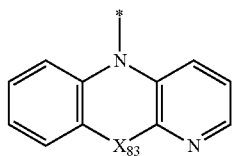

-continued

CY71-3(1)
CY71-3(2)
CY71-3(3)
CY71-3(4)
CY71-3(5)
CY71-3(6)
CY71-3(7)
CY71-3(8)

-continued

CY71-3(9)
CY71-3(10)
CY71-3(11)
CY71-3(12)
CY71-3(13)
CY71-3(14)
CY71-3(15)
CY71-3(16)
CY71-3(17)

CY71-4(2)
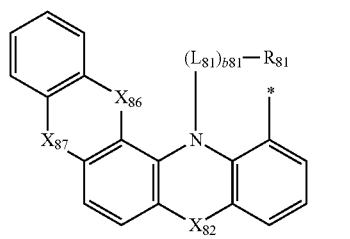
CY71-4(3)
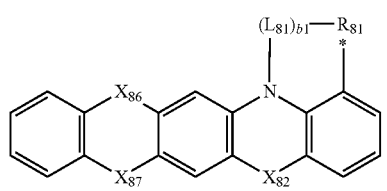
CY71-4(4)
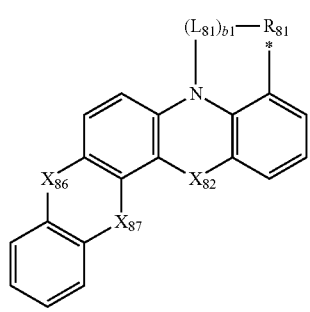
CY71-4(5)
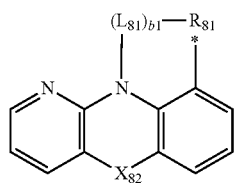
CY71-4(6)
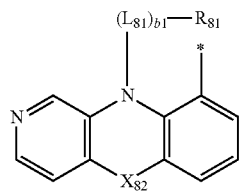
CY71-4(7)
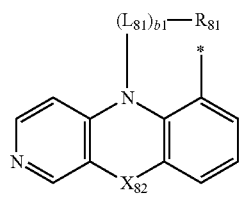
CY71-4(8)
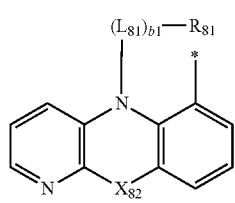
CY71-4(9)
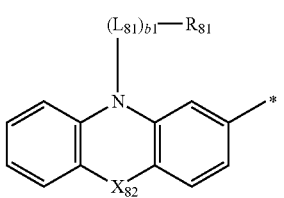
CY71-4(10)
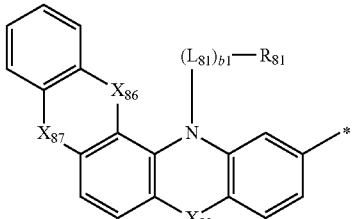
CY71-4(11)
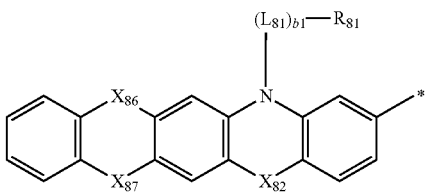
CY71-4(12)
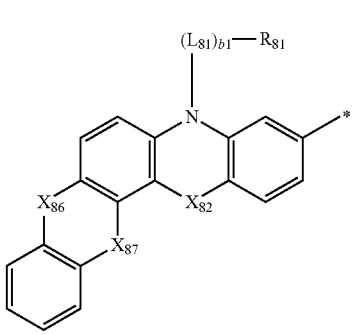
CY71-4(13)
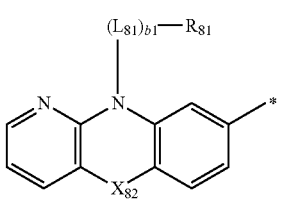
CY71-4(14)
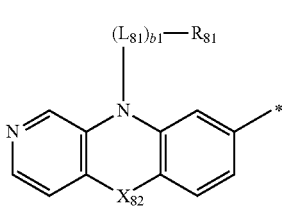
CY71-4(15)
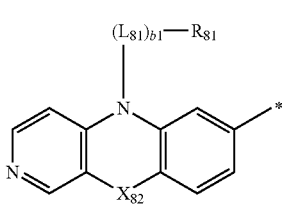

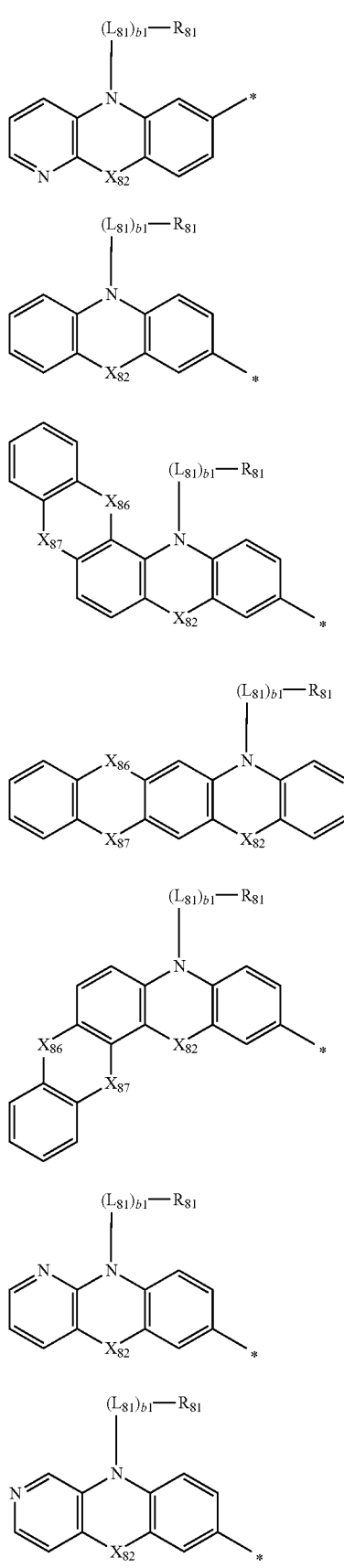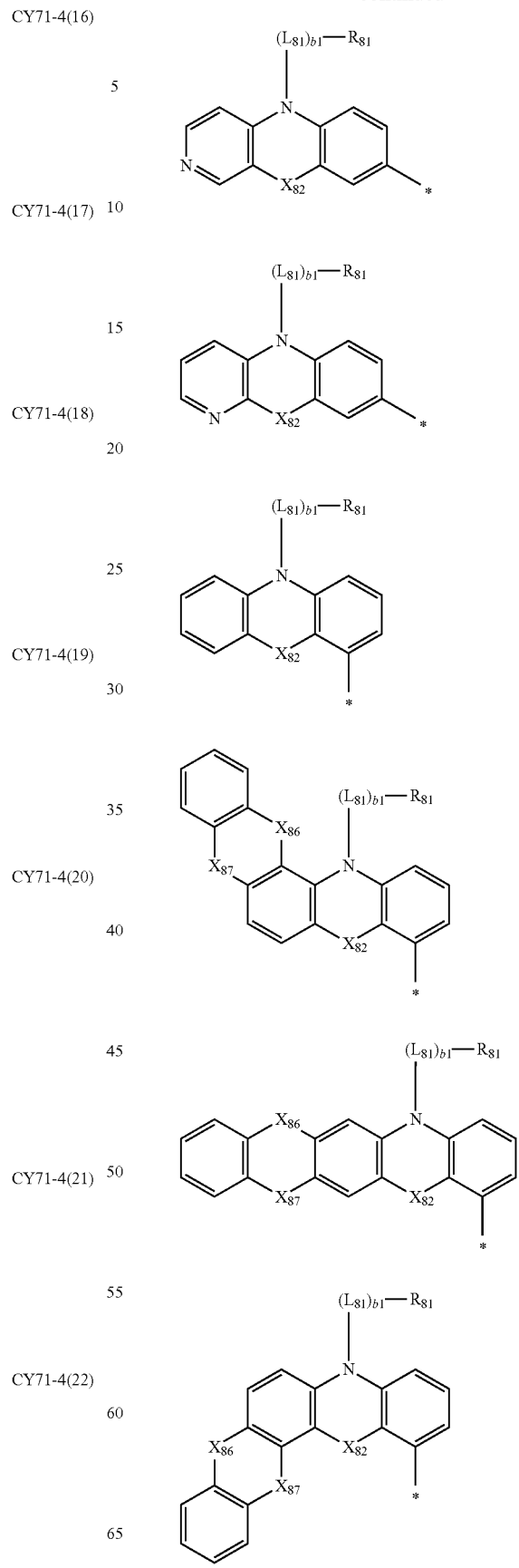

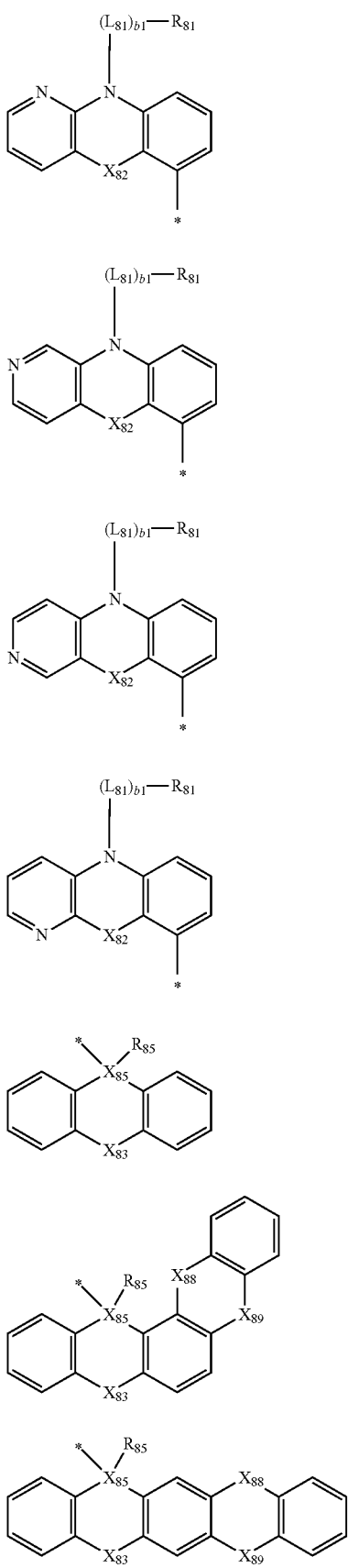

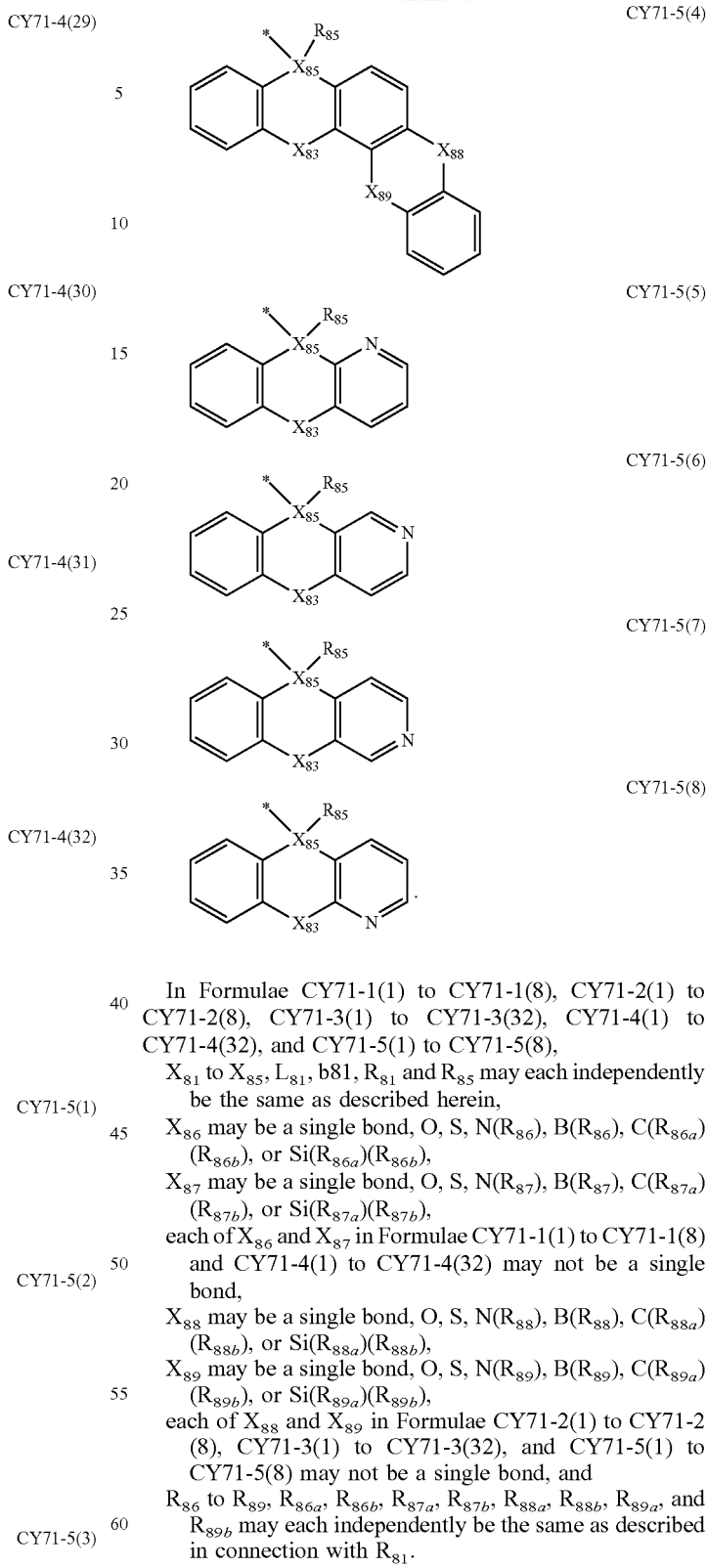

In Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{81}$ to $X_{85}$, $L_{81}$, b81, $R_{81}$ and $R_{85}$ may each independently be the same as described herein, $X_{86}$ may be a single bond, O, S, N($R_{86}$), B($R_{86}$), C($R_{86a}$)($R_{86b}$), or Si($R_{86a}$)($R_{86b}$), $X_{87}$ may be a single bond, O, S, N($R_{87}$), B($R_{87}$), C($R_{87a}$)($R_{87b}$), or Si($R_{87a}$)($R_{87b}$), each of $X_{86}$ and $X_{87}$ in Formulae CY71-1(1) to CY71-1(8) and CY71-4(1) to CY71-4(32) may not be a single bond, $X_{88}$ may be a single bond, O, S, N($R_{88}$), B($R_{88}$), C($R_{88a}$)($R_{88b}$), or Si($R_{88a}$)($R_{88b}$), $X_{89}$ may be a single bond, O, S, N($R_{89}$), B($R_{89}$), C($R_{89a}$)($R_{89b}$), or Si($R_{89a}$)($R_{89b}$), each of $X_{88}$ and $X_{89}$ in Formulae CY71-2(1) to CY71-2(8), CY71-3(1) to CY71-3(32), and CY71-5(1) to CY71-5(8) may not be a single bond, and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ may each independently be the same as described in connection with $R_{81}$.

EXAMPLES OF COMPOUNDS

In an embodiment, the first compound (the organometallic compound represented by Formula 1) may be at least one of Compounds BD1 to BD55:

BD1
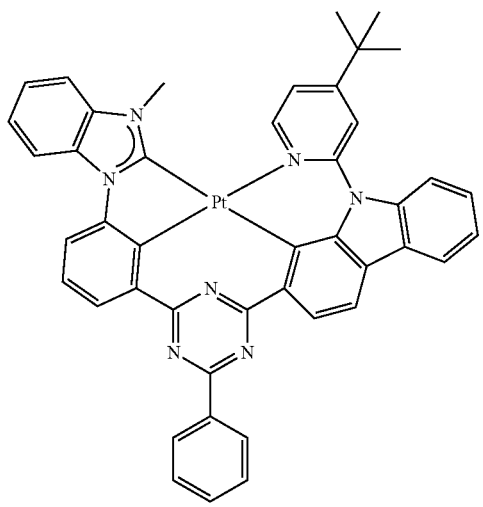
BD2
BD3
BD4
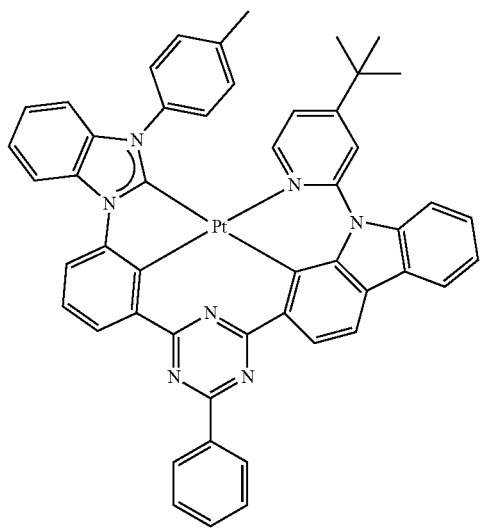
BD5
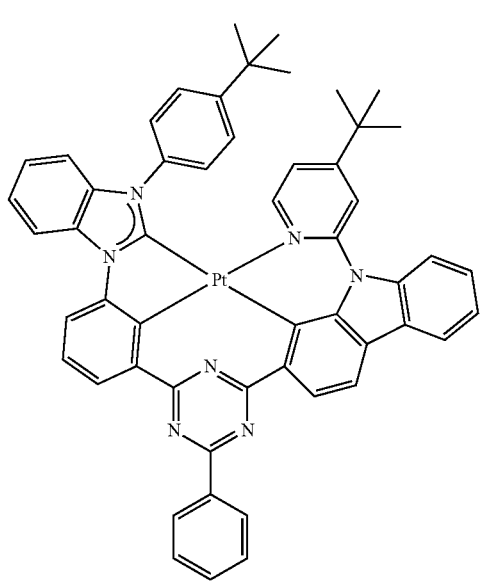
BD6
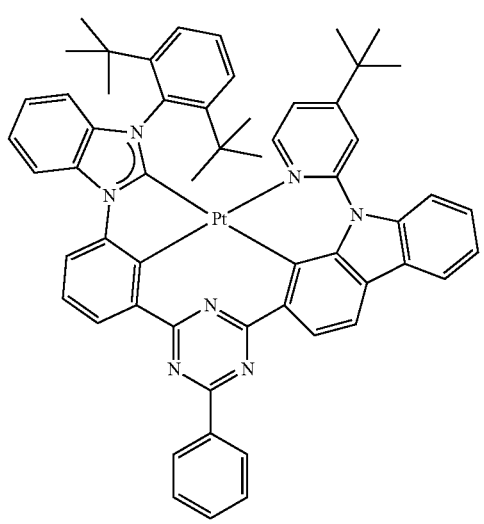

BD7
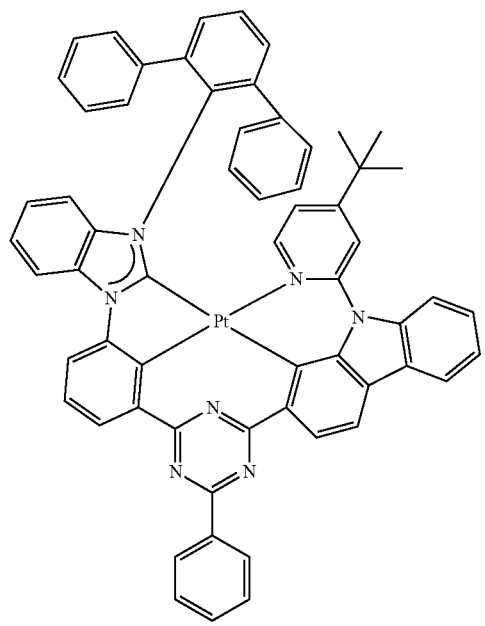
BD9
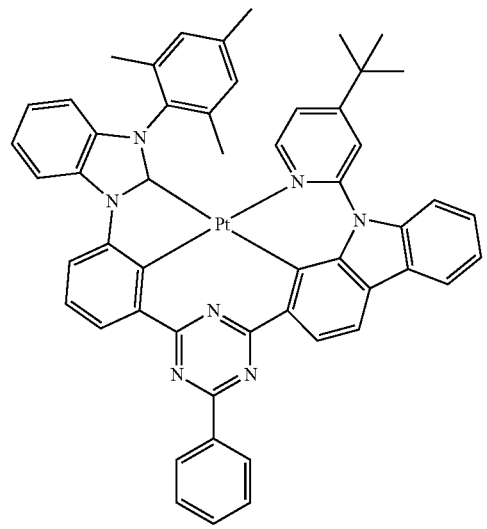
BD8
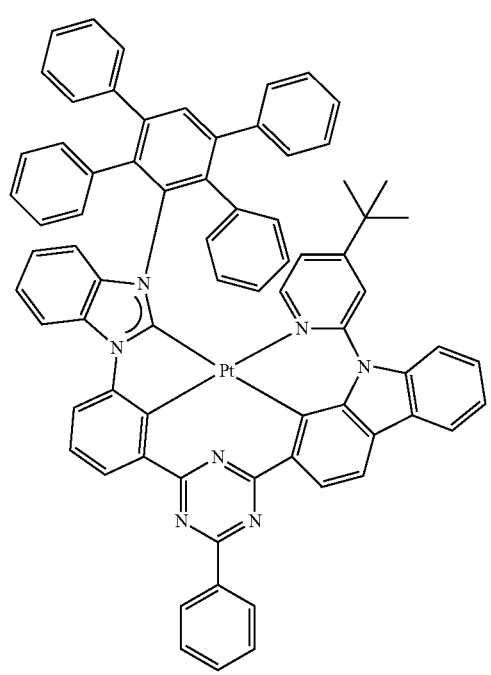
BD10
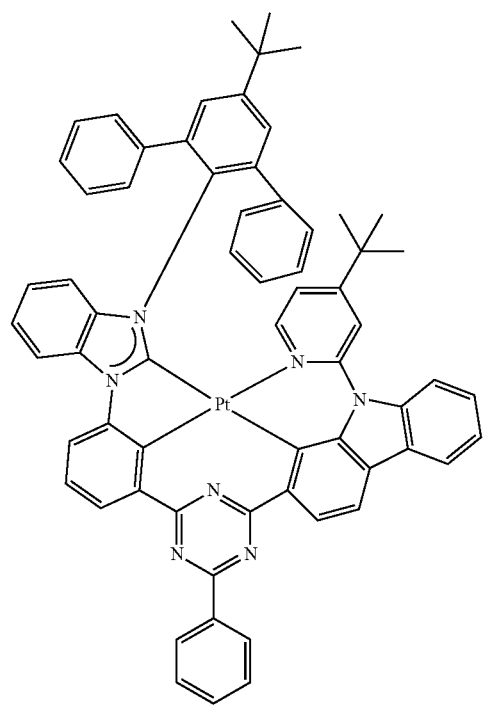

BD11
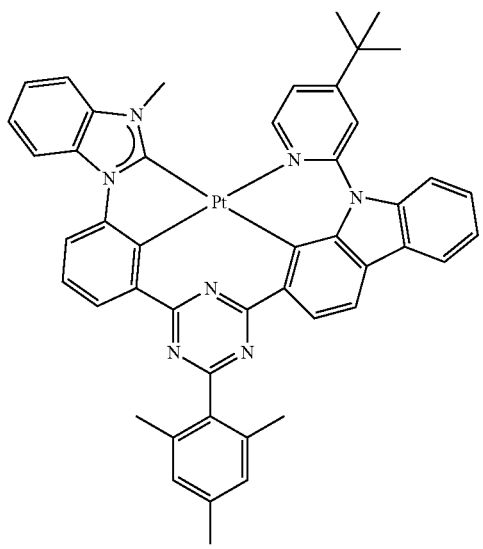
BD12
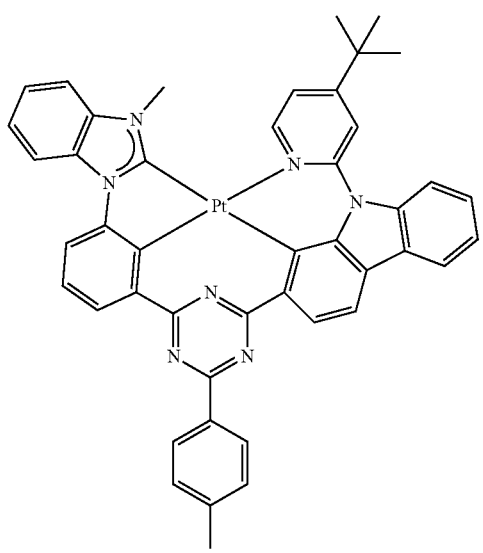
BD13
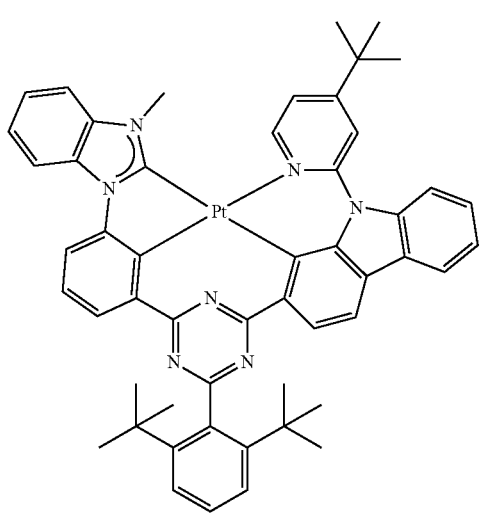
BD14
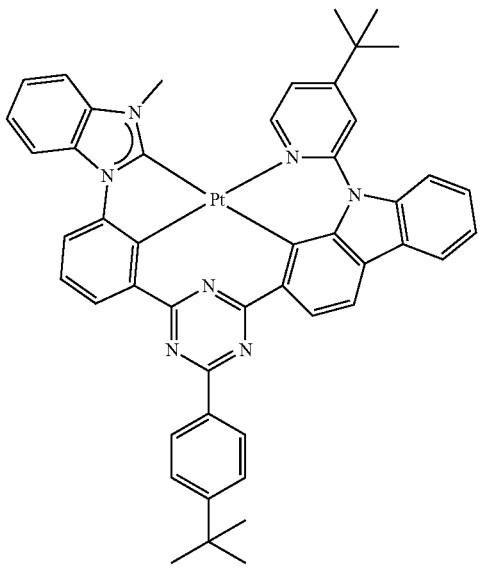
BD15
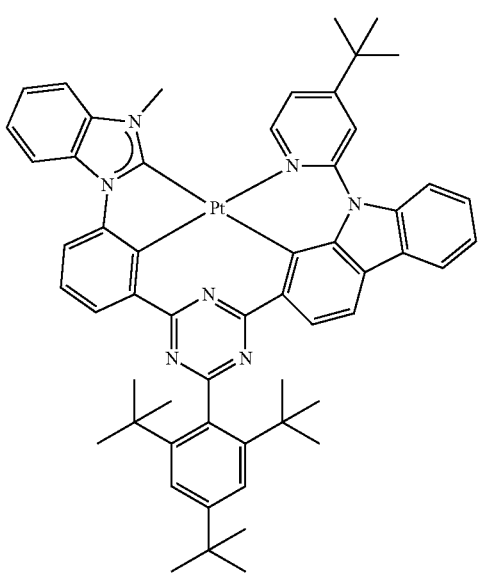

BD16
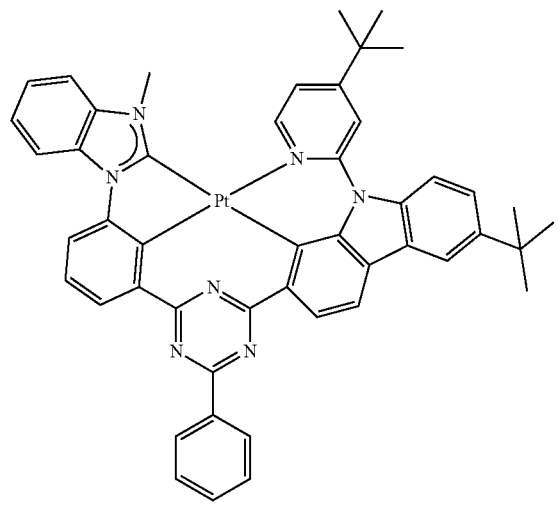
BD19
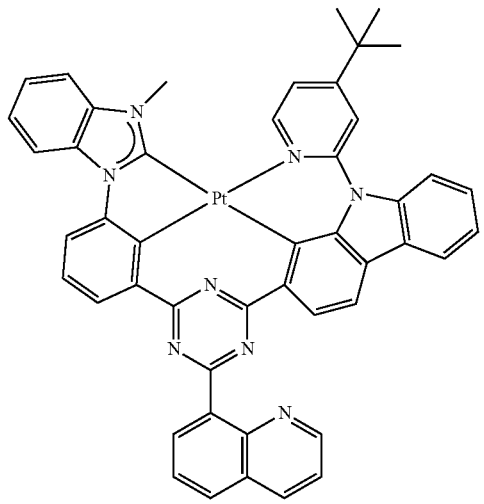
BD17
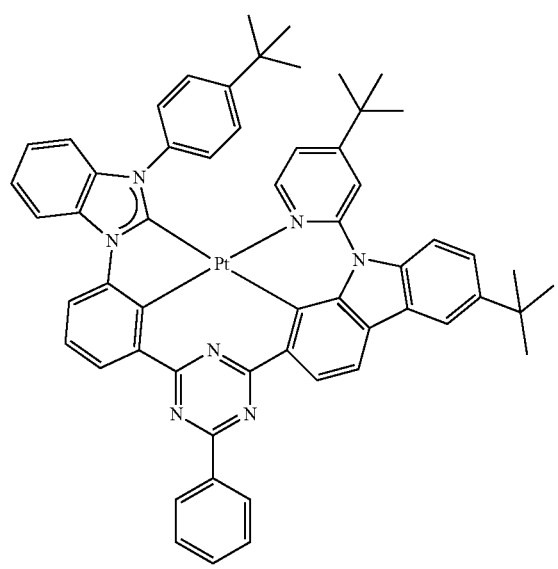
BD20
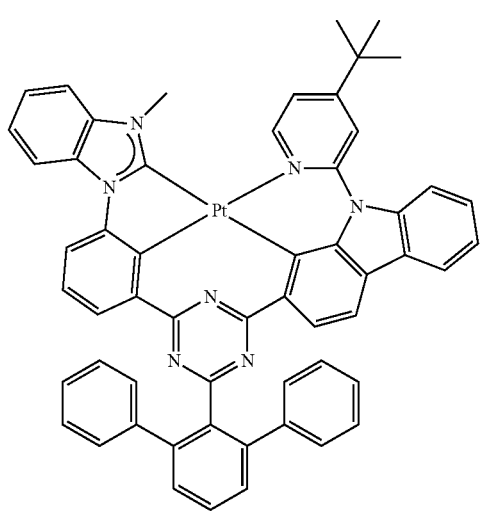
BD18
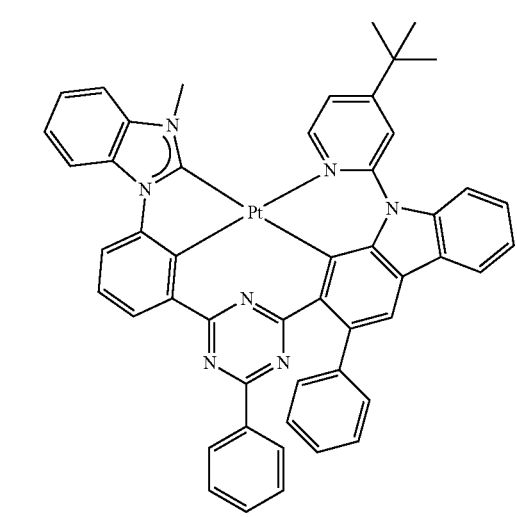
BD21
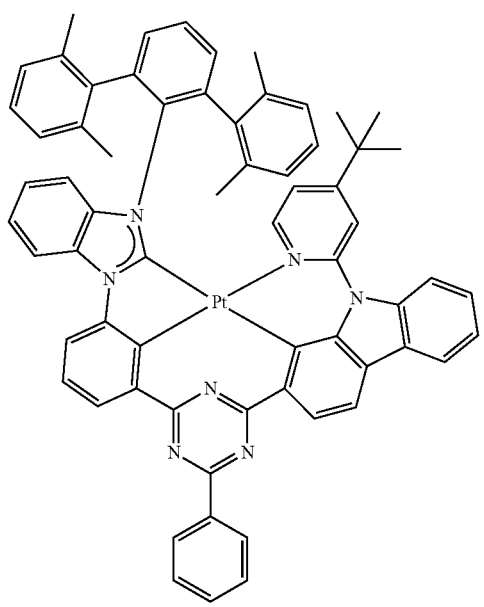

BD22
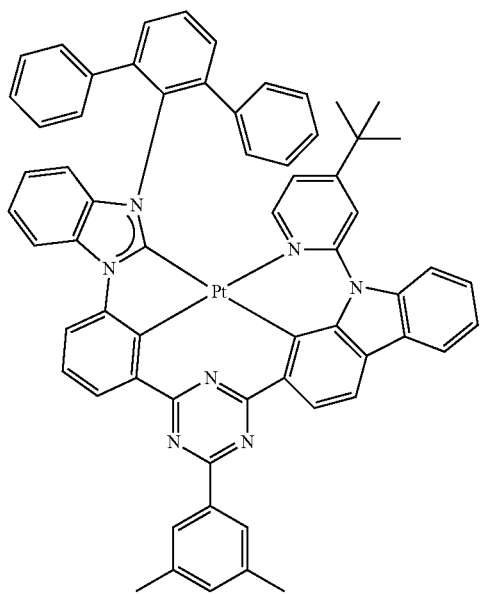
BD24
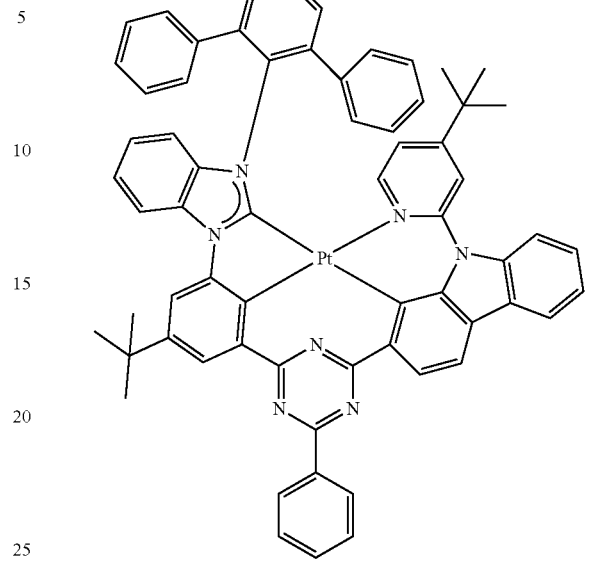
BD23
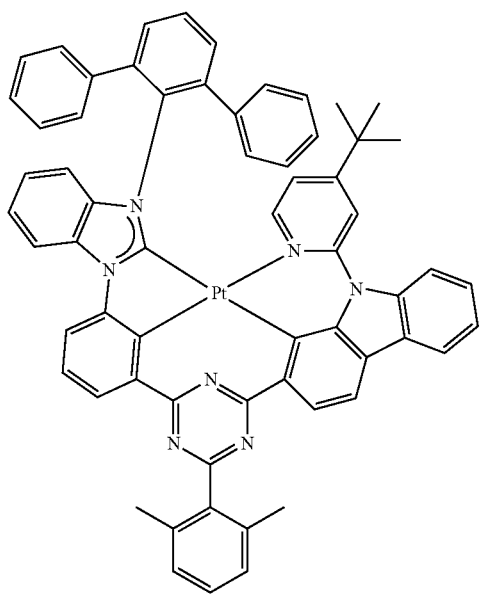
BD25
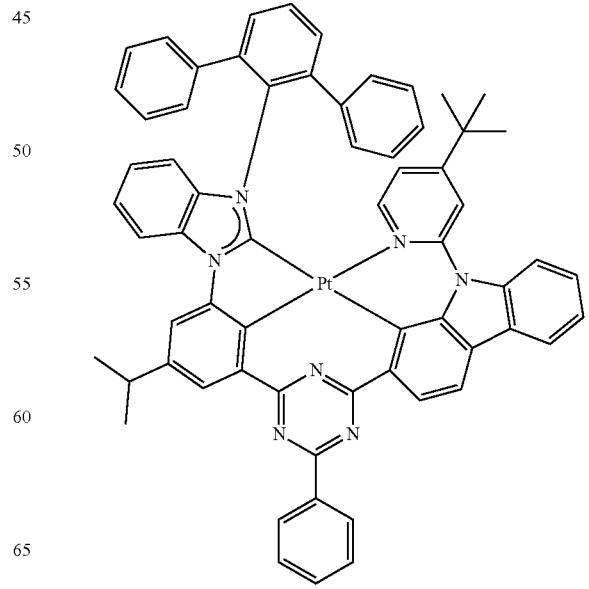

BD26
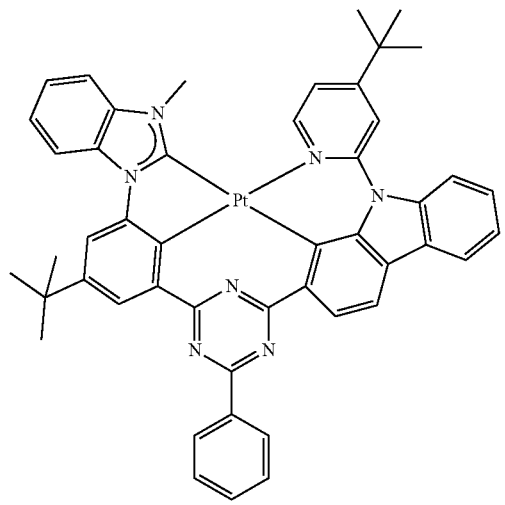
BD28
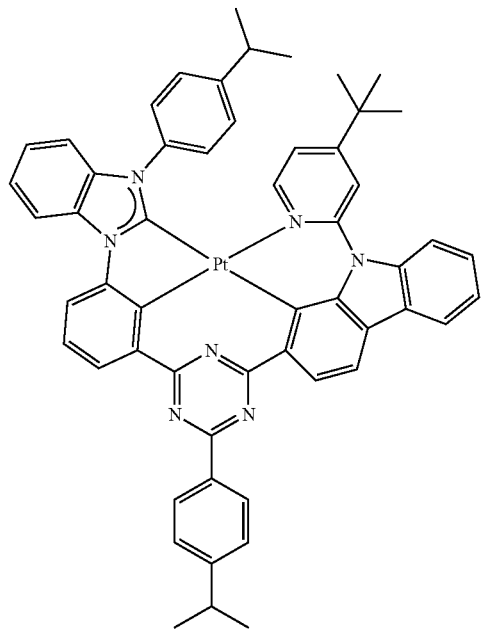
BD27
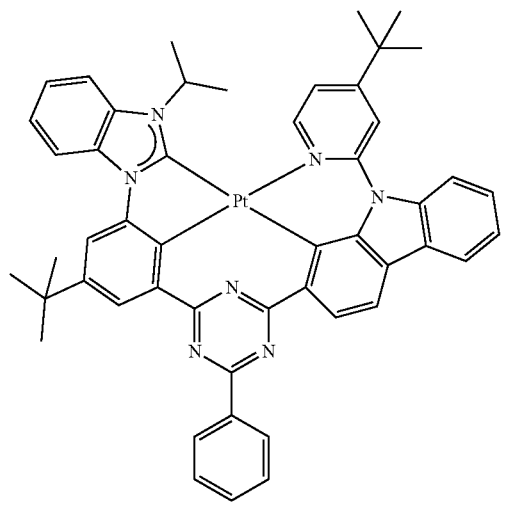
BD29
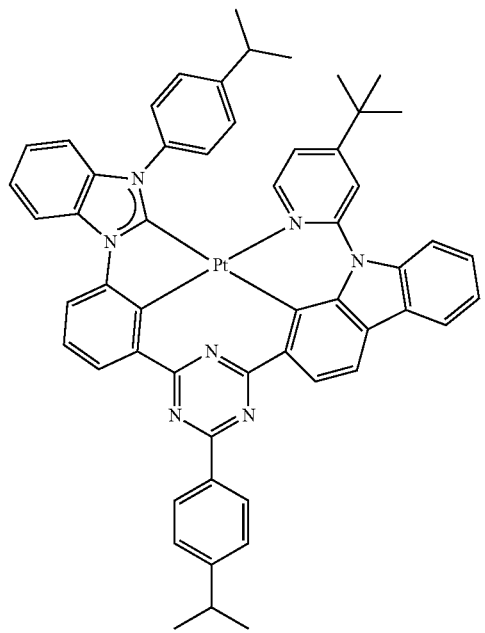

BD30
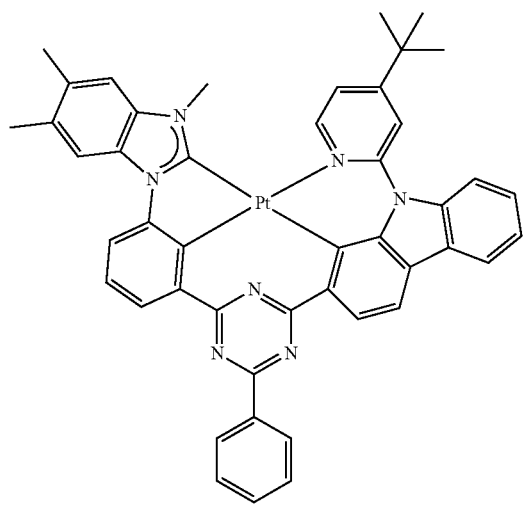
BD31
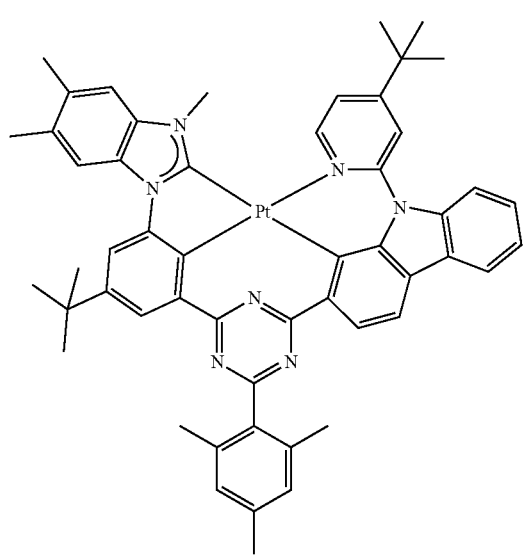
BD32
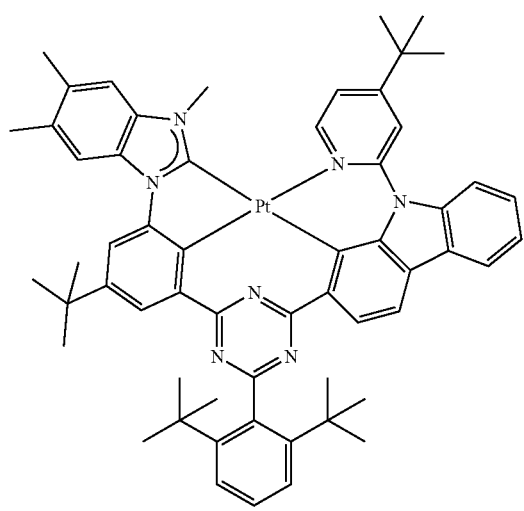
BD33
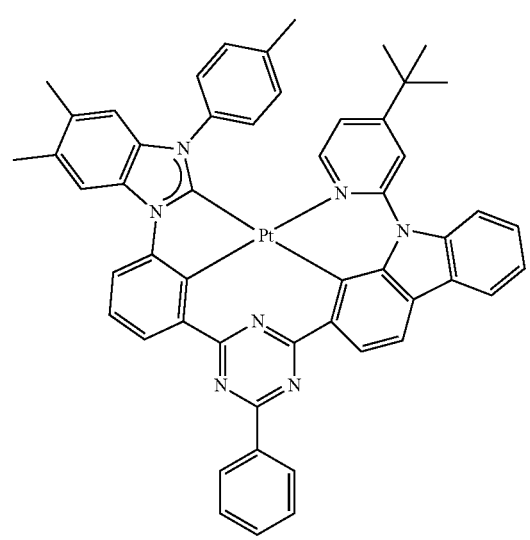
BD34
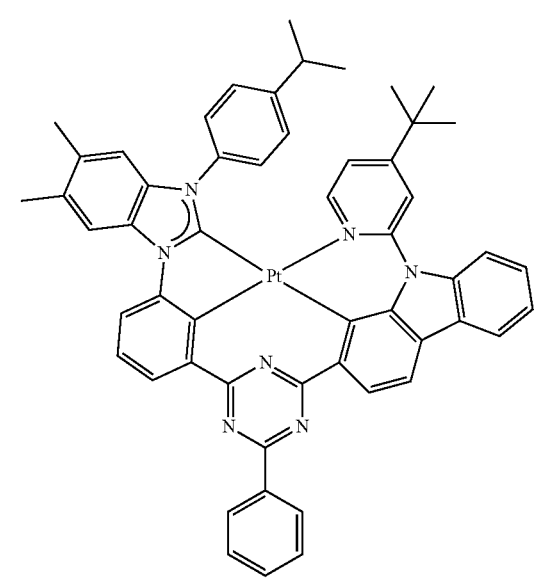

BD35
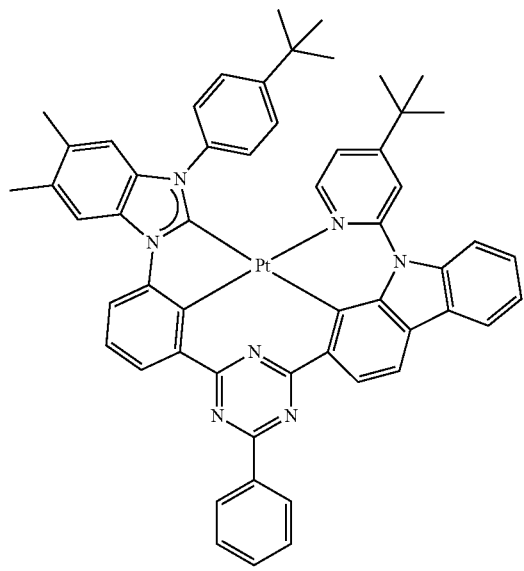
BD37
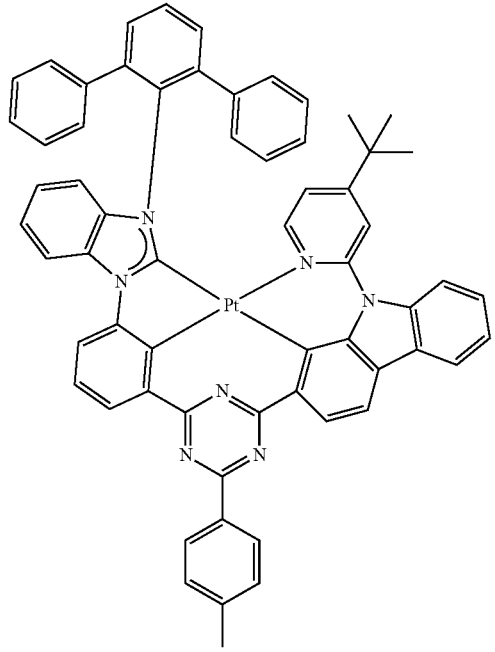
BD36
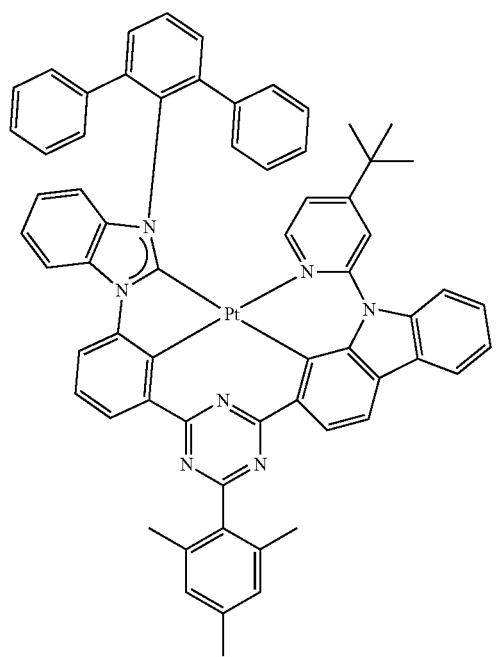
BD38
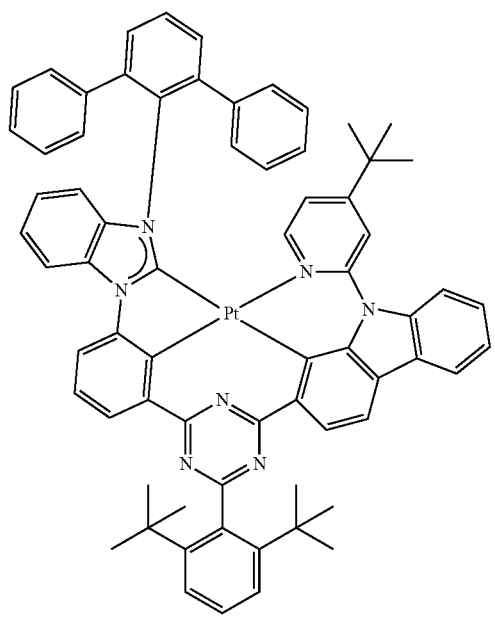

BD39
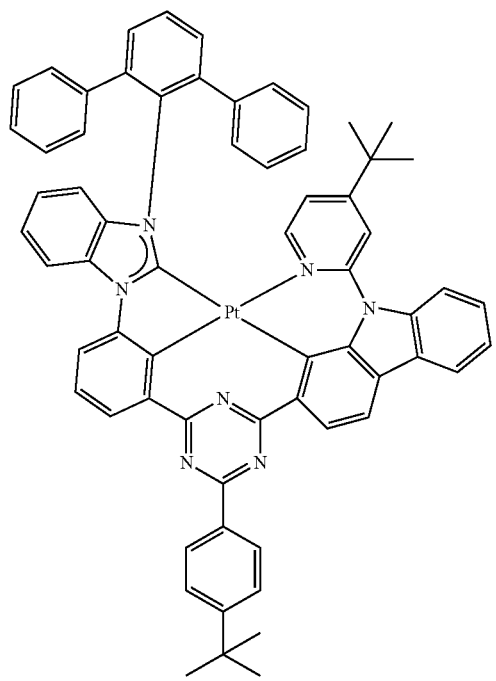
BD41
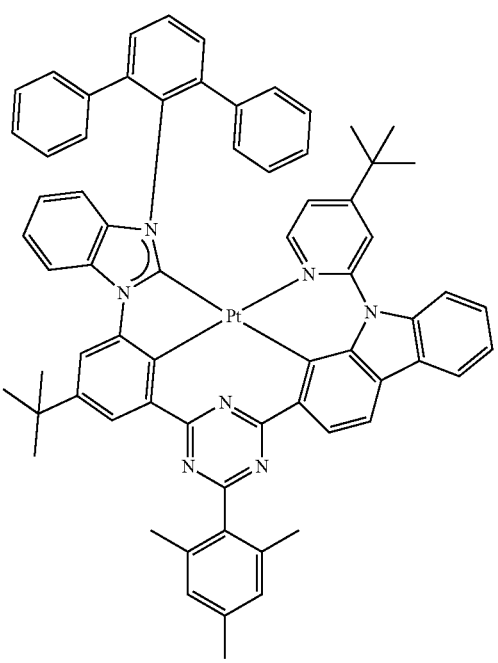
BD40
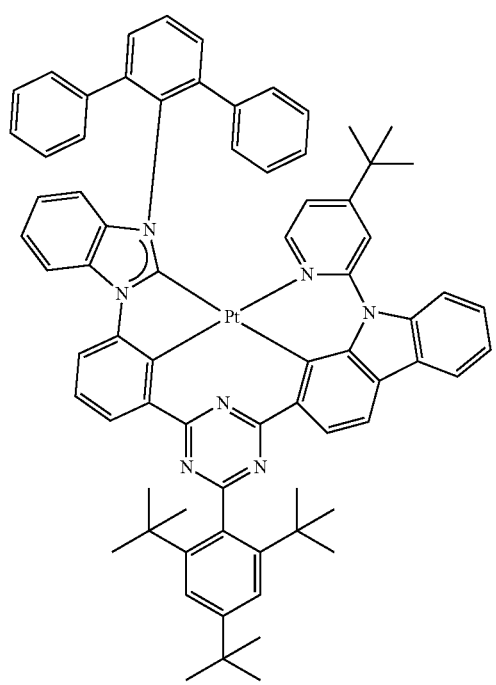
BD42
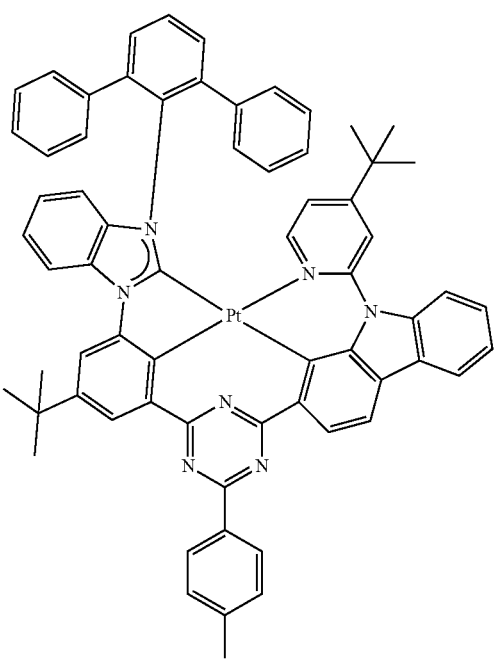

BD43
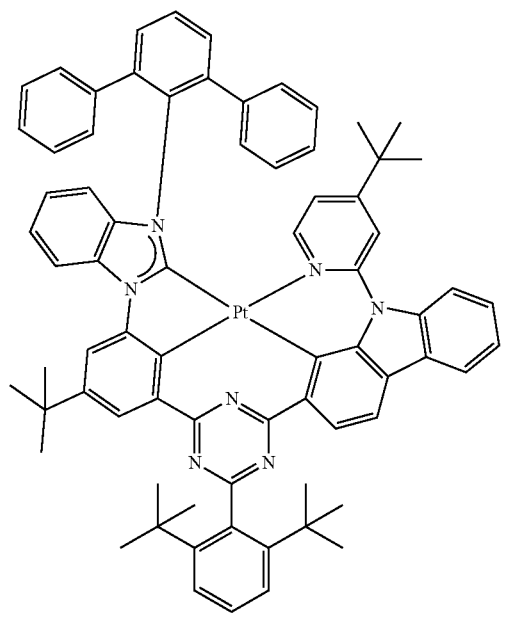
BD45
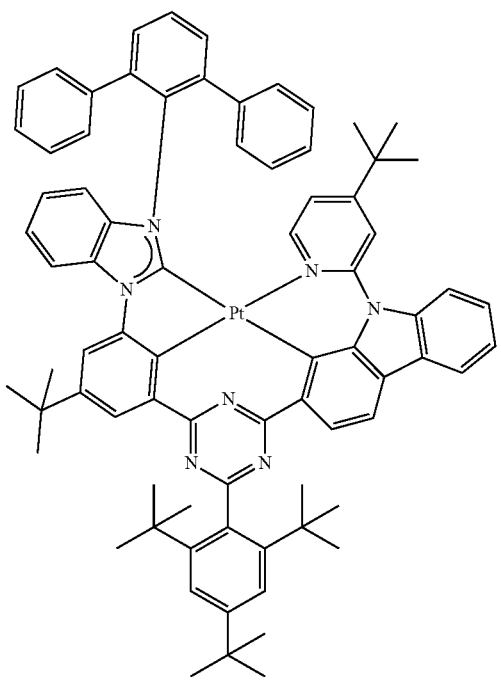
BD44
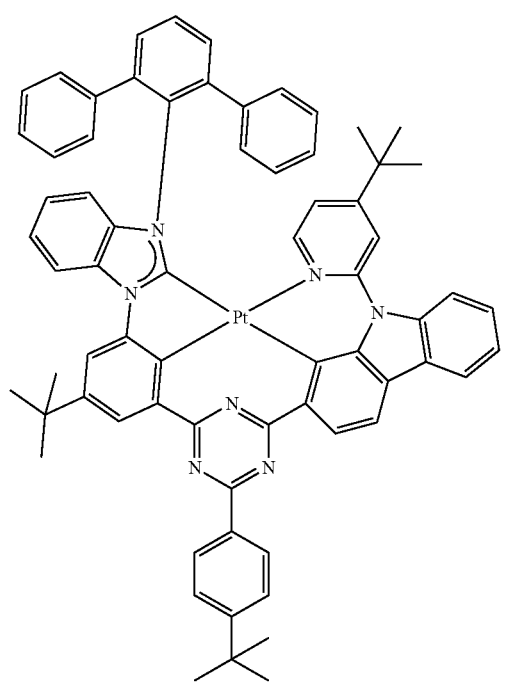
BD46
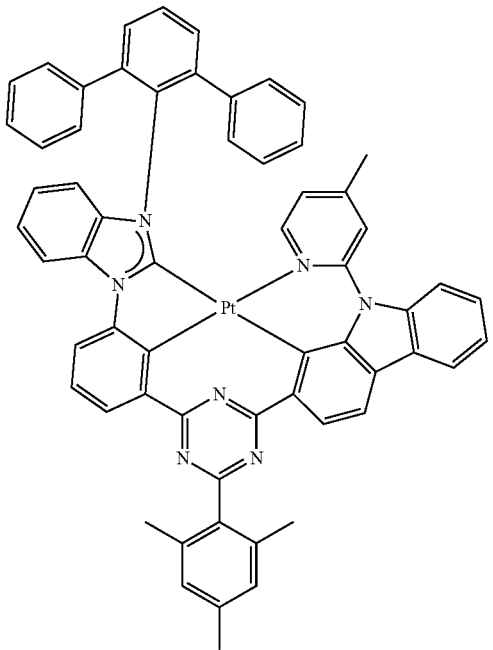

BD47
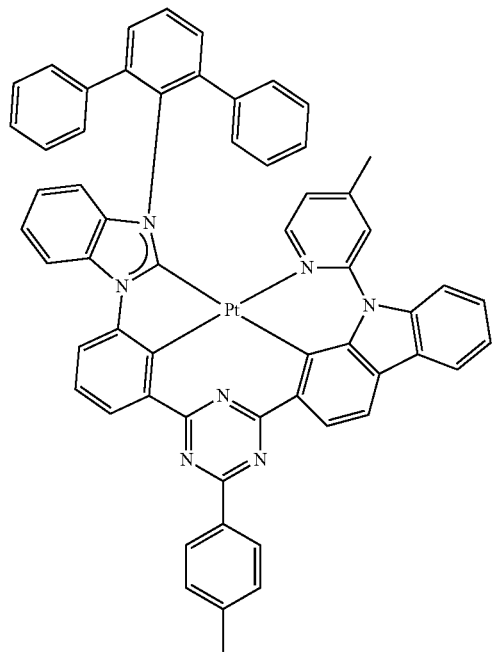
BD48
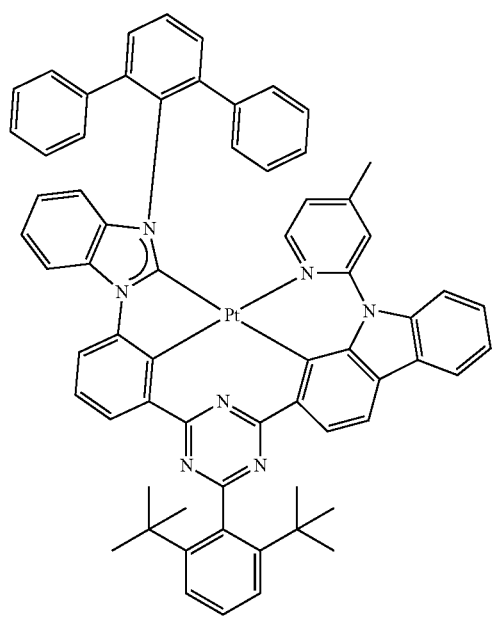
BD49
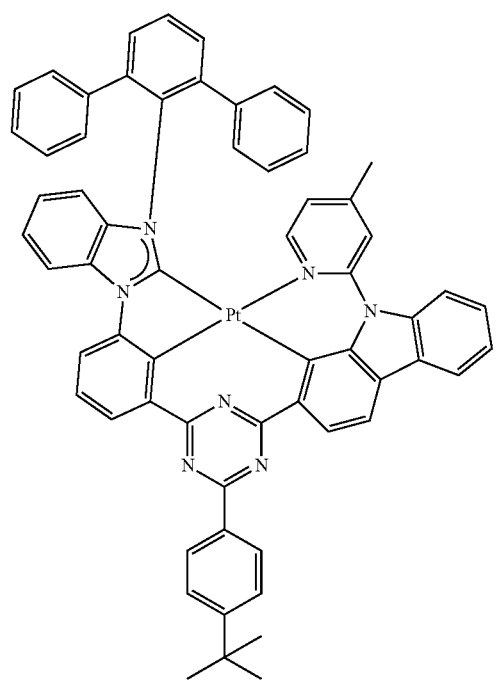
BD50
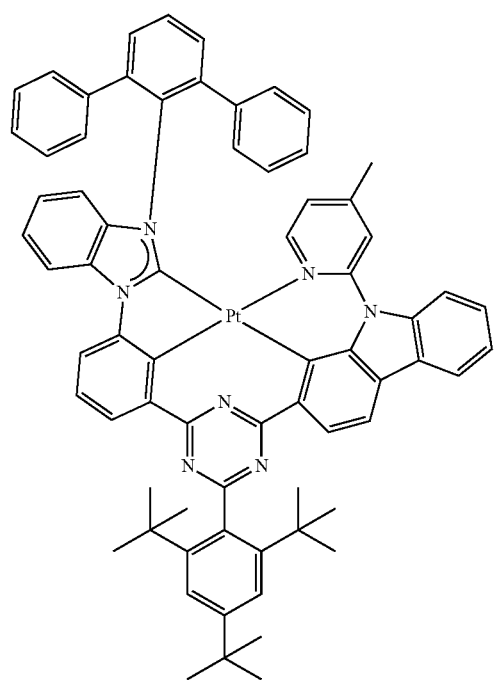

BD51
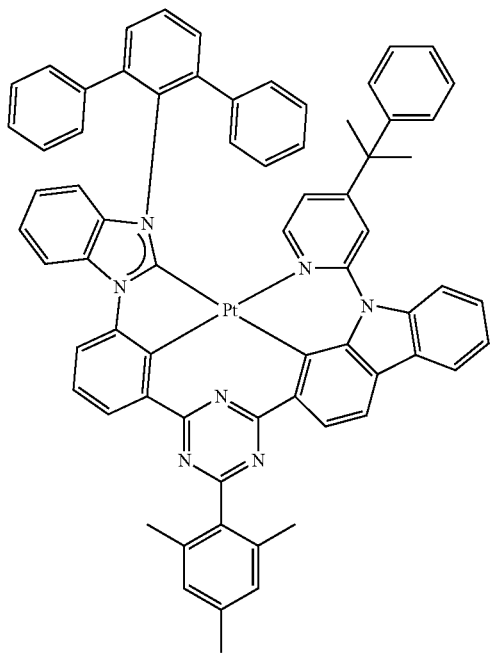
BD53
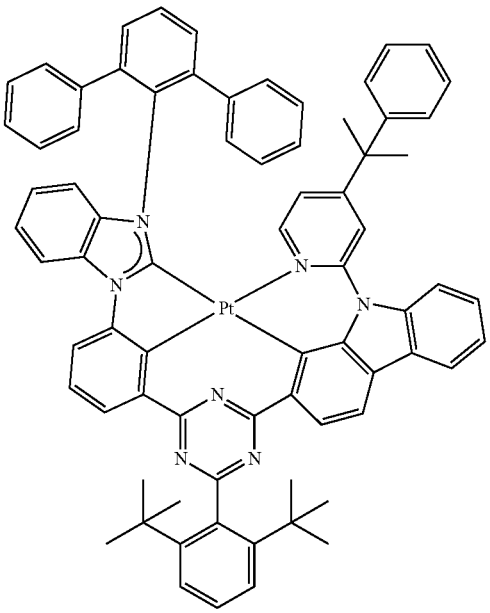
BD52
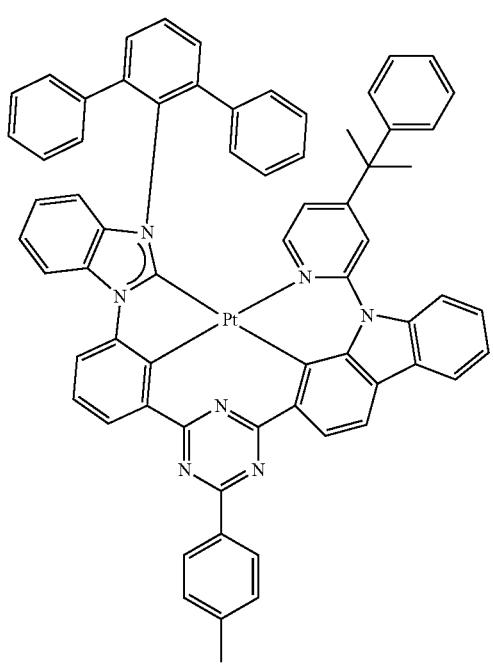
BD54
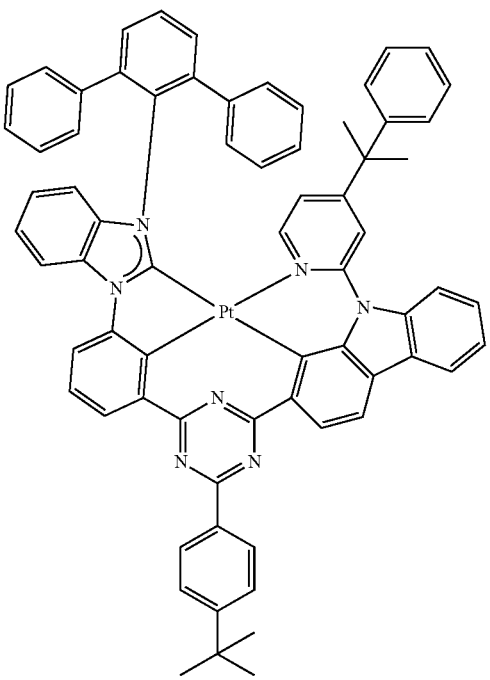

BD55
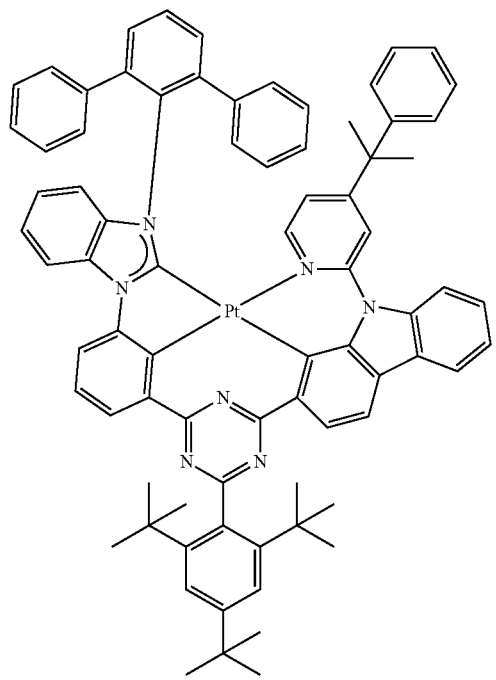
In an embodiment, the second compound may include at least one of Compounds ETH1 to ETH84:
ETH1
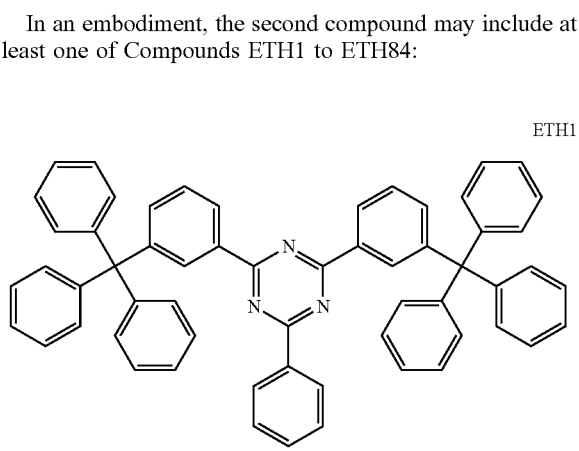
ETH2
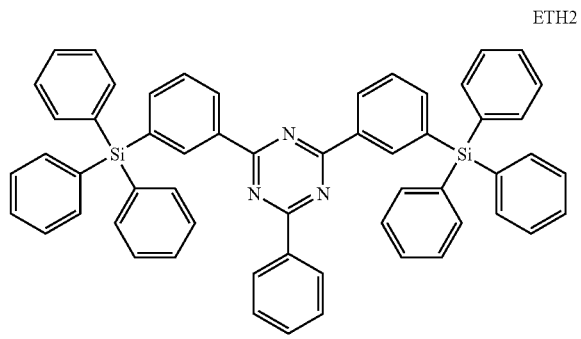
ETH3
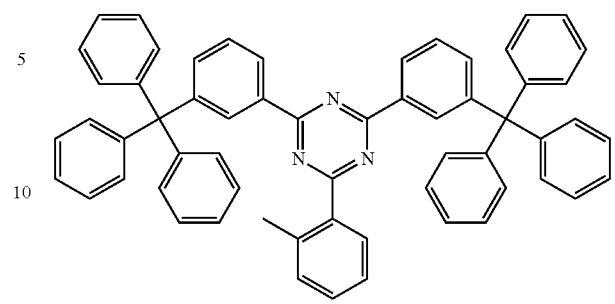
ETH4
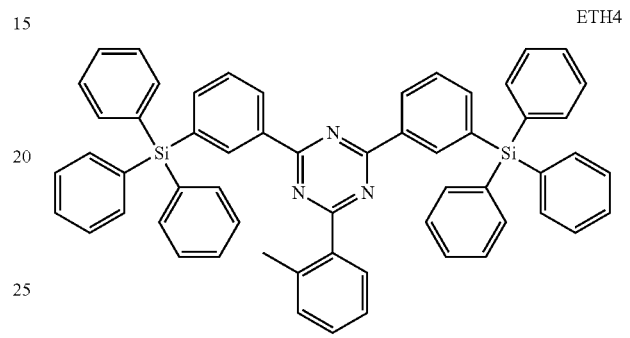
ETH5
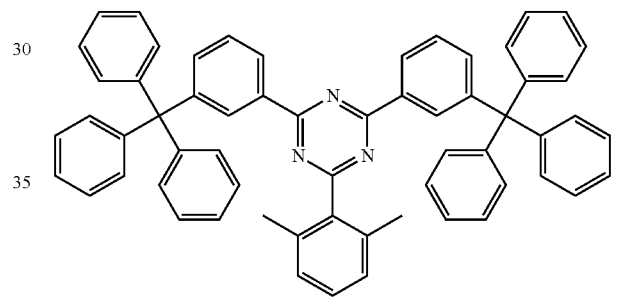
ETH6
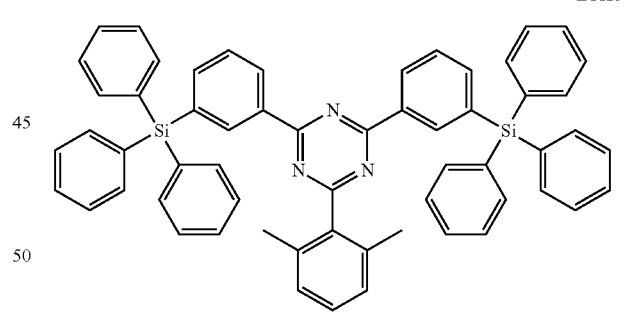
ETH7
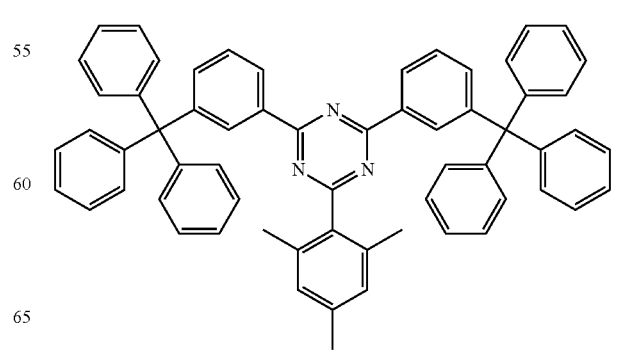

ETH8
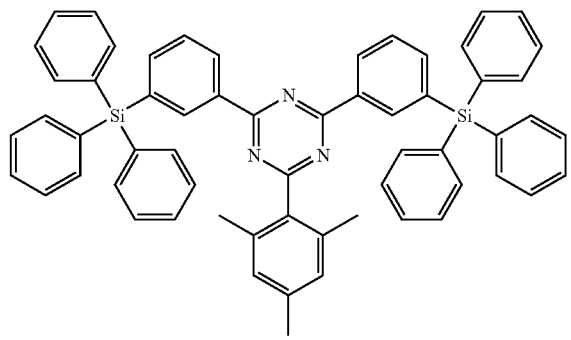
ETH9
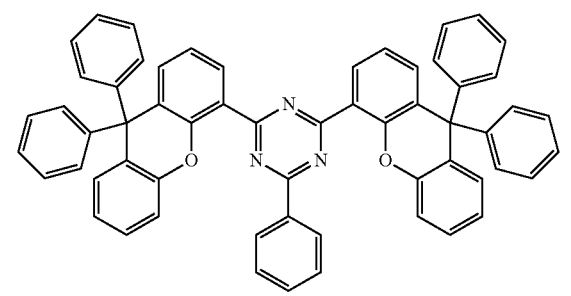
ETH10
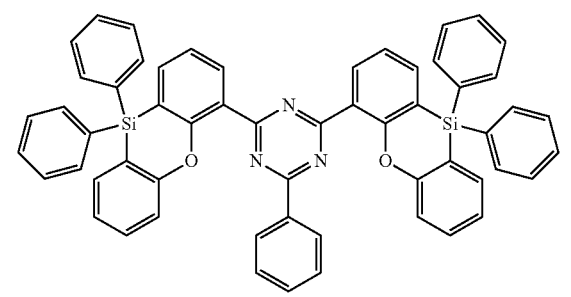
ETH11
ETH12
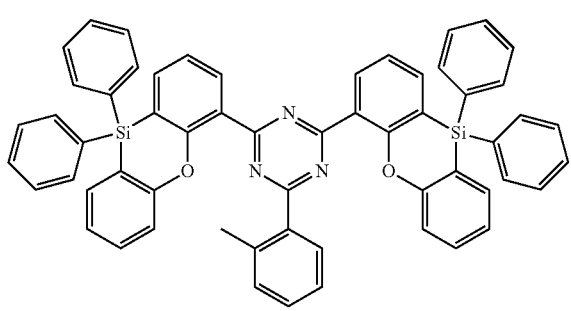
ETH13
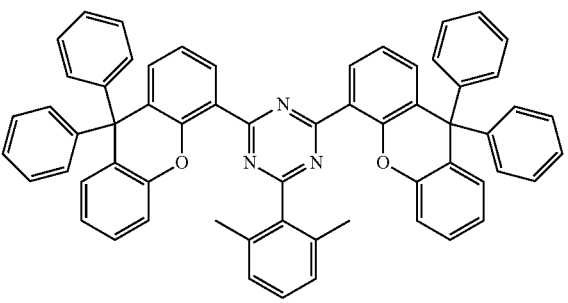
ETH14
ETH15
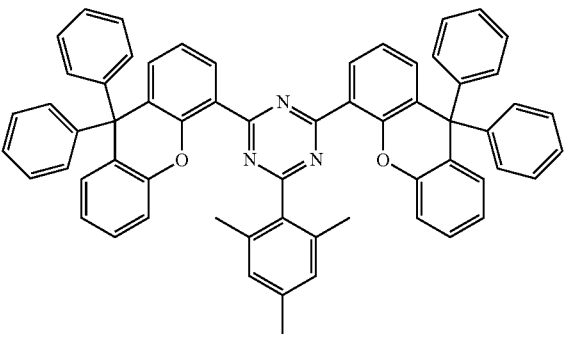
ETH16
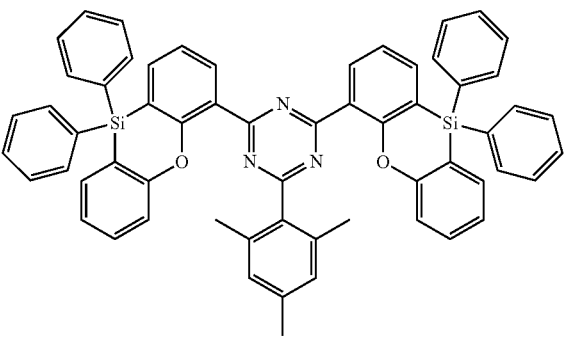

-continued
ETH17
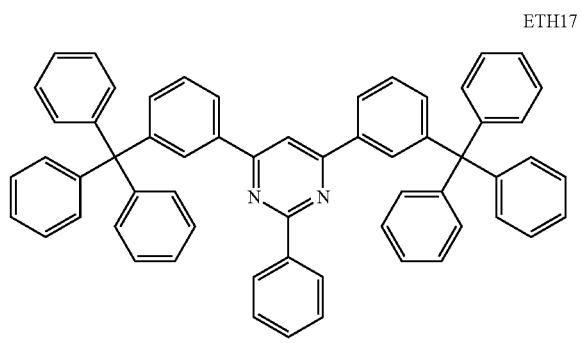
ETH18
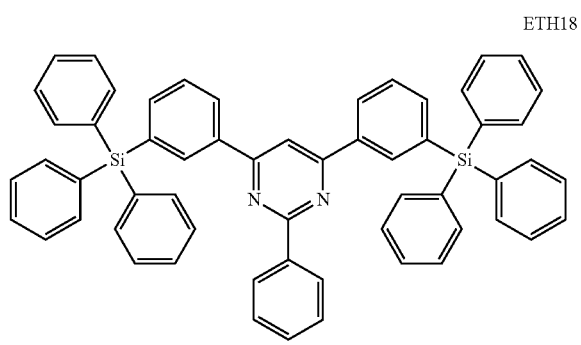
ETH19
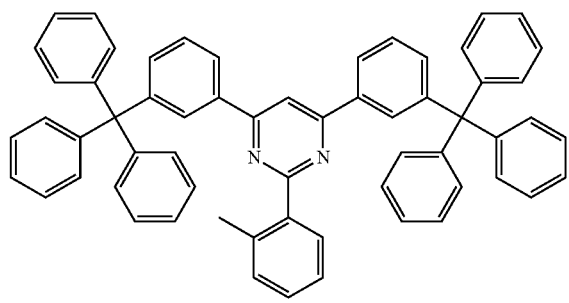
ETH20
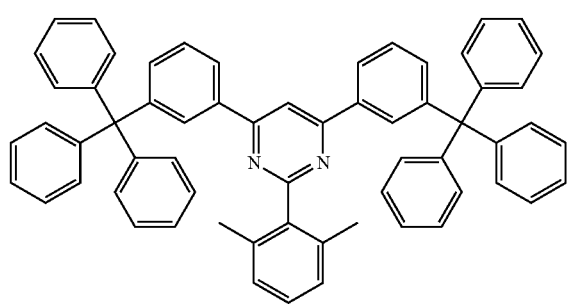
ETH21
-continued
ETH22
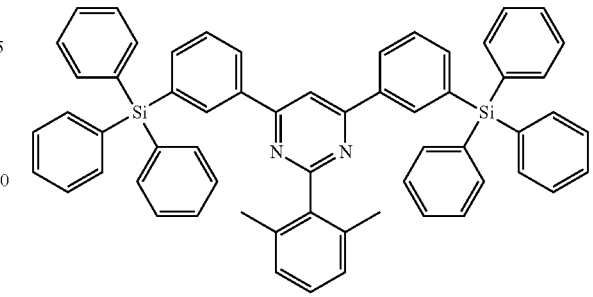
ETH23
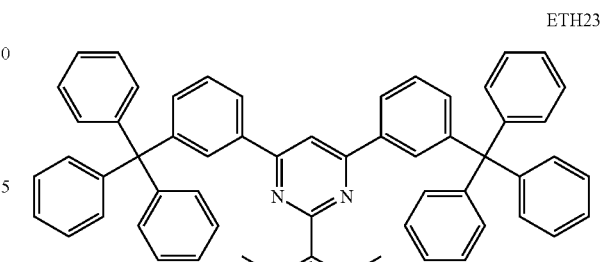
ETH24
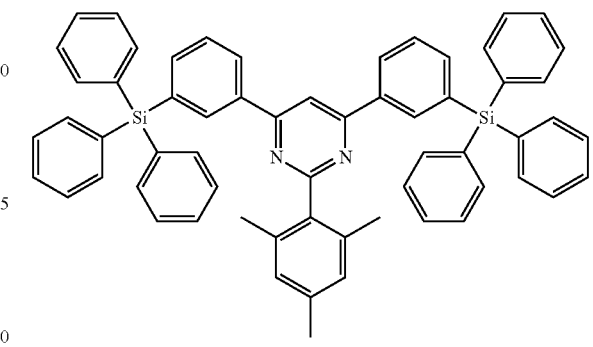
ETH25
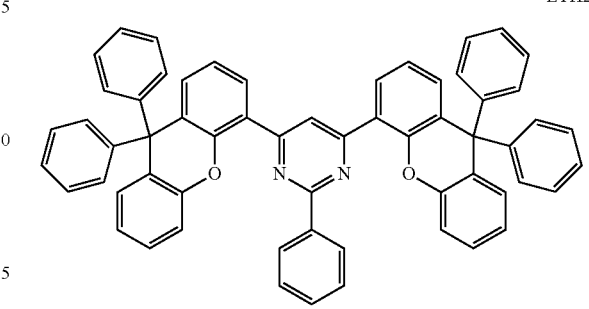

ETH26
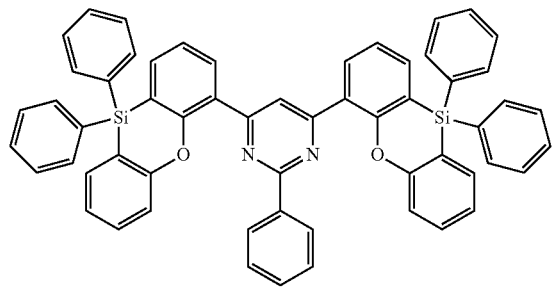
ETH27
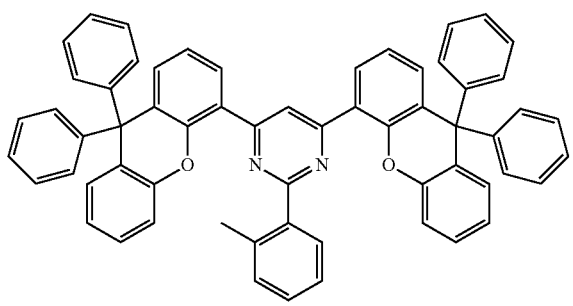
ETH28
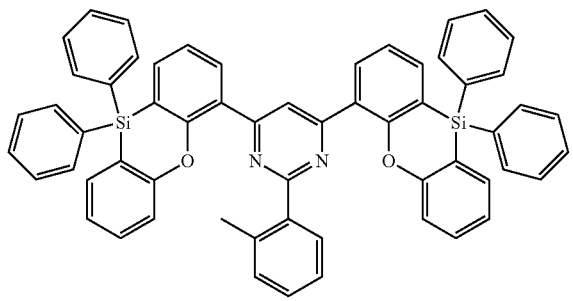
ETH29
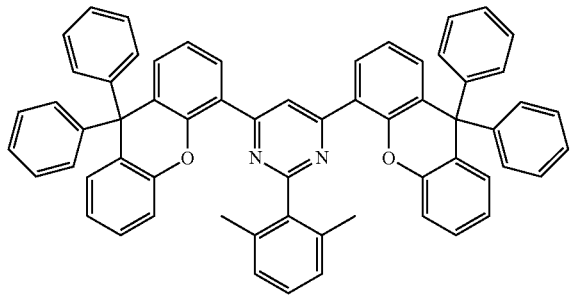
ETH30
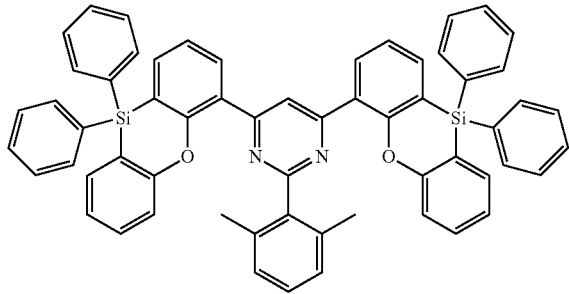
ETH31
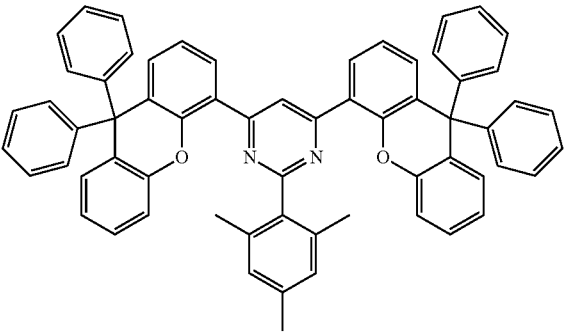
ETH32
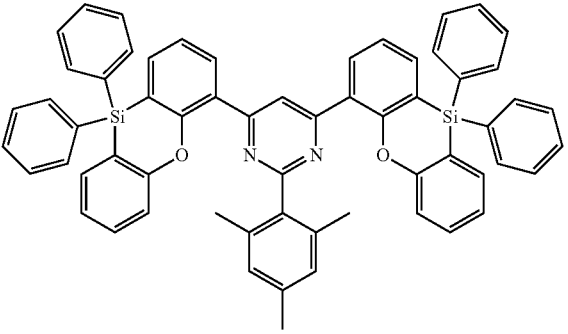
ETH33
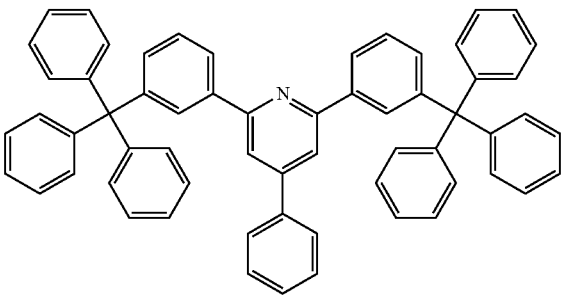
ETH34
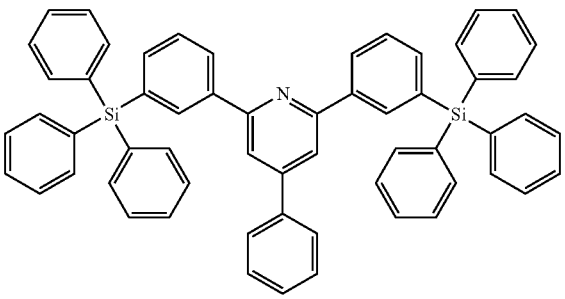

ETH35
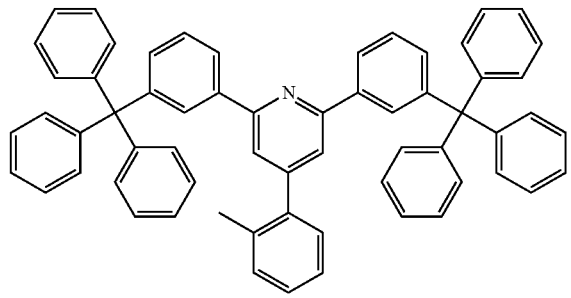
ETH40
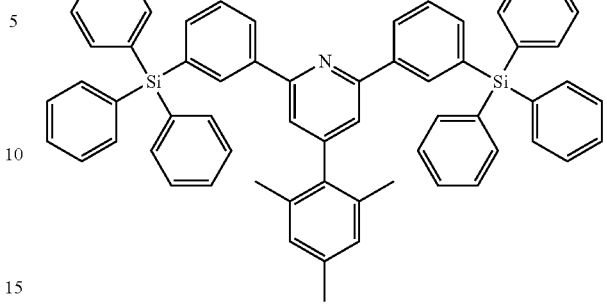
ETH36
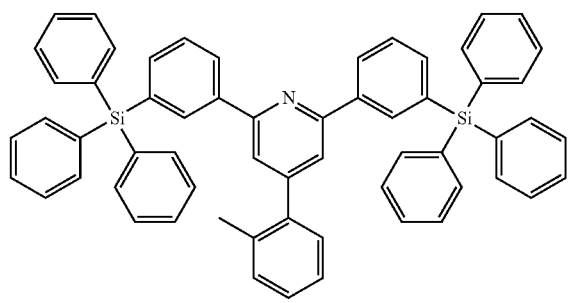
ETH41
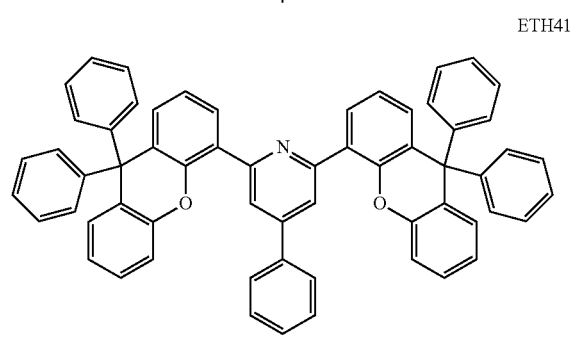
ETH37
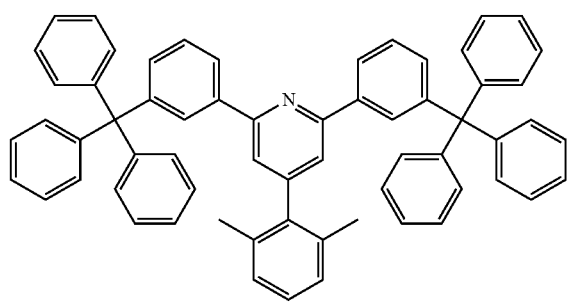
ETH42
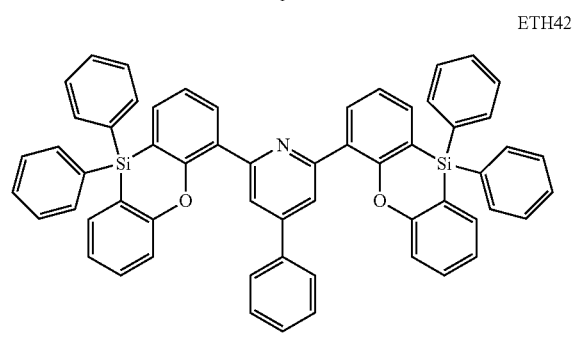
ETH38
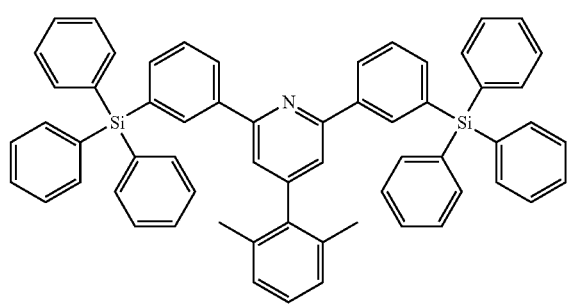
ETH43
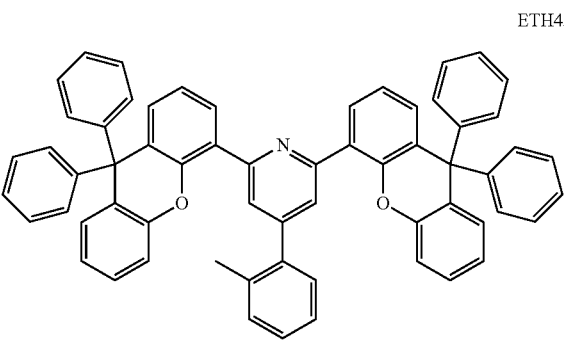
ETH39
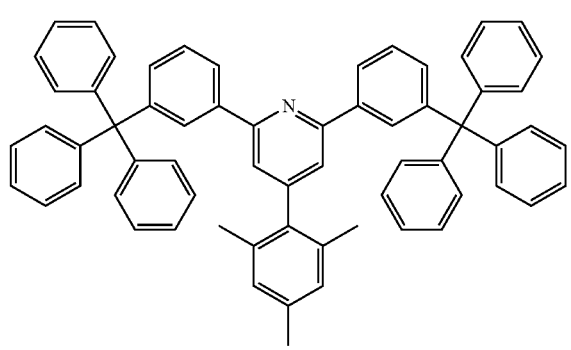
ETH44
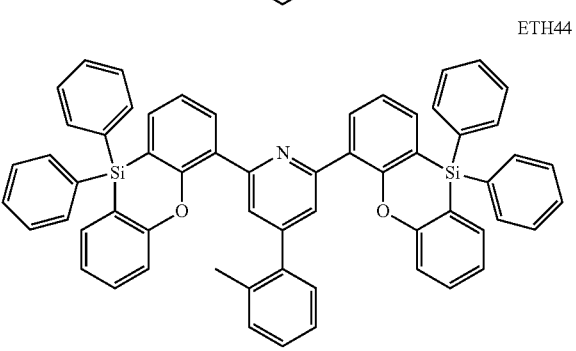

ETH45
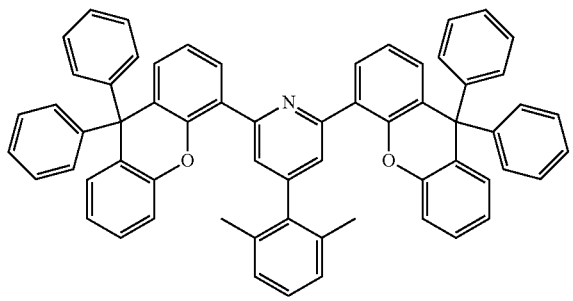
ETH46
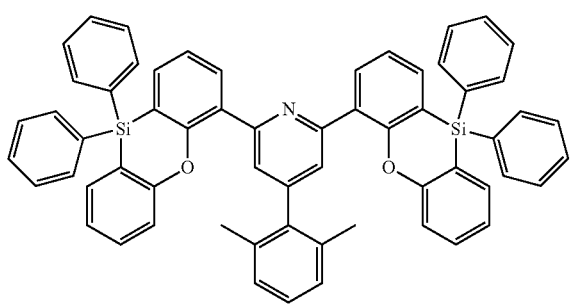
ETH47
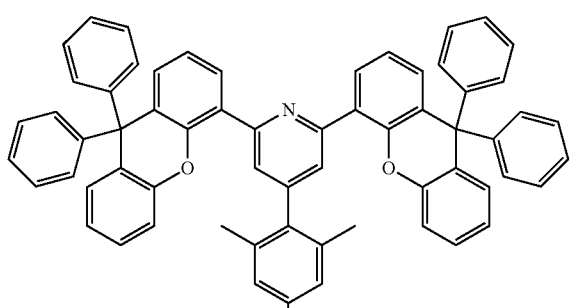
ETH48
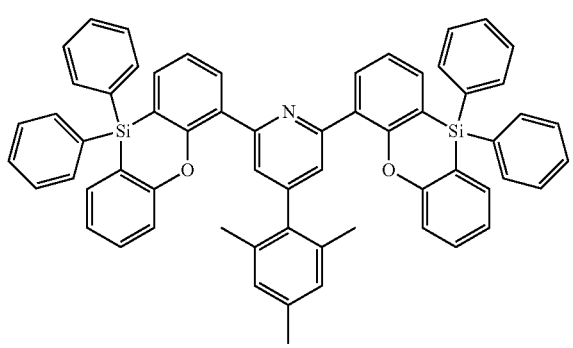
ETH49
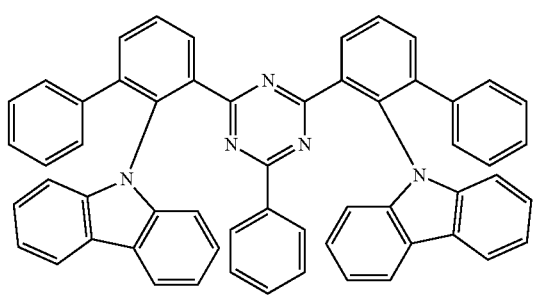
ETH50
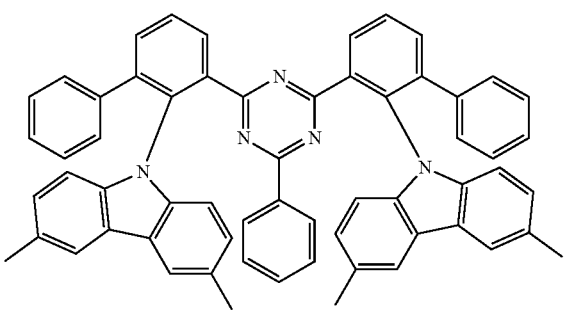
ETH51
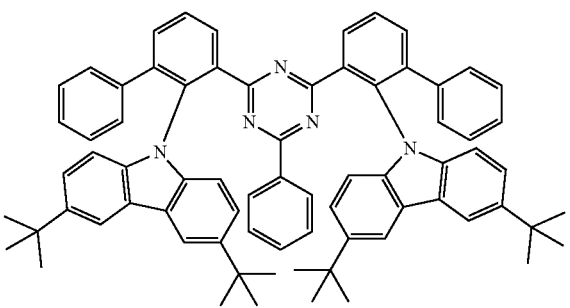
ETH52
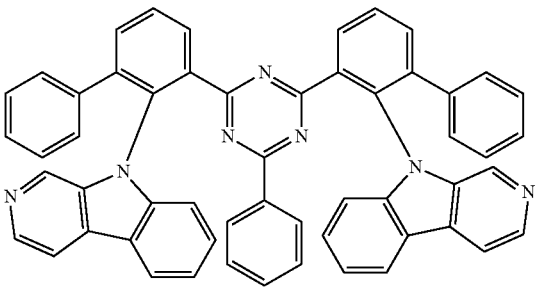
ETH53
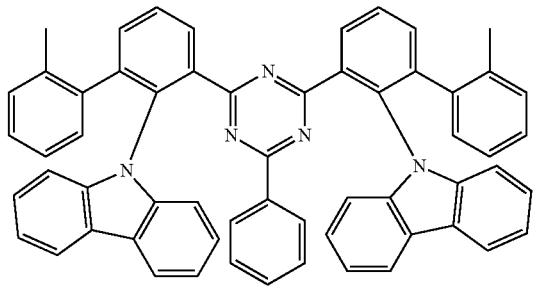

-continued
ETH54
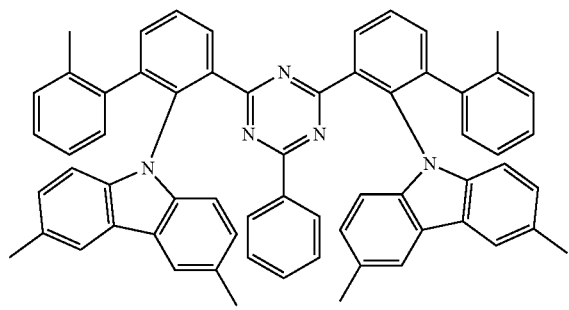
ETH55
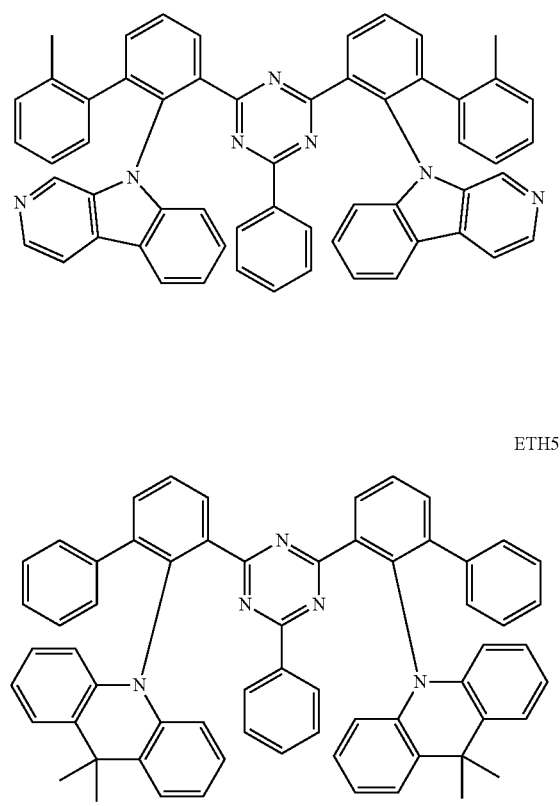
ETH56
ETH57
-continued
ETH58
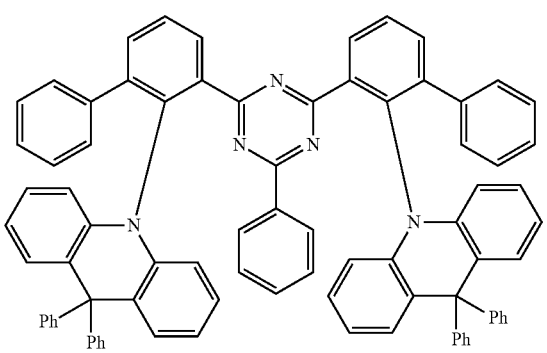
ETH59
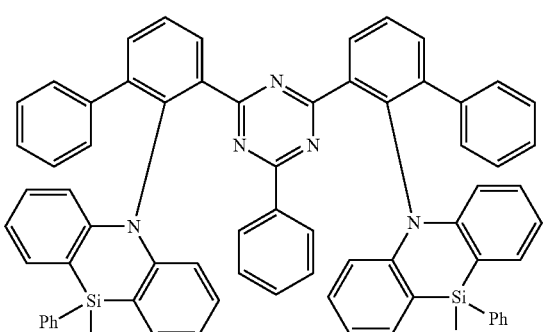
ETH60
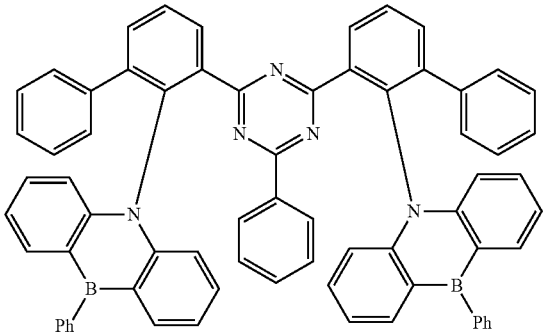
ETH61
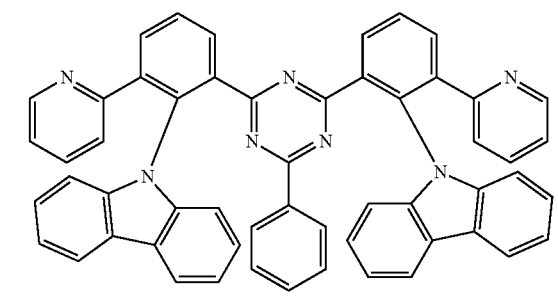

ETH62
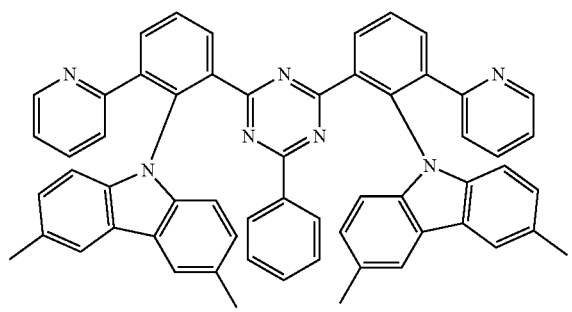
ETH63
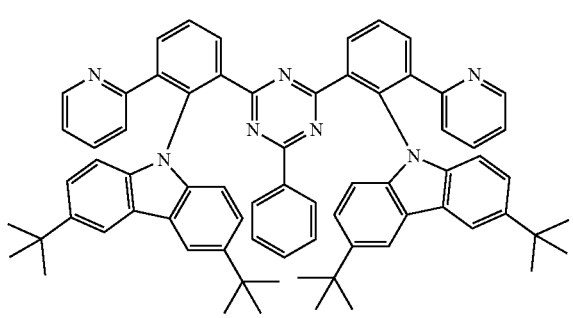
ETH64
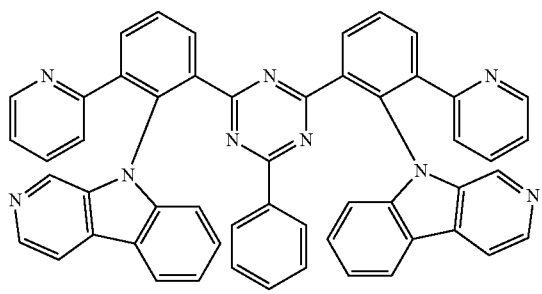
ETH65
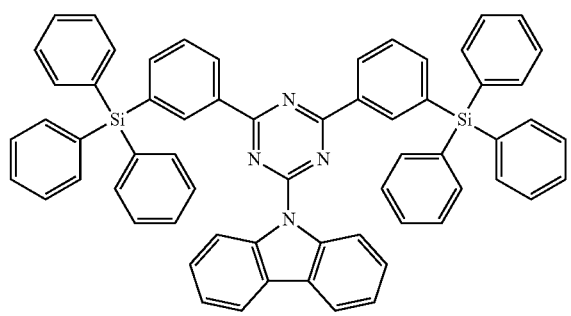
ETH66
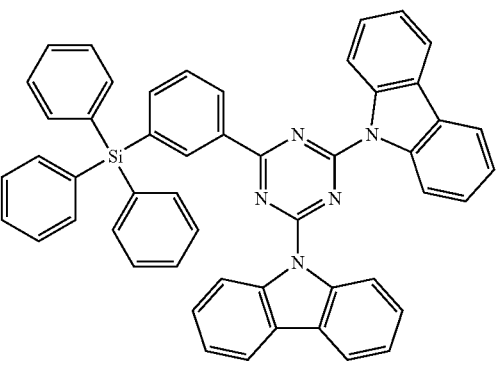
ETH67
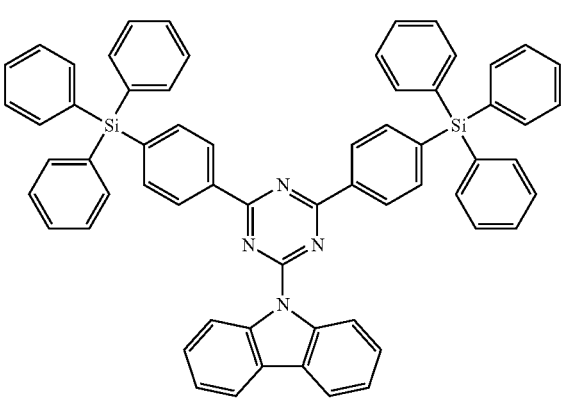
ETH68
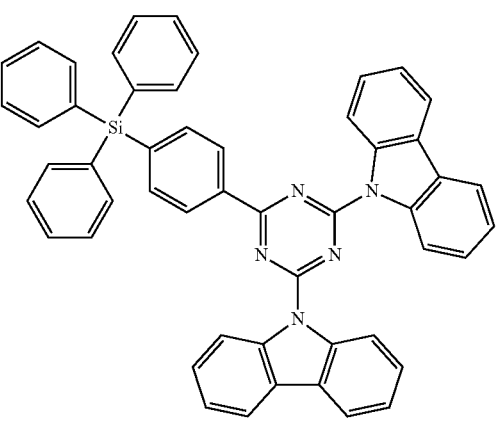
ETH69
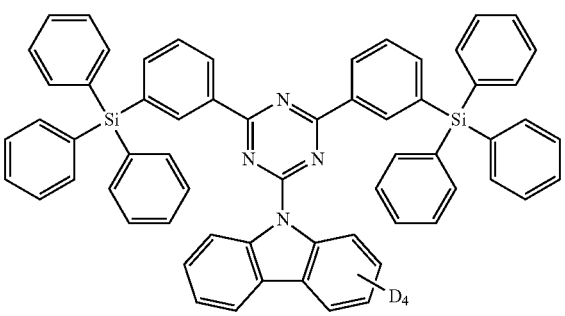

ETH70
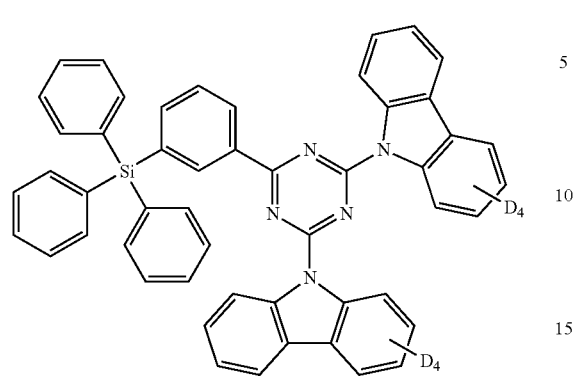
ETH71
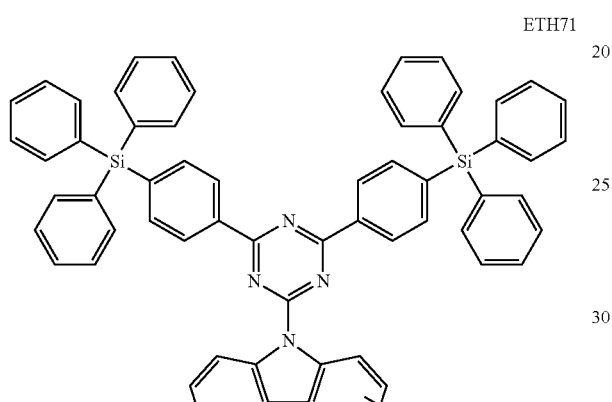
ETH72
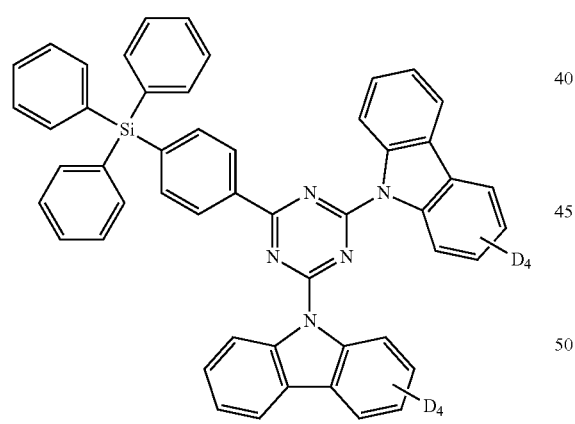
ETH73
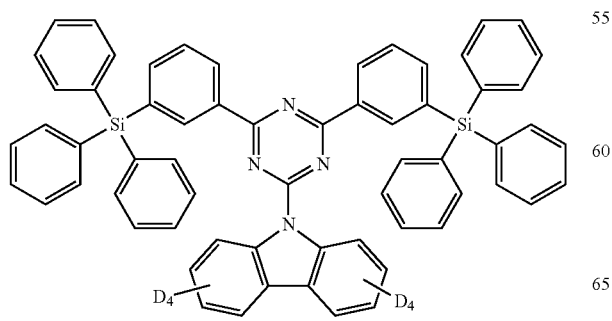
ETH74
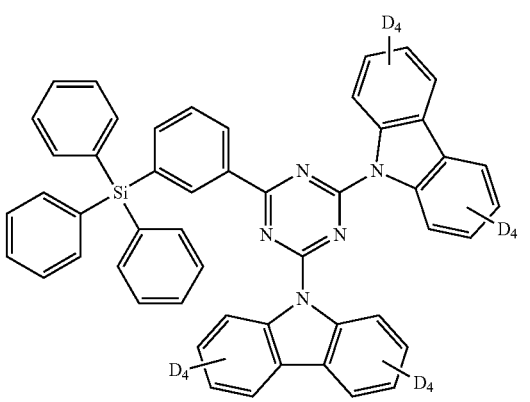
ETH75
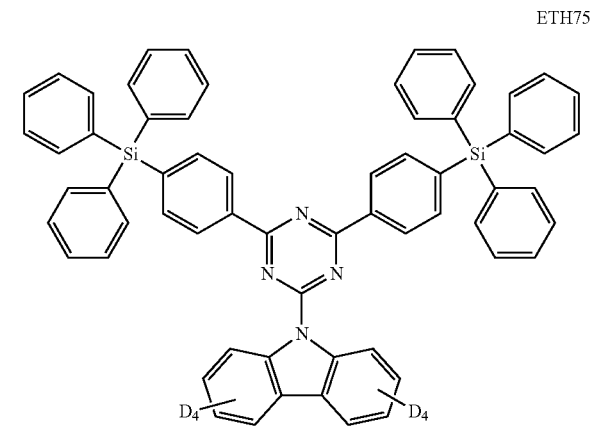
ETH76
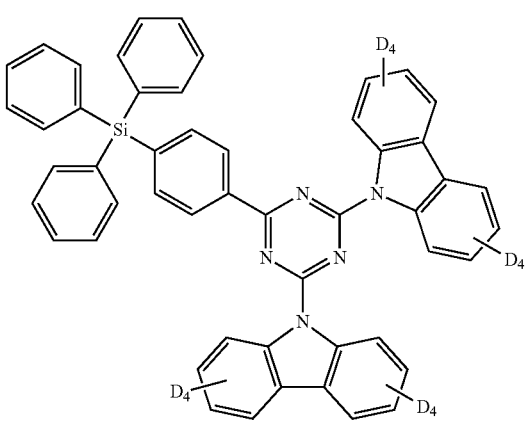

ETH77
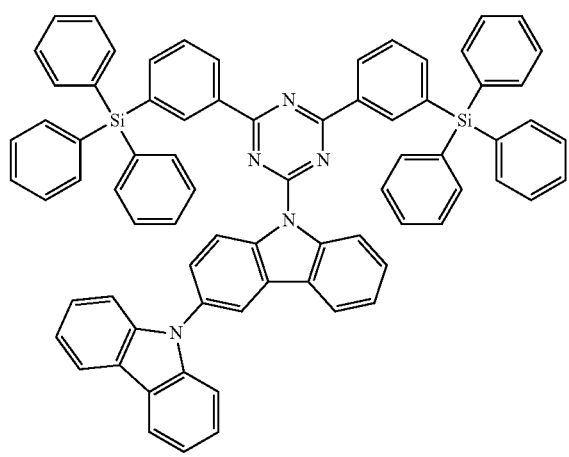
ETH78
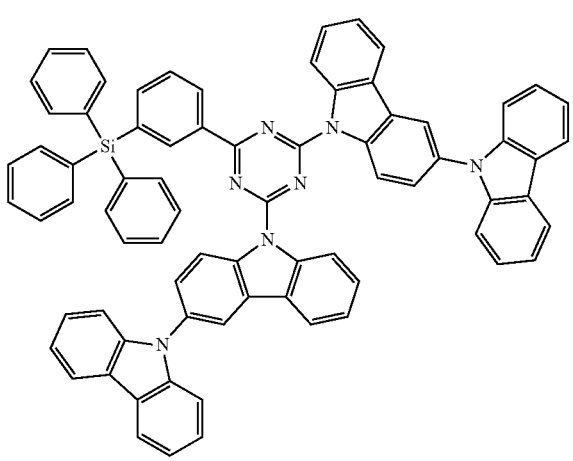
ETH79
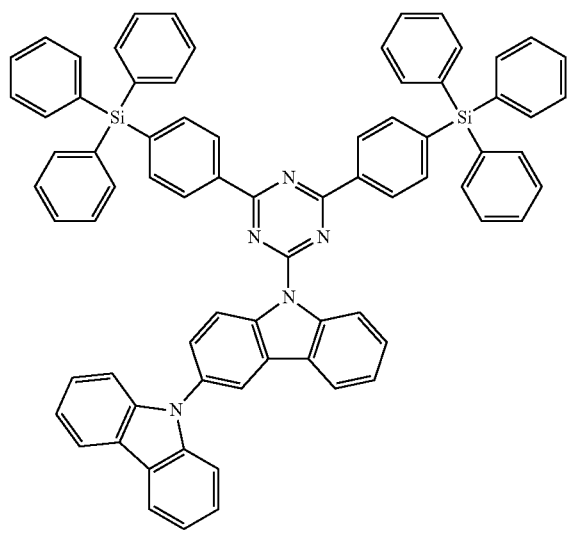
ETH80
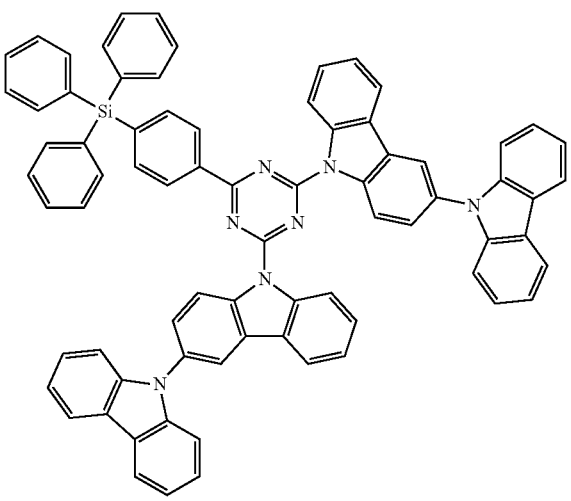
ETH81
ETH82
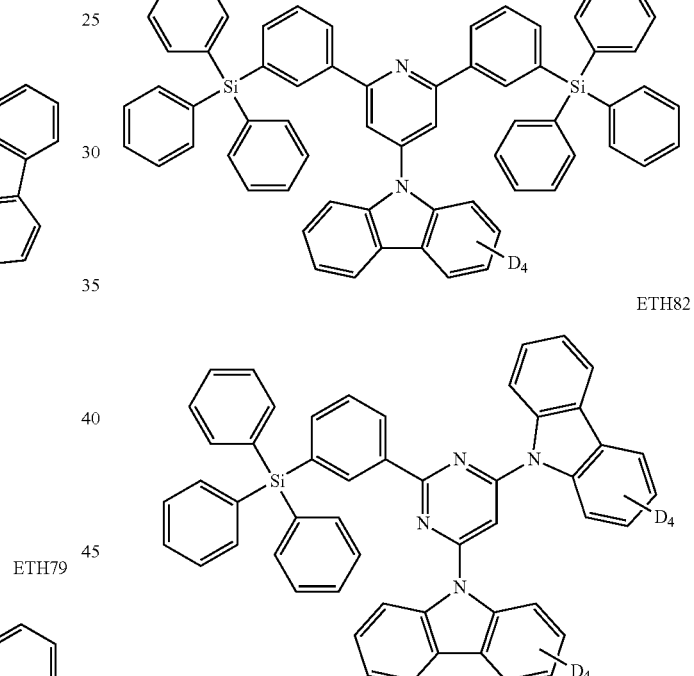
ETH83
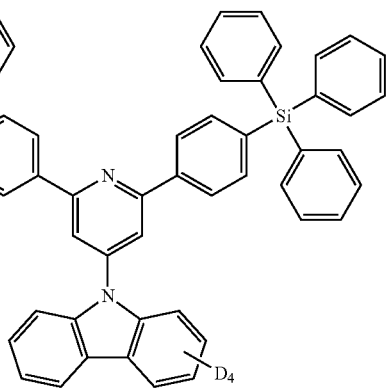

ETH84
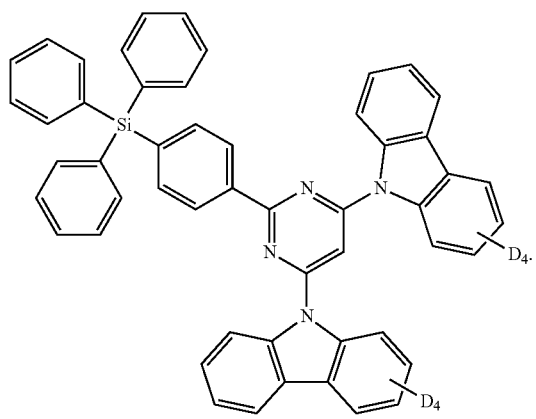
HTH4
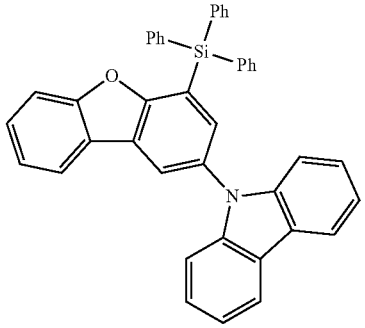
In an embodiment, the third compound may include at least one of Compounds HTH1 to HTH52:
HTH1
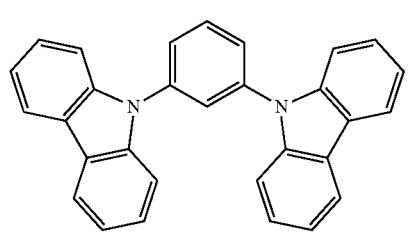
HTH5
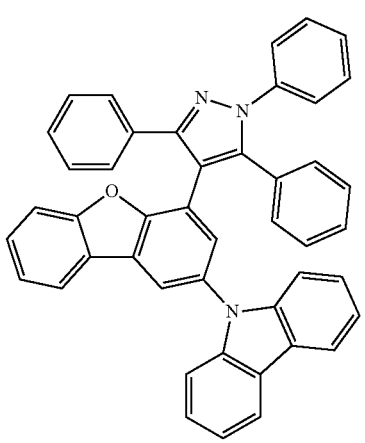
HTH2
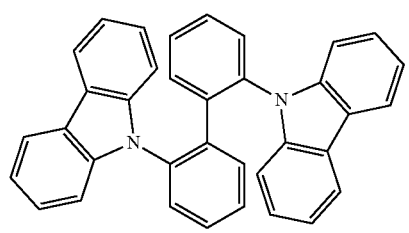
HTH6
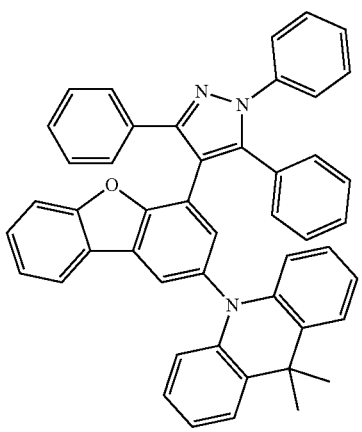
HTH3
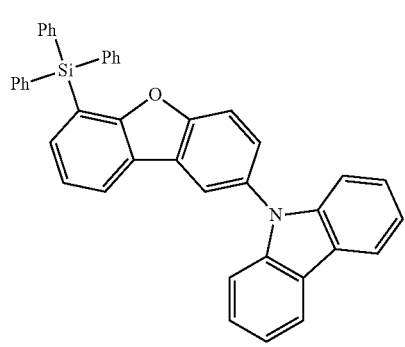
HTH7
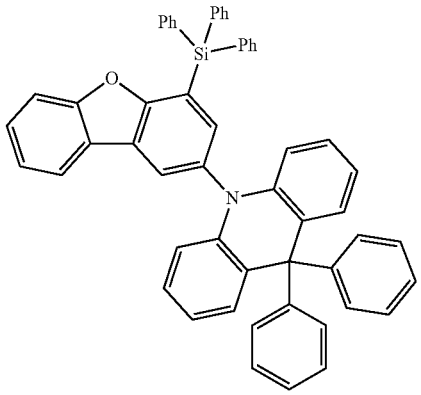

-continued
HTH8
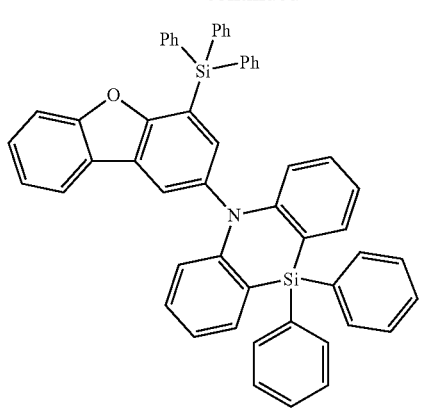
HTH9
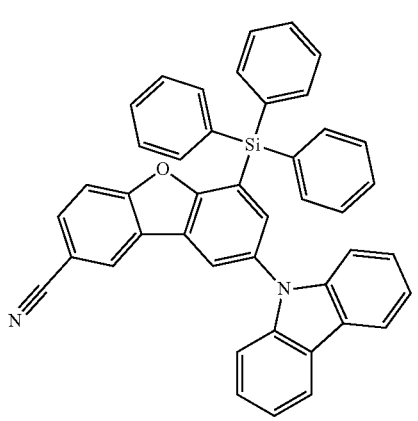
HTH10
HTH11
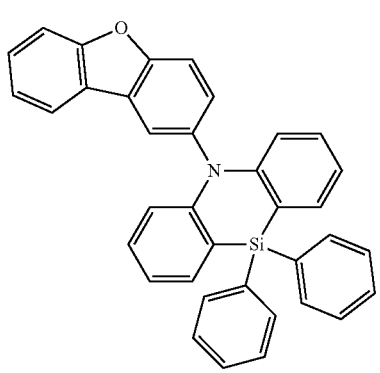
-continued
HTH12
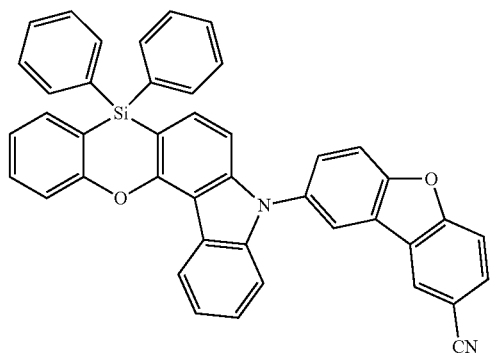
HTH13
HTH14
HTH15
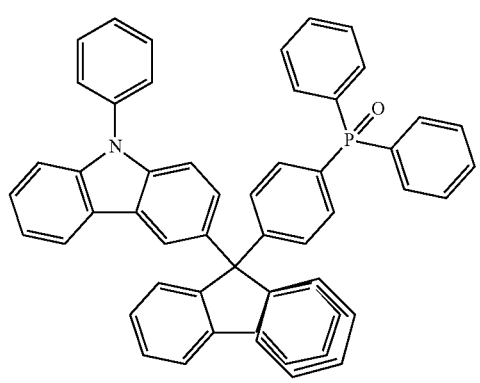

HTH16
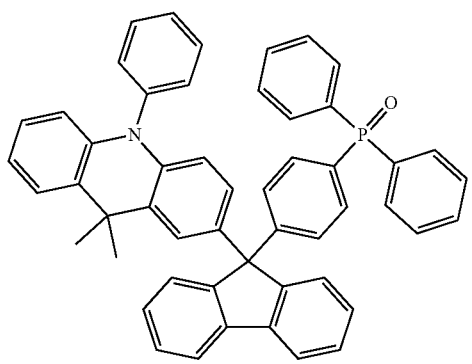
HTH17
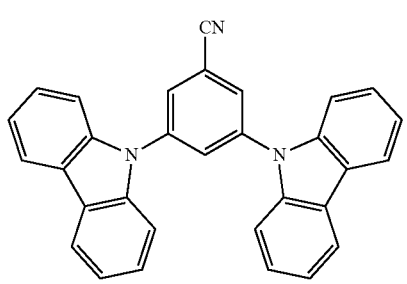
HTH18
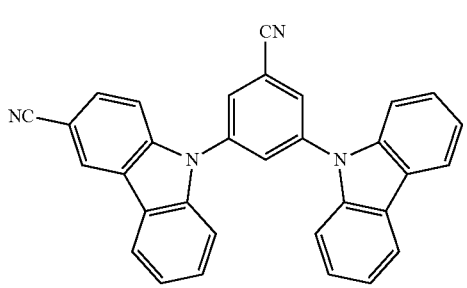
HTH19
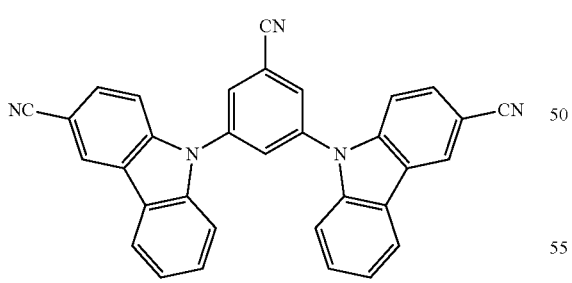
HTH20
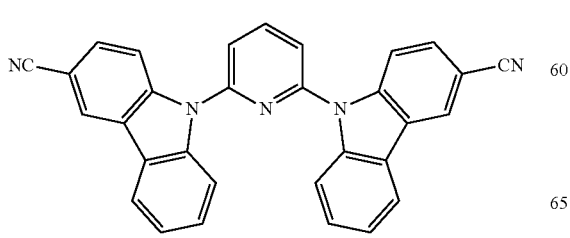
HTH21
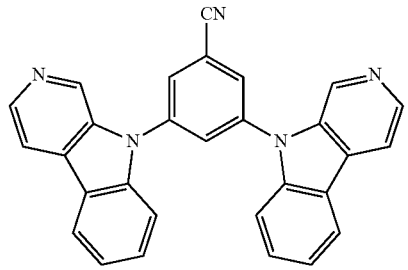
HTH22
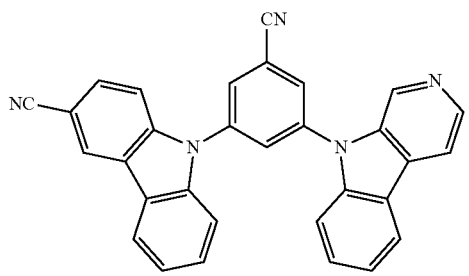
HTH23
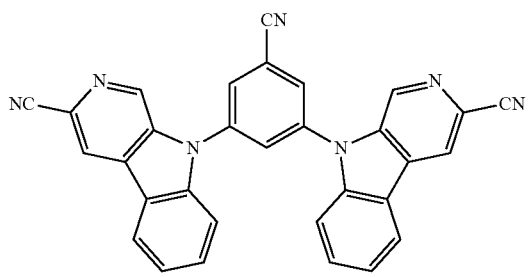
HTH24
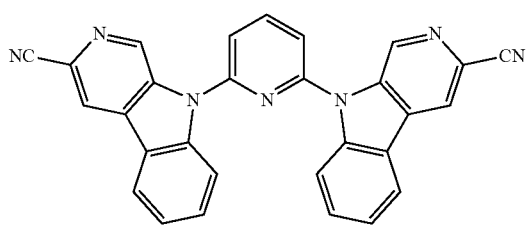
HTH25
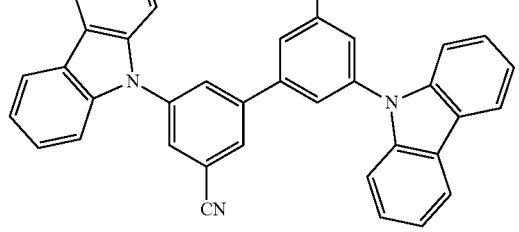

HTH26
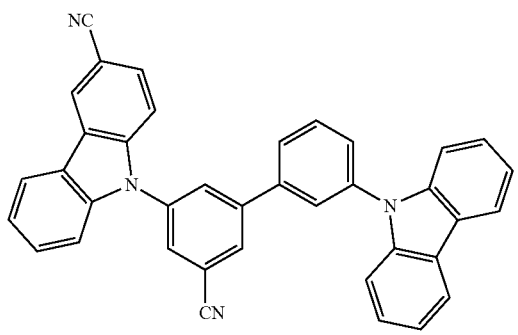
HTH30
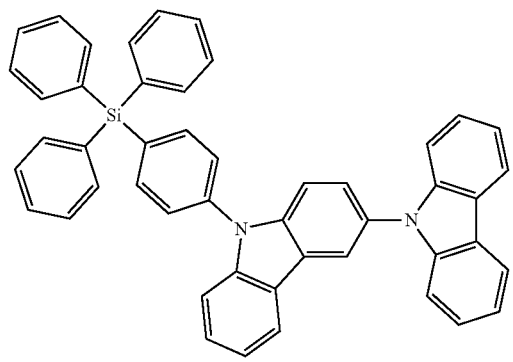
HTH27
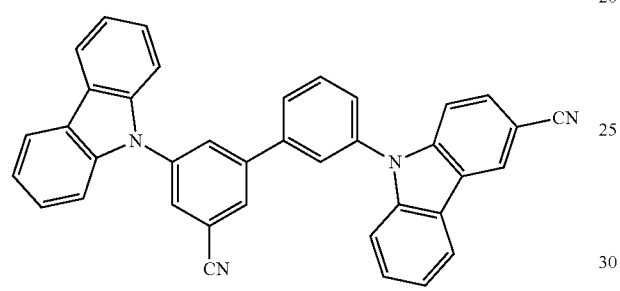
HTH31
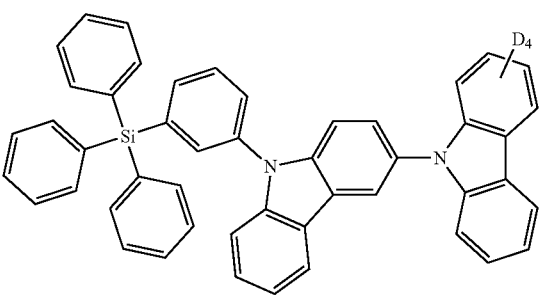
HTH28
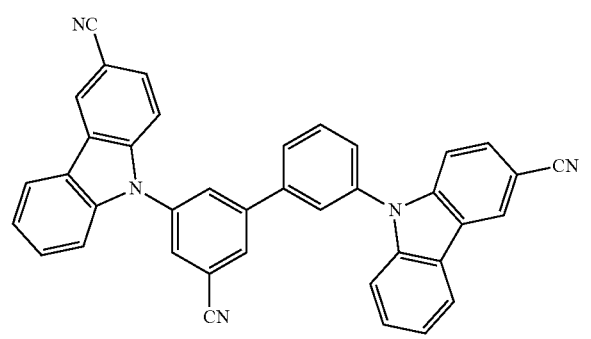
HTH32
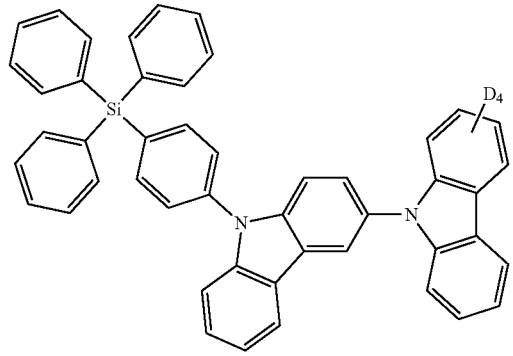
HTH29
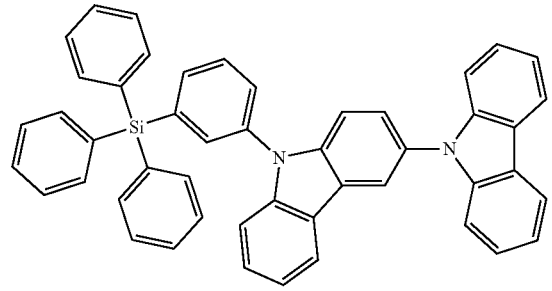
HTH33
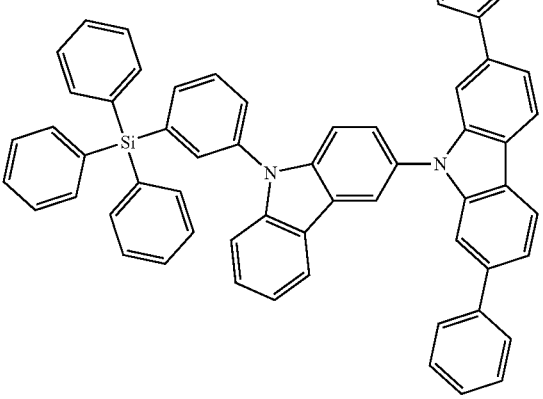

-continued
HTH34
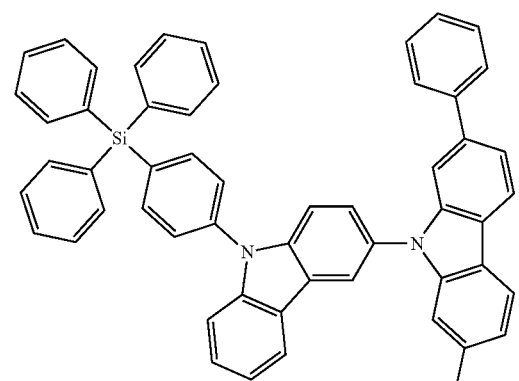
HTH35
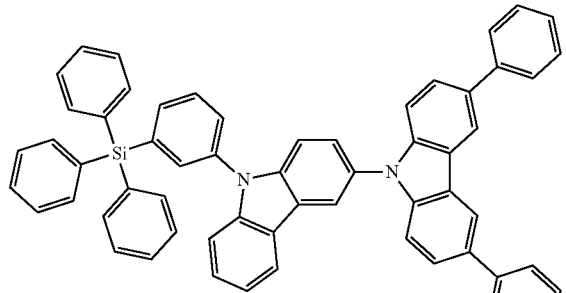
HTH36
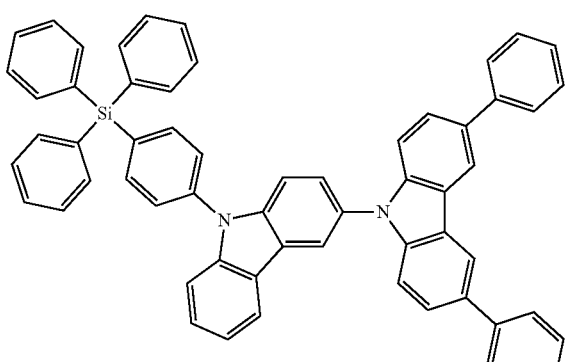
HTH37
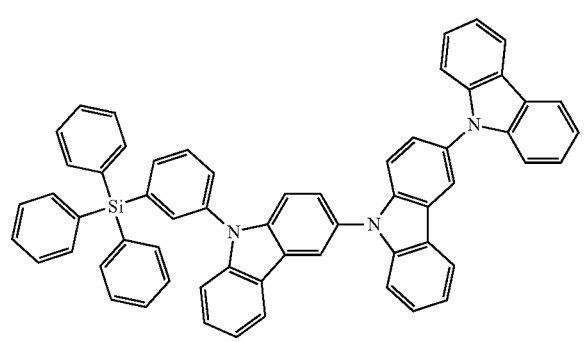
-continued
HTH38
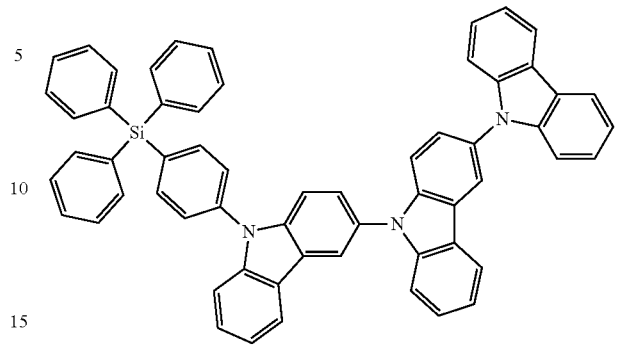
HTH39
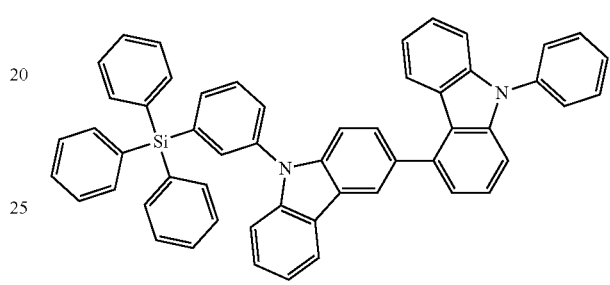
HTH40
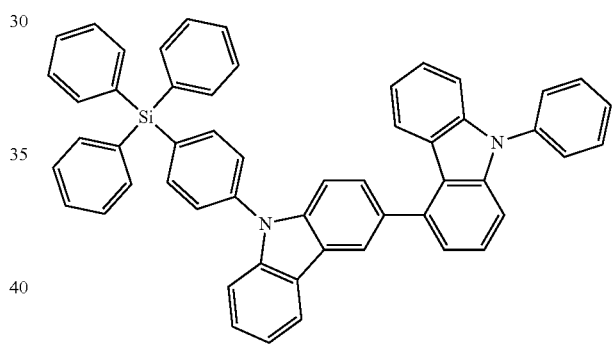
HTH41
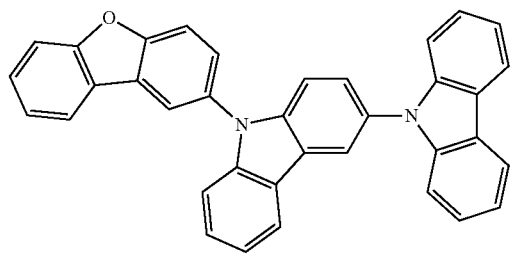
HTH42
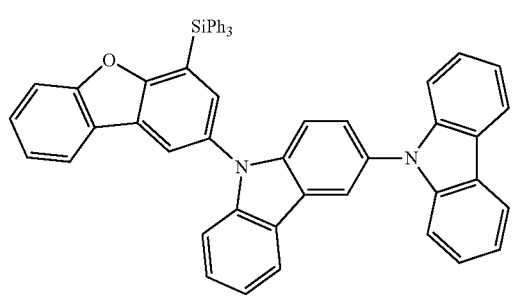

In an embodiment, the fourth compound may include at least one of Compounds DFD1 to DFD14:

-continued
DFD1
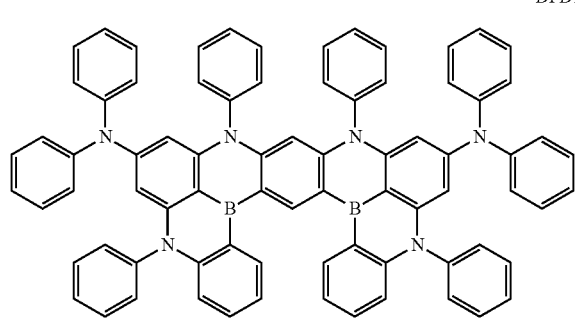
DFD2
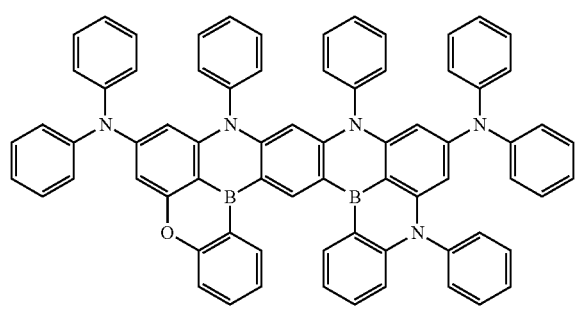
DFD3
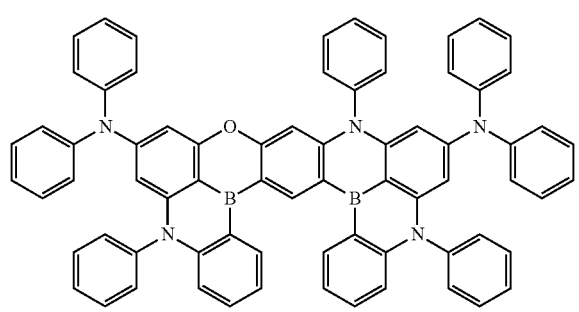
DFD4
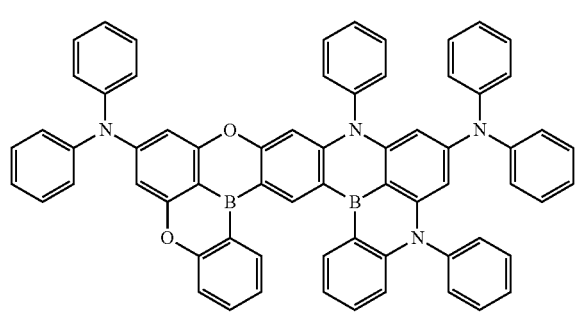
DFD5
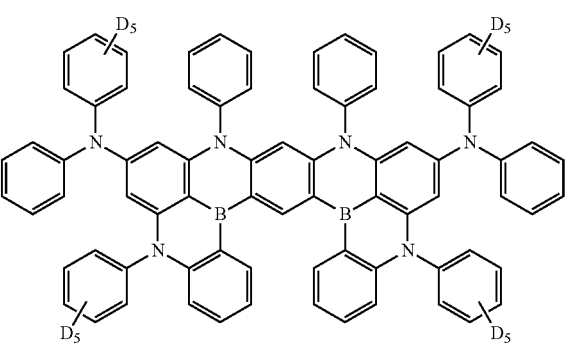
DFD6
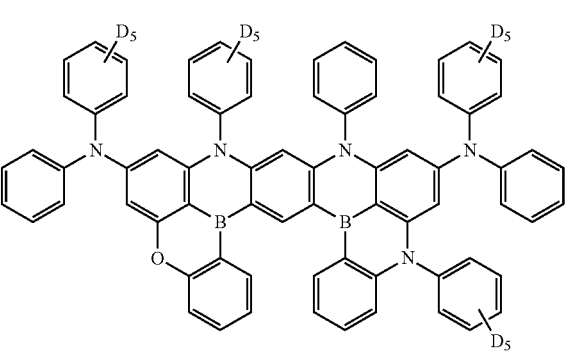
DFD7
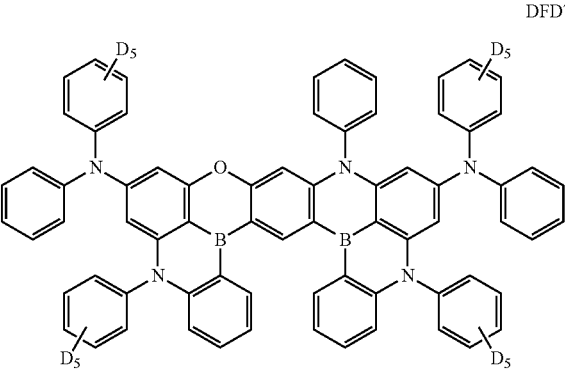
DFD8
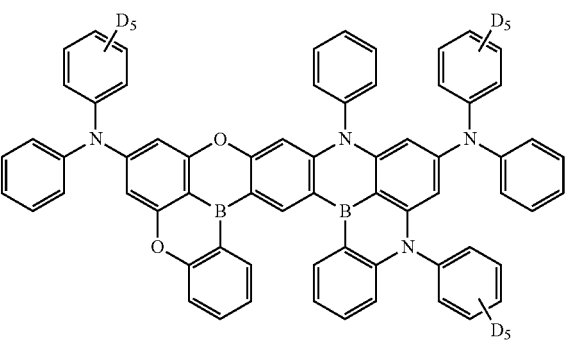

DFD9

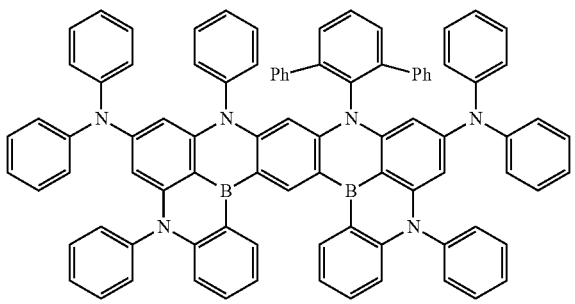

DFD10

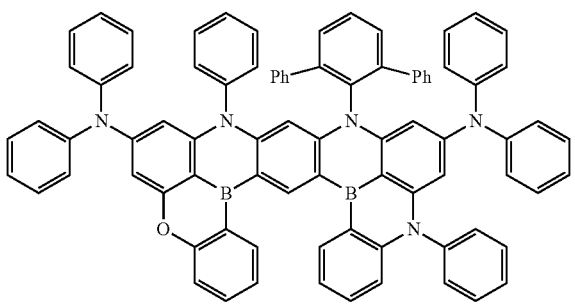

DFD11

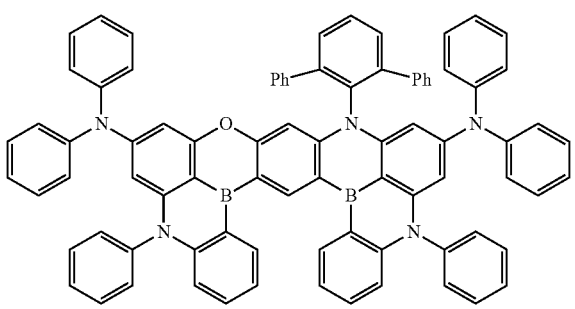

DFD12

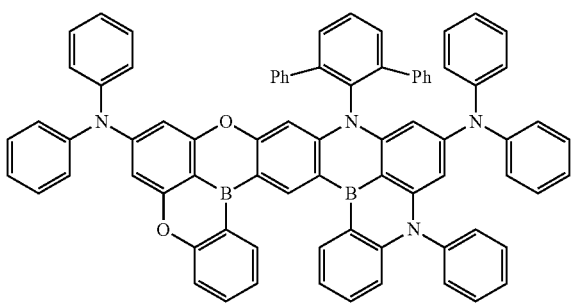

DF13

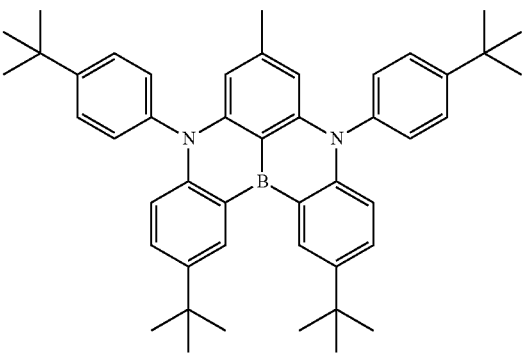

DF14

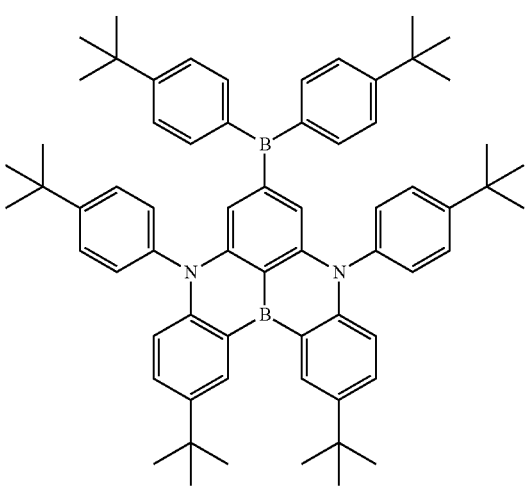

Among the compounds, Ph indicates a phenyl group, $D_5$ indicates a substitution with five deuteriums, and $D_4$ indicates a substitution with four deuteriums. For example, a group represented by

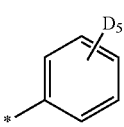

may be identical to a group represented by

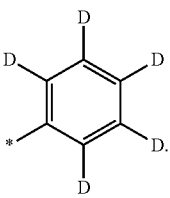

In an embodiment, the light-emitting device may satisfy at least one of Condition 1 to Condition 4:

Condition 1 lowest unoccupied molecular orbital (LUMO) energy level (eV) of the third compound>LUMO energy level (eV) of the first compound Condition 2

LUMO energy level (eV) of the first compound>LUMO energy level (eV) of the second compound Condition 3

HOMO energy level (eV) of the first compound>HOMO energy level (eV) of the third compound Condition 4

HOMO energy level (eV) of the first compound>HOMO energy level (eV) of the third compound The HOMO energy level and the LUMO energy level of each of the first compound, the second compound, and the third compound are negative values and may be measured according to any suitable method.

In an embodiment, the absolute value of the difference between the LUMO energy level of the first compound and the LUMO energy level of the second compound may be 0.1 eV or more and 1.0 eV or less, or the absolute value of the difference between the LUMO energy level of the first compound and the LUMO energy level of the third compound may be 0.1 eV or more and 1.0 eV or less, and the absolute value of the difference between the HOMO energy level of the first compound and the HOMO energy level of the second compound may be 1.25 eV or less (for example, 1.25 eV or less and 0.2 eV or more), or the absolute value of the difference between the HOMO energy level of the first compound and the HOMO energy level of the third compound may be 1.25 eV or less (for example, 1.25 eV or less and 0.2 eV or more).

When the relationships between LUMO energy level and HOMO energy level satisfy the conditions as described above, a suitable balance between holes and electrons injected into the emission layer can be achieved.

The light-emitting device may have the structure of a first embodiment or a second embodiment:

Description of First Embodiment

According to the first embodiment, the first compound is included in the emission layer in the interlayer of the light-emitting device, the emission layer further includes a host, the first compound and the host are different from each other, and the emission layer may be to emit phosphorescence or fluorescence emitted from the first compound. Thus, according to the first embodiment, the first compound may be a dopant or an emitter. In an embodiment, the first compound may be a phosphorescent dopant or a phosphorescent emitter.

In an embodiment, the phosphorescence or fluorescence to be emitted from the first compound may be blue light.

In an embodiment, the emission layer may further include an auxiliary dopant. The auxiliary dopant may improve the emission efficiency of the first compound by effectively transferring energy to the first compound, which may be a dopant or an emitter.

The auxiliary dopant may be different from each of the first compound and the host.

In an embodiment, the auxiliary dopant may be a delayed fluorescence emission compound.

In an embodiment, the auxiliary dopant may be a compound including at least one cyclic group including B (boron) and N (nitrogen) each (e.g., simultaneously) as ring-forming atoms.

Description of Second Embodiment

According to the second embodiment, the first compound is included in an emission layer in an interlayer of the light-emitting device, the emission layer further includes a host and a dopant, each of the first compound, the host, and the dopant are different from each other, and the emission layer may be to emit phosphorescence or fluorescence (for example, delayed fluorescence) emitted from the dopant.

For example, in the second embodiment, the first compound may act as an auxiliary dopant that transfers energy to the dopant (or emitter), not as a dopant.

As another example, the first compound in the second embodiment may act as an emitter and may also act as an auxiliary dopant for transferring energy to a dopant (or emitter).

In the second embodiment, the phosphorescence or fluorescence to be emitted from the dopant (or emitter) may be blue phosphorescence or blue fluorescence (for example, blue delayed fluorescence).

In the second embodiment, the dopant (or emitter) may be a phosphorescent dopant material (for example, an organometallic compound represented by Formula 1, an organometallic compound represented by Formula 401, or any combination thereof) or any fluorescent dopant material (for example, a compound represented by Formula 501, a compound represented by Formula 502, a compound represented by Formula 503, or any combination thereof).

In the first and second embodiments, the blue light may be blue light having a maximum emission wavelength in the range of 390 nm to 500 nm, 410 nm to 490 nm, 430 nm to 480 nm, 440 nm to 475 nm, or 455 nm to 470 nm.

In the first embodiment, the auxiliary dopant may include, for example, a fourth compound represented by Formula 502 or 503.

In the first and second embodiments, the host may be any host material (for example, a compound represented by Formula 301, a compound represented by 301-1, a compound represented by Formula 301-2, or any combination thereof).

In some embodiments, among the first and second embodiments, the host may be the second compound, the third compound, or any combination thereof.

In an embodiment, the light-emitting device may further include at least one of a first capping layer located outside the first electrode and a second capping layer located outside the second electrode, and the organometallic compound represented by Formula 1 may be included in at least one of the first capping layer and the second capping layer. More details for the first capping layer and/or second capping layer may be the same as described herein.

In one or more embodiments, the light-emitting device may further include:

a first capping layer located outside the first electrode and containing the heterocyclic compound represented by Formula 1;

a second capping layer located outside the second electrode and containing the heterocyclic compound represented by Formula 1; or the first capping layer and the second capping layer (e.g., simultaneously).

The wording "(an interlayer and/or capping layer) includes an organometallic compound represented by Formula 1" as utilized herein may be understood as "(an interlayer and/or capping layer) may include one kind of (e.g., the same) organometallic compound represented by Formula 1 or two different kinds of organometallic compounds, each represented by Formula 1."

For example, the interlayer and/or capping layer may include Compound D1 only as the organometallic compound. For example, Compound D1 may exist in the emission layer of the light-emitting device. In an embodiment, the interlayer may include, as the organometallic compound, Compound D1 and Compound D2. In this regard, Compound D1 and Compound D2 may both exist in an identical (e.g., the same) layer (for example, Compound D1 and Compound D2 may both exist in an emission layer), or may exist in different layers (for example, Compound D1 may exist in an emission layer and Compound D2 may exist in an electron transport region).

The term "interlayer" as utilized herein may refer to a single layer and/or all layers between a first electrode and a second electrode of a light-emitting device.

Another aspect provides an electronic apparatus including the light-emitting device. The electronic apparatus may further include a thin-film transistor. In one or more embodiments, the electronic apparatus may further include a thin-film transistor including a source electrode and a drain electrode, and the first electrode of the light-emitting device may be electrically connected to the source electrode or the drain electrode. In an embodiment, the electronic apparatus may further include a color filter, a color conversion layer, a touch screen layer, a polarizing layer, or any combination thereof. The electronic apparatus may be the same as described herein.

In an embodiment, provided is an organometallic compound represented by Formula 1. The organometallic compound represented by Formula 1 may be the same as described herein.

In an embodiment, the organometallic compound represented by Formula 1 may be to emit blue light. For example, the organometallic compound represented by Formula 1 may be to emit blue light having a maximum emission wavelength in the range of 390 nm to 500 nm, 410 nm to 490 nm, 430 nm to 480 nm, 440 nm to 475 nm, or 455 nm to 470 nm.

In an embodiment, the organometallic compound represented by Formula 1 may have a color purity in which the bottom emission $CIE_x$ coordinate is in the range of 0.12 to 0.15 or 0.13 to 0.14, and the bottom emission $CIE_y$ coordinate is in the range of 0.06 to 0.25, 0.10 to 0.20 or 0.13 to 0.20.

Suitable synthesis methods of the organometallic compound represented by Formula 1 may be recognizable by one of ordinary skill in the art by referring to the Synthesis Examples and/or Examples provided below.

Description of FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

First Electrode 110

In FIG. 1, a substrate may be additionally located under the first electrode 110 and/or above the second electrode 150. As the substrate, a glass substrate or a plastic substrate may be utilized. In an embodiment, the substrate may be a flexible substrate, and may include plastics with excellent or suitable heat resistance and durability (such as polyimide, polyethylene terephthalate (PET), polycarbonate, polyethylene naphthalate, polyarylate (PAR), polyetherimide, or any combination thereof).

The first electrode 110 may be formed by, for example, depositing and/or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In an embodiment, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be utilized as a material for forming a first electrode.

The first electrode 110 may have a single-layered structure including (e.g., consisting of) a single layer, or a multilayer structure including a plurality of layers. For example, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region placed between the first electrode 110 and the emission layer, and an electron transport region placed between the emission layer and the second electrode 150.

The interlayer 130 may further include metal-containing compounds (such as organometallic compounds), inorganic materials (such as quantum dots), and/or the like, in addition to one or more suitable organic materials.

In an embodiment, the interlayer 130 may include i) two or more emitting units sequentially stacked between the first electrode 110 and the second electrode 150 and ii) a charge generation layer located between the two emitting units. When the interlayer 130 includes the emitting unit and the charge generation layer as described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer (HIL), a hole transport layer (HTL), an emission auxiliary layer, an electron blocking layer (EBL), or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the constituting layers of each structure are stacked sequentially from the first electrode 110.

The hole transport region may include a compound represented by Formula 201, a compound represented by Formula 202, or any combination thereof:

Formula 201

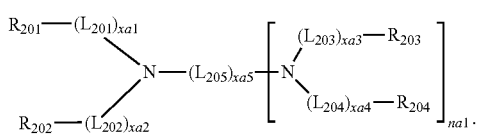

Formula 202

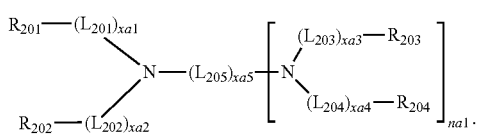

In Formulae 201 and 202,

L$_{201}$ to L$_{204}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, L$_{205}$ may be *—O—*', *—S—*', *—N(Q$_{201}$)-*', a C$_1$-C$_{20}$ alkylene group unsubstituted or substituted with at least one R$_{10a}$, a C$_2$-C$_{20}$ alkenylene group unsubstituted or substituted with at least one R$_{10a}$, a C$_3$-C$_{60}$ carbocyclic group unsubstituted or substituted with at least one R$_{10a}$, or a C$_1$-C$_{60}$ heterocyclic group unsubstituted or substituted with at least one R$_{10a}$, xa1 to xa4 may each independently be an integer from 0 to 5, xa5 may be an integer from 1 to 10, R$_{201}$ to R$_{204}$ and Q$_{201}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, R$_{201}$ and R$_{202}$ may optionally be linked to each other via a single bond, a C$_1$-C$_5$ alkenylene group unsubstituted or substituted with at least one R$_{10a}$, or a C$_2$-C$_5$ alkenylene group unsubstituted or substituted with at least one R$_{10a}$ to thereby form a C$_8$-C$_{60}$ polycyclic group (for example, a carbazole group and/or the like) unsubstituted or substituted with at least one R$_{10a}$ (see e.g., Compound HT16 and/or the like), R$_{203}$ and R$_{204}$ may optionally be linked to each other via a single bond, a C$_1$-C$_5$ alkylene group unsubstituted or substituted with at least one R$_{10a}$, or a C$_2$-C$_5$ alkenylene group unsubstituted or substituted with at least one R$_{10a}$ to thereby form a C$_8$-C$_{60}$ polycyclic group unsubstituted or substituted with at least one R$_{10a}$, and na1 may be an integer from 1 to 4.

In an embodiment, each of Formulae 201 and 202 may include at least one of the groups represented by Formulae CY201 to CY217:

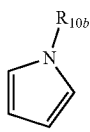

CY201

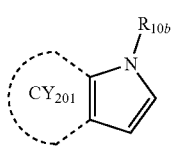

CY202

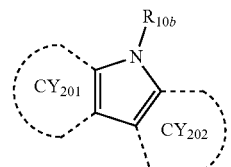

CY203

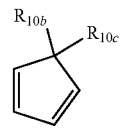

CY204

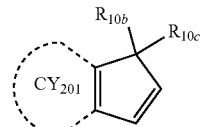

CY205

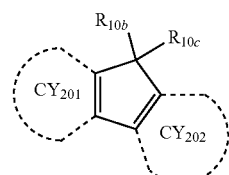

CY206

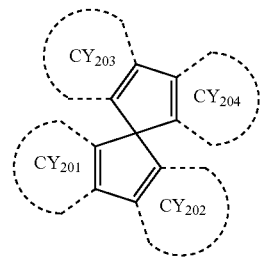

CY207

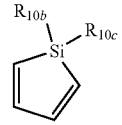

CY208

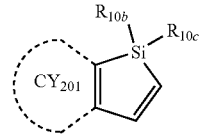

CY209

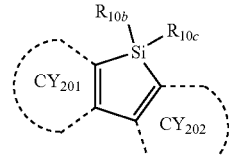

CY210

-continued

CY211
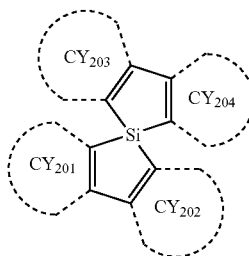

CY212

CY213
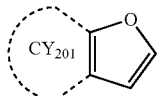

CY214
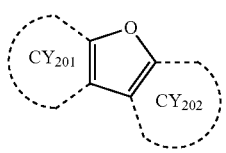

CY215

CY216
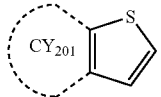

CY217
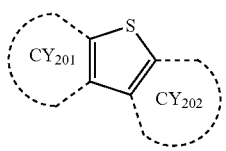

$R_{10b}$ and $R_{10c}$ in Formulae CY201 to CY217 may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with at least one $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include (e.g., may exclude) a group represented by one of Formulae CY201 to CY203.

In one or more embodiments, each of Formulae 201 and 202 may not include a group represented by one of Formulae CY201 to CY203, and may include at least one of the groups represented by Formulae CY204 to CY217.

In an embodiment, each of Formulae 201 and 202 may not include a group represented by one of Formulae CY201 to CY217.

In an embodiment, the hole transport region may further include one or more of Compounds HT1 to HT46, m-MT-DATA, TDATA, 2-TNATA, NPB(NPD), p-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzene sulfonic acid (PANI/DBSA), poly(3,4-ethylene dioxythiophene)/poly(4-styrene sulfonate) (PEDOT/PSS), polyaniline/camphor sulfonic acid (PANI/CSA), polyaniline/poly(4-styrene sulfonate) (PANI/PSS), or any combination thereof:

HT1
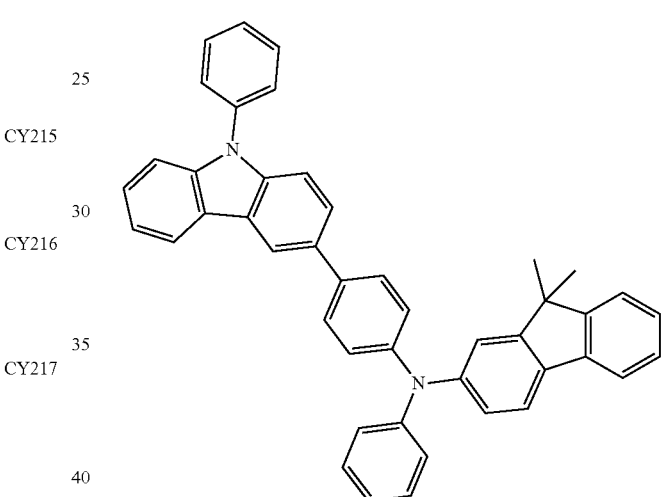

HT2
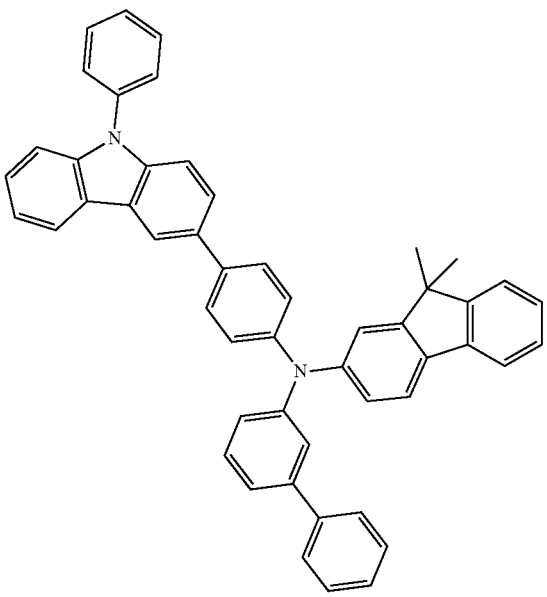

HT3
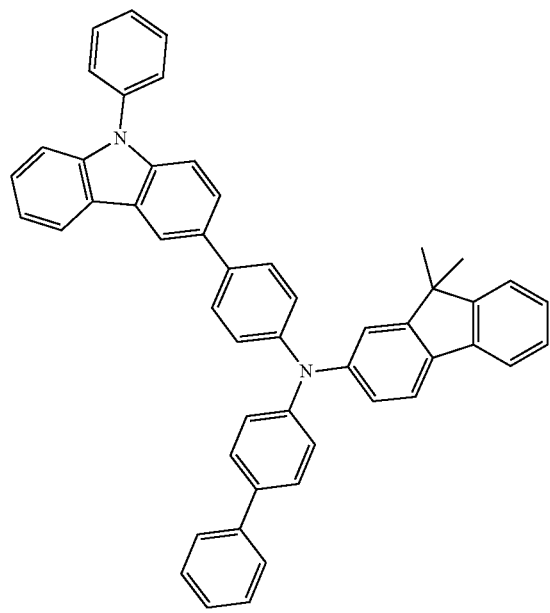
HT5
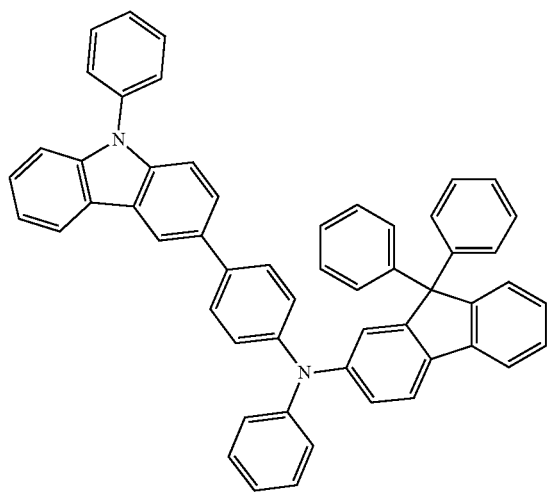
HT4
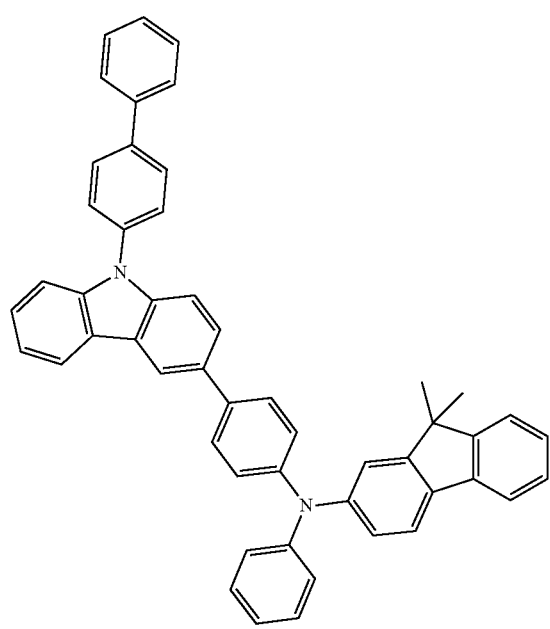
HT6
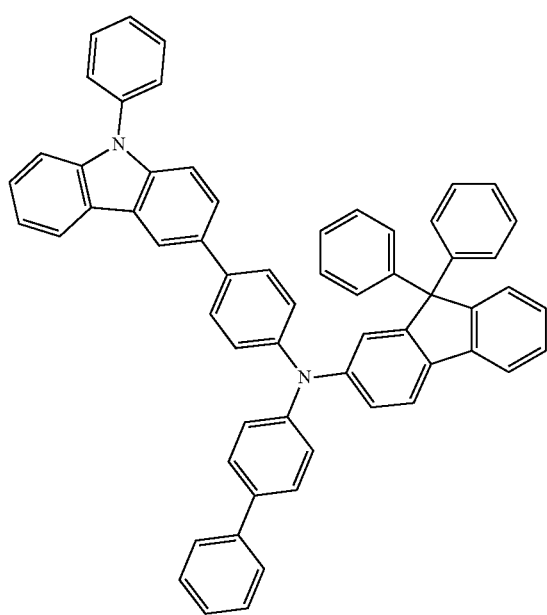

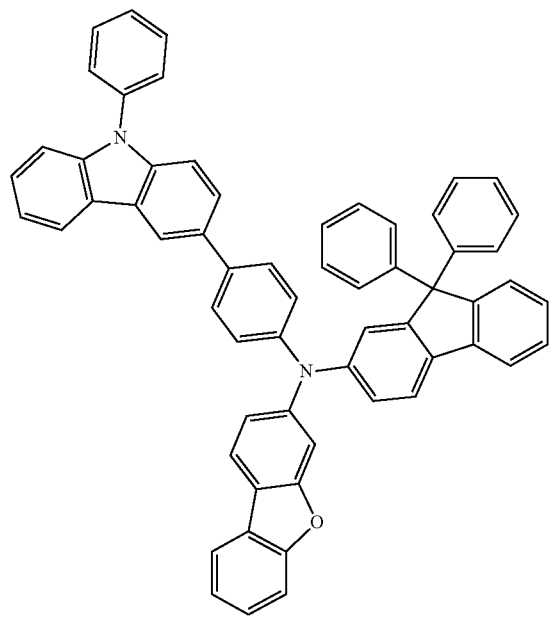
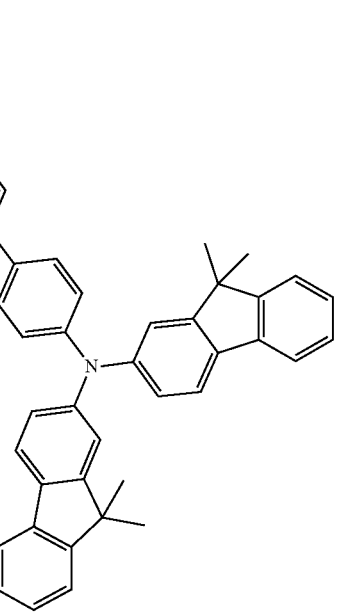

HT11
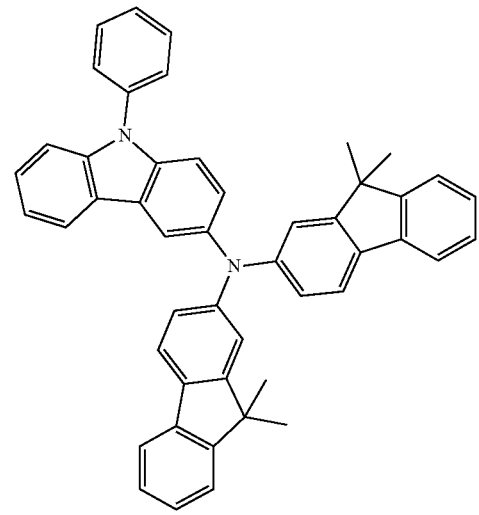
HT12
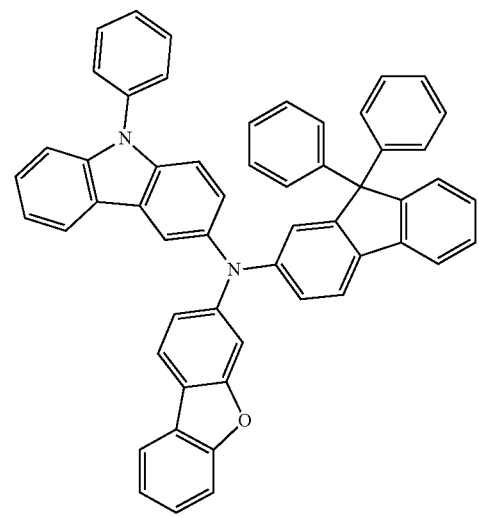
HT13
HT14
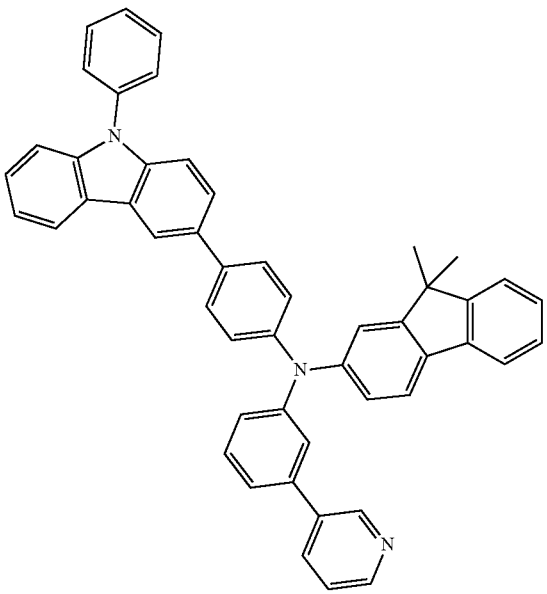
HT15
HT16
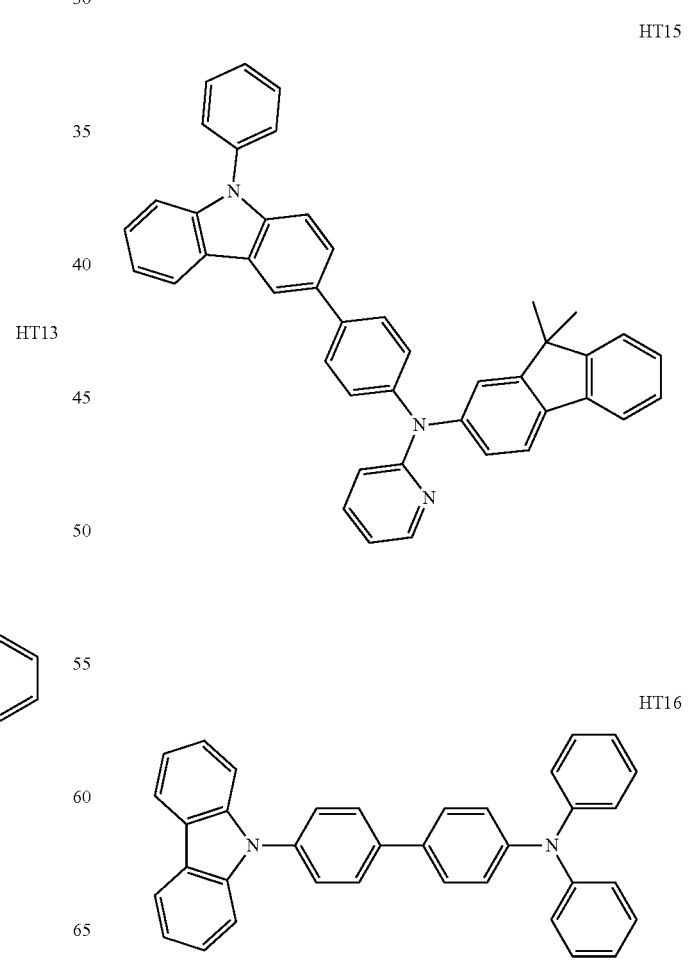

HT17
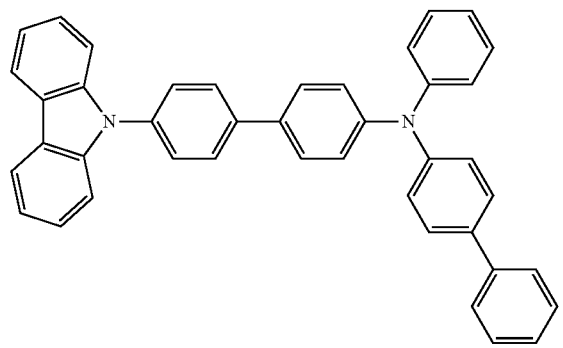
HT18
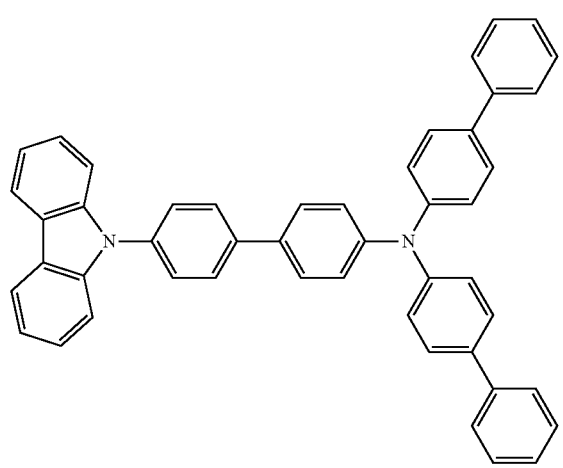
HT19
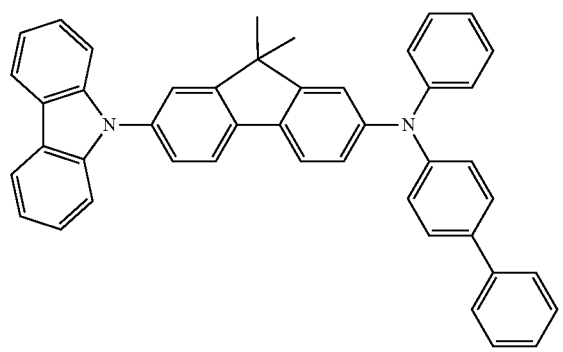
HT20
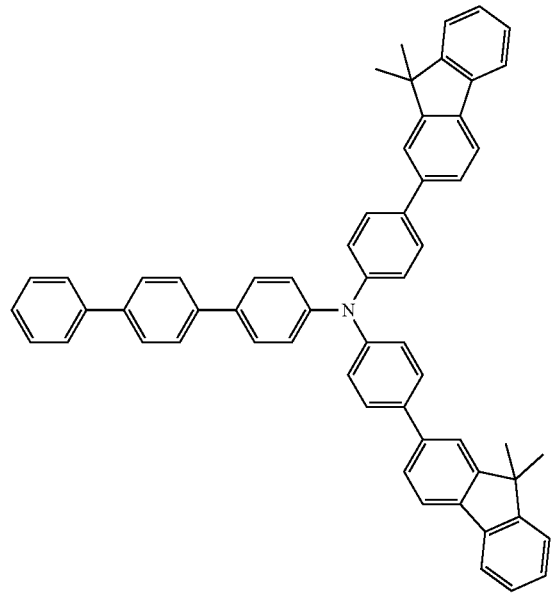
HT21
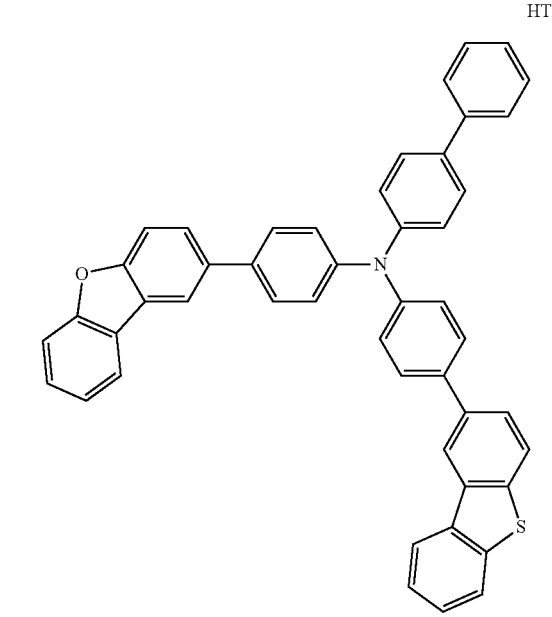
HT22
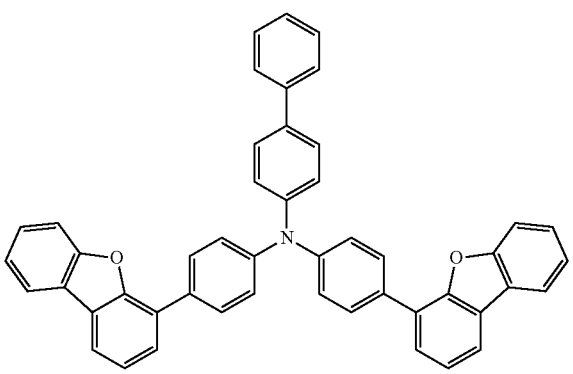

151
-continued
HT23
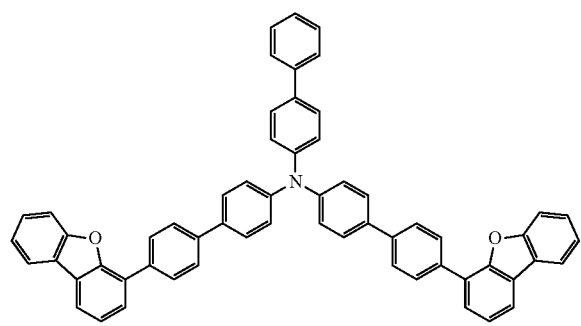
HT24
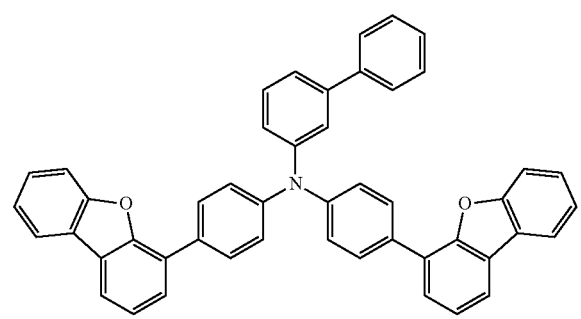
HT25
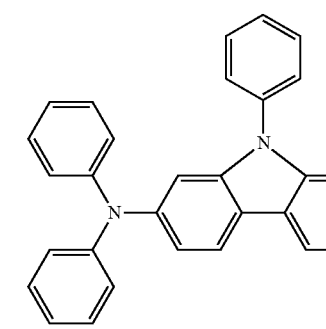
152
-continued
HT26
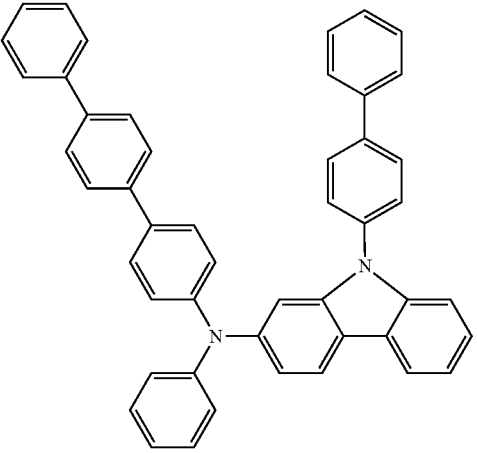
HT27
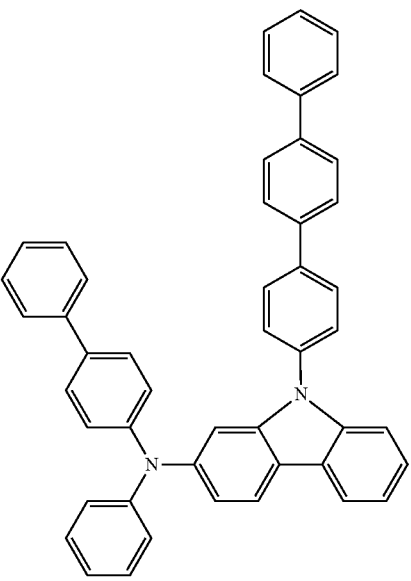
HT28
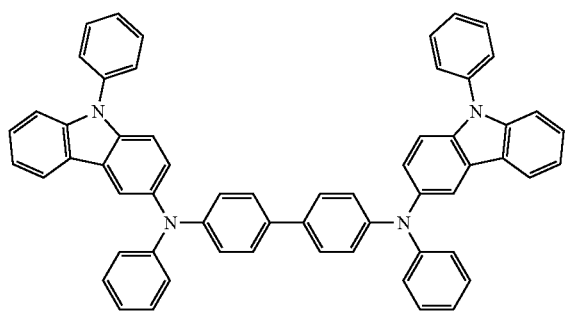

HT29
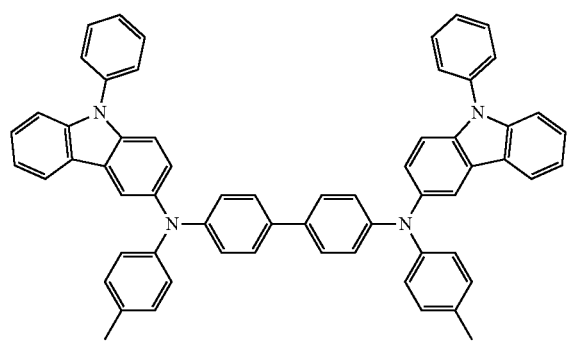
HT33
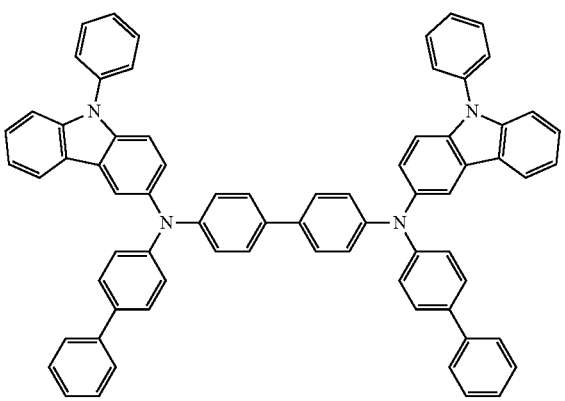
HT30
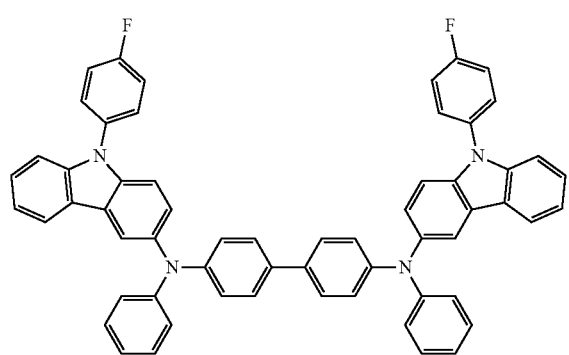
HT34
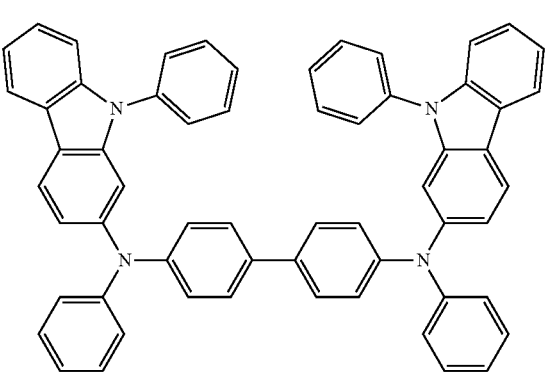
HT31
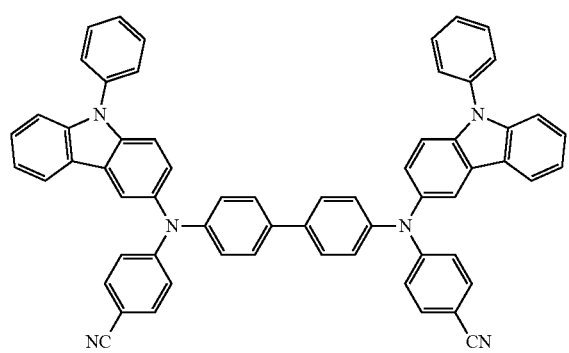
HT35
HT32
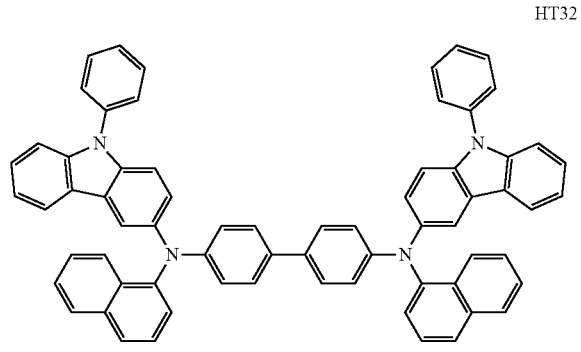
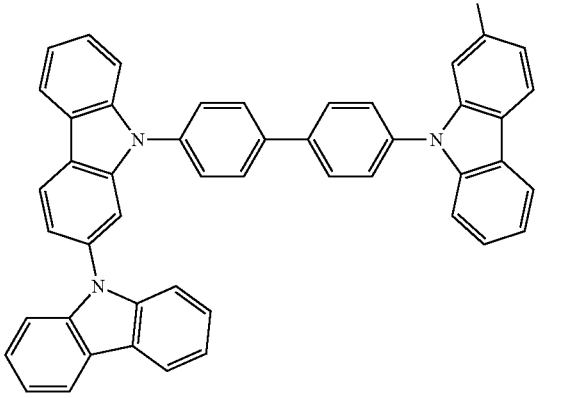

HT36
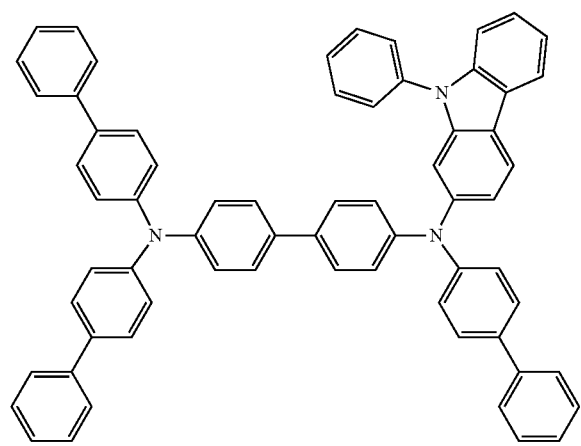
HT37
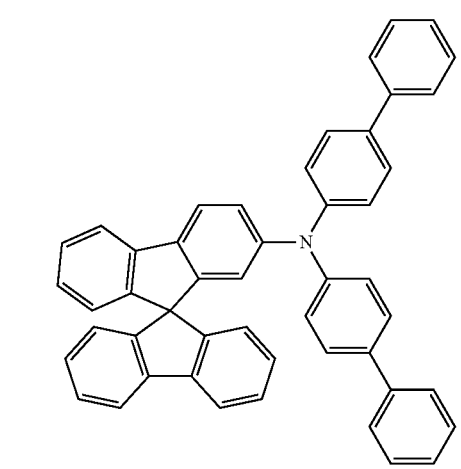
HT38
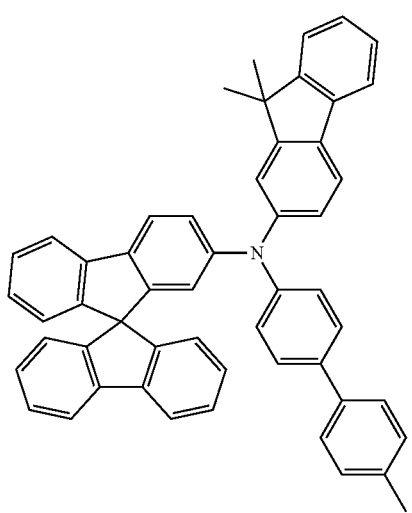
HT39
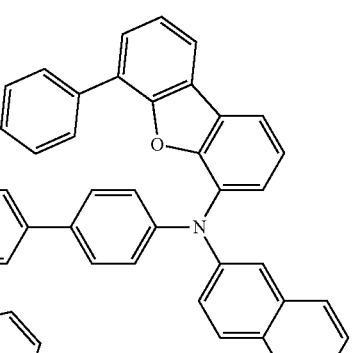
HT40
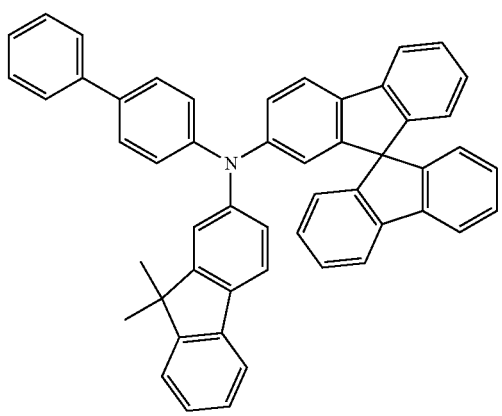
HT41
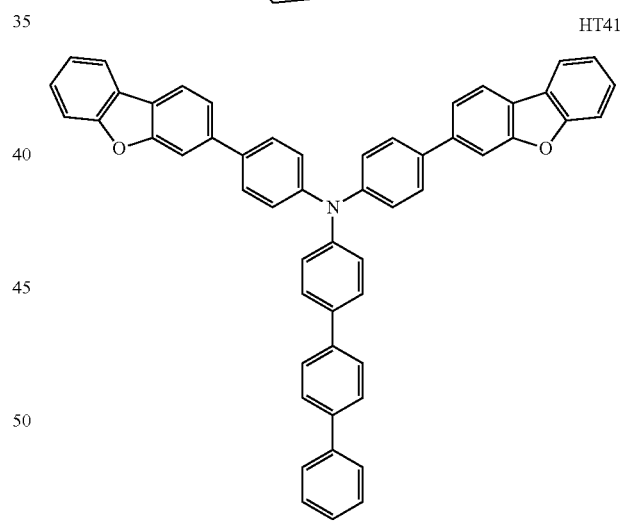
HT42
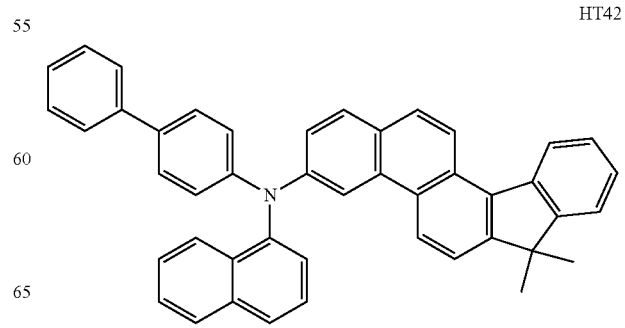

HT43
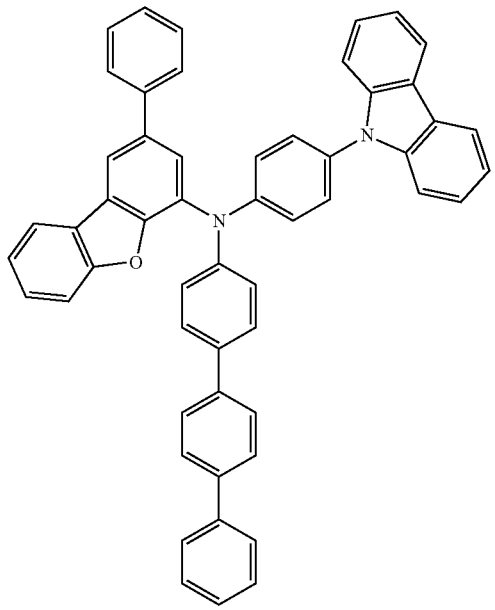
HT44
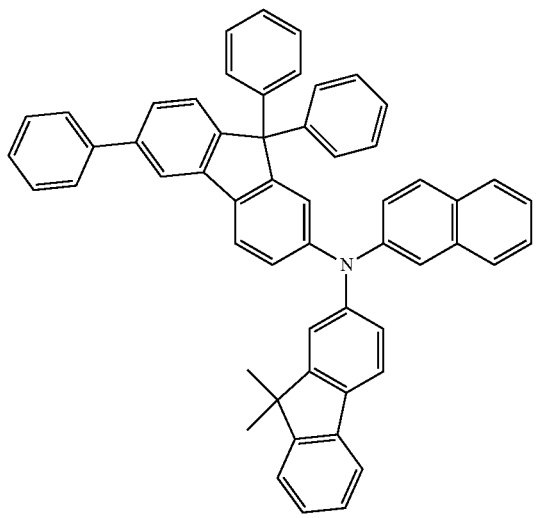
HT45
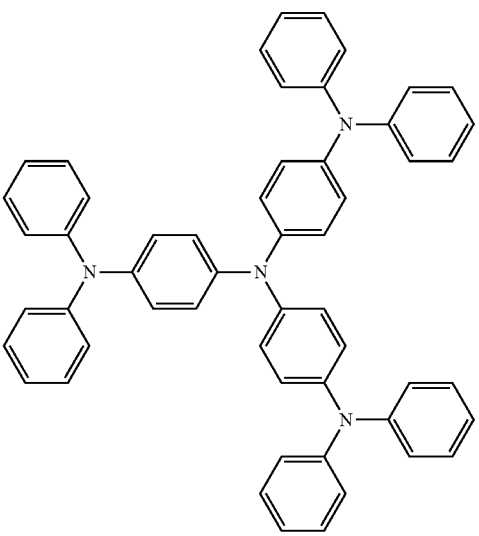
HT46
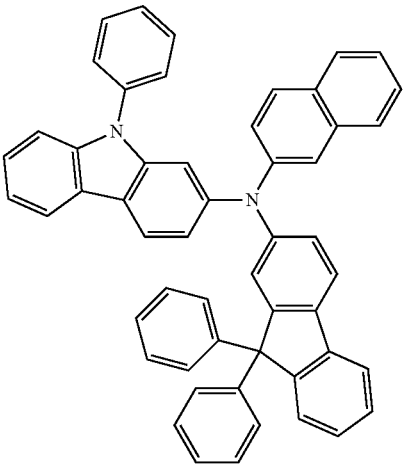
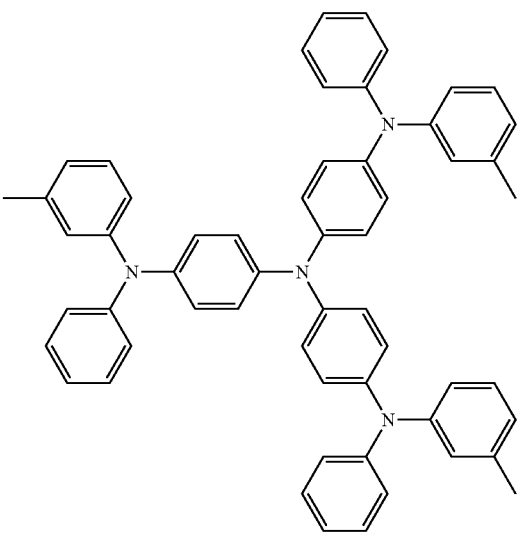
m-MTDATA
TDATA -continued
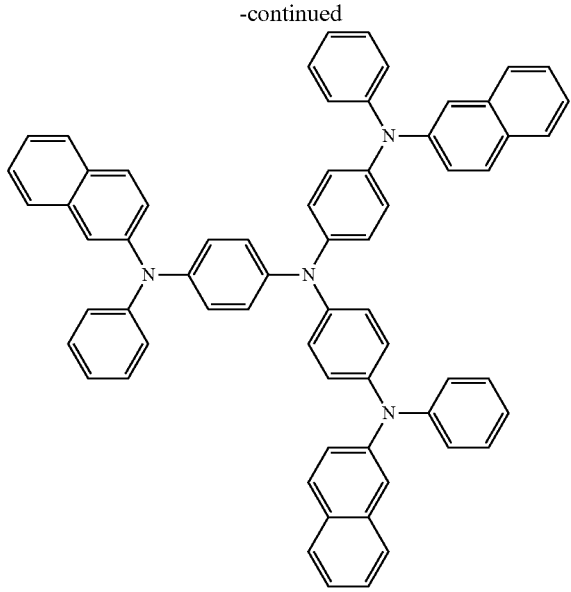
2-TNATA
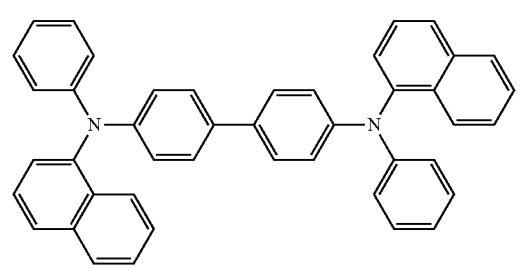
NPB
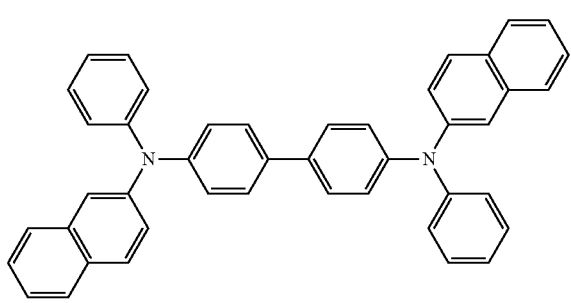
β-NPB
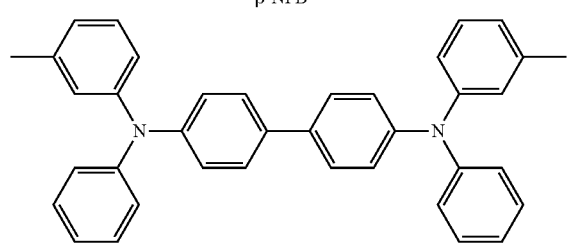
TPD
-continued
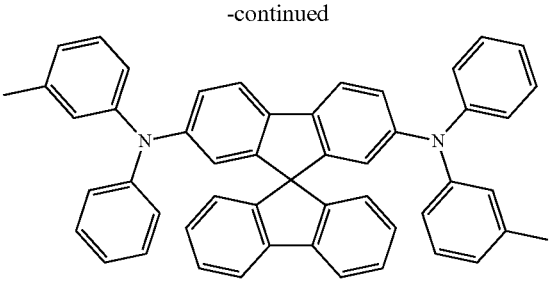
Spiro-TPD
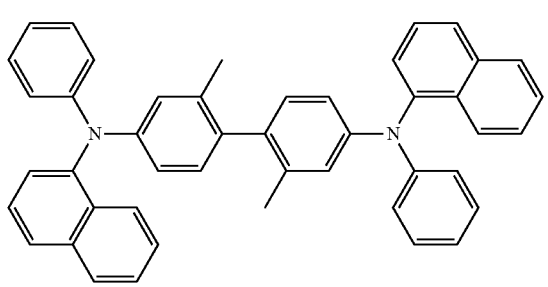
Spiro-NPB
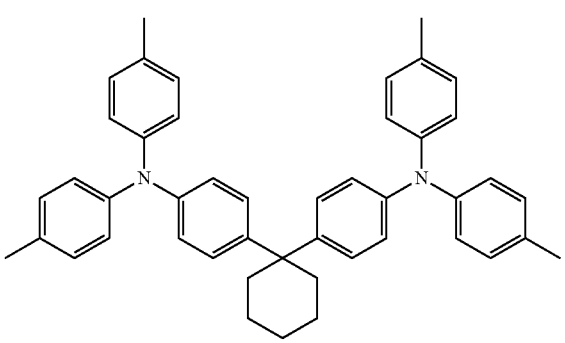
methylated-NPB
TAPC

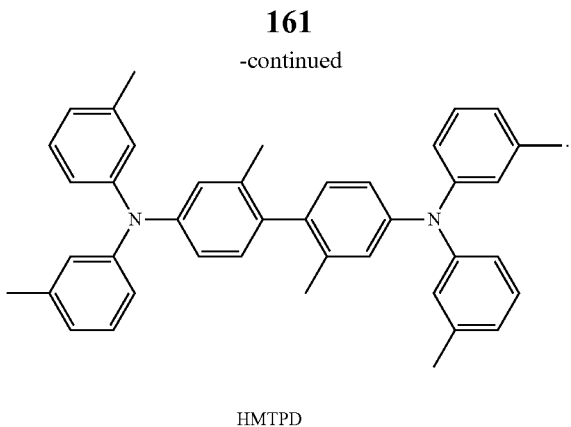

HMTPD

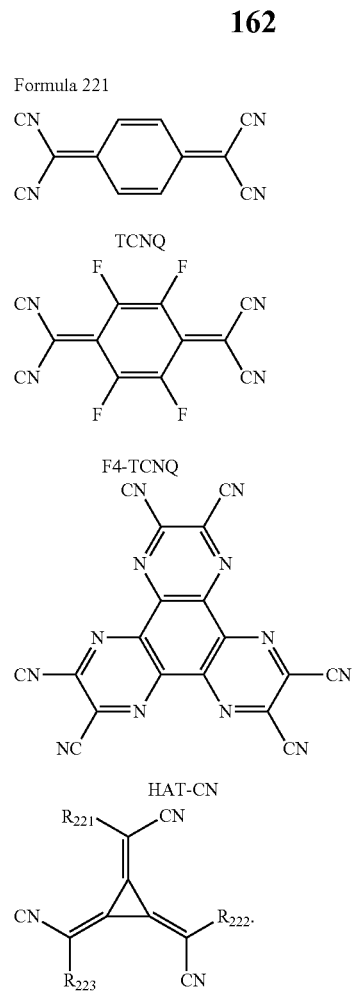

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase the light-emission efficiency of a device by compensating for an optical resonance distance of the wavelength of light emitted by an emission layer, and the electron-blocking layer may block or reduce the flow of electrons from an electron transport region. The emission auxiliary layer and the electron-blocking layer may include the materials as described above.

p-Dopant

The hole transport region may further include, in addition to these materials, a charge-generation material for the improvement of conductive properties. The charge-generation material may be substantially uniformly or non-uniformly dispersed in the hole transport region (for example, in the form of a single layer including (e.g., consisting of) a charge-generation material).

The charge-generation material may be, for example, a p-dopant.

In an embodiment, the lowest unoccupied molecular orbital (LUMO) energy level of the p-dopant may be −3.5 eV or less.

In an embodiment, the p-dopant may include a quinone derivative, a cyano group-containing compound, a compound containing an element EL1 and an element EL2, or any combination thereof.

Non-limiting examples of the quinone derivative include TCNQ, F4-TCNQ, etc.

Non-limiting examples of the cyano group-containing compound include HAT-CN, and a compound represented by Formula 221.

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing the element EL1 and the element EL2, the element EL1 may be a metal, a metalloid, or a combination thereof, and the element EL2 may be a non-metal, a metalloid, or a combination thereof.

Non-limiting examples of the metal include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), ruthenium (Lu), etc.).

Non-limiting examples of the metalloid include silicon (Si), antimony (Sb), and tellurium (Te).

Non-limiting examples of the non-metal include oxygen (O) and a halogen (for example, F, Cl, Br, I, etc.).

In an embodiment, non-limiting examples of the compound containing the element EL1 and the element EL2 are a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Non-limiting examples of the metal oxide include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), and a rhenium oxide (for example, $ReO_3$, etc.).

Non-limiting examples of the metal halide include an alkali metal halide, an alkaline earth metal halide, a transition metal halide, a post-transition metal halide, and a lanthanide metal halide.

Non-limiting examples of the alkali metal halide include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Non-limiting examples of the alkaline earth metal halide include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Non-limiting examples of the transition metal halide include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $COI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Non-limiting examples of the post-transition metal halide include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Non-limiting examples of the lanthanide metal halide include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

A non-limiting example of the metalloid halide is antimony halide (for example, $SbCl_5$, etc.).

Non-limiting examples of the metal telluride include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers may contact each other or may be separated from each other. In one or more embodiments, the emission layer may include two or more materials of a red light-emitting material, a green light-emitting material, and a blue light-emitting material, in which the two or more materials are mixed with each other in a single layer to emit white light.

In an embodiment, the emission layer may include a host and a dopant (or emitter). In some embodiments, the emission layer may further include an auxiliary dopant for promoting energy transfer to the dopant (or emitter), in addition to the host and the dopant (or emitter). When the emission layer includes the dopant (or emitter) and the auxiliary dopant, the dopant (or emitter) and the auxiliary dopant may be different from each other.

The first compound described herein may serve as the dopant (or emitter) or the auxiliary dopant.

The amount of the dopant (or emitter) in the emission layer may be about 0.01 parts by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within these ranges, excellent or suitable light-emission characteristics may be obtained without a substantial increase in driving voltage.

Host

The host in the emission layer may include the second compound, the third compound, or any combination thereof.

In an embodiment, the host may include a compound represented by Formula 301:

$$[Ar_{301}]_{xb11}-[(L_{301})_{xb1}-R_{301}]_{xb21}.$$ Formula 301

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{301})(Q_{302})(Q_{303})$, $-N(Q_{301})(Q_{302})$, $-B(Q_{301})(Q_{302})$, $-C(=O)(Q_{301})$, $-S(=O)_2(Q_{301})$, or $-P(=O)(Q_{301})(Q_{302})$, xb21 may be an integer from 1 to 5, and $Q_{301}$ to $Q_{303}$ may each independently be the same as described in connection with $Q_1$.

For example, when xb11 in Formula 301 is 2 or more, two or more $Ar_{301}(S)$ may be linked to each other via a single bond.

In an embodiment, the host may include a compound represented by Formula 301-1, a compound represented by Formula 301-2, or any combination thereof:

Formula 301-1

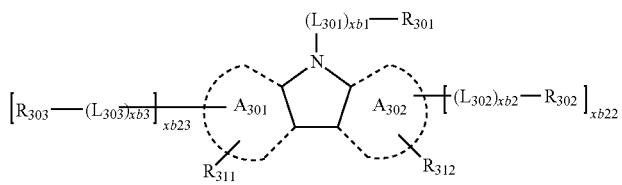

Formula 301-2

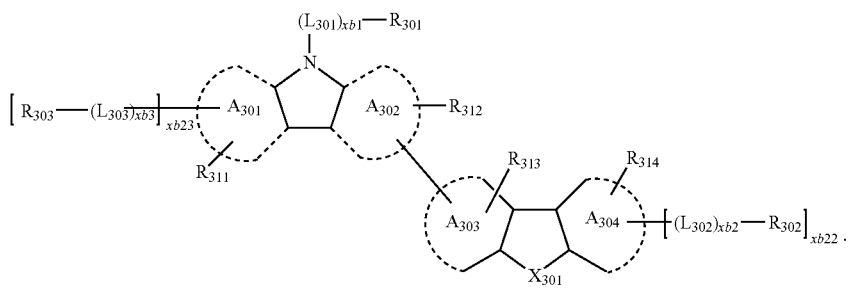

In Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ may each independently be the same as described herein, $L_{302}$ to $L_{304}$ may each independently be substantially the same as described in connection with $L_{301}$, xb2 to xb4 may each independently be substantially the same as described in connection with xb1, and $R_{302}$ to $R_{305}$ and $R_{311}$ to $R_{314}$ may each independently be the same as described in connection with $R_{301}$.

In an embodiment, the host may include an alkaline earth-metal complex. In an embodiment, the host may include a Be complex (for example, Compound H55), an Mg complex, a Zn complex, or a combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof, but embodiments of the present disclosure are not limited thereto:

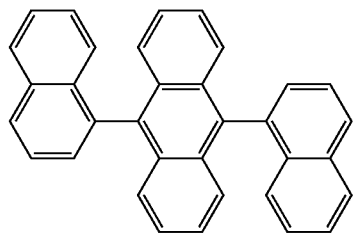

H1

-continued

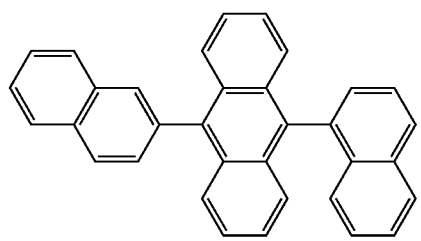

H2

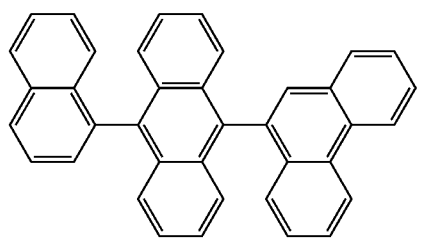

H3

H4
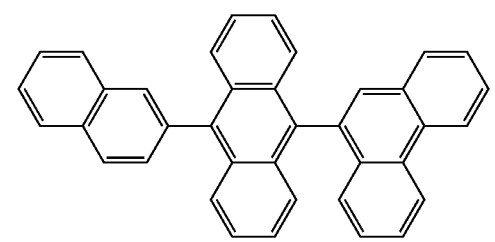
H5
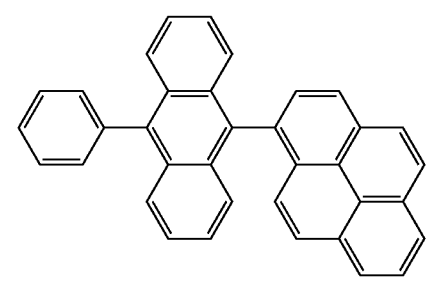
H6
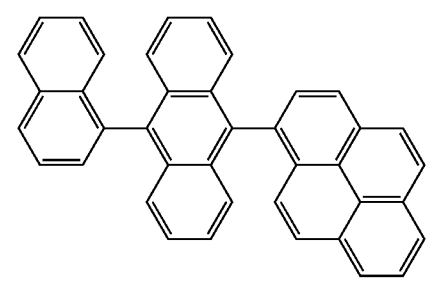
H7
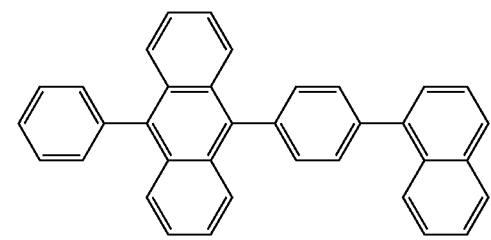
H8
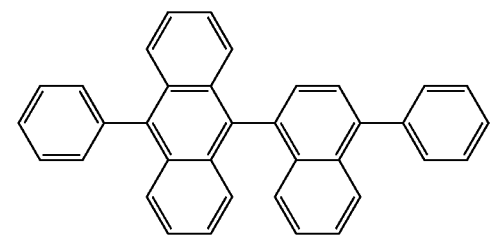
H9
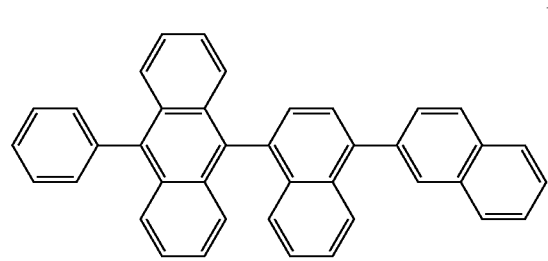
H10
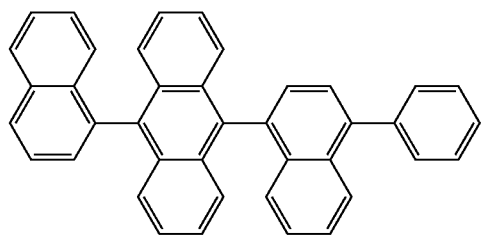
H11
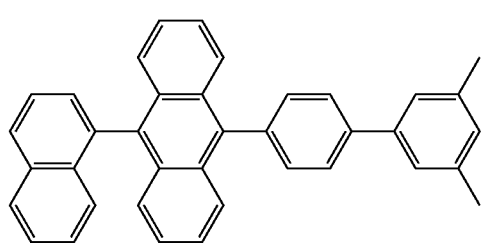
H12
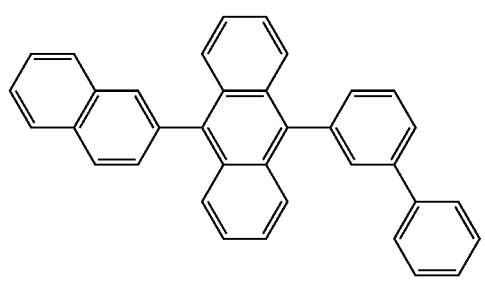
H13
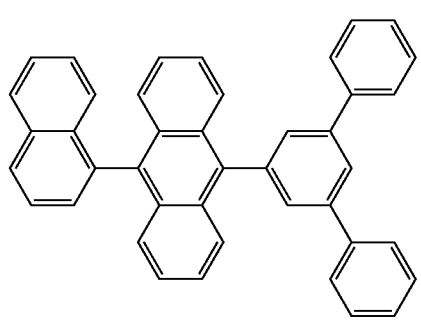
H14
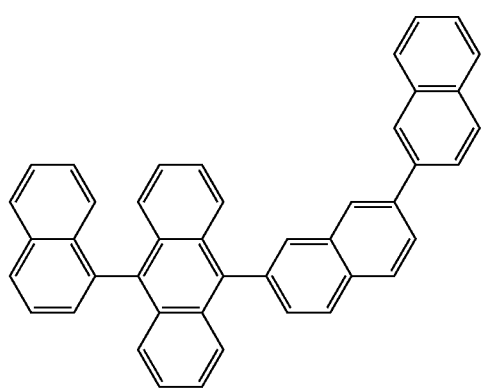

H15
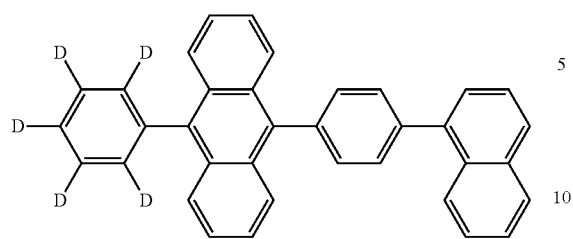
H20
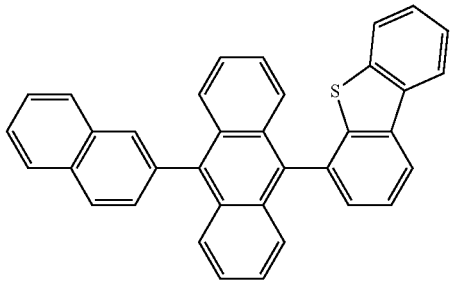
H16
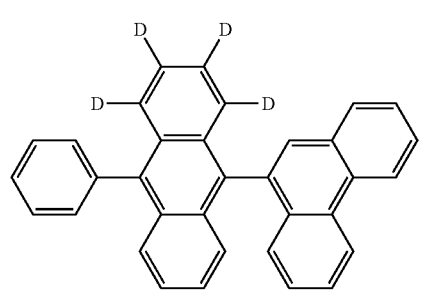
H21
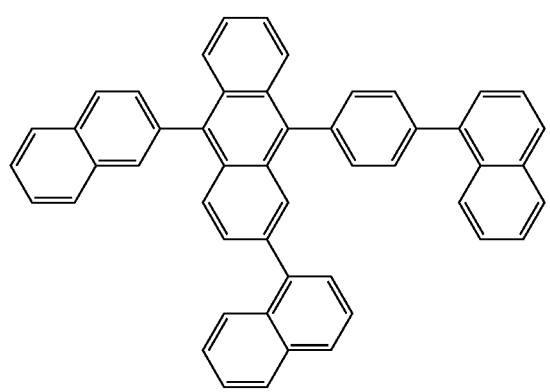
H17
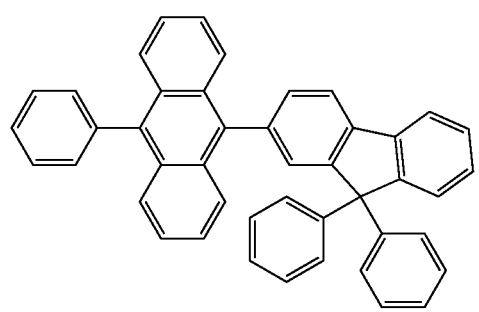
H22
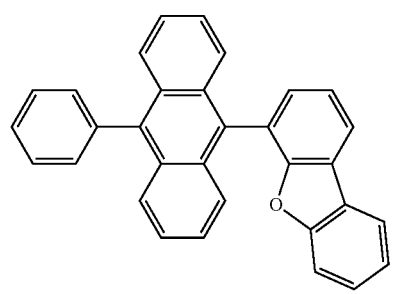
H18
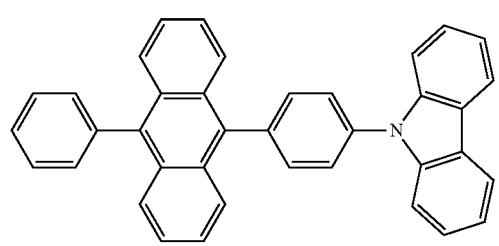
H23
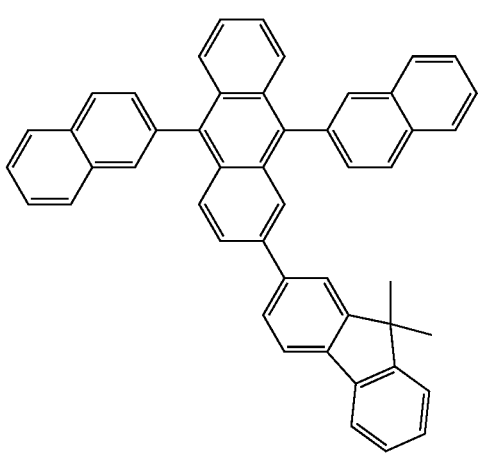
H19

H24
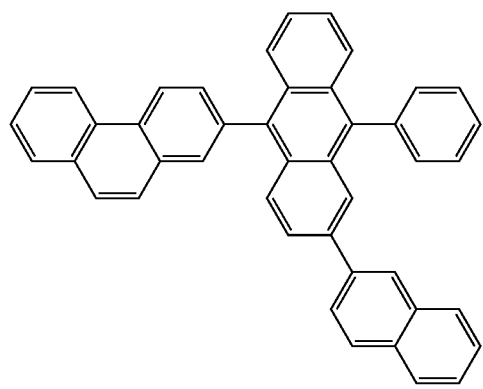
H25
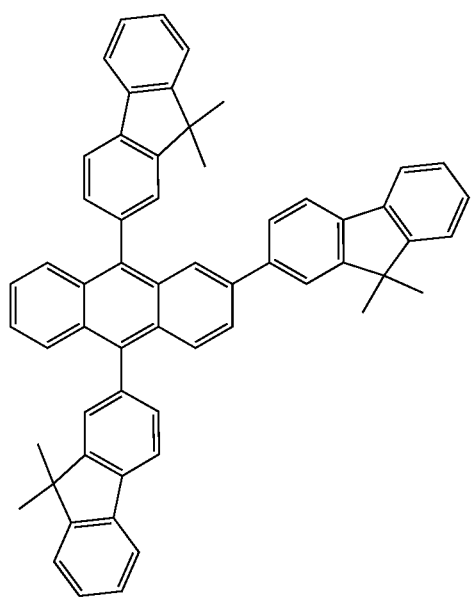
H26
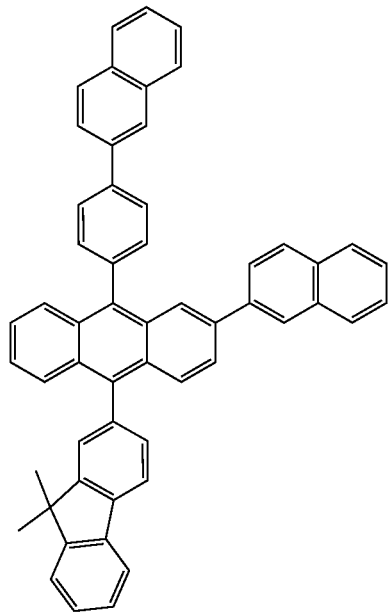
H27
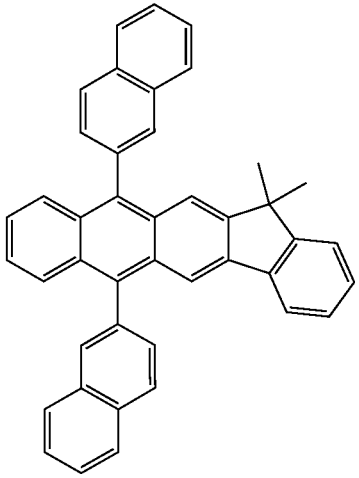
H28
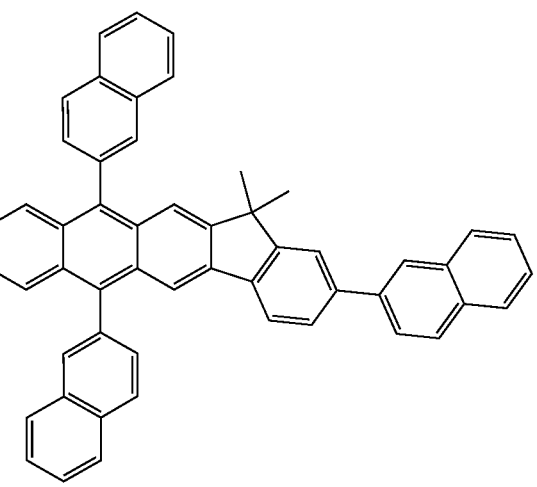
H29
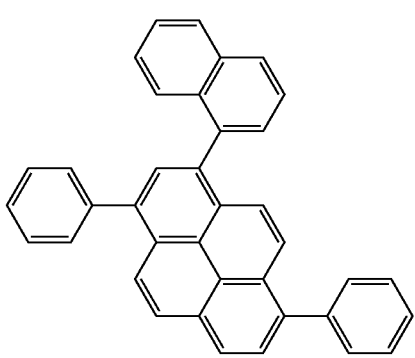

H30
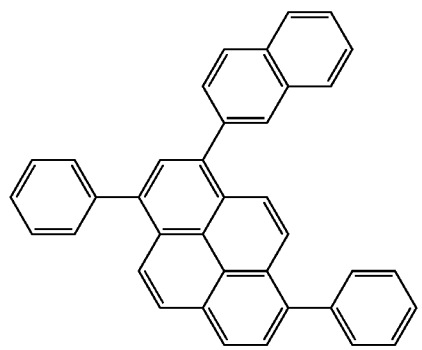
H31
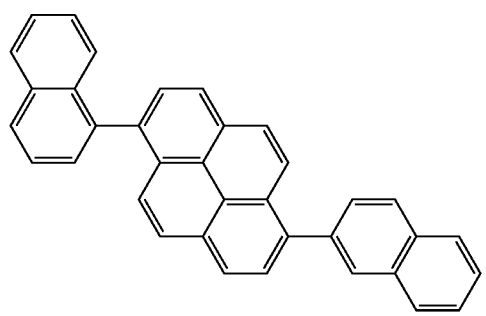
H32
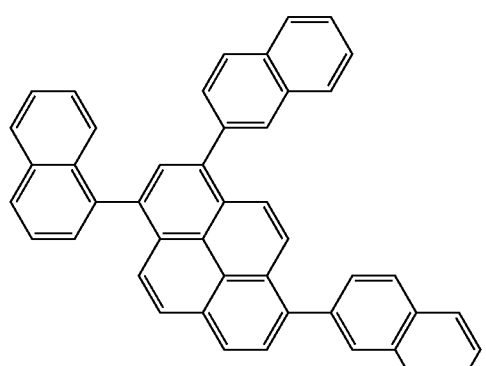
H33
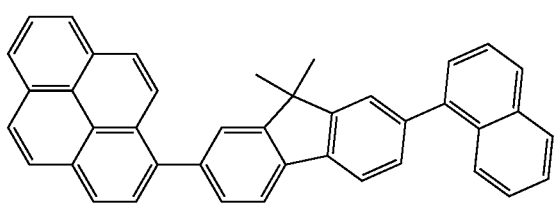
H34
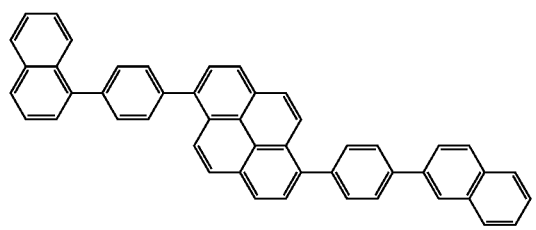
H35
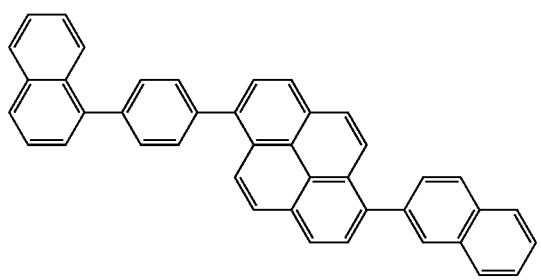
H36
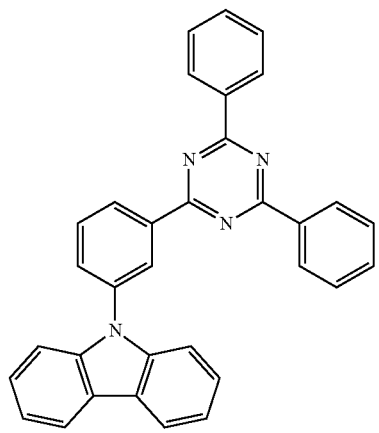
H37
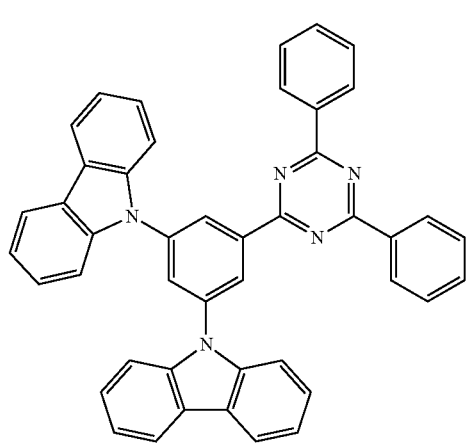
H38
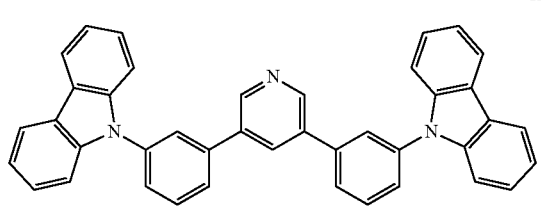

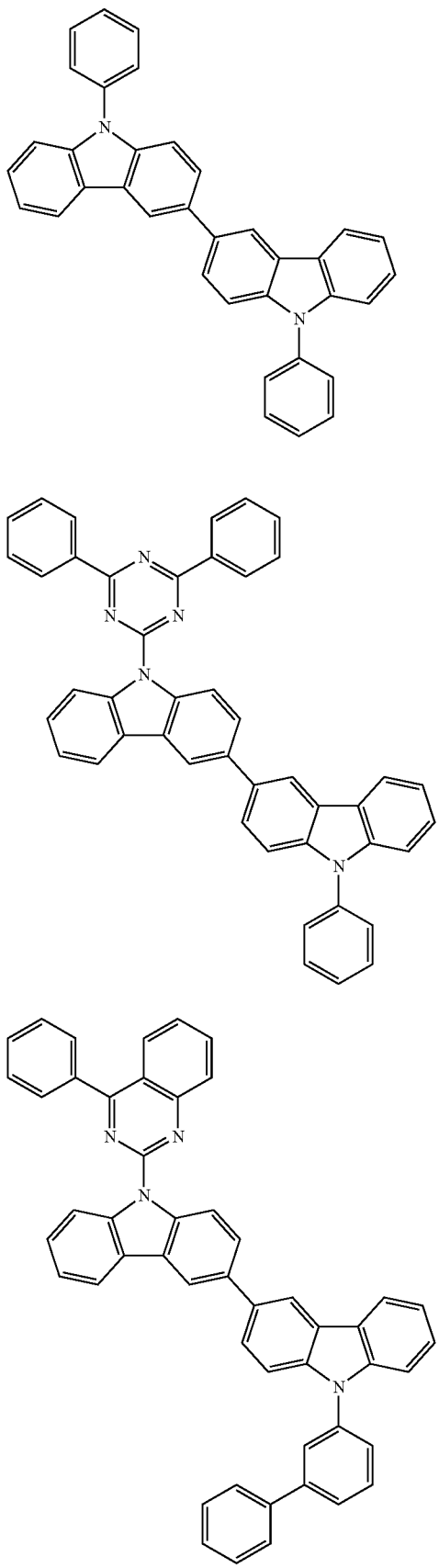
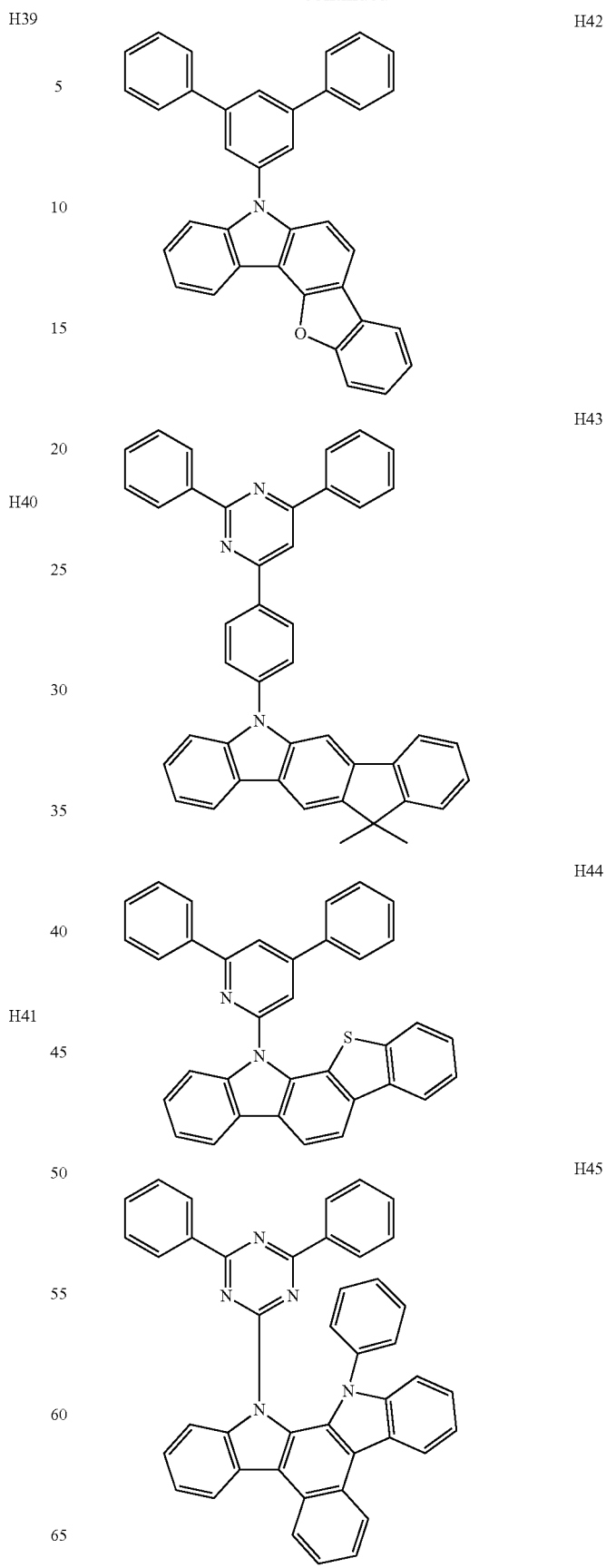

-continued
H46
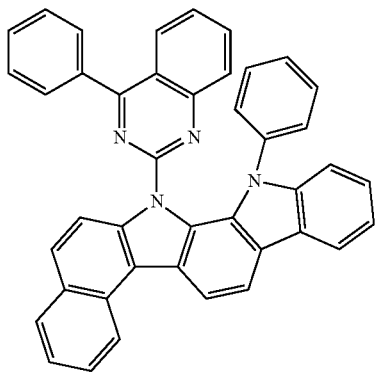
H47
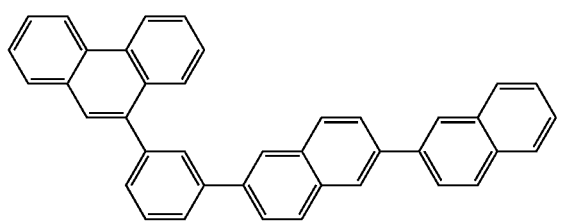
H48
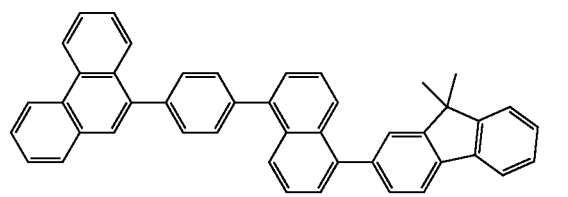
H49
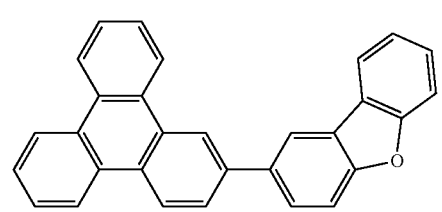
H50
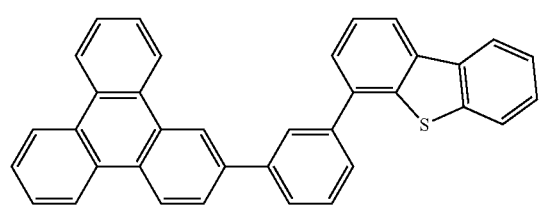
H51
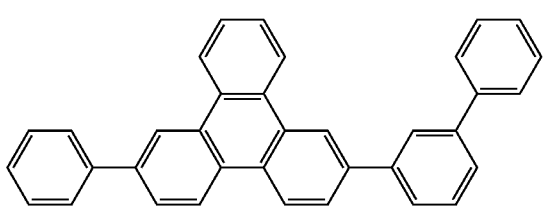
-continued
H52
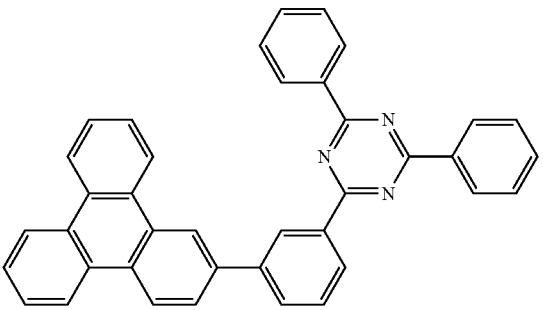
H53
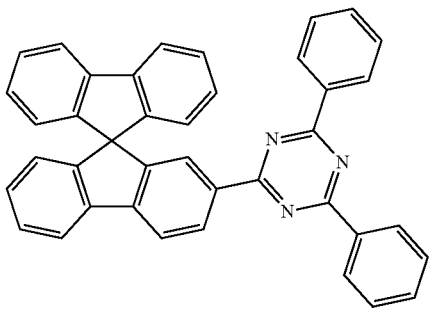
H54
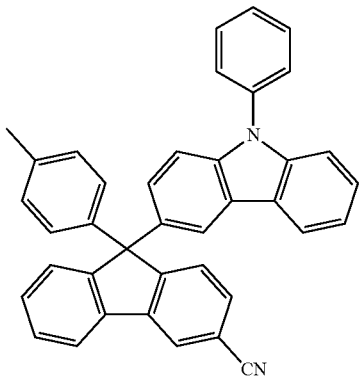
H55
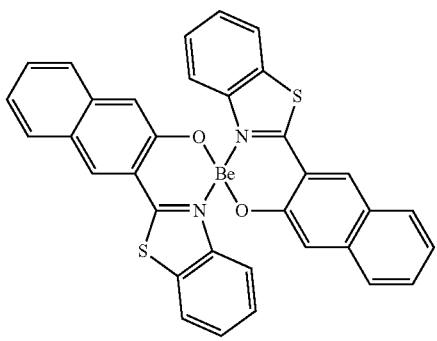

H56
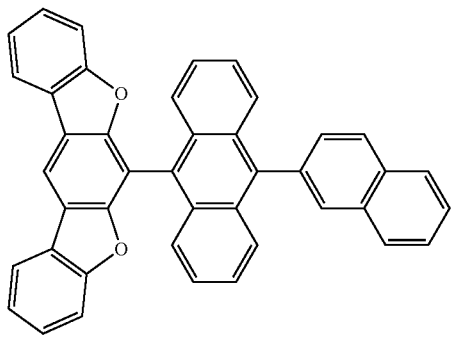
H57
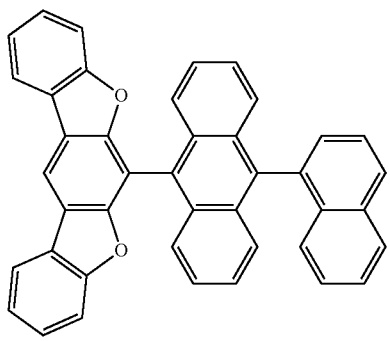
H58
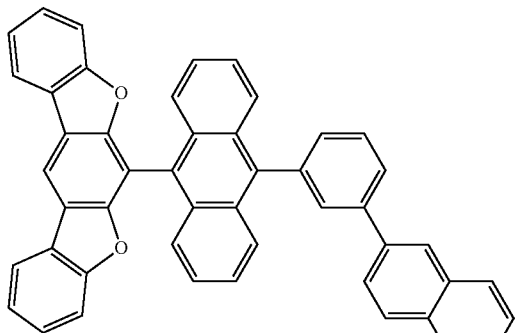
H59
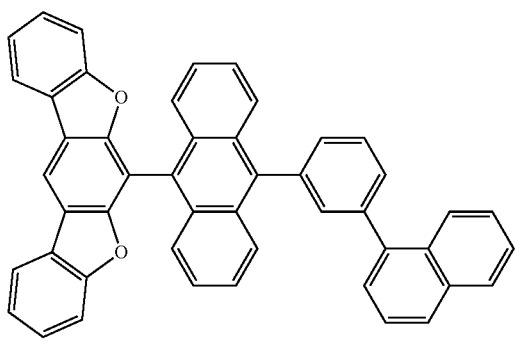
H60
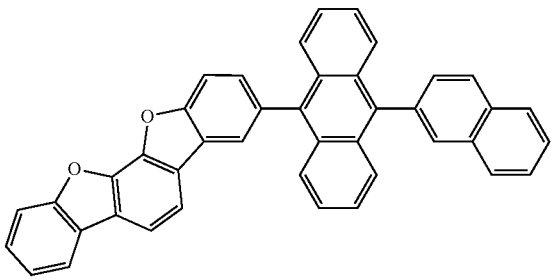
H61
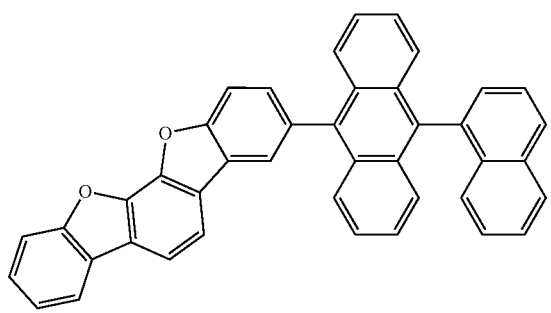
H62
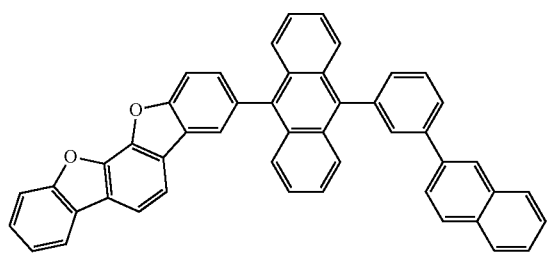
H63
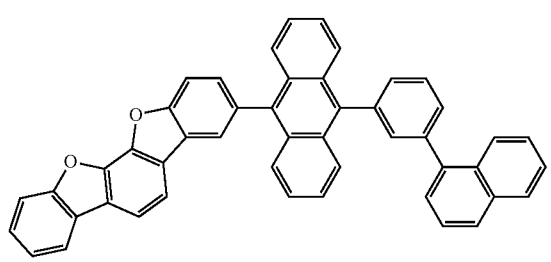
H64
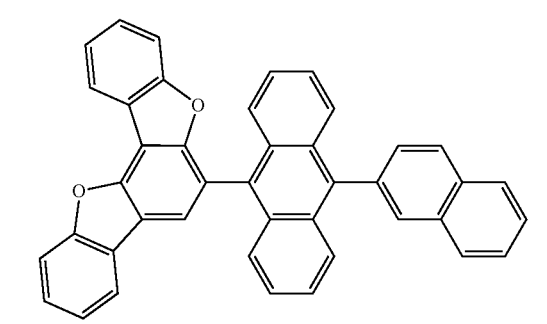

H65
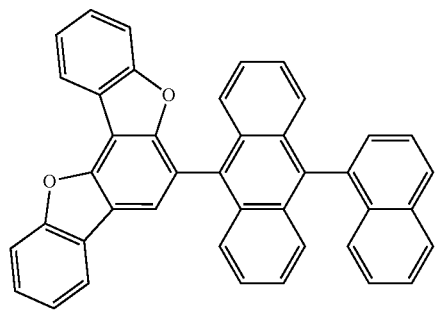
H66
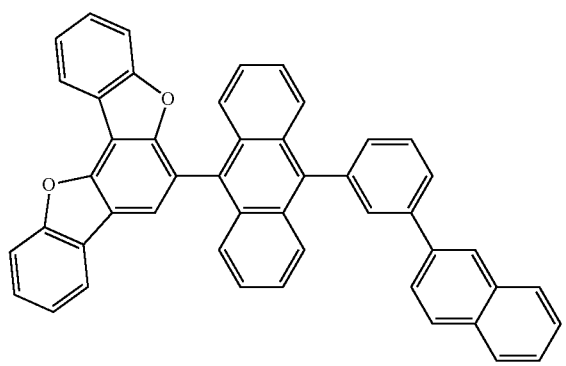
H67
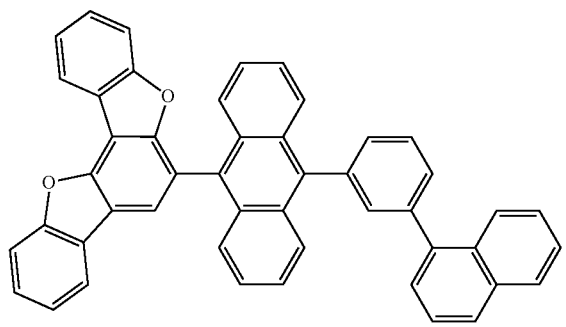
H68
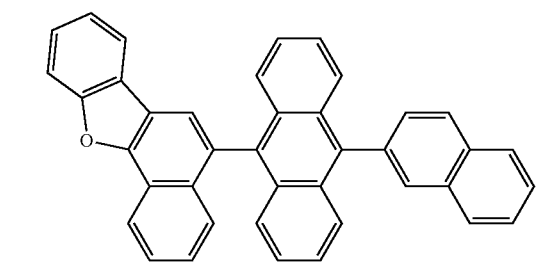
H69
H70
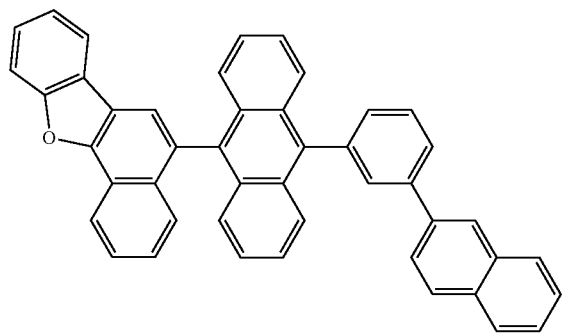
H71
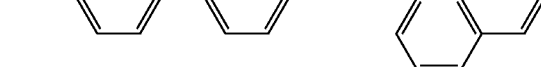
H72
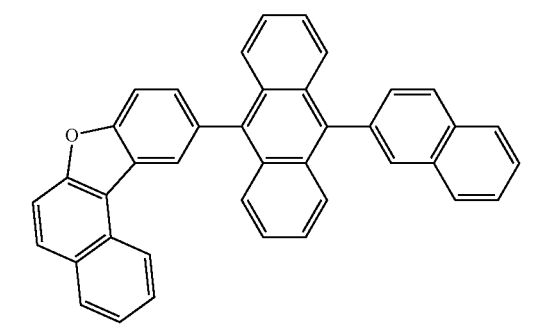
H73
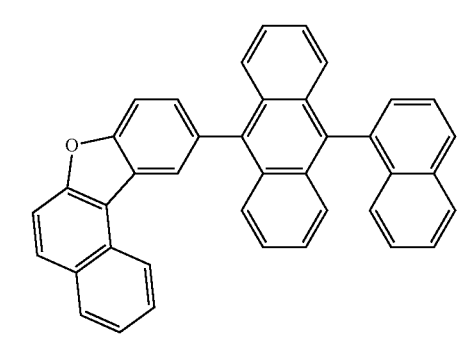

H74
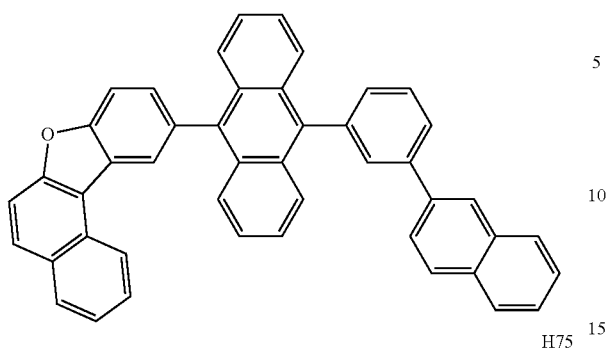
H75
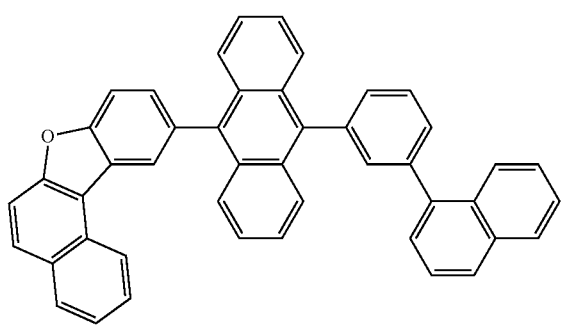
H76
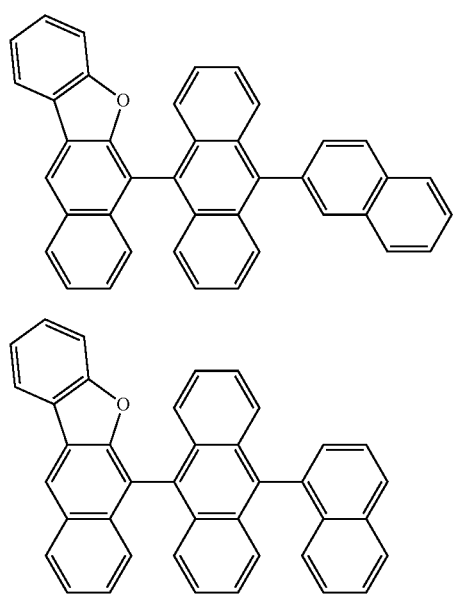
H77
H78
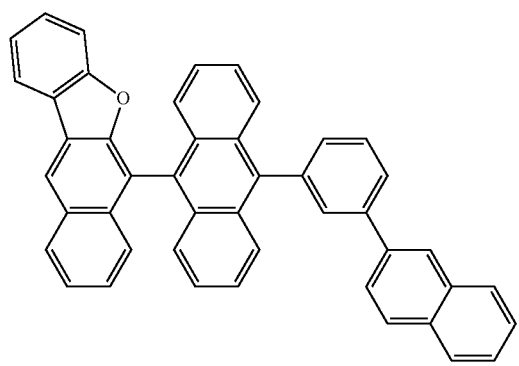
H79
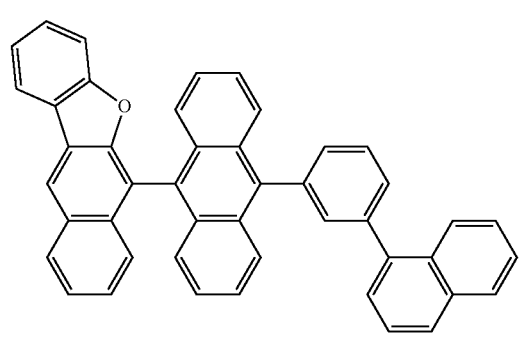
H80
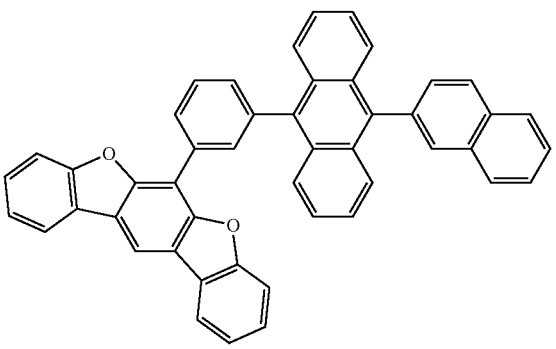
H81
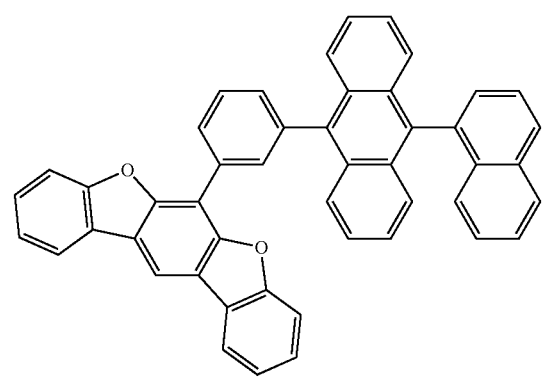
H82
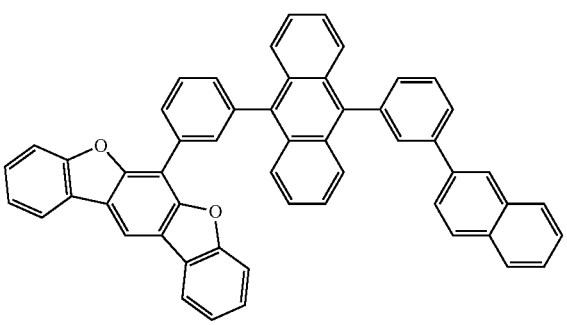

H83
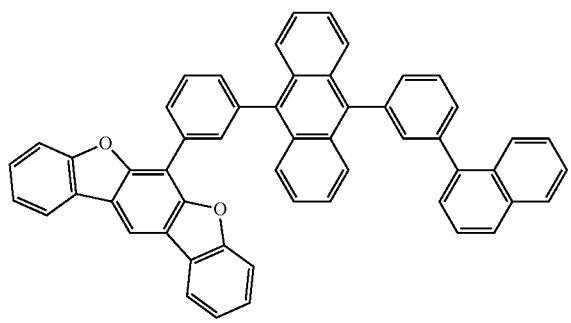
H84
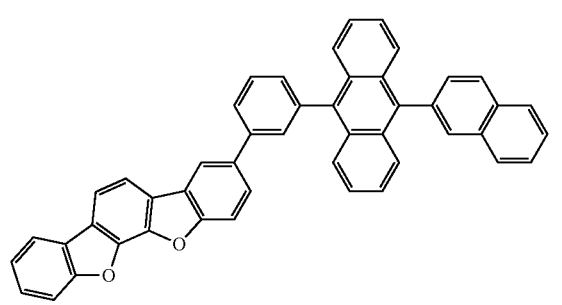
H85
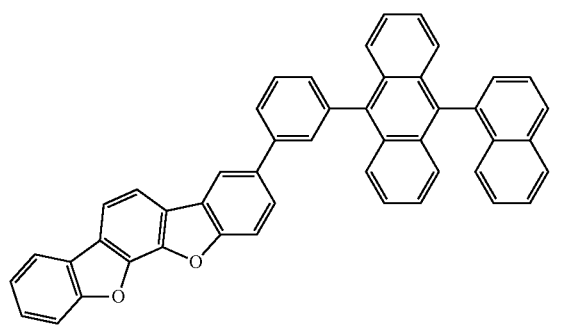
H86
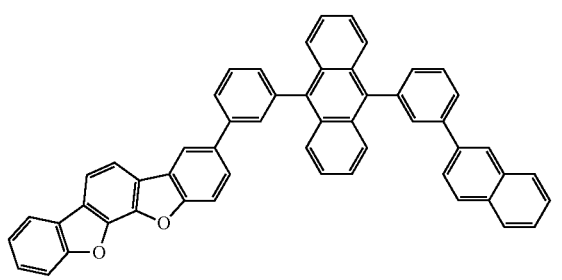
H87
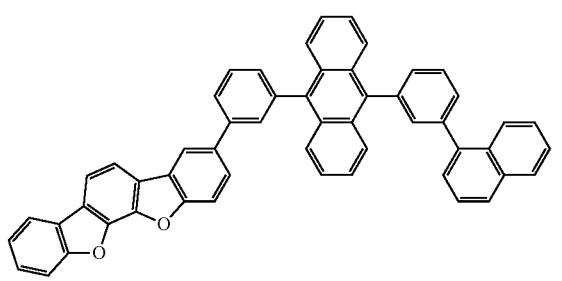
H88
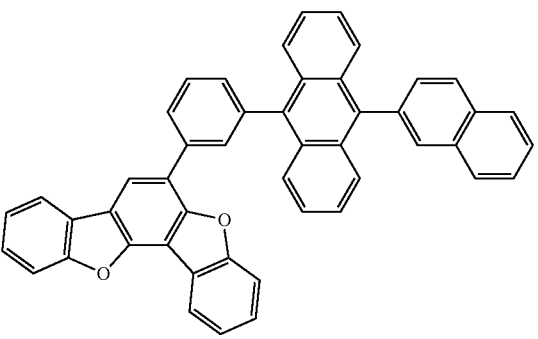
H89
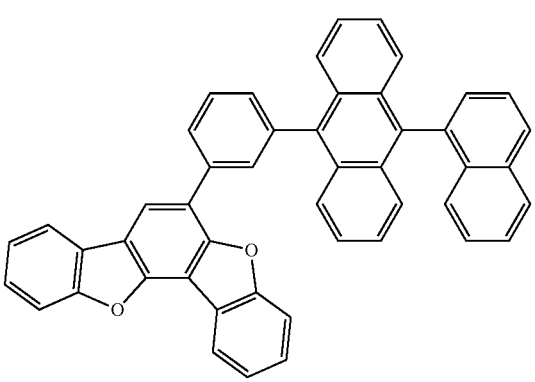
H90
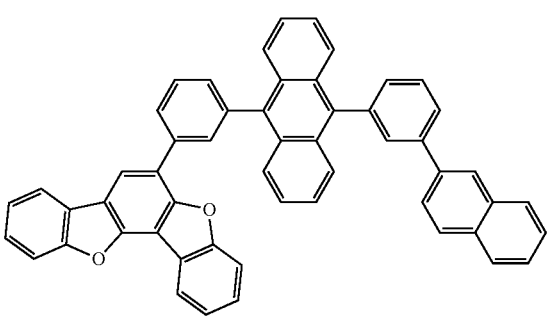
H91
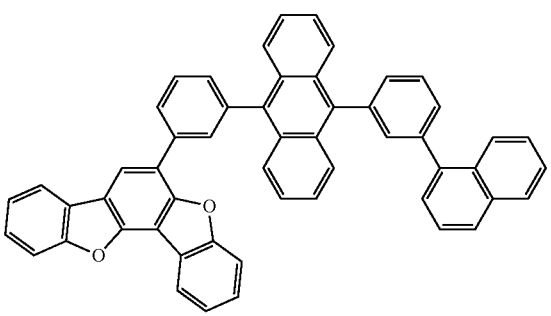

H92
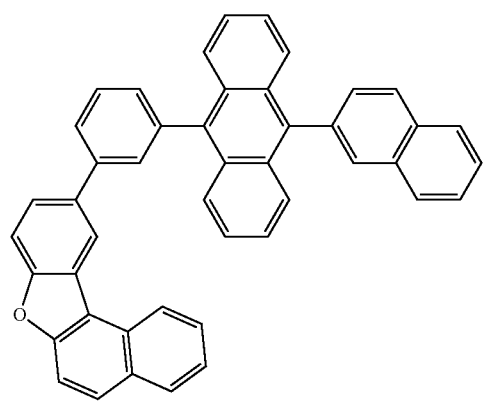
H93
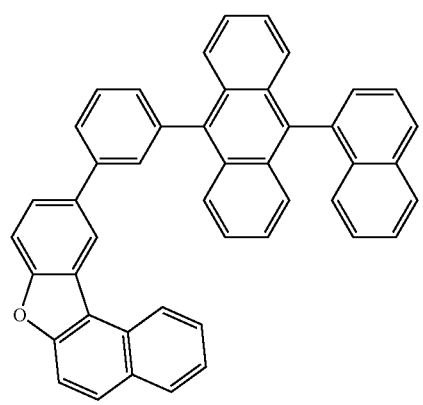
H94
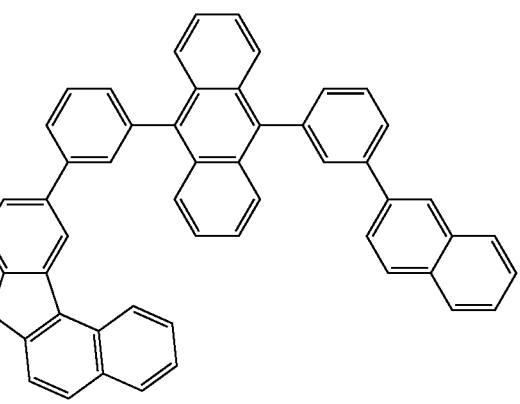
H95
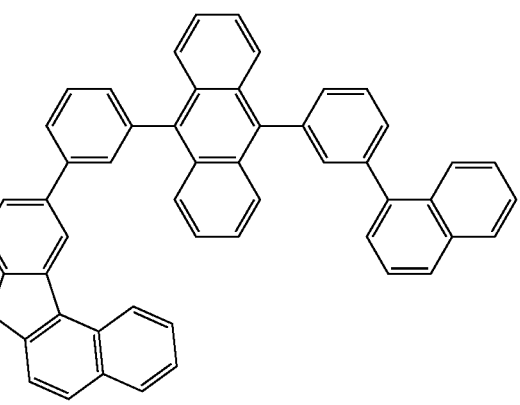
H96
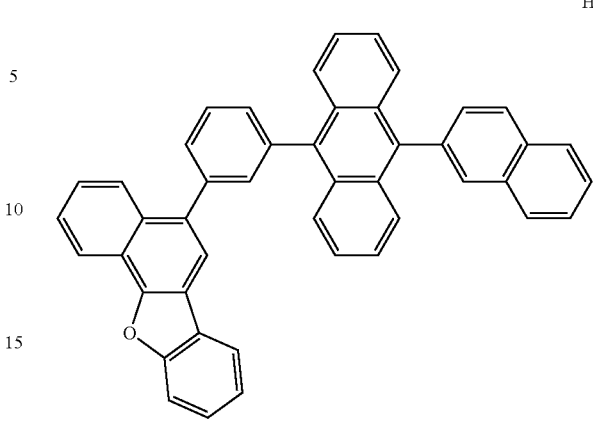
H97
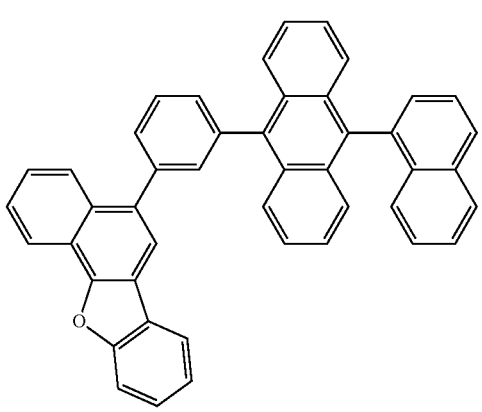
H98
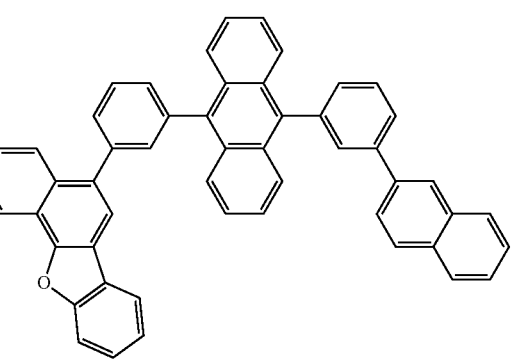
H99
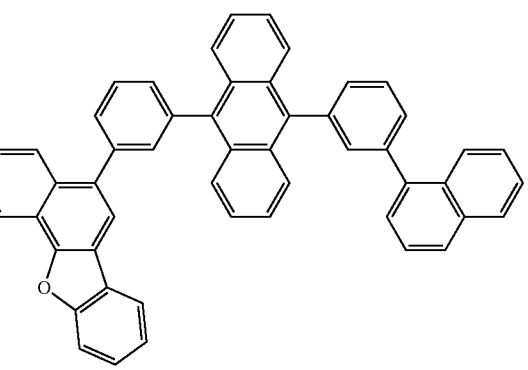

-continued
H100
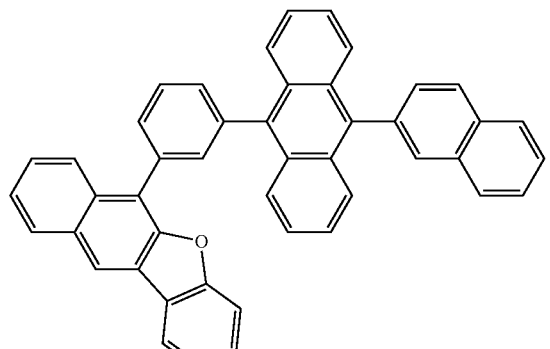
H101
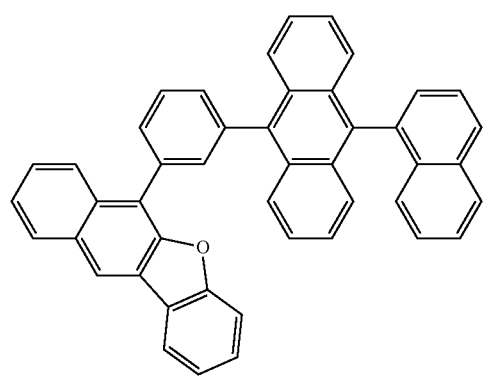
H102
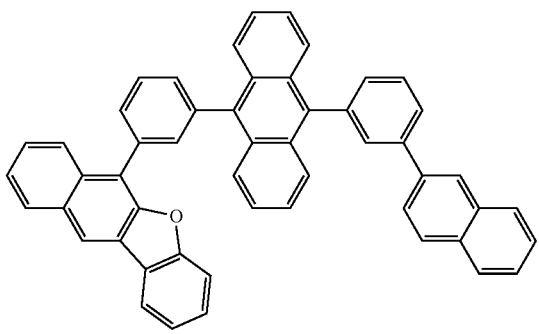
H103
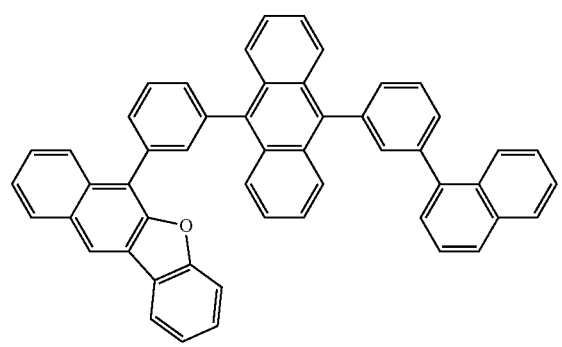
-continued
H104
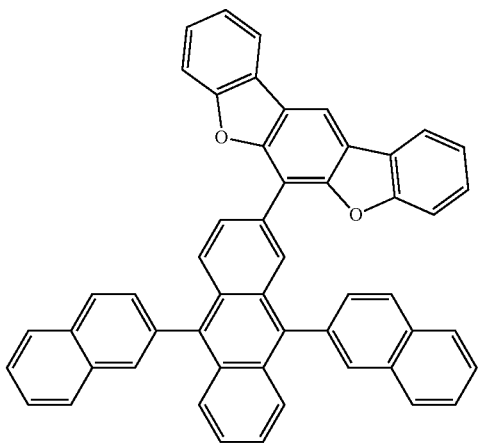
H105
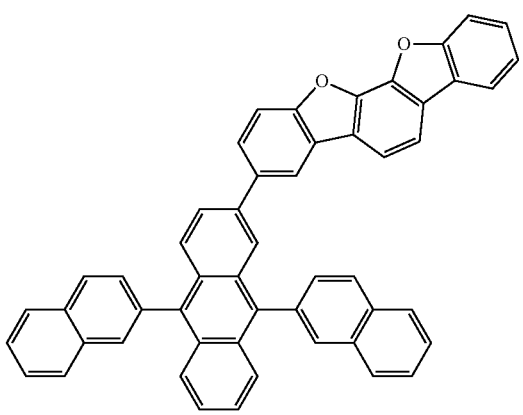
H106
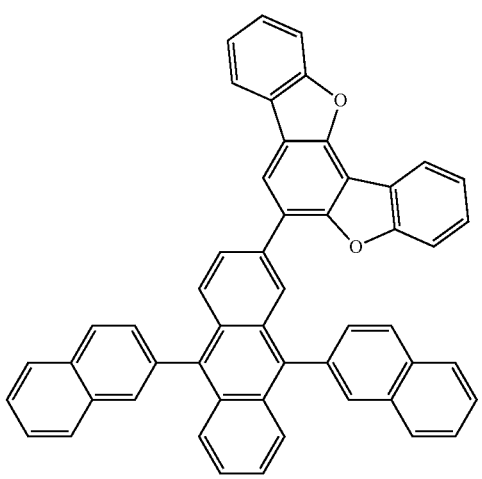

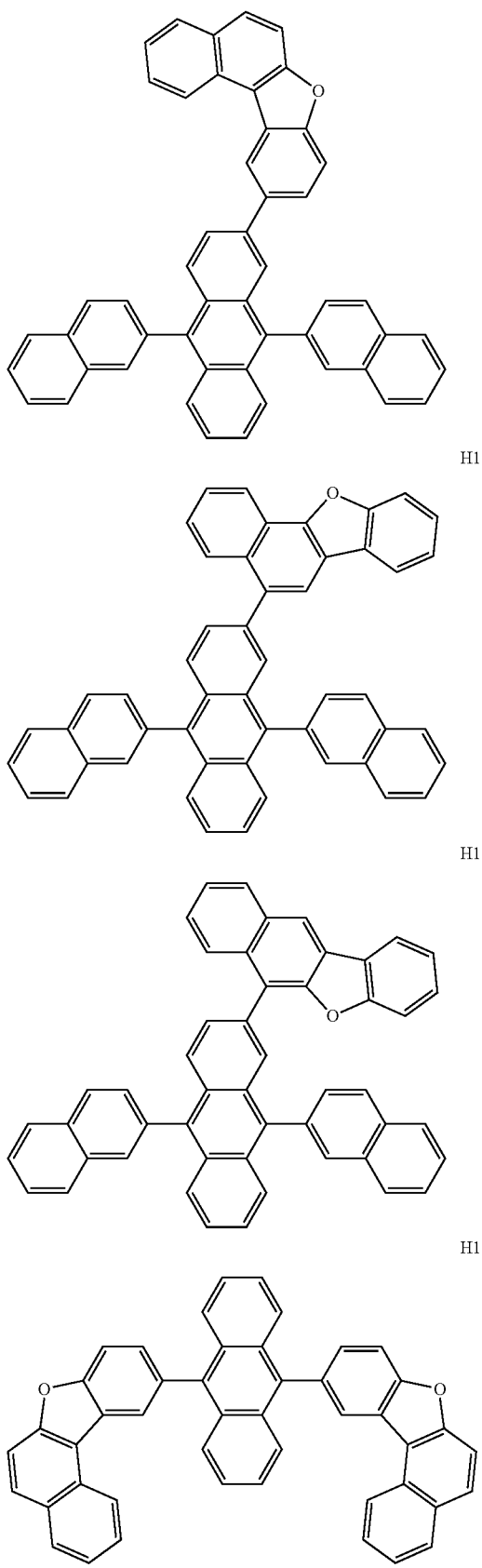
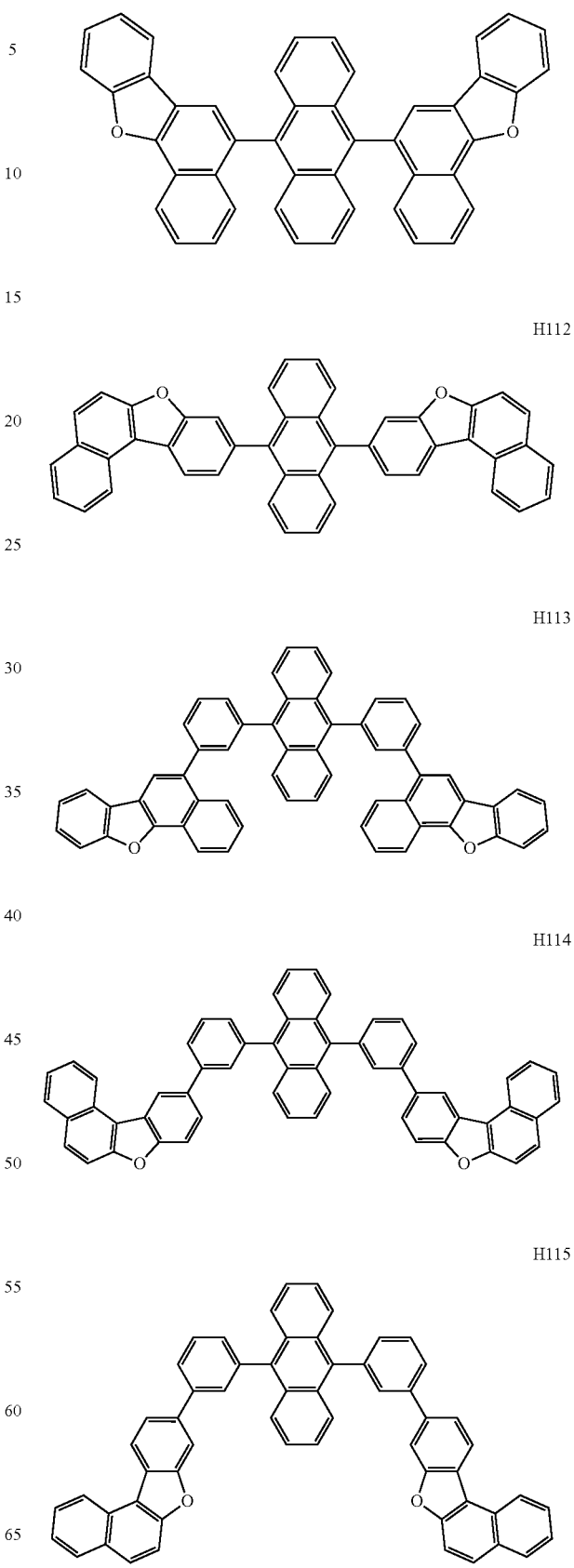

H116
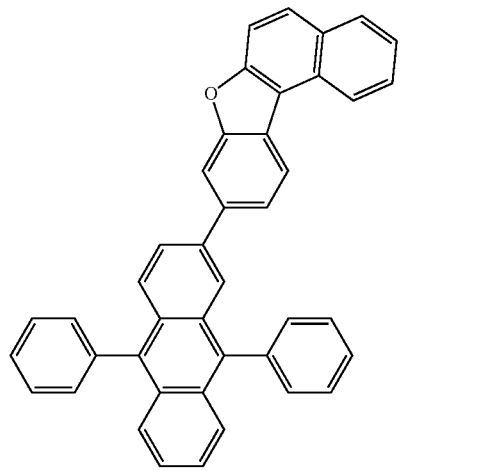
H117
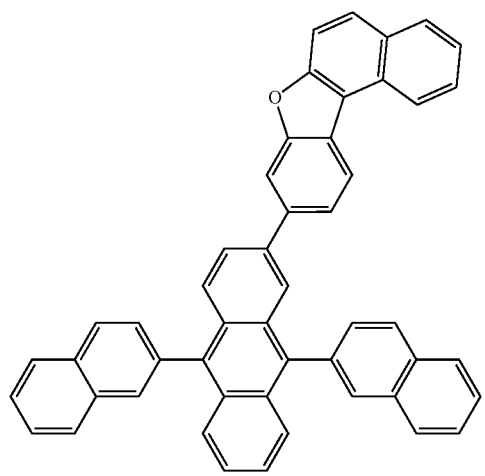
H118
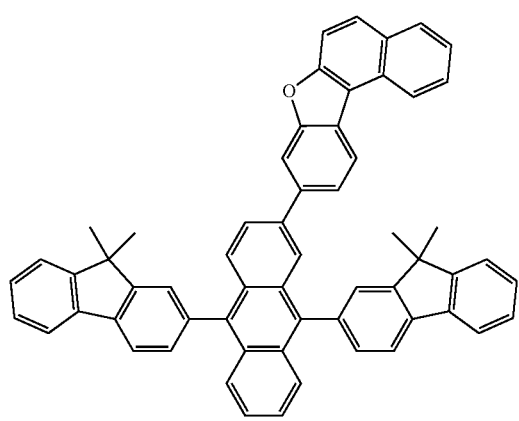
H119
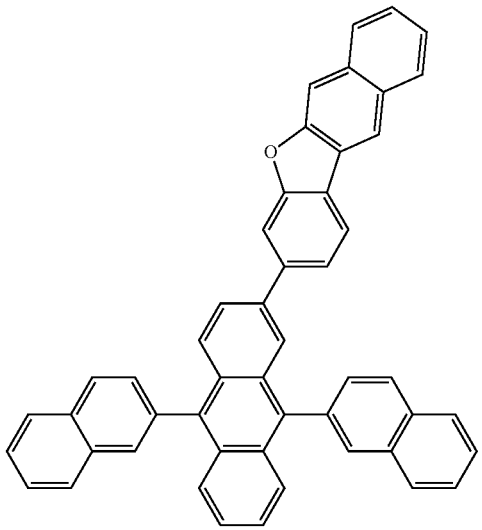
H120
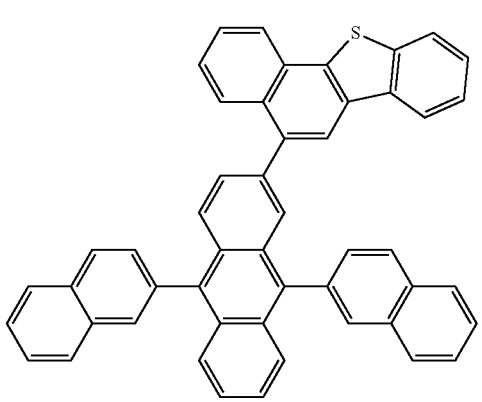
H121
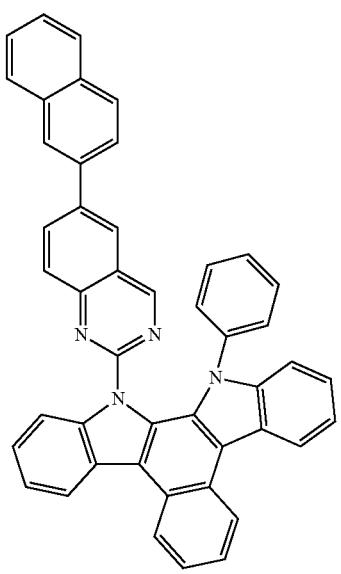

-continued

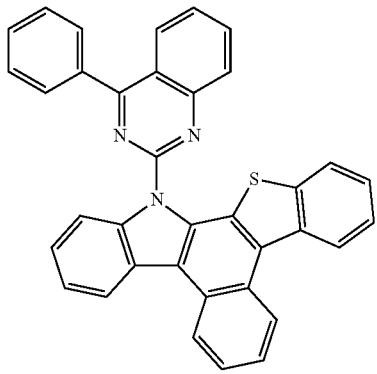
H122

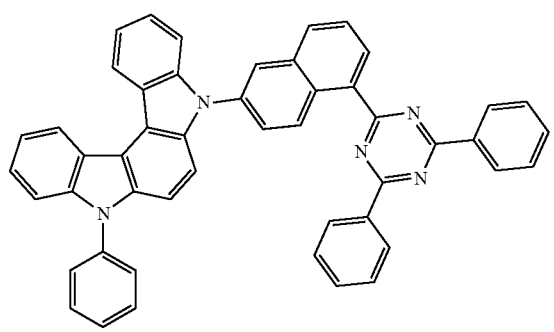
H123

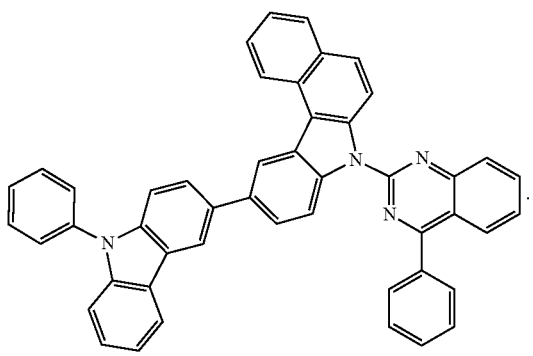
H124

The host may include a silicon-containing compound, a phosphine oxide-containing compound, or any combination thereof.

The host may have one or more suitable modifications, For example, the host may include only one kind of compound, or may include two or more kinds of different compounds.

Phosphorescent Dopant

The emission layer is a phosphorescent dopant and may include the first compound as described herein.

In some embodiments, when the first compound is included in the emission layer, and the first compound acts as an auxiliary dopant, the emission layer may include a phosphorescent dopant.

In an embodiment, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

Formula 401

$M(L_{401})_{xc1}(L_{402})_{xc2}$

Formula 402

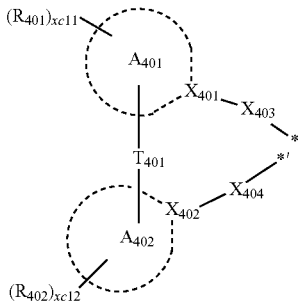

In Formulae 401 and 402,

M may be transition metal (for example, iridium (Ir), platinum (Pt), palladium (Pd), osmium (Os), titanium (Ti), gold (Au)hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more $L_{401}$(s) may be identical to or different from each other, $L_{402}$ may be an organic ligand, and xc2 may be 0, 1, 2, 3, or 4, and when xc2 is 2 or more, two or more $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)*', *—C($Q_{411}$)($Q_{412}$)*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and and *' in Formula 402 each indicate a binding site to M in Formula 401.

For example, in Formula 402, i) $X_{401}$ is nitrogen, and $X_{402}$ is carbon, or ii) each of $X_{401}$ and $X_{402}$ is nitrogen.

In an embodiment, when xc1 in Formula 402 is 2 or more, two rings $A_{401}$ in two or more $L_{401}$(s) may be optionally linked to each other via $T_{402}$, which is a linking group, and two rings $A_{402}$ may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of compounds PD1 to PD25, or any combination thereof:

PD1

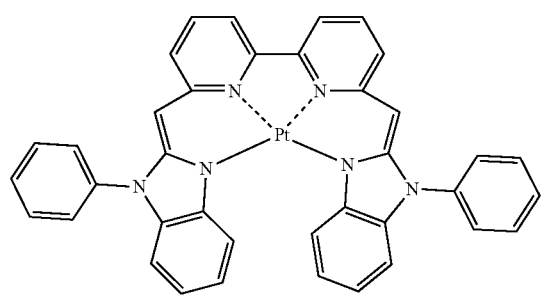

PD2

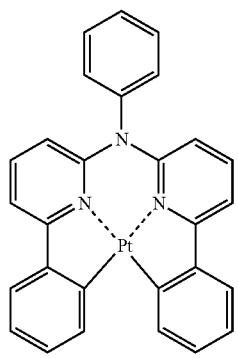

PD3

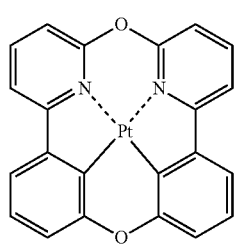

PD4

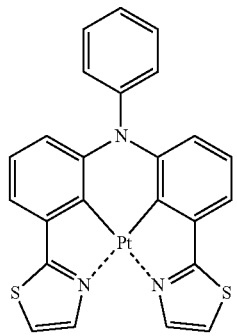

PD5

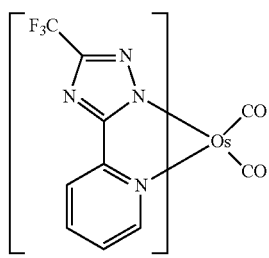

PD6

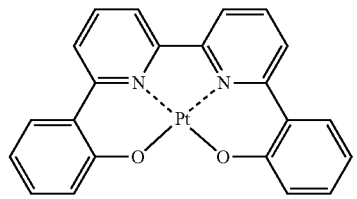

PD7

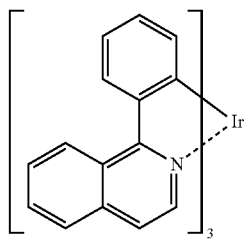

PD8

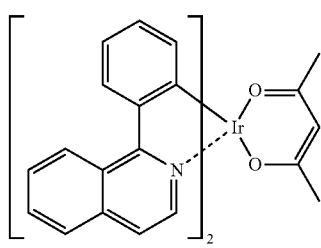

PD9

PD10 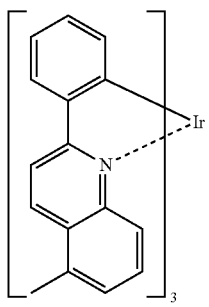
PD11 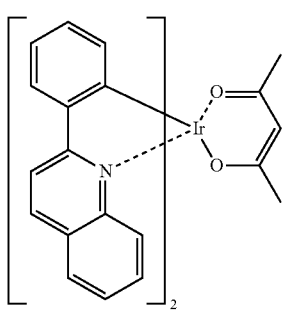
PD12 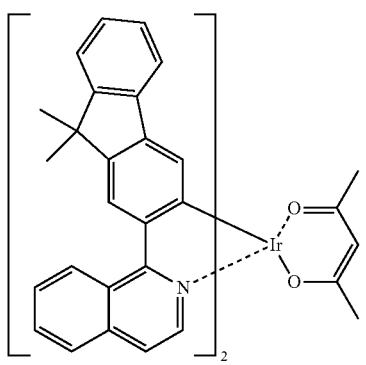
PD13 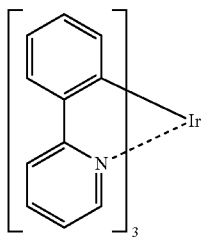
PD14 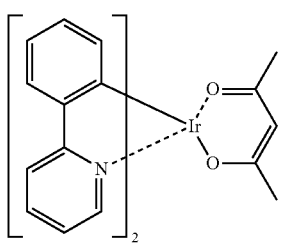
PD15 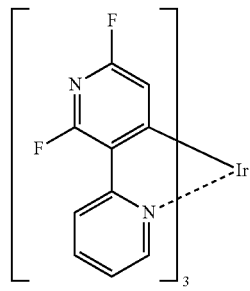
PD16 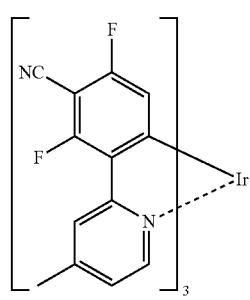
PD17 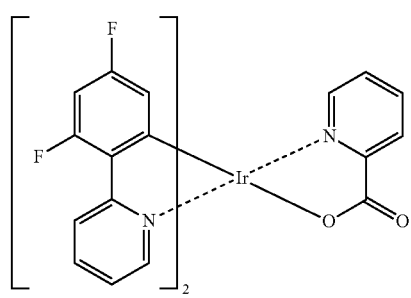
PD18 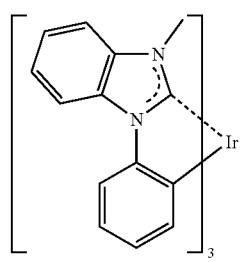
PD19 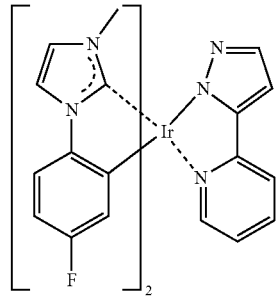

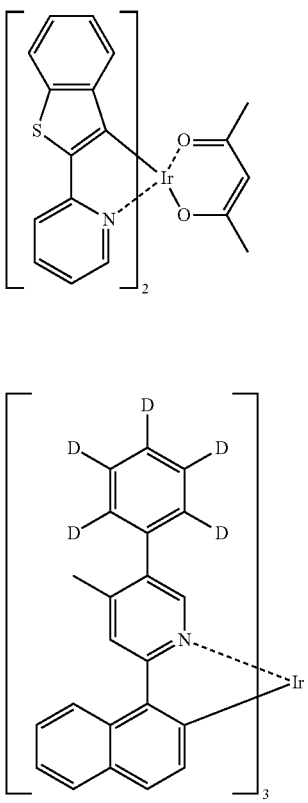

PD20

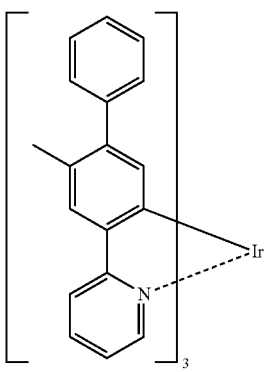

PD22

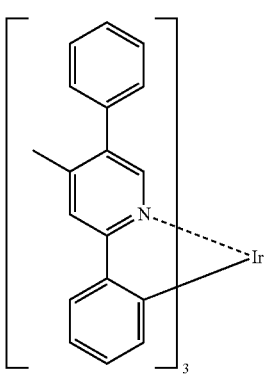

PD23

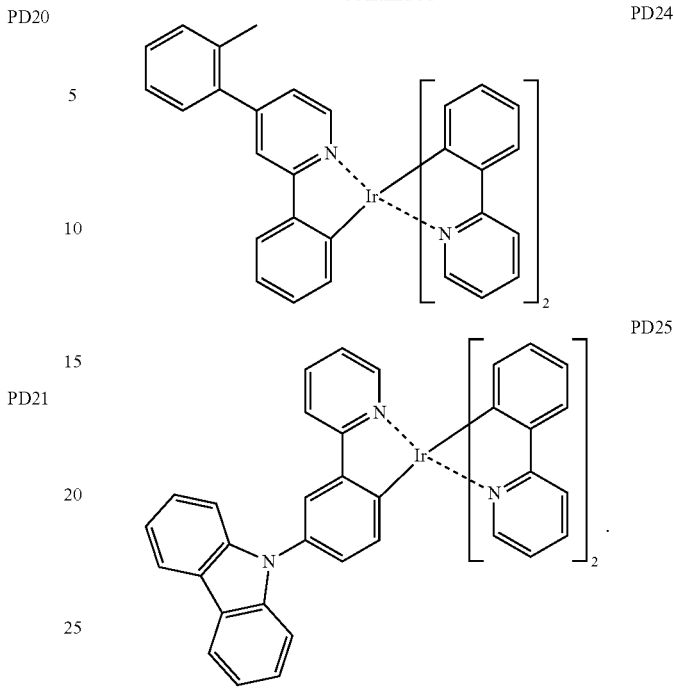

PD24

PD25

Fluorescent Dopant

When the first compound is included in the emission layer, and the first compound acts as an auxiliary dopant, the emission layer may further include a fluorescent dopant.

In some embodiments, when the first compound is included in the emission layer, and the first compound acts as a phosphorescent dopant, the emission layer may further include an auxiliary dopant.

The fluorescent dopant and auxiliary dopant may each independently include an arylamine compound, a styrylamine compound, a boron-containing compound, or any combination thereof.

For example, the fluorescent dopant and auxiliary dopant may each independently include a compound represented by Formula 501:

Formula 501

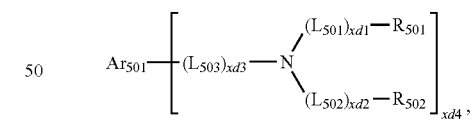

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

In an embodiment, the fluorescent dopant and auxiliary dopant may include: one of Compounds FD1 to FD36; DPVBi; DPAVBi; or any combination thereof:
FD1
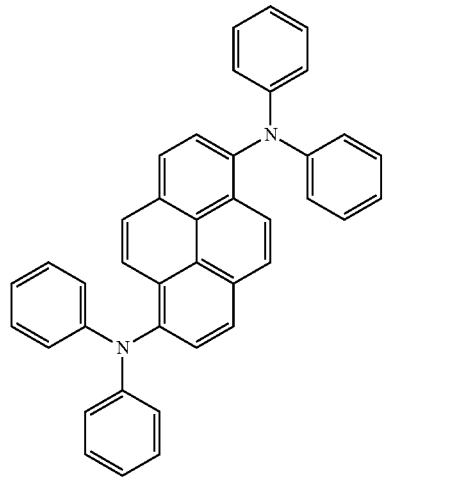
FD2
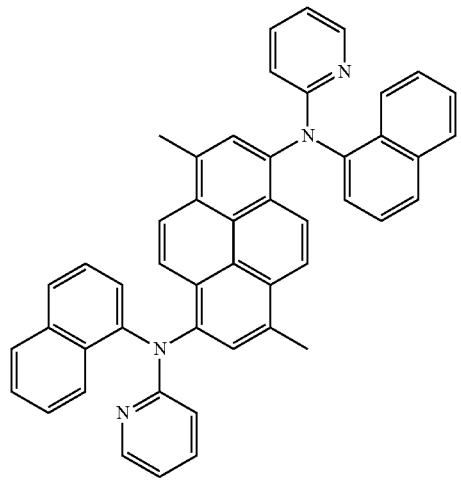
FD3
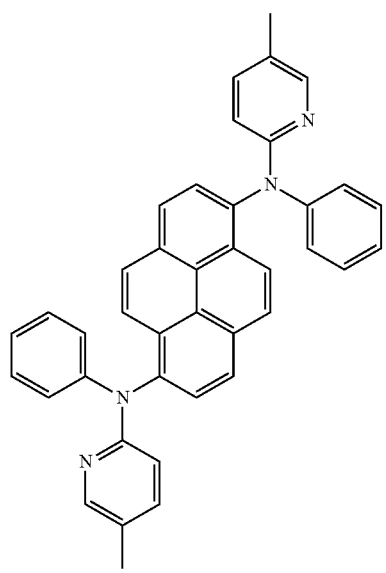
-continued
FD4
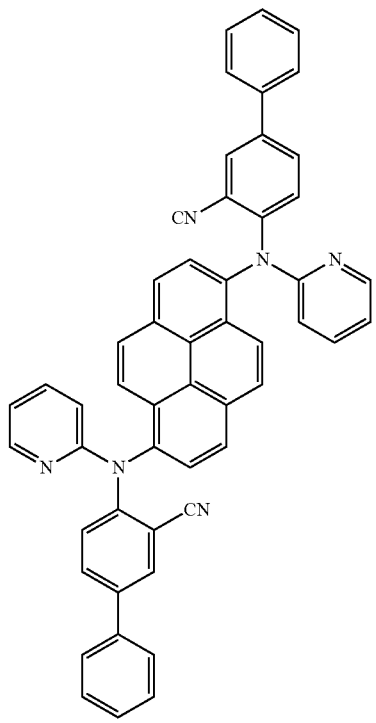
FD5
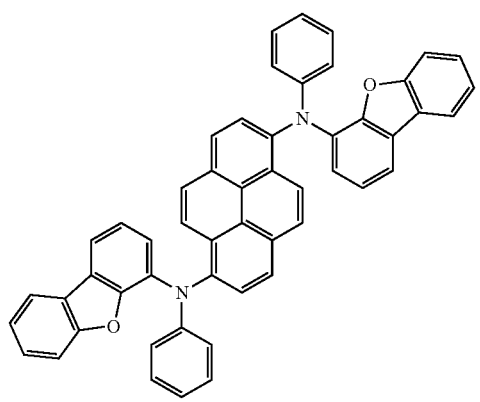
FD6
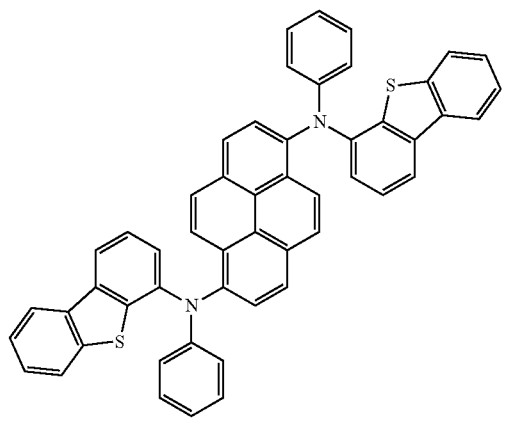

-continued
FD7
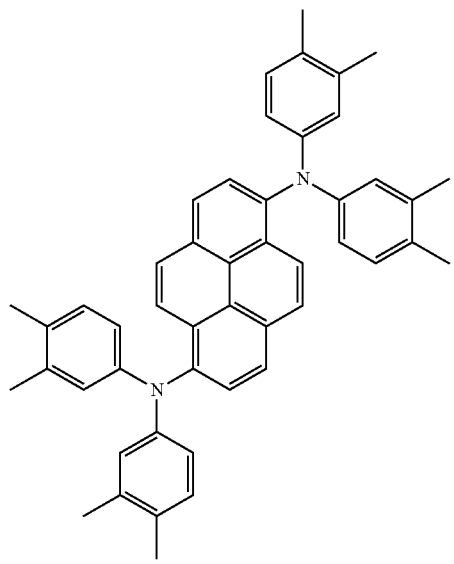
FD10
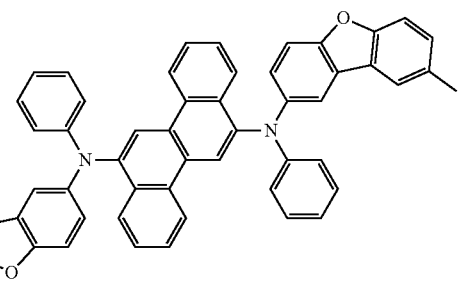
FD8
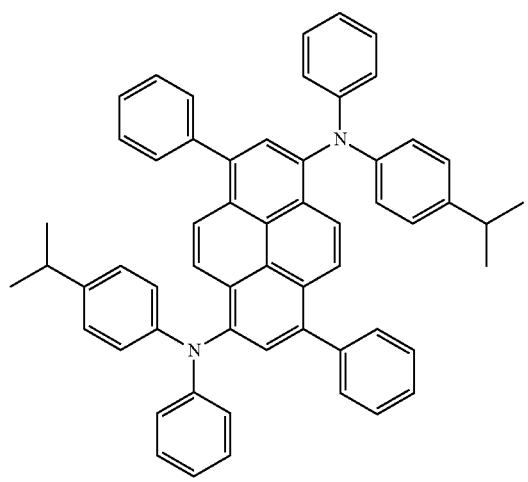
FD11
FD12
FD9
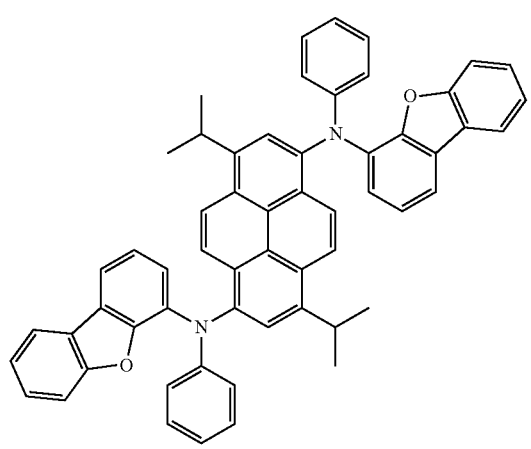
FD13
FD14
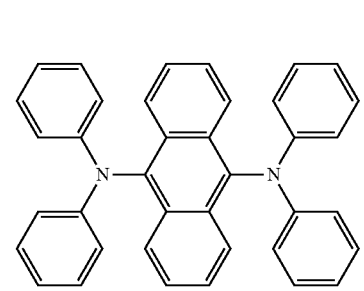

FD15
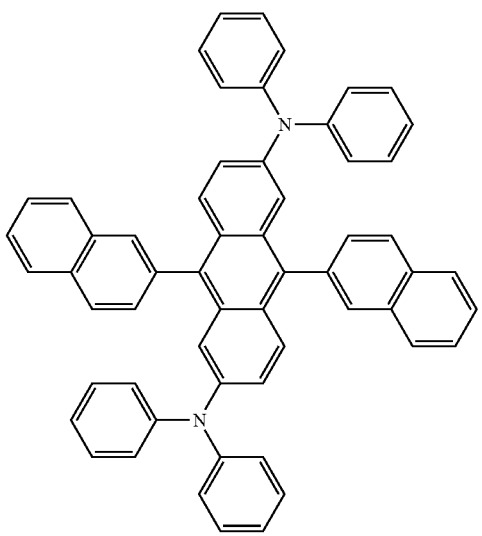
FD19
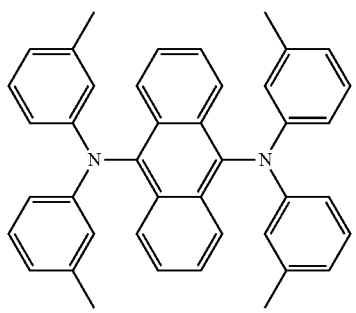
FD16
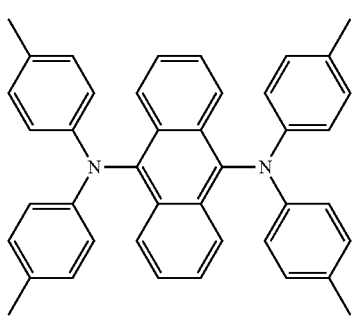
FD20
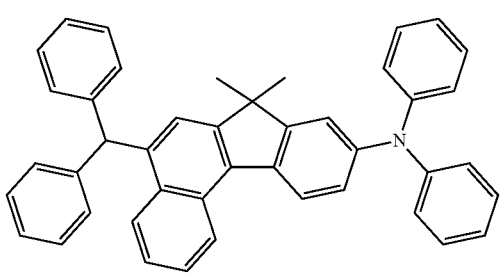
FD17
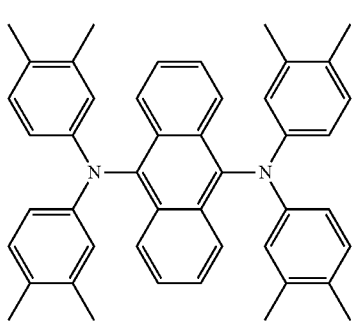
FD21
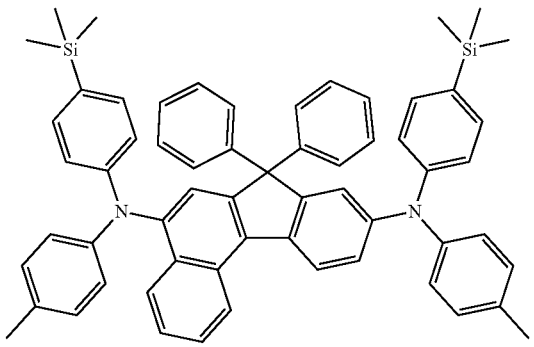
FD18
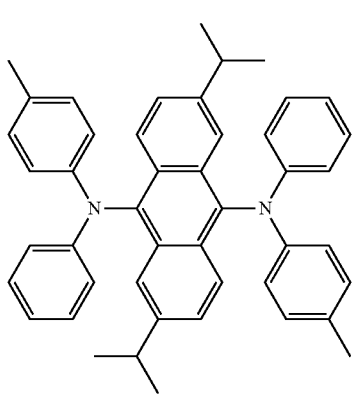
FD22
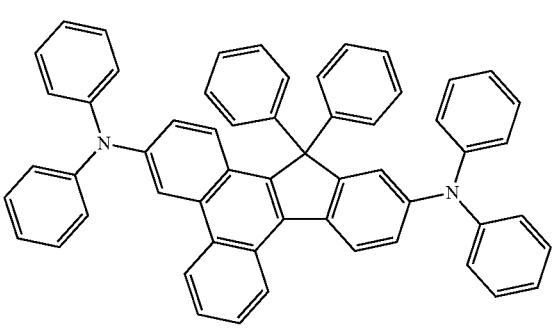

FD23
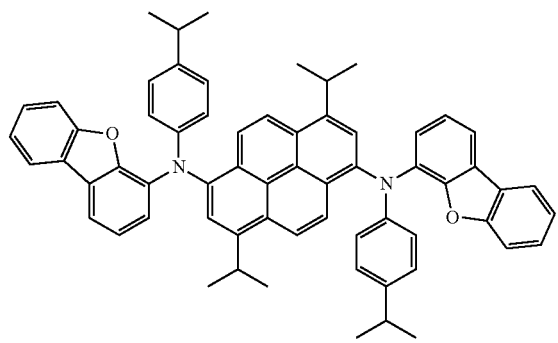
FD24
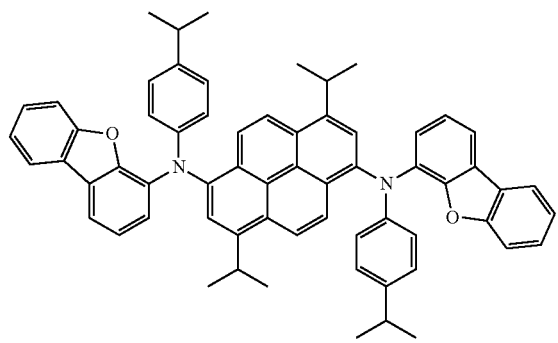
FD25
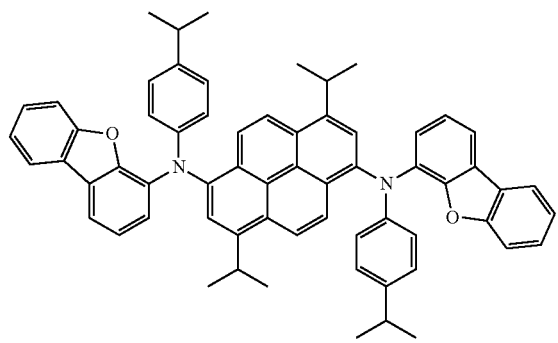
FD26
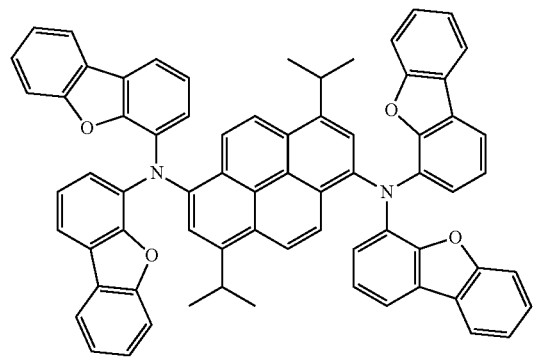
FD27
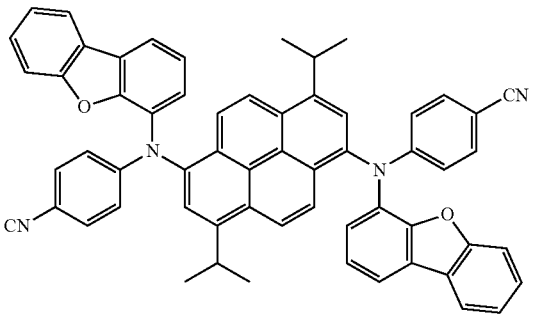
FD28
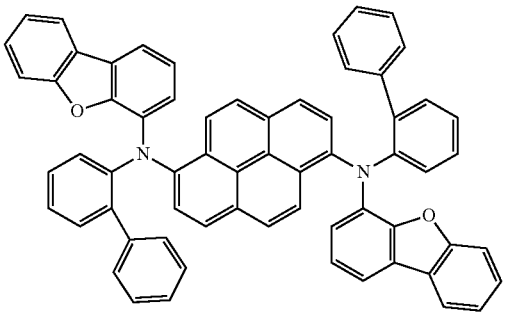
FD29
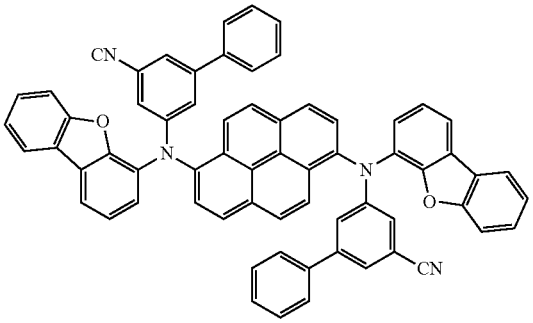
FD30
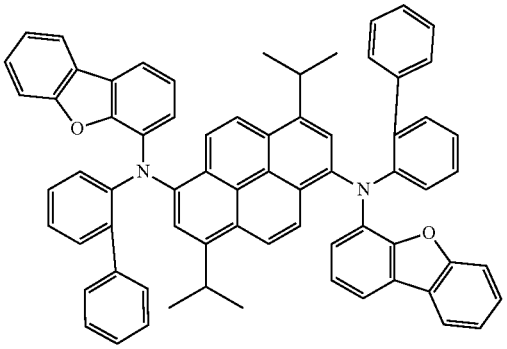

-continued

FD31
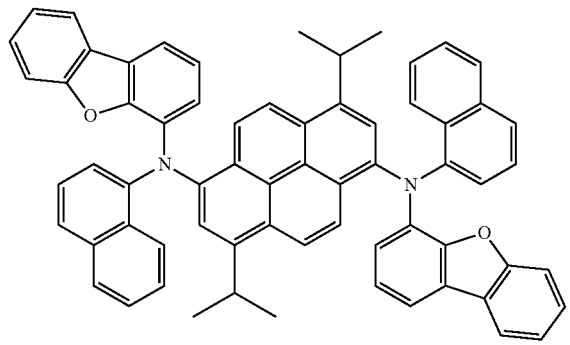

FD32
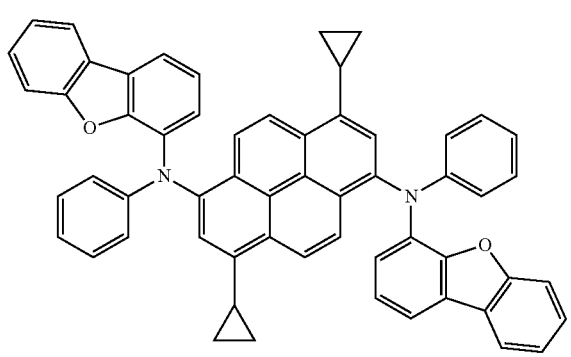

FD33
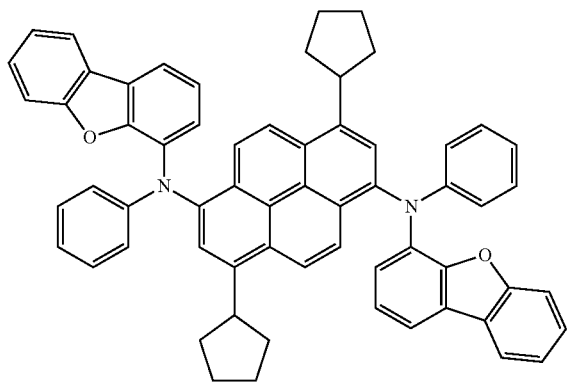

FD34
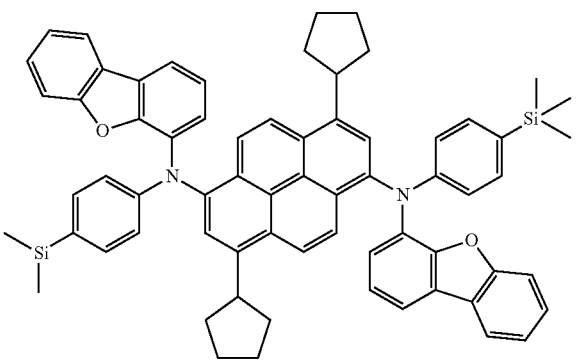

-continued

FD35
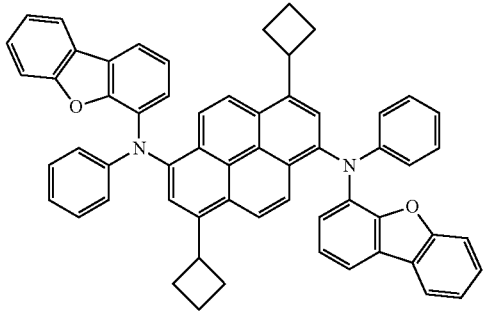

FD36
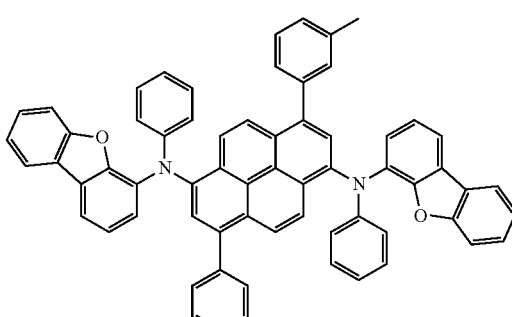

DPVBi
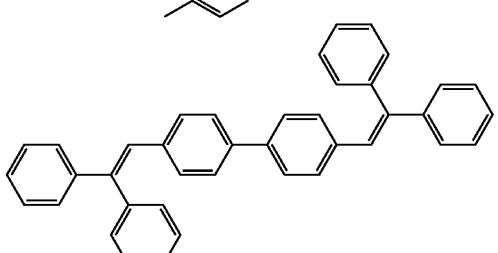

DPAVBi
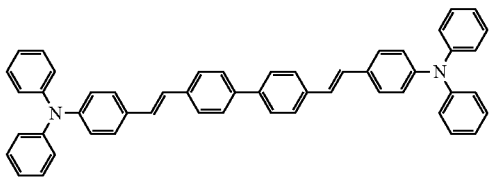

In some embodiments, the fluorescent dopant and auxiliary dopant may each independently include a fourth compound represented by Formula 502 or 503 as described herein.

Delayed Fluorescence Material

In an embodiment, the emission layer may include a delayed fluorescence material.

The delayed fluorescence material may be selected from compounds capable of emitting delayed fluorescence via a delayed fluorescence emission mechanism.

The delayed fluorescence material included in the emission layer may act as (e.g., be) a host or a dopant depending on the kind (e.g., type) of other materials included in the emission layer.

In an embodiment, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence material may effectively occur, and thus, the emission efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, and/or a π electron-deficient nitrogen-containing $C_1$-$C_{60}$ cyclic group), and/or ii) a material including a $C_8$-$C_{60}$ polycyclic group in which two or more cyclic groups are condensed while sharing a boron (B) atom.

In an embodiment, the delayed fluorescence material may include at least one of the following Compounds DF1 to DF9:

DF1

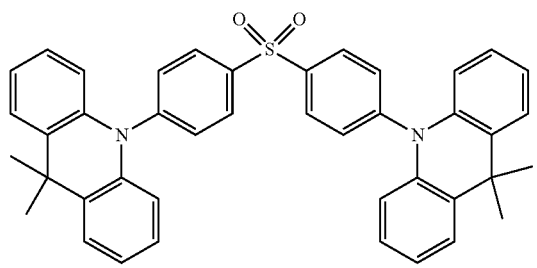

(DMAC-DPS)

DF2

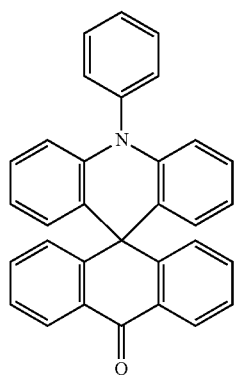

(ACRFLCN)

DF3

(ACRSA)

DF4

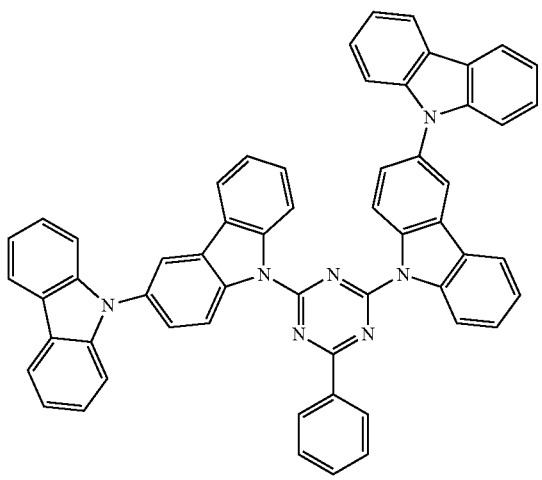

(CC2TA)

DF5

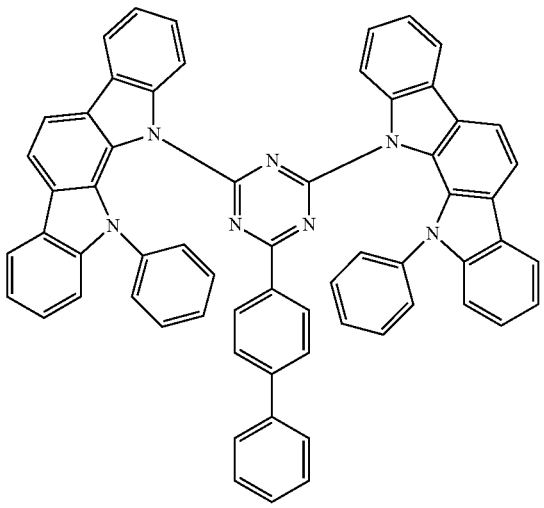

(PIC-TRZ)

DF6

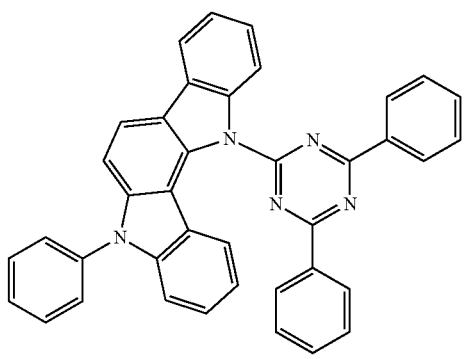

(PIC-TRZ2)

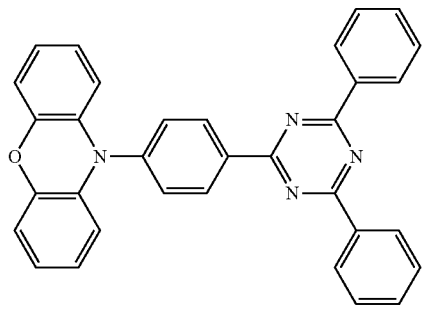

(PXZ-TRZ)

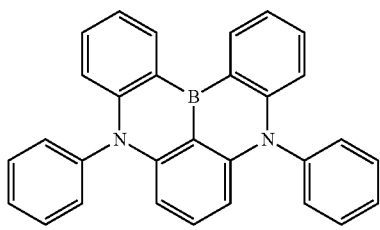

(DABNA-1)

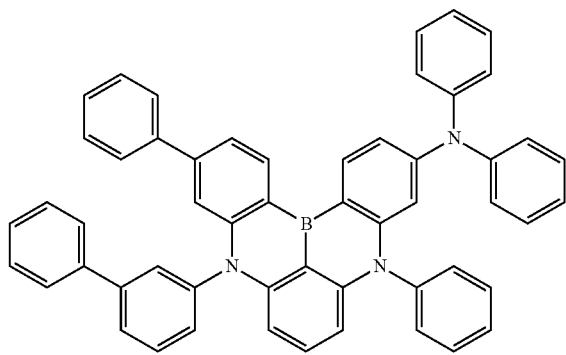

(DABNA-2)

Quantum Dot

The emission layer may include a quantum dot.

In the present specification, the term "quantum dot" refers to a crystal of a semiconductor compound, and may include any material capable of emitting light of various emission wavelengths according to the size (e.g., diameter) of the crystal.

A diameter of the quantum dot may be, for example, in a range of about 1 nm to about 10 nm.

The quantum dot may be synthesized by a wet chemical process, a metal organic (e.g., organometallic) chemical vapor deposition process, a molecular beam epitaxy process, or any suitable process similar thereto.

In the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process that is more easily performed than vapor deposition methods, (such as metal organic chemical vapor deposition (MOCVD) and/or molecular beam epitaxy (MBE)), and which is a low cost process.

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound; or any combination thereof.

Non-limiting examples of the Group II-VI semiconductor compound may include a binary compound (such as CdSe, CdTe, ZnS, ZnSe, ZnTe, ZnO, HgS, HgSe, HgTe, MgSe, and/or MgS); a ternary compound (such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS); a quaternary compound (such as CdZnSeS, CdZnSeTe, CdZnSTe, CdHgSeS, CdHgSeTe, CdHgSTe, HgZnSeS, HgZnSeTe, and/or HgZnSTe); or any combination thereof.

Non-limiting examples of the Group III-V semiconductor compound may include a binary compound (such as GaN, GaP, GaAs, GaSb, AlN, AlP, AlAs, AlSb, InN, InP, InAs, InSb, and/or the like); a ternary compound (such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like); a quaternary compound (such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, GaAlNP, and/or the like); or any combination thereof. The Group III-V semiconductor compound may further include a Group II element. Non-limiting examples of the Group III-V further including a Group II element are InZnP, InGaZnP, InAlZnP, etc.

Non-limiting examples of the Group III-VI semiconductor compound may include a binary compound (such as GaS, GaSe, $Ga_2Se_3$, GaTe, InS, InSe, $In_2S_3$, $In_2Se_3$, and/or InTe); a ternary compound (such as $InGaS_3$, and/or $InGaSe_3$); or any combination thereof.

Non-limiting examples of the Group I-III-VI semiconductor compound may include a ternary compound (such as AgInS, $AgInS_2$, CuInS, $CuInS_2$, $CuGaO_2$, $AgGaO_2$, and/or $AgAlO_2$); or any combination thereof.

Non-limiting examples of the Group IV-VI semiconductor compound may include a binary compound (such as SnS, SnSe, SnTe, PbS, PbSe, PbTe, and/or the like); a ternary compound (such as SnSeS, SnSeTe, SnSTe, PbSeS, PbSeTe, PbSTe, SnPbS, SnPbSe, SnPbTe, and/or the like); a quaternary compound (such as SnPbSSe, SnPbSeTe, SnPbSTe, and/or the like); or any combination thereof.

The Group IV element or compound may include a single element compound (such as Si and/or Ge); a binary compound (such as SiC and/or SiGe); or any combination thereof.

Each element included in a multi-element compound (such as the binary compound, the ternary compound, and/or the quaternary compound), may exist (e.g., be included) in a particle with a substantially uniform concentration (e.g., concentration distribution) or non-uniform concentration.

In one embodiment, the quantum dot may have a single structure or a dual core-shell structure. In the case of the quantum dot having a single structure, the concentration of each element included in the corresponding quantum dot may be substantially uniform. In an embodiment, in the dual core-shell structure, the material contained in the core and the material contained in the shell may be different from each other.

The shell of the quantum dot may act as (e.g., be) a protective layer to reduce or prevent chemical degeneration of the core to maintain semiconductor characteristics and/or as a charging layer to impart electrophoretic characteristics to the quantum dot. The shell may be a single layer or a multi-layer. The interface between the core and the shell may have a concentration gradient in which the concentration of elements existing in the shell decreases toward the center of the of the core.

Non-limiting examples of the material in the shell of the quantum dot may include an oxide of a metal, a metalloid, or a non-metal; a semiconductor compound; or any combination thereof. Non-limiting examples of the oxide of a metal, a metalloid, or a non-metal may include a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO); a ternary compound (such as $MgAl_2O_4$, $CoFe_2O_4$, $NiFe_2O_4$, and/or $CoMn_2O_4$); or any combination thereof. Non-limiting examples of the semiconductor compound may include, as described herein, Group II-VI semiconductor compounds; Group III-V semiconductor compounds; Group III-VI semiconductor compounds; Group I-III-VI semiconductor compounds; Group IV-VI semiconductor compounds; or any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within these ranges, color purity or color gamut may be increased. In addition, because the light emitted through the quantum dot is emitted in all directions, the wide viewing angle can be improved.

In addition, the quantum dot may be or include a spherical particle, a pyramidal particle, a multi-arm particle, a cubic nanoparticle, a nanotube particle, a nanowire particle, a nanofiber particle, and/or a nanoplate particle.

Because the energy band gap can be adjusted by controlling the size of the quantum dot, light having various wavelength bands can be obtained from the quantum dot emission layer. Therefore, by utilizing quantum dots of different sizes, a light-emitting display to emit light of various suitable wavelengths may be implemented. In an embodiment, the size of the quantum dot may be selected to emit red, green and/or blue light. In addition, the size of the quantum dot may be configured to emit white light by combining light of various suitable colors.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the constituting layers of each structure are sequentially stacked from an emission layer.

In an embodiment, the electron transport region (for example, the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

$$[Ar_{601}]_{xe11}\text{-}[(L_{601})_{xe1}\text{-}R_{601}]_{xe21}, \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more $Ar_{601}$(s) may be linked via a single bond.

In an embodiment, $Ar_{601}$ in Formula 601 may be a substituted or unsubstituted anthracene group.

In an embodiment, the electron transport region may include a compound represented by Formula 601-1:

Formula 601-1

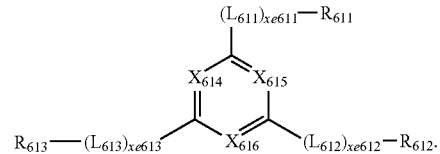

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group substituted or unsubstituted at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10- phenanthroline (BCP), 4,7-diphenyl-1,10-phenanthroline (Bphen), Alq₃, BAlq, TAZ, NTAZ, or any combination thereof:
ET1
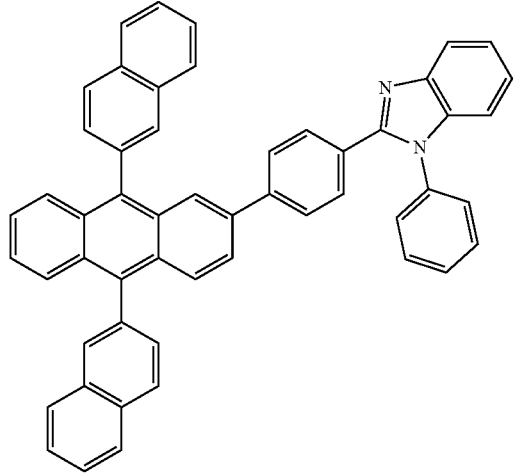
ET2
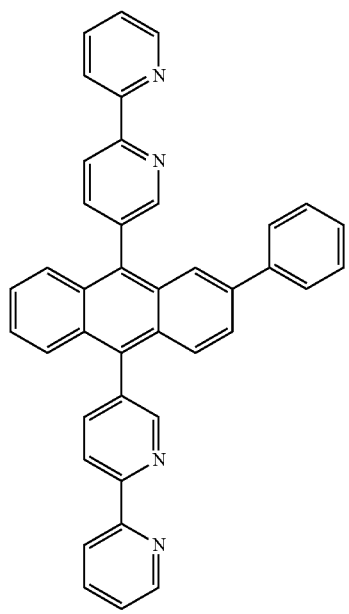
-continued
ET3
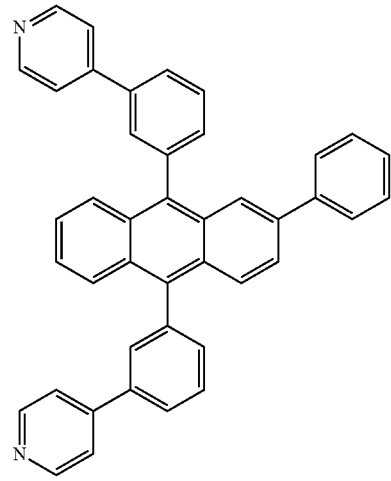
ET4
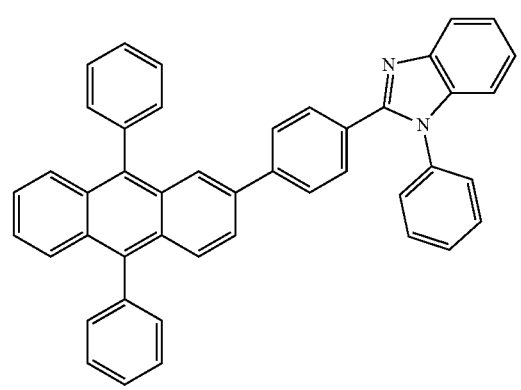
ET5

ET6
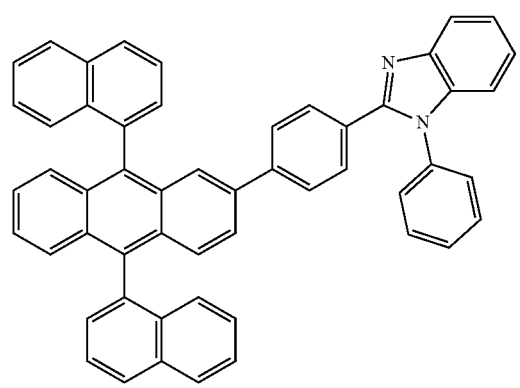
ET7
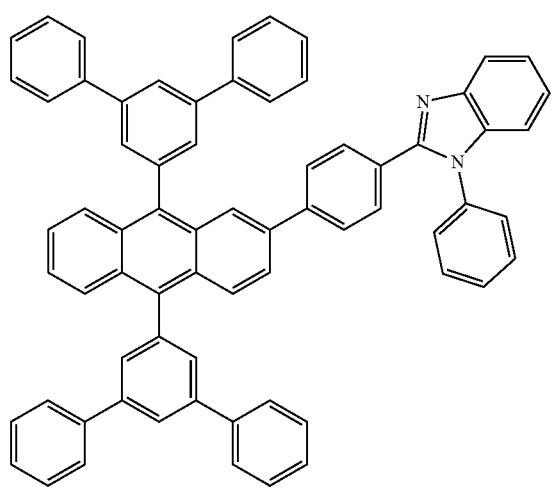
ET8
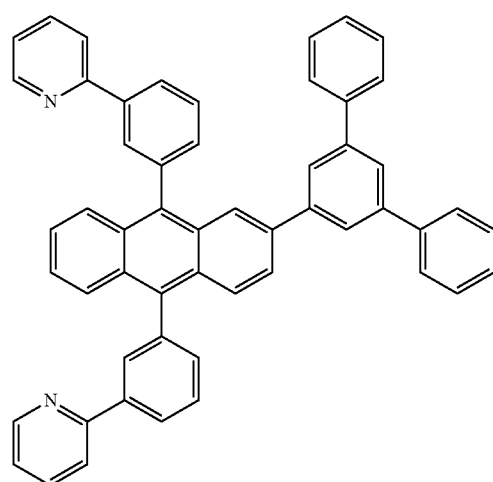
ET9
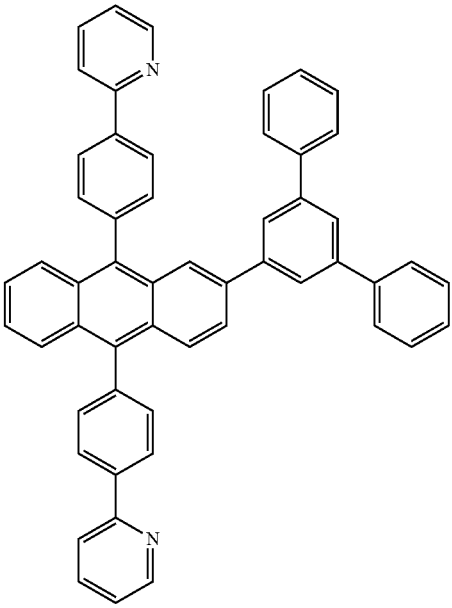
ET10
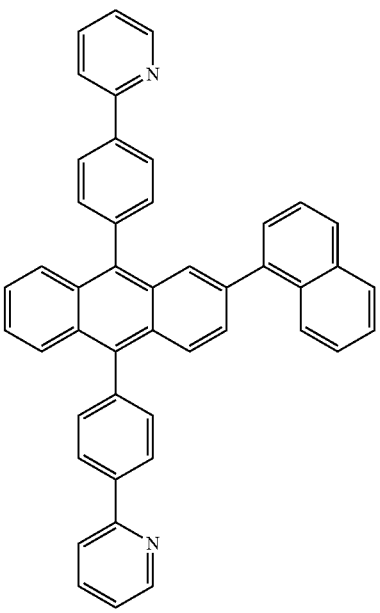

ET11
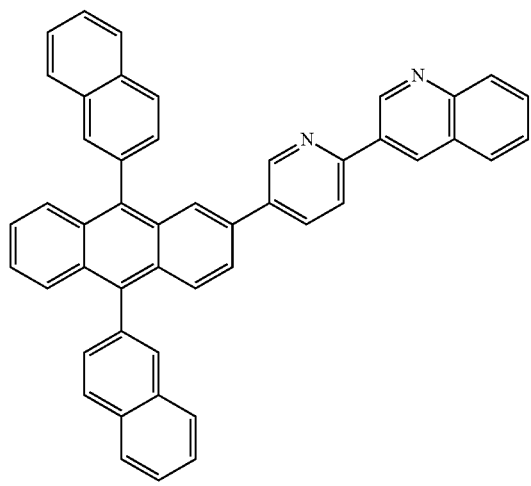
ET12
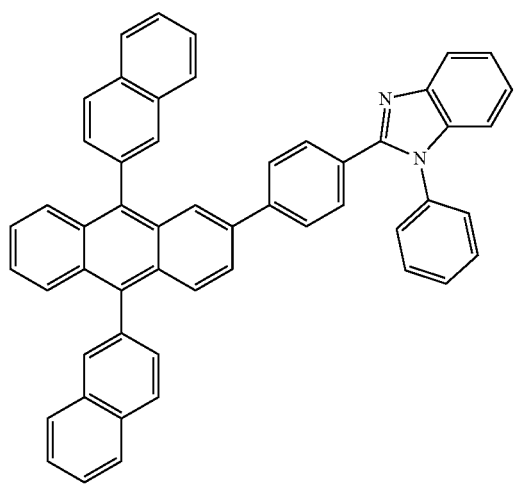
ET13
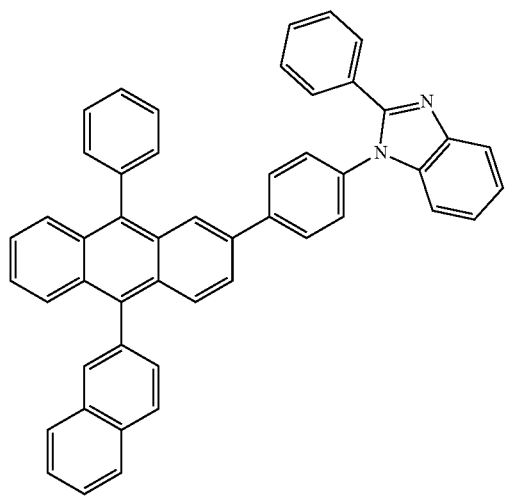
ET14
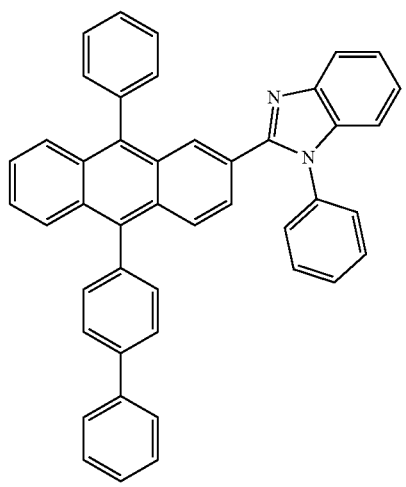
ET15
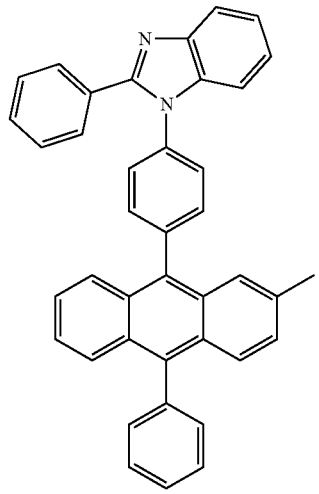
ET16
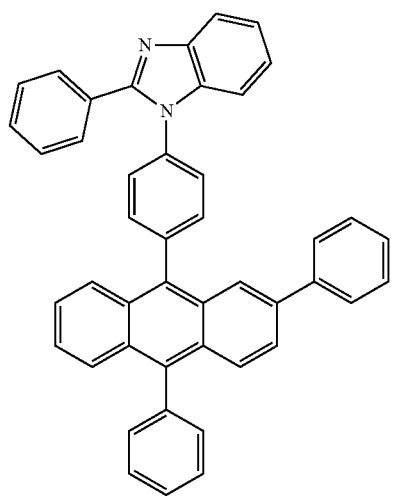

-continued
ET17
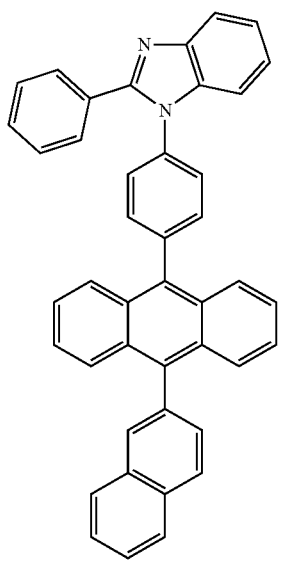
ET18
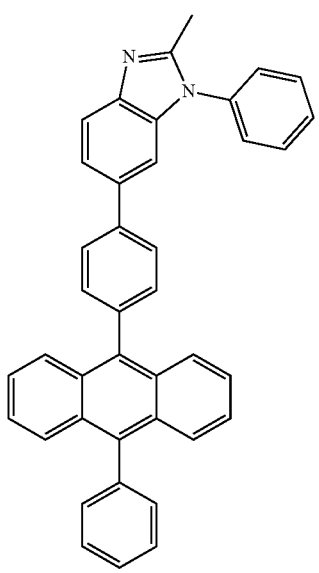
ET19
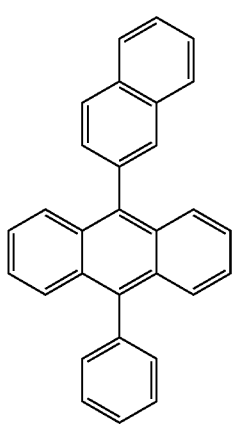
ET20
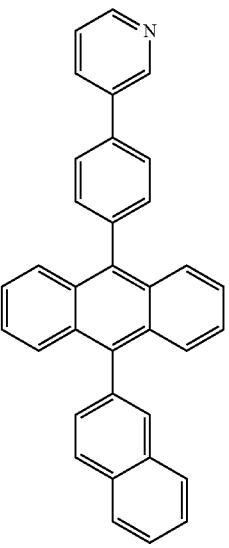
ET21
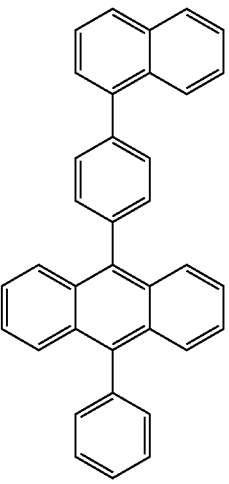
ET22
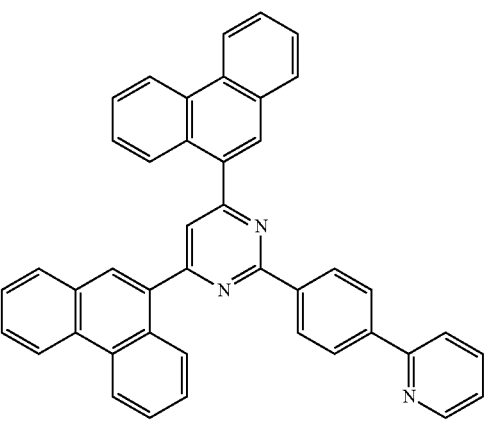

-continued
ET23
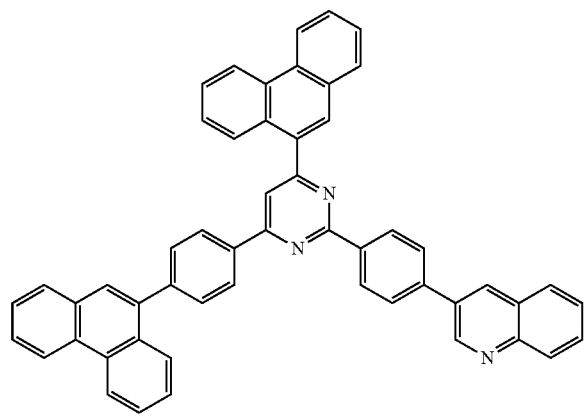
ET24
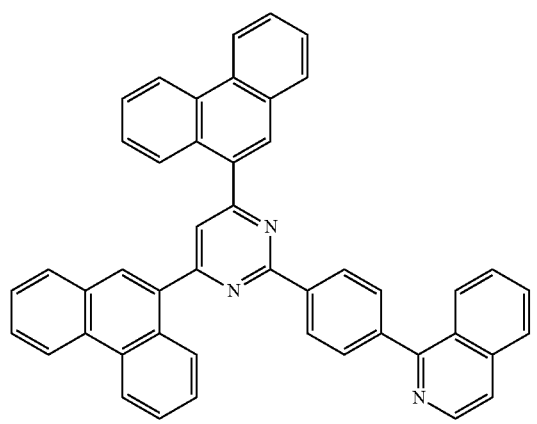
ET25
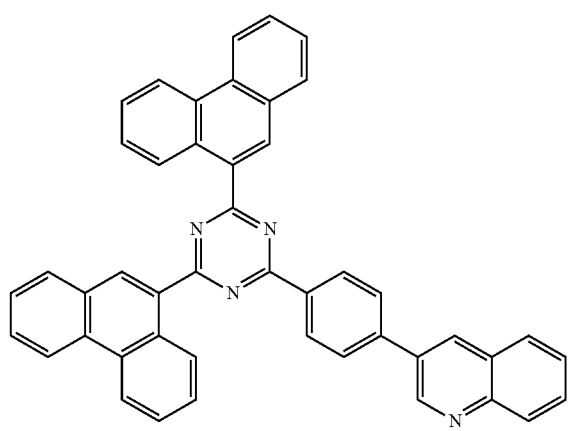
ET26
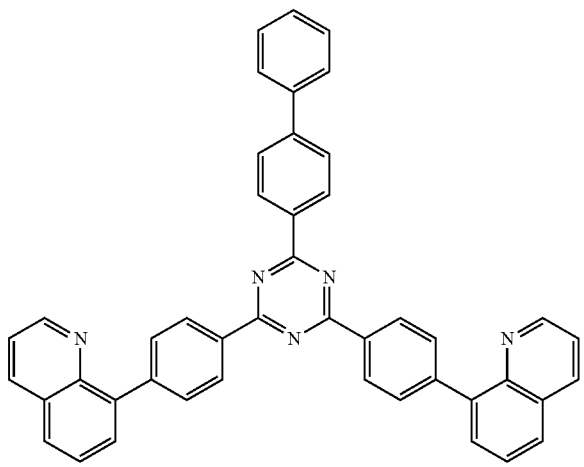
ET27
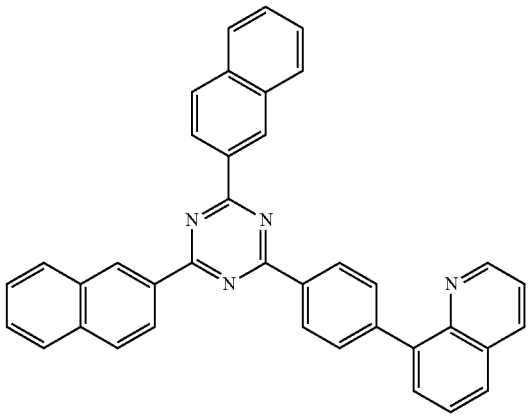
ET28
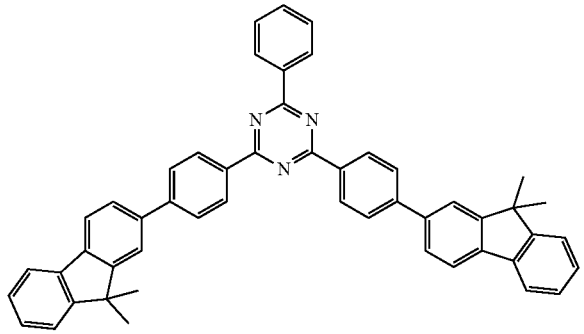

ET29
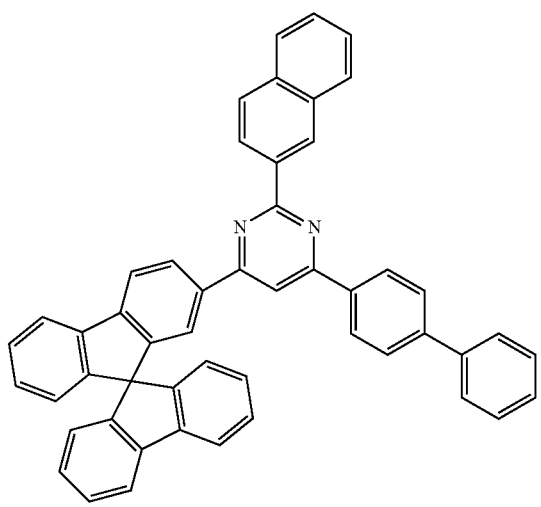
ET30
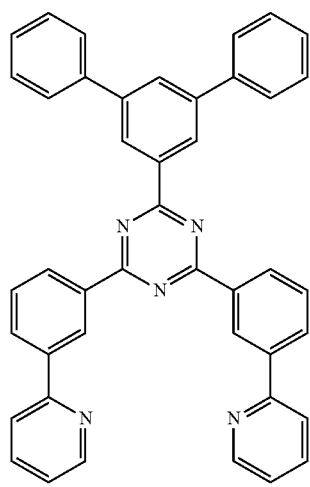
ET31
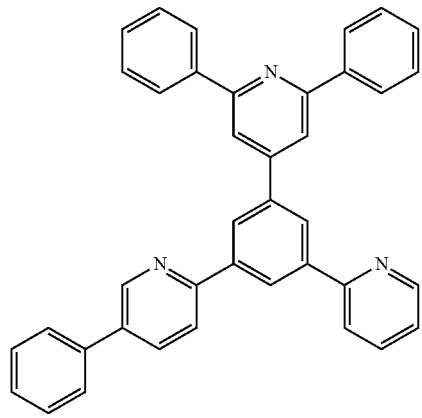
ET32
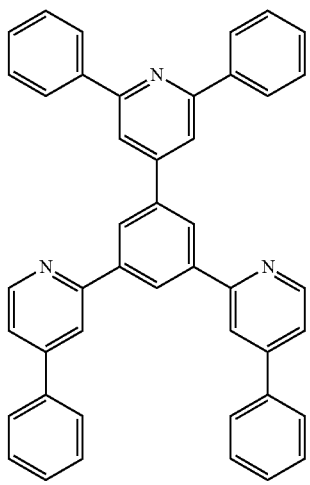
ET33
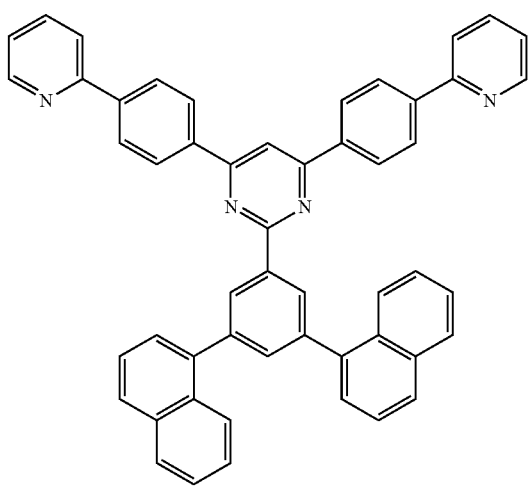
ET34
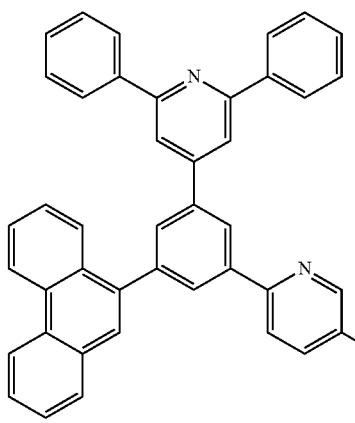

ET35
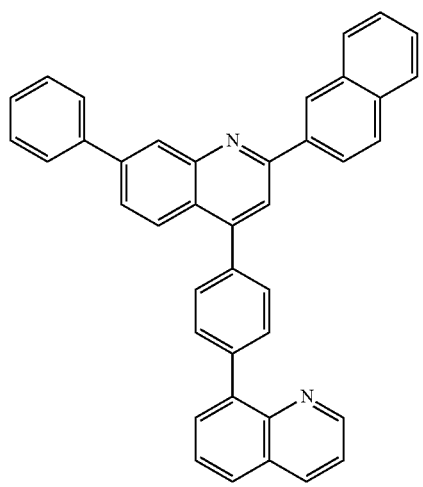
ET36
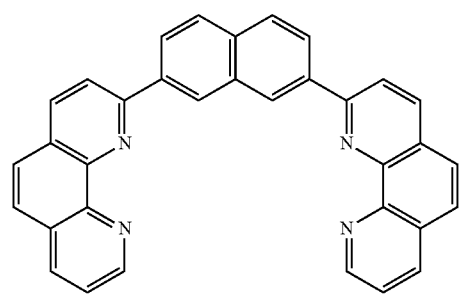
ET37
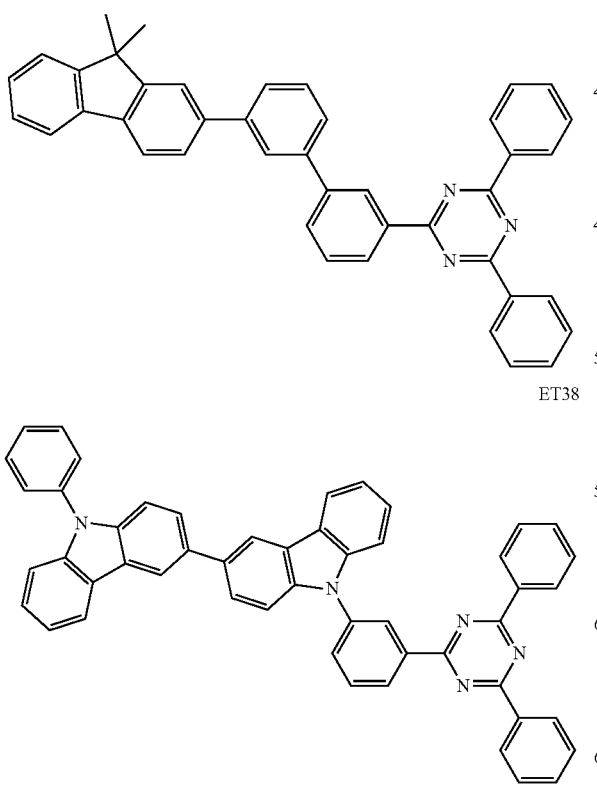
ET38
ET39
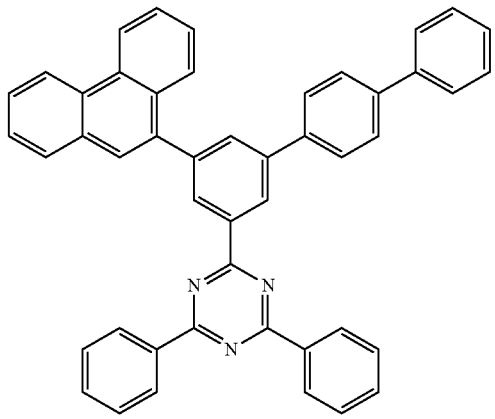
ET40
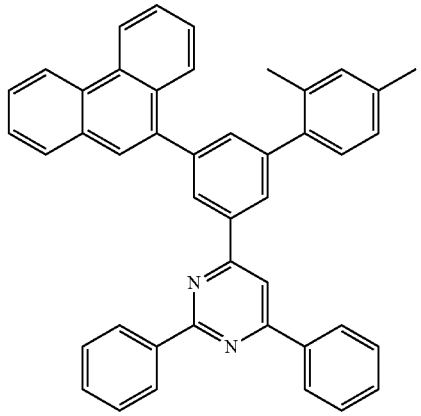
ET41
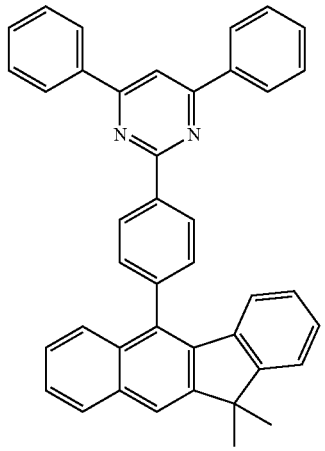

ET42
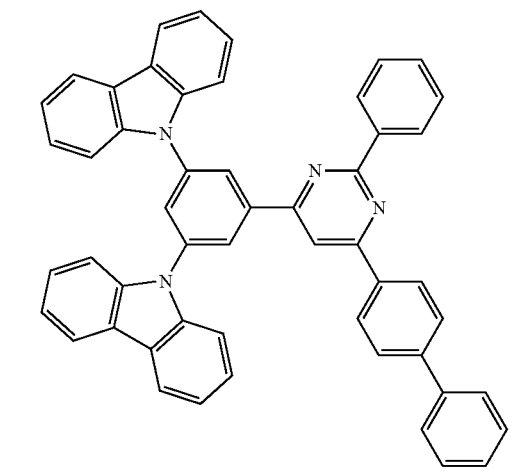

ET43
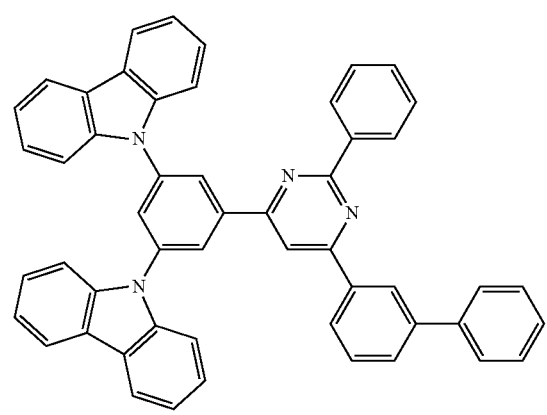

ET44
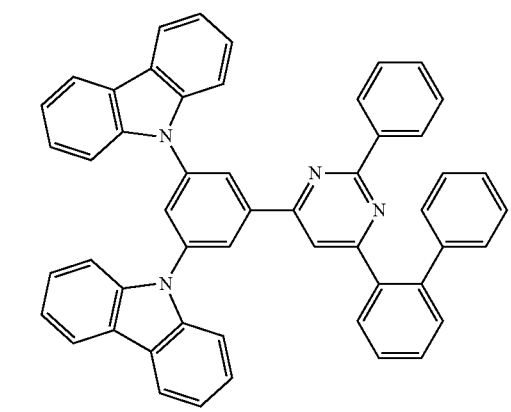

ET45
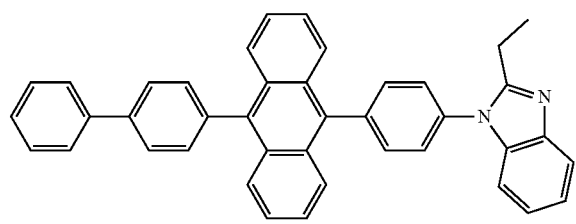

Alq₃
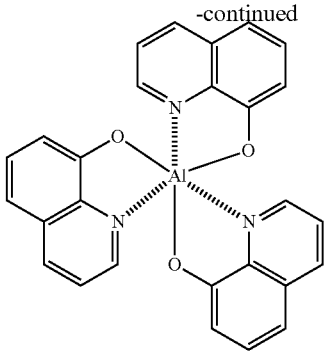

BAlq
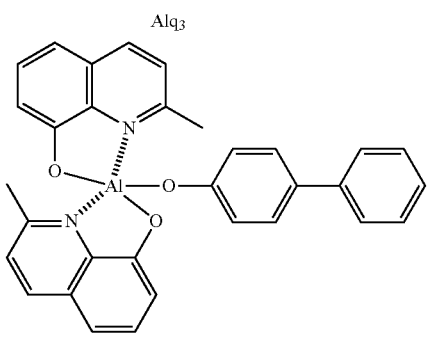

TAZ
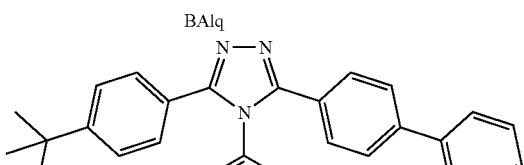

NTAZ
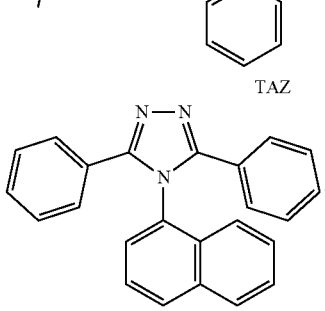

The thickness of the electron transport region may be about 160 Å to about 5,000 Å, for example, about 100 Å to about 4,000 Å. When the electron transport region includes a buffer layer, a hole blocking layer, an electron control layer, an electron transport layer, or any combination thereof, the thickness of the buffer layer, the hole blocking layer, or the electron control layer may each independently be about 20 Å to about 1000 Å, for example, about 30 Å to about 300 Å, and the thickness of the electron transport layer may be about 100 Å to about 1000 Å, for example, about 150 Å to about 500 Å. When the thicknesses of the buffer layer, hole blocking layer, electron control layer, electron transport layer and/or electron transport layer are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of the alkali metal complex may be a Li ion, a Na ion, a K ion, a Rb ion, or a Cs ion, and the metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxydiphenyloxadiazole, a hydroxydiphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

ET-D1

ET-D2

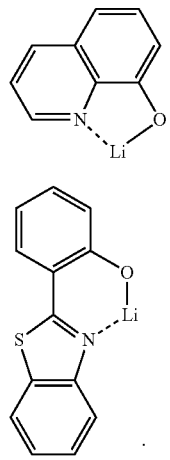

The electron transport region may include an electron injection layer to facilitate the injection of electrons from the second electrode 150. The electron injection layer may directly contact the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, and/or iodides), and/or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Non-limiting examples of the lanthanide metal telluride include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one ion of the alkali metal, the alkaline earth metal, and the rare earth metal, and ii) a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may include (e.g., consist of) i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, and/or the like.

When the electron injection layer further includes an organic material, the alkali metal, alkaline earth metal, rare earth metal, alkali metal-containing compound, alkaline earth metal-containing compound, rare earth metal-containing compound, alkali metal complex, alkaline earth-metal complex, rare earth metal complex, or any combination thereof may be substantially homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be utilized.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside of the device through the first electrode 110 (which is a semi-transmissive electrode or a transmissive electrode) and the first capping layer, and/or light generated in an emission layer of the interlayer 130 of the light-emitting device 10 may be extracted toward the outside through the second electrode 150 (which is a semi-transmissive electrode or a transmissive electrode) and the second capping layer.

The first capping layer and the second capping layer may increase the external emission efficiency of the device according to the principle of constructive interference. Accordingly, the light extraction efficiency of the light-emitting device 10 may be increased, so that the emission efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include one or more carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In one or more embodiments, at least one of the first capping layer and the second capping layer may each independently include one of Compounds HT28 to HT33, one of Compounds CP1 to CP6, p-NPB, or any combination thereof:

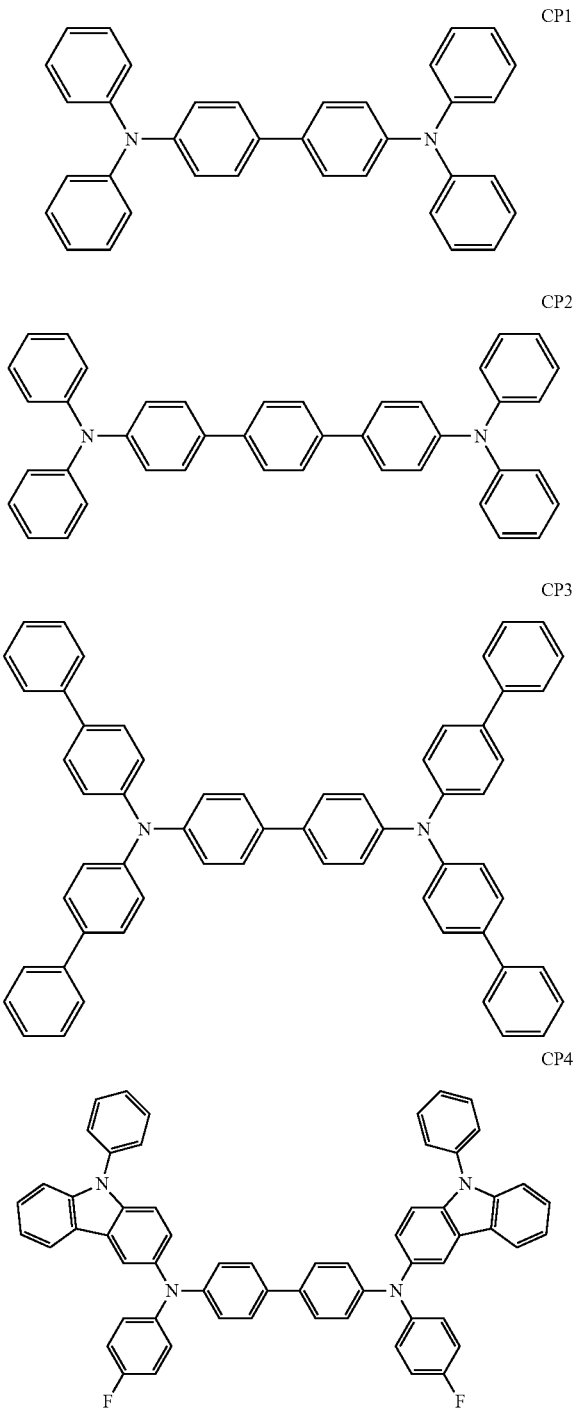

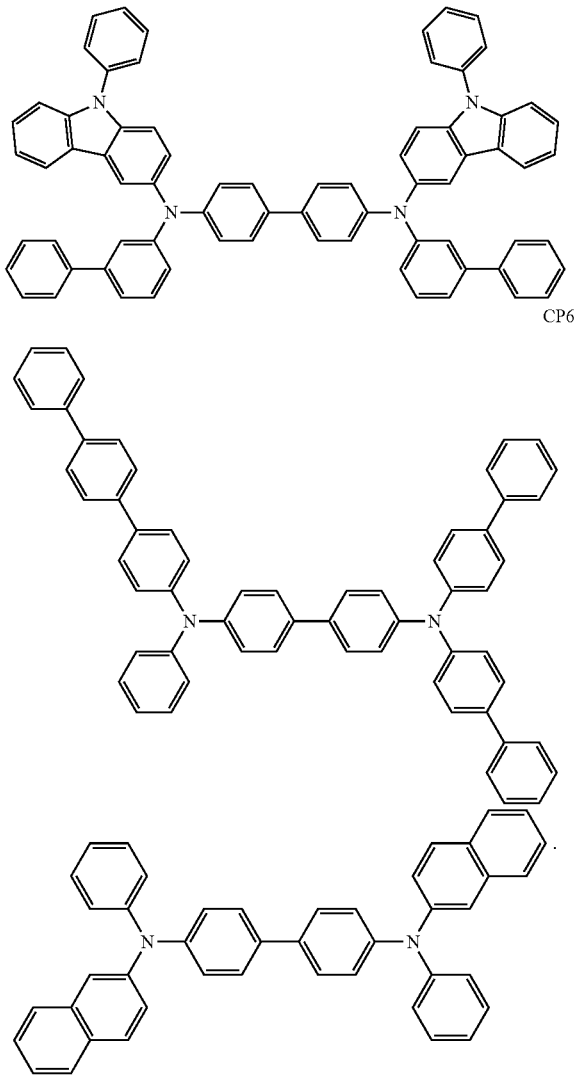

β-NPB

Electronic Apparatus

The light-emitting device may be included in one or more suitable electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, the light emitted from the light-emitting device may be blue light or white light. The light-emitting device may be substantially the same as described above. In an embodiment, the color conversion layer may include quantum dots.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-blocking patterns located among the color filter areas, and the color conversion layer may include a plurality of color conversion areas and light-blocking patterns located among the color conversion areas.

The color filter areas (and/or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In detail, the first area may include a red quantum dot, the second area may include a green quantum dot, and the third area may not include a quantum dot. The quantum dot may be the same as described herein. The first area, the second area, and/or the third area may each include a scatter.

In an embodiment, the light-emitting device may be to emit a first (e.g., initial) light, the first area may be to absorb the first light to emit first first-color light, the second area may be to absorb the first light to emit second first-color light, and the third area may be to absorb the first light to emit third first-color light. In this regard, the first first-color light, the second first-color light, and the third first-color light may have different maximum emission wavelengths. In detail, the first light may be blue light, the first first-color light may be red light, the second first-color light may be green light, and the third first-color light may be blue light.

The electronic apparatus may further include a thin-film transistor in addition to the light-emitting device 1 as described above. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulating film, etc.

The activation layer may include crystalline silicon, an amorphous silicon, an organic semiconductor, an oxide semiconductor, and/or the like.

The electronic apparatus may further include a sealing portion for sealing the light-emitting device. The sealing portion and/or the color conversion layer may be placed between the color filter and the light-emitting device. The sealing portion allows light from the light-emitting device to be extracted to the outside, while concurrently (e.g., simultaneously) preventing or reducing ambient air and/or moisture from penetrating into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the color conversion layer, according to the use of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various suitable measuring instruments, meters (for example, meters for a vehicle, an aircraft, and a vessel), projectors, and/or the like.

Figure 2:
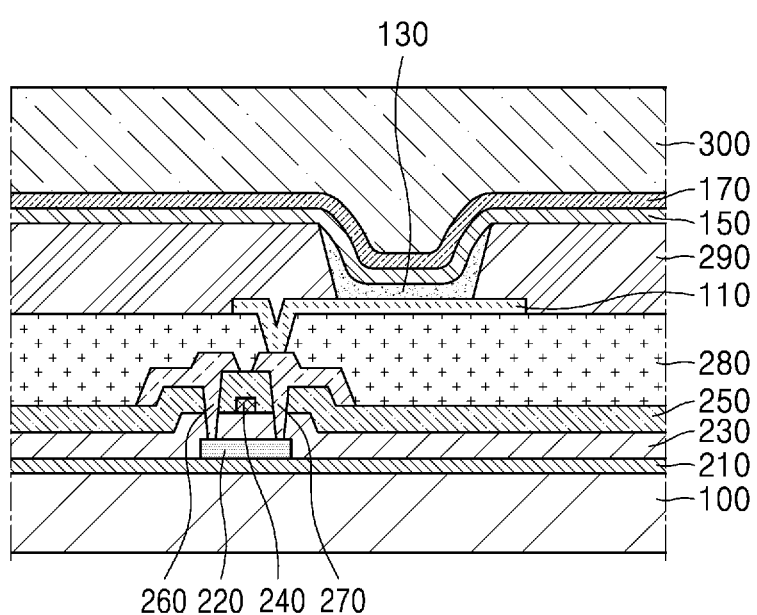
FIGS. 2 and 3 are each a cross-sectional view of a light-emitting apparatus according to another embodiment.
Figure 3:
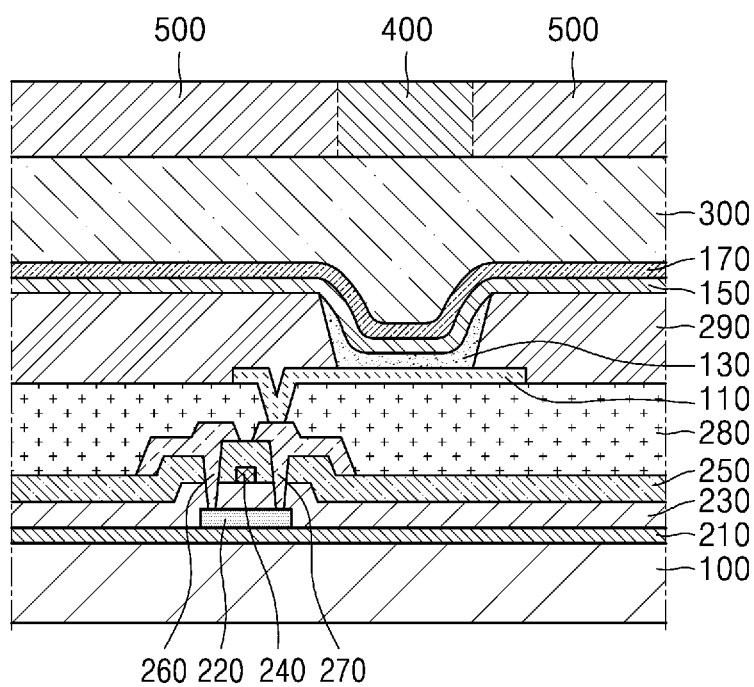

Description of FIGS. 2 and 3

FIG. 2 is a cross-sectional view showing a light-emitting apparatus according to an embodiment of the present disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device may be provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and may expose a portion of the drain electrode 270, and the first electrode 110 is connected to the exposed portion of the drain electrode 270.

A pixel defining layer 290 containing an insulating material may be located on the first electrode 110. The pixel defining layer 290 exposes a region of the first electrode 110, and an interlayer 130 may be formed in the exposed region of the first electrode 110. The pixel defining layer 290 may be a polyimide or polyacrylic organic film. In some embodiments, at least some layers of the interlayer 130 may extend beyond the upper portion of the pixel defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or a combination thereof; or a combination of the inorganic film and the organic film.

FIG. 3 shows a cross-sectional view showing a light-emitting apparatus according to an embodiment of the present disclosure.

The light-emitting apparatus of FIG. 3 is substantially the same as the light-emitting apparatus of FIG. 2, except that a light-blocking pattern 500 and a functional region 400 are additionally located on the encapsulation portion 300. The functional region 400 may be a combination of i) a color filter area, ii) a color conversion area, or iii) a combination of the color filter area and the color conversion area. In an embodiment, the light-emitting device included in the light-emitting apparatus of FIG. 3 may be a tandem light-emitting device.

Manufacture Method

The layers included in the hole transport region, the emission layer, and the layers included in the electron transport region may be formed in a set or predetermined region by utilizing one or more suitable methods selected from vacuum deposition, spin coating, casting, Langmuir-Blodgett (LB) deposition, ink-jet printing, laser-printing, and laser-induced thermal imaging.

When the layers constituting the hole transport region, the emission layer, and the layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on the material to be included and the structure of a layer to be formed.

Definition of Terms

The term "$C_3$-$C_{60}$ carbocyclic group" as utilized herein refers to a cyclic group including (e.g., consisting of) three to sixty carbon atoms, and the term "$C_1$-$C_{60}$ heterocyclic group" as utilized herein refers to a cyclic group that has one to sixty carbon atoms and further has, in addition to carbon, a heteroatom. The $C_3$-$C_{60}$ carbocyclic group and the $C_1$-$C_{60}$ heterocyclic group may each be a monocyclic group including (e.g., consisting of) one ring, or a polycyclic group in which two or more rings are condensed with each other. For example, the number of ring-forming atoms of the $C_1$-$C_{60}$ heterocyclic group may be from 3 to 61.

The term "cyclic group" as utilized herein may include the $C_3$-$C_{60}$ carbocyclic group, and the $C_1$-$C_{60}$ heterocyclic group.

The term "π electron-rich $C_3$-$C_{60}$ cyclic group" as utilized herein refers to a cyclic group that has three to sixty carbon atoms and does not include *—N=*' as a ring-forming moiety, and the term "π electron-deficient nitrogen-containing $C_1$-$C_{60}$ cyclic group" as utilized herein refers to a heterocyclic group that has one to sixty carbon atoms and includes *—N=*' as a ring-forming moiety.

For example, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a group T4, ii) a condensed cyclic group in which two or more group T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group", "the $C_3$-$C_{60}$ carbocyclic group", "the $C_1$-$C_{60}$ heterocyclic group", "the Tr electron-rich $C_3$-$C_{60}$ cyclic group", and/or "the π electron-deficient nitrogen-containing $C_1$-$C_{60}$ cyclic group" as utilized herein may refer to a group condensed to any cyclic group or a polyvalent group (for example, a divalent group, a trivalent group, a tetravalent group, etc.), depending on the context e.g., the structure of a formula in connection with which the terms are utilized). In an embodiment, "a benzene group" may be a benzo group, a phenyl group, a phenylene group, and/or the like, which may be easily understand by one of ordinary skill in the art according to the structure of a formula including the "benzene group."

Non-limiting examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and non-limiting examples of the divalent $C_3$-$C_{60}$ carbocyclic group and the divalent $C_1$—$C_{60}$ heterocyclic group are a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as utilized herein refers to a linear or branched aliphatic hydrocarbon monovalent group that has one to sixty carbon atoms, and non-limiting examples thereof include a methyl group, an ethyl group, an n-propyl group, an isopropyl group, an n-butyl group, a sec-butyl group, an isobutyl group, a tert-butyl group, an n-pentyl group, a tert-pentyl group, neopentyl group, an isopentyl group, a sec-pentyl group, 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as utilized herein refers to a divalent group having substantially the same structure as the $C_1$-$C_{60}$ alkyl group.

The term "$C_2$-$C_{60}$ alkenyl group" as utilized herein refers to a monovalent hydrocarbon group having at least one carbon-carbon double bond in the middle or at the terminus of the $C_2$-$C_{60}$ alkyl group, and non-limiting examples thereof include an ethenyl group, a propenyl group, and a butenyl group. The term "$C_2$-$C_{60}$ alkenylene group" as utilized herein refers to a divalent group having substantially the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle or at the terminus of the $C_2$-$C_{60}$ alkyl group, and non-limiting examples thereof include an ethynyl group and a propynyl group. The term "$C_1$-$C_{60}$ alkynylene group" as utilized herein refers to a divalent group having substantially the same structure as the $C_1$-$C_{60}$ alkynyl group.

The term "$C_1$-$C_{60}$ alkoxy group" as utilized herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as utilized herein refers to a monovalent saturated hydrocarbon cyclic group having 3 to 10 carbon atoms, and non-limiting examples thereof include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as utilized herein refers to a divalent group having substantially the same structure as the $C_3$-$C_{10}$ cycloalkyl group.

The term "$C_1$-$C_{10}$ heterocycloalkyl group" as utilized herein refers to a monovalent cyclic group that further includes, in addition to a carbon atom, at least one heteroatom as a ring-forming atom and has 1 to 10 carbon atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as utilized herein refers to a divalent group having substantially the same structure as the $C_1$-$C_{10}$ heterocycloalkyl group.

The term "$C_3$-$C_{10}$ cycloalkenyl group" utilized herein refers to a monovalent cyclic group that has three to ten carbon atoms, at least one carbon-carbon double bond in the ring thereof, and no aromaticity, and non-limiting examples thereof include a cyclopentenyl group, a cyclohexenyl group, and a cycloheptenyl group. The term "$C_3$-$C_{10}$ cycloalkenylene group" as utilized herein refers to a divalent group having substantially the same structure as the $C_3$-$C_{10}$ cycloalkenyl group.

The term "$C_1$-$C_{10}$ heterocycloalkenyl group" as utilized herein refers to a monovalent cyclic group that has, in addition to a carbon atom, at least one heteroatom as a ring-forming atom, 1 to 10 carbon atoms, and at least one carbon-carbon double bond in the cyclic structure thereof. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as utilized herein refers to a divalent group having substantially the same structure as the $C_1$-$C_{10}$ heterocycloalkenyl group.

The term "$C_6$-$C_{60}$ aryl group" as utilized herein refers to a monovalent group having a carbocyclic aromatic system having six to sixty carbon atoms, and the term "$C_6$-$C_{60}$ arylene group" as utilized herein refers to a divalent group having a carbocyclic aromatic system having six to sixty carbon atoms. Non-limiting examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as utilized herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as utilized herein refers to a divalent group having a heterocyclic aromatic system that has, in addition to a carbon atom, at least one heteroatom as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as utilized herein refers to a monovalent group (for example, having 8 to 60 carbon atoms) having two or more rings condensed to each other, only carbon atoms as ring-forming atoms, and no aromaticity in its entire molecular structure. Non-limiting examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as utilized herein refers to a divalent group having substantially the same structure as a monovalent non-aromatic condensed polycyclic group.

The term "monovalent non-aromatic condensed heteropolycyclic group" as utilized herein refers to a monovalent group (for example, having 1 to 60 carbon atoms) having two or more rings condensed to each other, at least one heteroatom other than carbon atoms, as a ring-forming atom, and no aromaticity in its entire molecular structure. Non-limiting examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic heterocondensed polycyclic group" as utilized herein refers to a divalent group having substantially the same structure as a monovalent non-aromatic heterocondensed polycyclic group.

The term "$C_6$-$C_{60}$ aryloxy group" as utilized herein refers to —$OA_{102}$ (wherein $A_{102}$ is a $C_6$-$C_{60}$ aryl group), and the term "$C_6$-$C_{60}$ arylthio group" as utilized herein indicates —$SA_{103}$ (wherein $A_{103}$ is a $C_6$-$C_{60}$ aryl group).

The term "$R_{10a}$" as utilized herein refers to:
deuterium (-D), —F, —Cl, —Br, —I, a hydroxyl group, a cyano group, or a nitro group,
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or any combination thereof,
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or any combination thereof, or
—Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$,
$Q_1$ to $Q_3$, $Q_{11}$ to $Q_{13}$, $Q_{21}$ to $Q_{23}$ and $Q_{31}$ to $Q_{33}$ utilized herein may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom" as utilized herein refers to any atom other than a carbon atom. Non-limiting examples of the heteroatom include O, S, N, P, Si, B, Ge, Se, and any combination thereof.

The term "Ph" as utilized herein refers to a phenyl group, the term "Me" as utilized herein refers to a methyl group, the term "Et" as utilized herein refers to an ethyl group, the term "ter-Bu" or "Bu$^t$" as utilized herein refers to a tert-butyl group, and the term "OMe" as utilized herein refers to a methoxy group.

The term "biphenyl group" as utilized herein refers to "a phenyl group substituted with a phenyl group." In other words, the "biphenyl group" is a substituted phenyl group having a $C_6$-$C_{60}$ aryl group as a substituent.

The term "terphenyl group" as utilized herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as utilized herein, unless defined otherwise, each refer to a binding site to a neighboring atom in a corresponding formula.

Hereinafter, a compound according to embodiments and a light-emitting device according to embodiments will be described in more detail with reference to Synthesis Examples and Examples. The wording "B was utilized instead of A" utilized in describing Synthesis Examples indicates that an identical molar equivalent of B was utilized in place of A.

EXAMPLES

Synthesis Example 1: Synthesis of Compound BD1

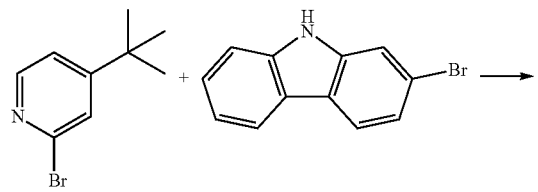

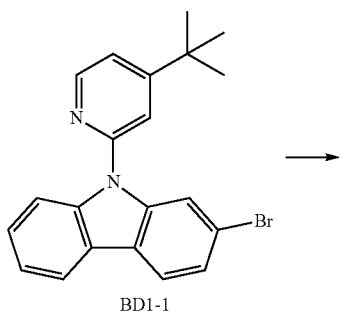

BD1-1

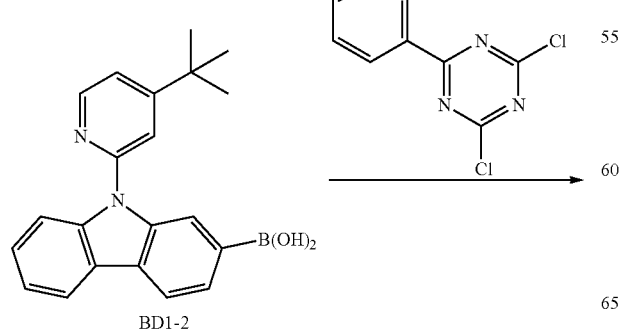

BD1-2

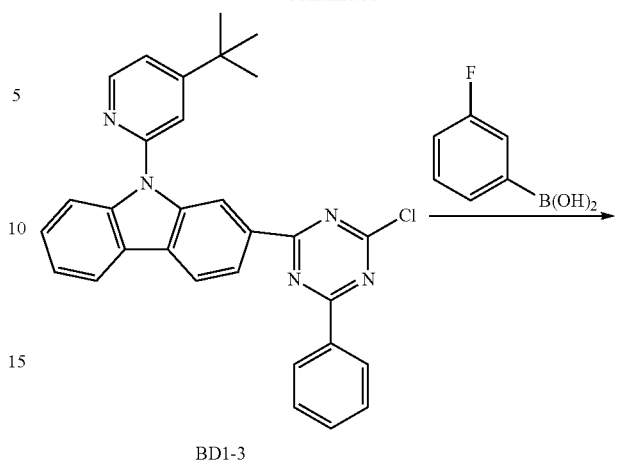

BD1-3

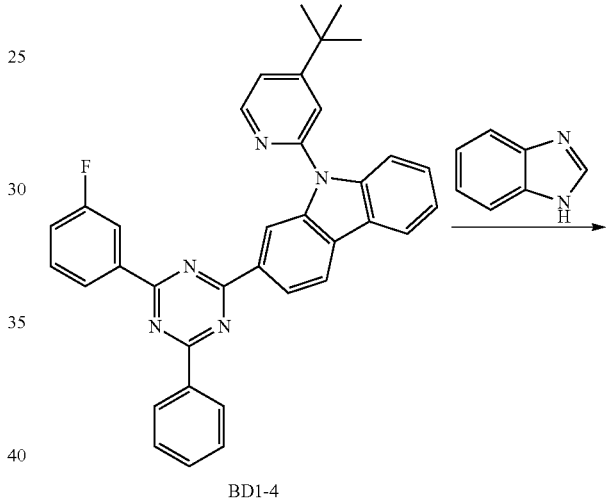

BD1-4

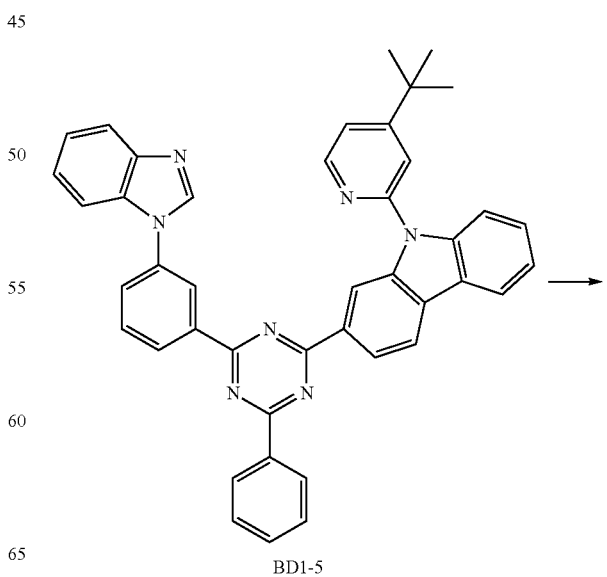

BD1-5

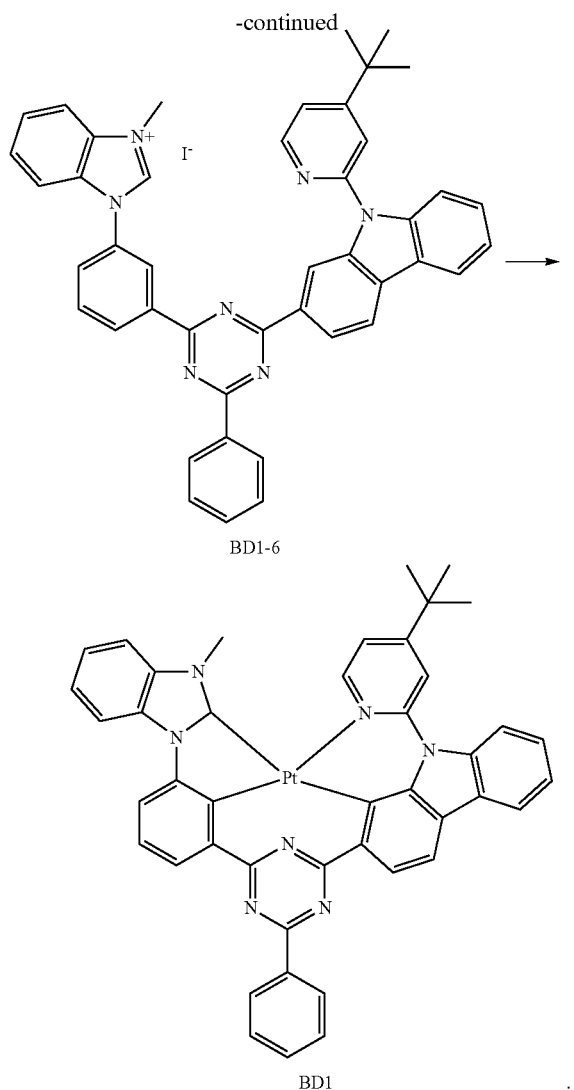

1) Synthesis of Intermediate Compound BD1-1

2-bromo-4-(tert-butyl)pyridine (1.0 eq), 2-bromo-9H-carbazole (1.2 eq), CuI (0.01 eq), $K_2CO_3$ (2.0 eq), and L-proline (0.02 eq) were dissolved in dimethyl sulfoxide (0.1M) and stirred at a temperature of 130° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD1-1 (yield: 65%).

2) Synthesis of Intermediate BD1-2

Intermediate compound BD1-1 was dissolved in THF (0.1M), n-butyllithium (2.5M in Hexane, 1.2 eq) was slowly added dropwise thereto at a temperature of −78° C., and stirred for 1 hour. Trimethyl borate (1.2 eq) was added to the reactants and stirred at room temperature for 24 hours. 2M HCl was added to the resultant, was stirred for 30 minutes, and then subjected to an extraction process three times utilizing dichloromethane and water to obtain an organic layer. The obtained organic layer was dried utilizing magnesium sulfate, concentrated, and recrystallized utilizing hexane to synthesize Intermediate compound BD1-2 (yield: 80%).

3) Synthesis of Intermediate Compound BD1-3

Intermediate compound BD1-2 (1.2 eq), 2,4-dichloro-6-phenyl-1,3,5-triazine (1.0 eq), Ph(PPh$_3$)$_4$ (0.02 eq), and $K_2CO_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate BD1-3 (yield: 85%).

4) Synthesis of Intermediate Compound BD1-4

Intermediate compound BD1-3 (1.0 eq), 3-fluorophenylboronic acid (1.2 eq), Ph(PPh$_3$)$_4$ (0.02 eq), and $K_2CO_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate BD1-4 (yield: 90%).

3) Synthesis of Intermediate Compound BD1-5

Intermediate compound BD1-4 (1.0 eq), 1H-benzo[d]imidazole (2.5 eq), and $K_3PO_4$ (2.0 eq) were dissolved in dimethyl sulfoxide (0.1M) and stirred at a temperature of 160° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD1-5 (yield: 67%).

3) Synthesis of Intermediate Compound BD1-6

Intermediate compound BD1-5 (1.0 eq) and iodomethane (3.0 eq) were dissolved in THF (1.0 M) and stirred at a temperature of 70° C. for 12 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate BD1-6 (yield: 75%).

(5) Synthesis of Compound BD1

Intermediate compound BD1-6 (1.0 eq), dichloro(1,2-dicyclooctadiene)platinum (Pt(COD)Cl$_2$) (1.1 eq), and sodium acetate (2.0 eq) were dissolved in dioxane (0.1 M) and stirred at a temperature of 120° C. for 72 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate BD1 (yield: 21%).
Synthesis Example 2: Synthesis of Compound BD10
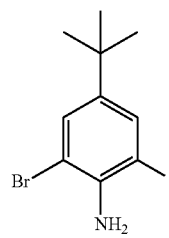
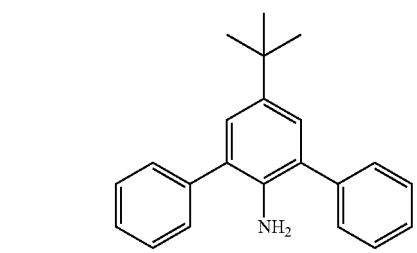
BD10-1
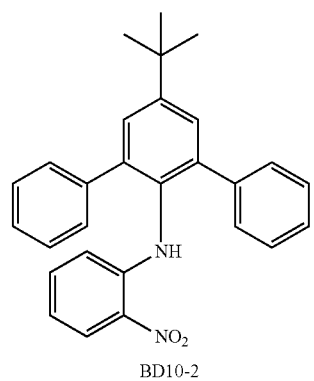
BD10-2
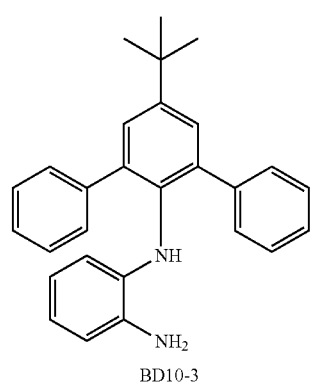
BD10-3
-continued
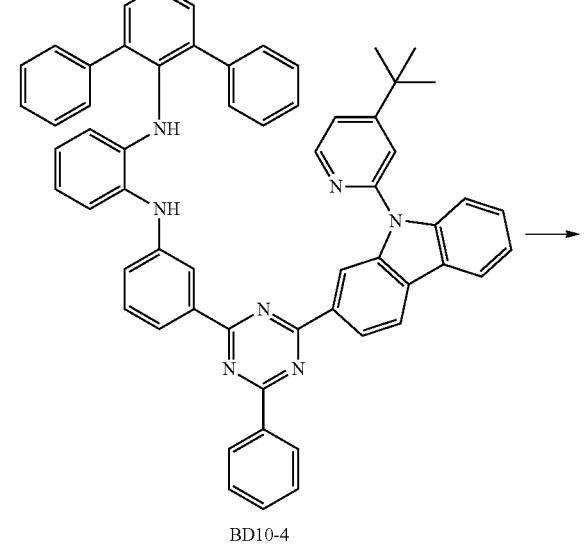
BD10-4
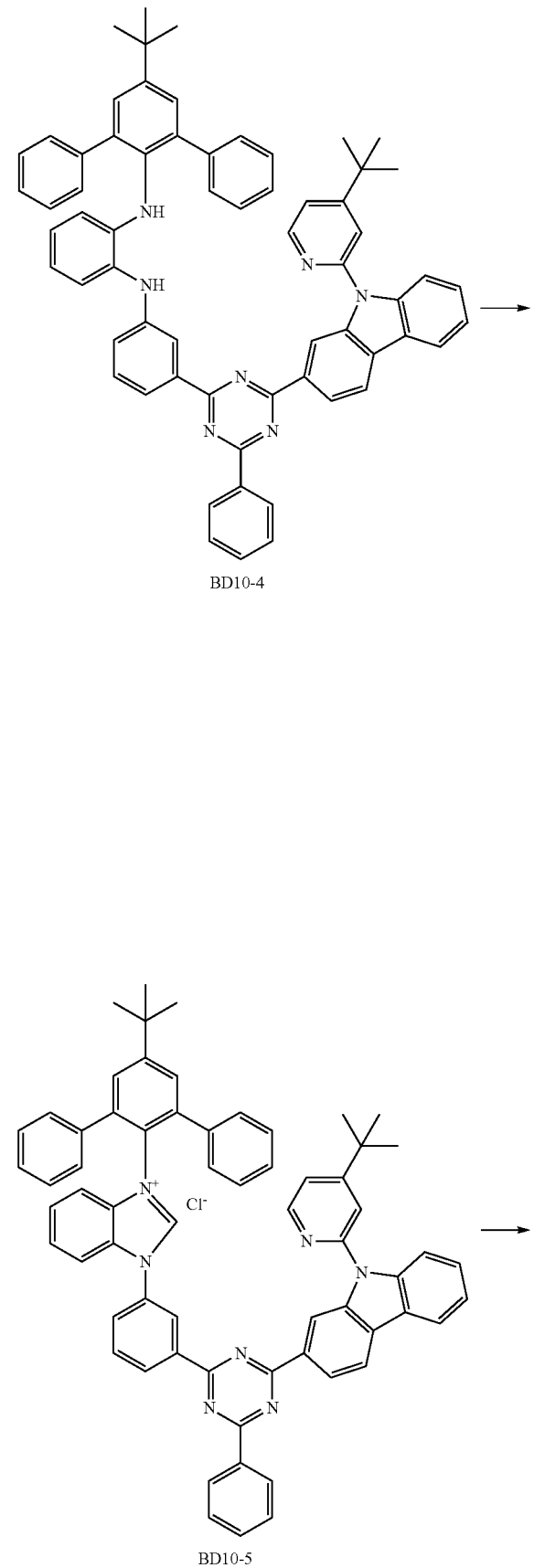
BD10-5

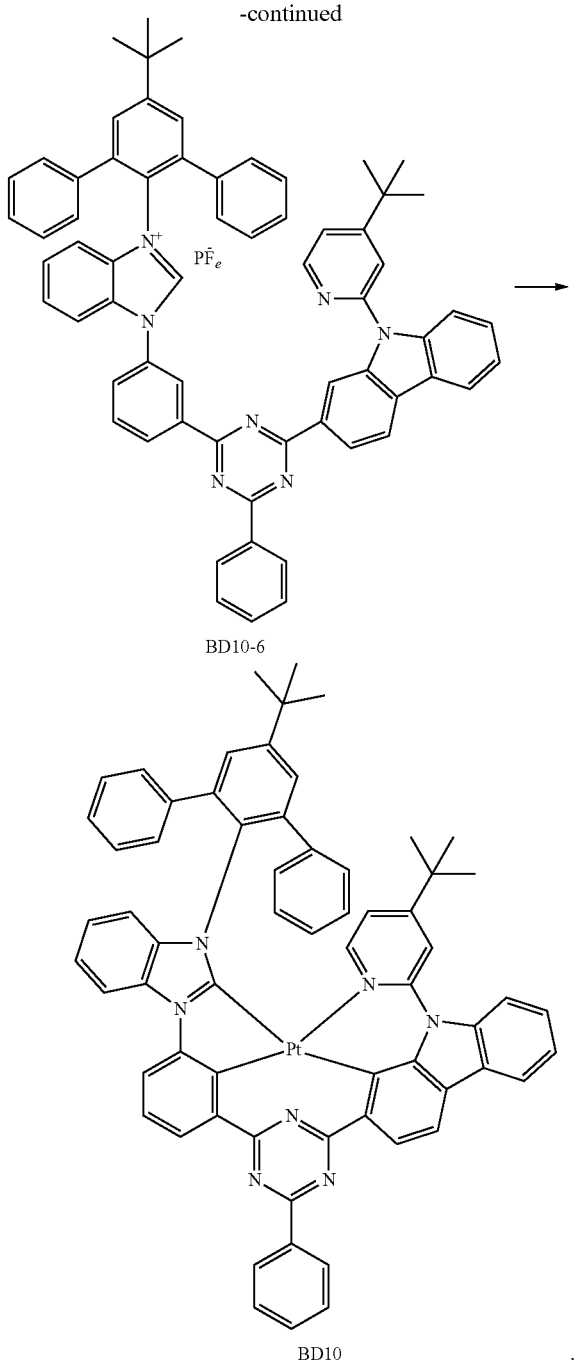

BD10-6

BD10

1) Synthesis of Intermediate Compound BD0-1

2,6-dibromo-4-(tert-butyl)aniline, (1.0 eq), phenyl boronic acid (3.0 eq), Ph(PPh$_3$)$_4$ (0.02 eq), and K$_2$CO$_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD10$^{-4}$ (yield: 90%).

2) Synthesis of Intermediate Compound BD10-2

Intermediate compound BD10-1 (1.0 eq), 1-iodo-2-nitrobenzene (1.2 eq), Pd$_2$(dba)$_3$ (0.05 eq), Sphos (0.05 eq), and sodium tert-butoxide (2.0 eq) were dissolved in toluene (0.05 M) and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD10-2 (yield: 81%).

3) Synthesis of Intermediate Compound BD10-3

Intermediate compound BD10-2, Sn (2.5 eq), and HCl (2.0 eq) were dissolved in EtOH and stirred at a temperature of 80° C. for 12 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD10-3 (yield: 90%).

4) Synthesis of Intermediate Compound BD10-4

Intermediate compound BD1-4 (1.0 eq), Intermediate compound BD10-3 (2.5 eq), and K$_3$PO$_4$ (2.0 eq) were dissolved in dimethyl sulfoxide (0.1M) and stirred at a temperature of 160° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD10-4 (yield: 77%).

3) Synthesis of Intermediate Compound BD10-5

Intermediate compound BD10-4 (1.0 eq), triethylorthoformate (50 eq), and HCl (25 eq) were dissolved and stirred at a temperature of 80° C. for 12 hours. The reaction mixture was cooled at room temperature, triethylorthoformate was removed, and then the mixture was subjected to an extraction process three times utilizing ethyl acetate and water to obtain an organic layer. The obtained organic layer was dried by utilizing magnesium sulfate and concentrated, and column chromatography was utilized to synthesize Intermediate compound BD10-4 (yield: 92%).

6) Synthesis of Intermediate Compound BD10-6

Intermediate compound BD10-5 was dissolved in methanol (0.1M), distilled water was slowly added thereto and stirred, and then NH$_4$PF$_6$ (1.2 eq) was added thereto and stirred at room temperature for 12 hours. The resultant solid was filtered, washed three times with diethyl ether, and dried to synthesize Intermediate compound BD10-5 (yield: 94%).

7) Synthesis of Compound BD10

Intermediate compound BD10-6 (1.0 eq), dichloro(1,2-dicyclooctadiene)platinum (Pt(COD)Cl$_2$) (1.1 eq), and sodium acetate (2.0 eq) were dissolved in dioxane (0.1 M) and stirred at a temperature of 120° C. for 72 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Compound BD10 (yield: 21%).

Synthesis Example 3: Synthesis of Compound BD14

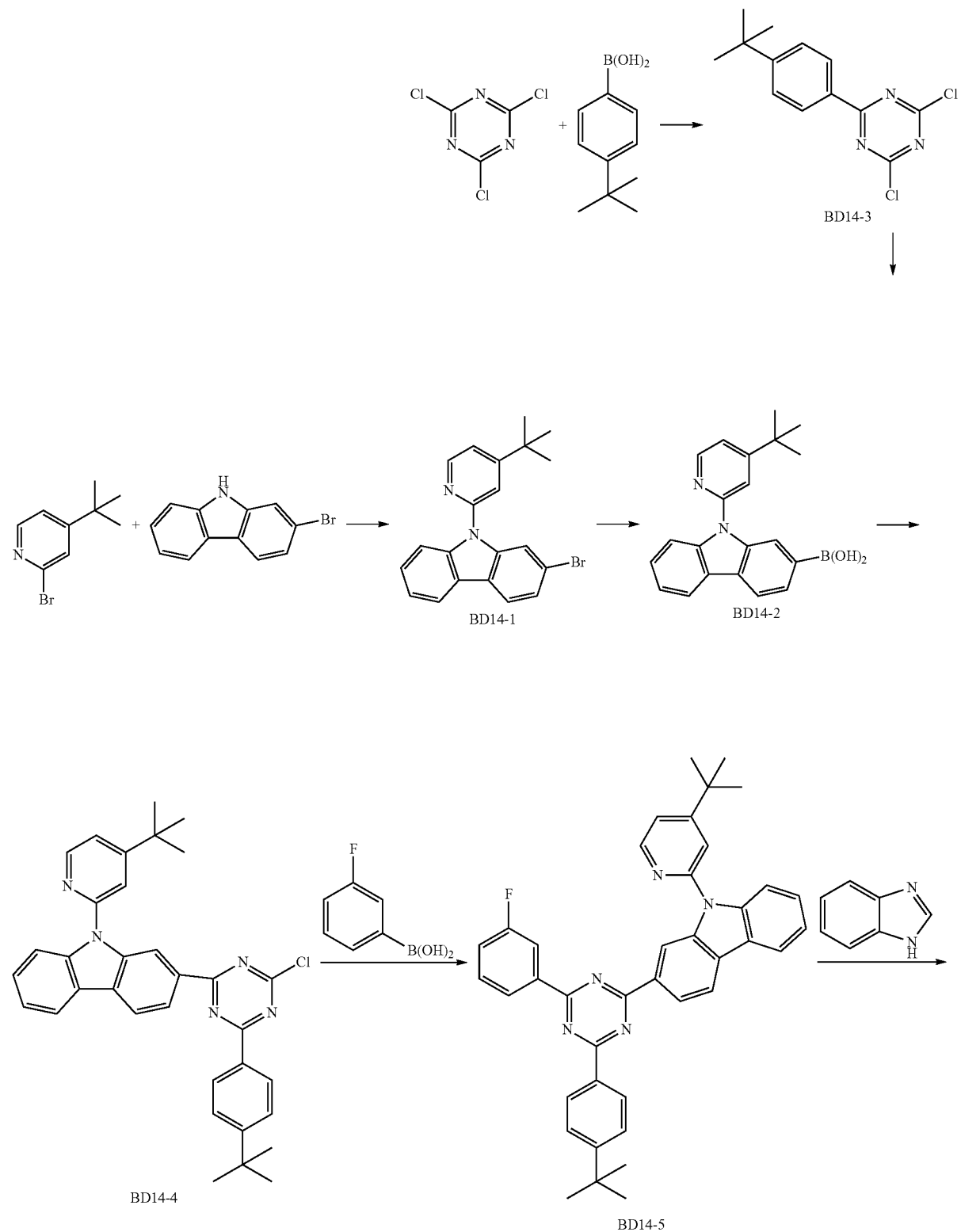

-continued

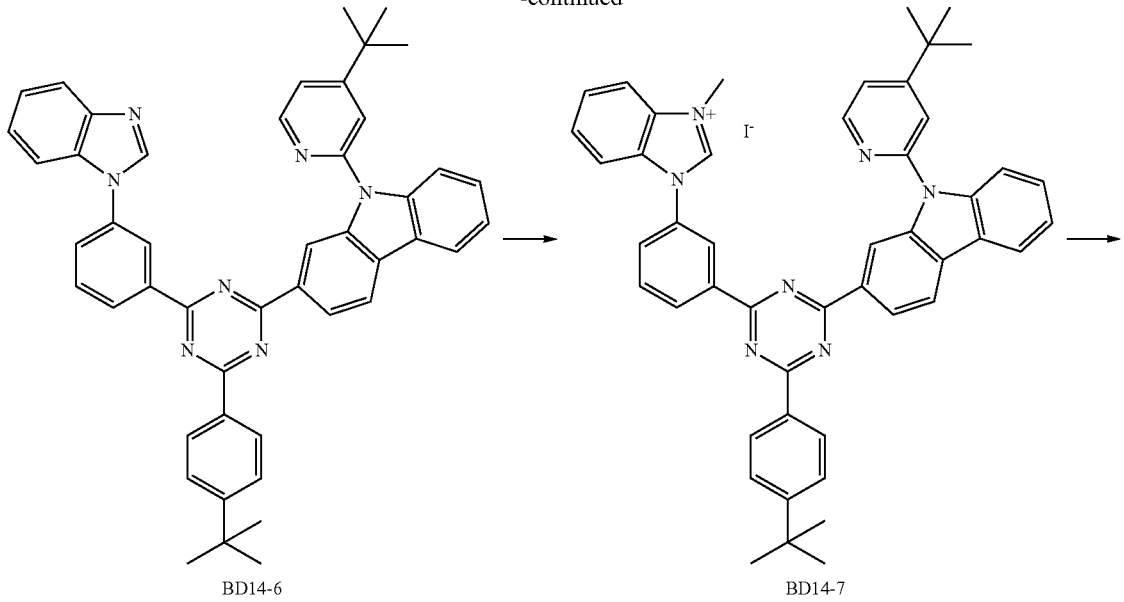

BD14-6

BD14-7

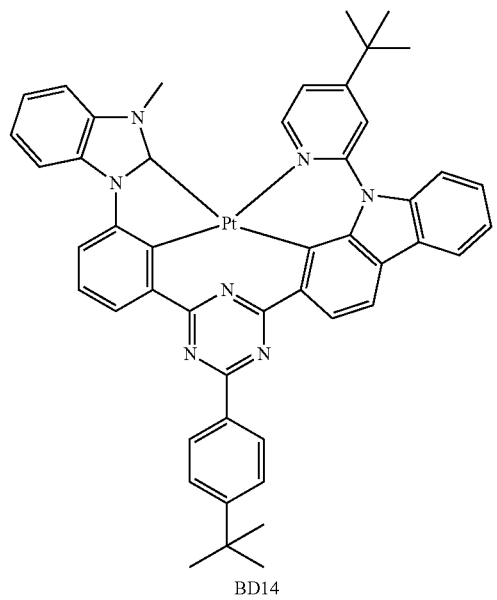

BD14

1) Synthesis of Intermediate Compound BD14-1

2-bromo-4-(tert-butyl)pyridine (1.0 eq), 2-bromo-9H-carbazole (1.2 eq), CuI (0.01 eq), K₂n₃ (2.0 eq), and L-proline (0.02 eq) were dissolved in dimethyl sulfoxide (0.1M) and stirred at a temperature of 130° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD14-1 (yield: 65%).

2) Synthesis of Intermediate Compound BD14-2

Intermediate compound BD14-1 was dissolved in THF (0.1M), n-butyllithium (2.5M in Hexane, 1.2 eq) was slowly added dropwise thereto at a temperature of −78 OC and stirred for 1 hour. Trimethyl borate (1.2 eq) was added to the reaction mixture and stirred at room temperature for 24 hours. 2M HCl was added to the resultant, was stirred for 30 minutes, and then subjected to an extraction process three times utilizing dichloromethane and water to obtain an organic layer. The obtained organic layer was dried utilizing magnesium sulfate, concentrated, and recrystallized utilizing hexane to synthesize Intermediate compound BD14-2 (yield: 80%).

3) Synthesis of Intermediate Compound BD14-3

2,4,6-trichloro-1,3,5-triazine (1.0 eq), 4-tert-butylphenylboronic acid (1.2 eq), Ph(PPh₃)₄ (0.02 eq), and K₂CO₃ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD14-3 (yield: 92%).

4) Synthesis of Intermediate Compound BD14-4

Intermediate compound BD14-2 (1.2 eq), Intermediate compound BD14-3 (1.0 eq), Ph(PPh$_3$)$_4$ (0.02 eq), and K$_2$CO$_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD14-4 (yield: 65%).

3) Synthesis of Intermediate Compound BD14-5

Intermediate compound BD14-4 (1.0 eq), 3-fluorophenylboronic acid (1.2 eq), Ph(PPh$_3$)$_4$ (0.02 eq), and K$_2$CO$_3$ (2.0 eq) were dissolved in Toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD14-5 (yield: 55%).

6) Synthesis of Intermediate Compound BD14-6

Intermediate compound BD14-5 (1.0 eq), 1H-benzo[d]imidazole (2.5 eq), and K$_3$PO$_4$ (2.0 eq) were dissolved in dimethyl sulfoxide (0.1M) and stirred at a temperature of 160° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD14-6 (yield: 88%).

7) Synthesis of Intermediate Compound BD14-7

Intermediate compound BD14-6 (1.0 eq) and iodomethane (3.0 eq) were dissolved in THF (1.0 M) and stirred at a temperature of 70° C. for 12 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD14-7 (yield: 70%).

8) Synthesis of Compound BD14

Intermediate compound BD14-7 (1.0 eq), dichloro(1,2-dicyclooctadiene)platinum (Pt(COD)Cl$_2$) (1.1 eq), and sodium acetate (2.0 eq) were dissolved in dioxane (0.1 M) and stirred at a temperature of 120° C. for 72 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Compound BD14 (yield: 30%).

Synthesis Example 4: Synthesis of Compound BD20

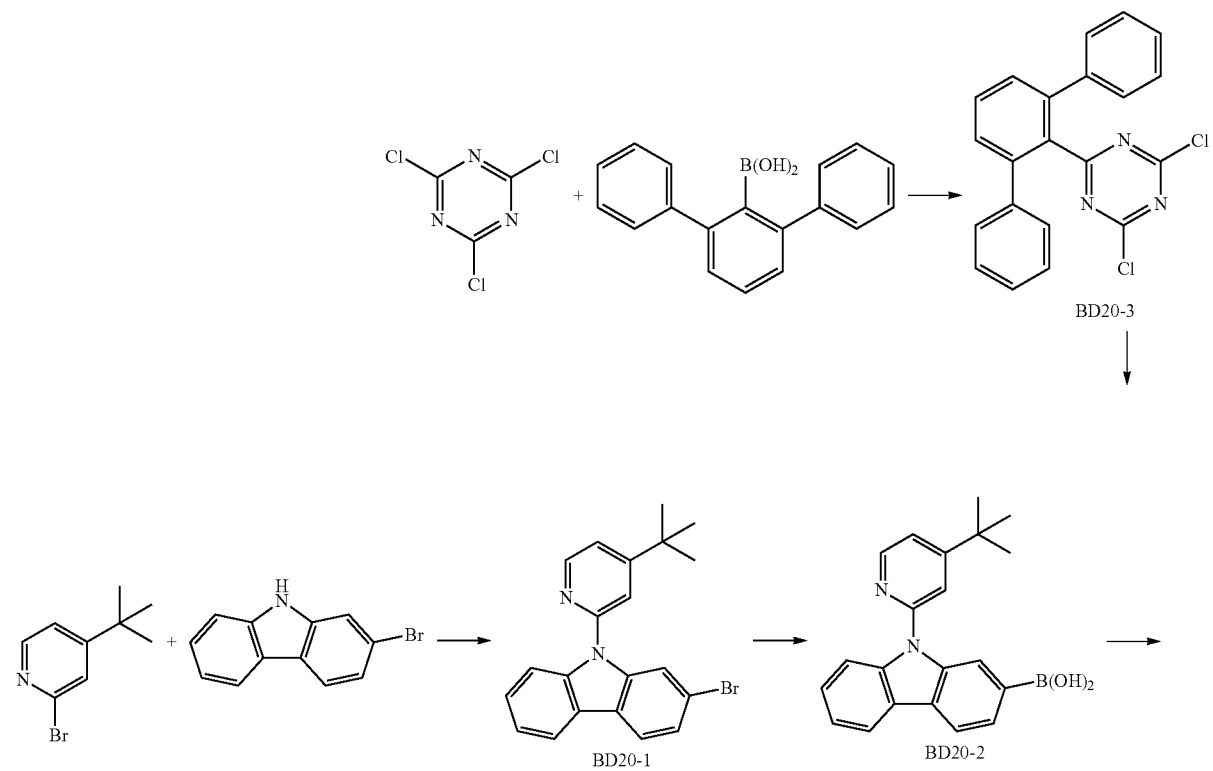

-continued
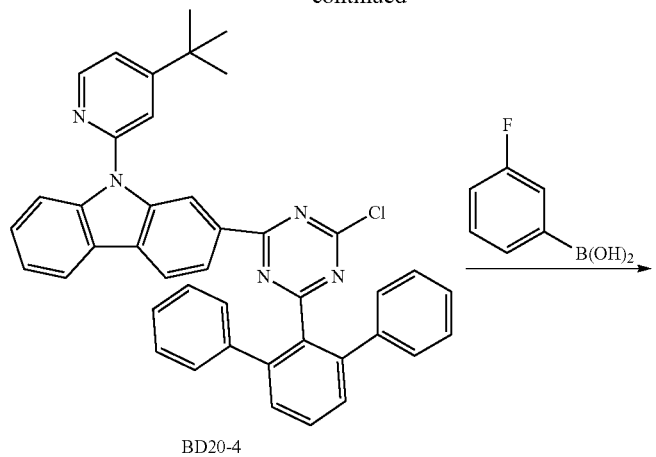
BD20-4
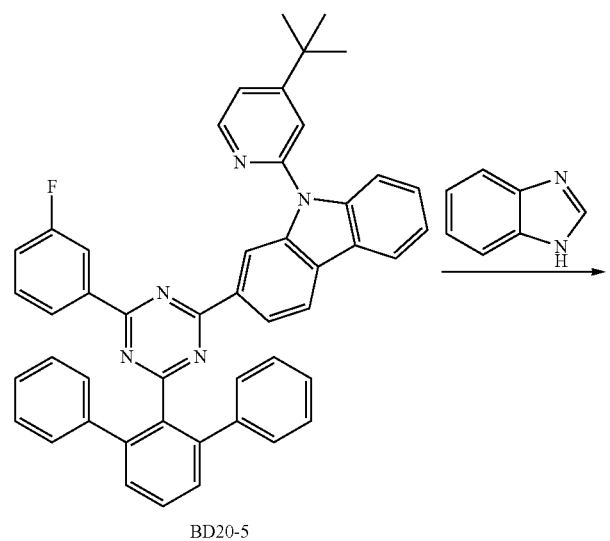
BD20-5
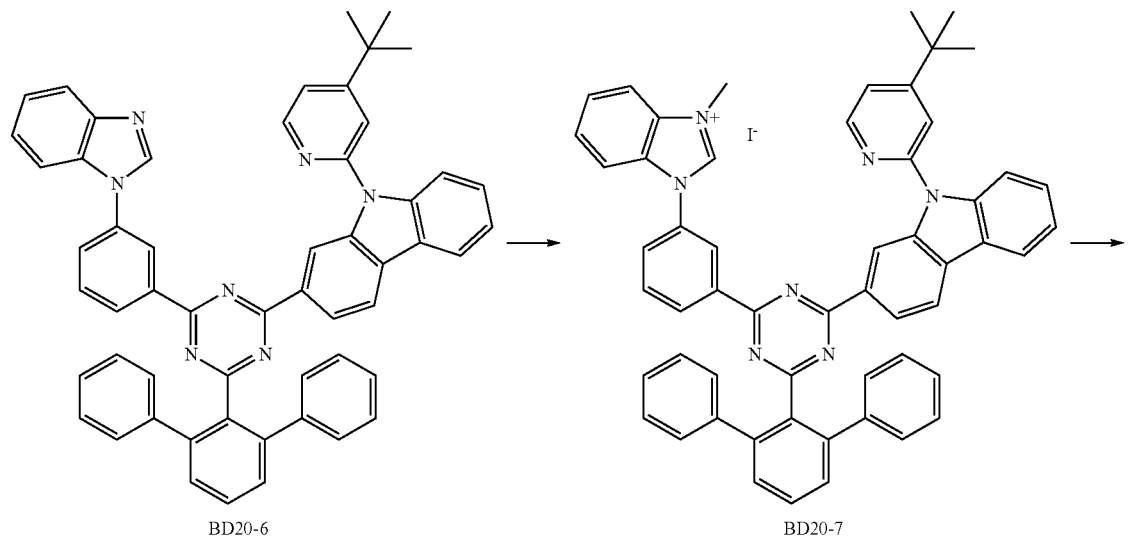
BD20-6    BD20-7

-continued

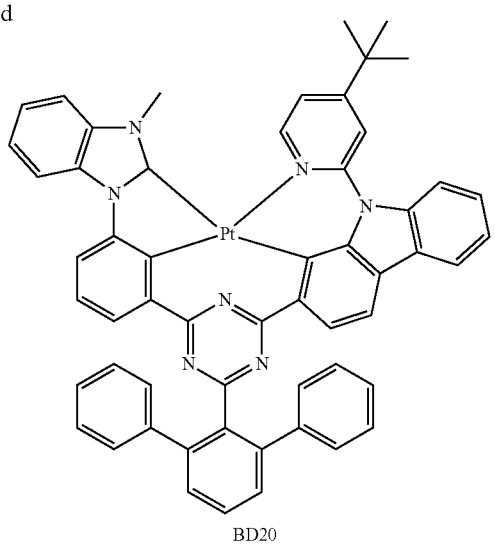

BD20

1) Synthesis of Intermediate Compound BD20-1

2-bromo-4-(tert-butyl)pyridine (1.0 eq), 2-bromo-9H-carbazole (1.2 eq), CuI (0.01 eq), $K_2CO_3$ (2.0 eq), and L-proline (0.02 eq) were dissolved in dimethyl sulfoxide (0.1M) and stirred at a temperature of 130° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD20-1 (yield: 70%).

2) Synthesis of Intermediate Compound BD20-2

Intermediate compound BD20-1 was dissolved in THF (0.1M), n-butyllithium (2.5M in Hexane, 1.2 eq) was slowly added dropwise thereto at a temperature of −78° C. and stirred for 1 hour. Trimethyl borate (1.2 eq) was added to the reaction mixture and stirred at room temperature for 24 hours. 2M HCl was added to the resultant and stirred for 30 minutes, and then subjected to an extraction process three times utilizing dichloromethane and water to obtain an organic layer. The obtained organic layer was dried utilizing magnesium sulfate, concentrated, and recrystallized utilizing hexane to synthesize Intermediate compound BD20-2 (yield: 85%).

3) Synthesis of Intermediate Compound BD20-3

2,4,6-trichloro-1,3,5-triazine (1.0 eq), [1,1':3',1''-terphenyl]-2'-ylboronic acid (1.2 eq), $Ph(PPh_3)_4$ (0.02 eq), and $K_2CO_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD20-3 (yield: 88%).

4) Synthesis of Intermediate Compound BD20-4

Intermediate compound BD20-2 (1.2 eq), Intermediate compound BD20-3 (1.0 eq), $Ph(PPh_3)_4$ (0.02 eq), and $K_2CO_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD20-3 (yield: 71%).

5) Synthesis of Intermediate Compound BD20-5

Intermediate compound BD14-4 (1.0 eq), 3-fluorophenylboronic acid (1.2 eq), $Ph(PPh_3)_4$ (0.02 eq), and $K_2CO_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD20-4 (yield: 62%).

6) Synthesis of Intermediate Compound BD20-6

Intermediate compound BD20-5 (1.0 eq), 1H-benzo[d]imidazole (2.5 eq), and $K_3PO_4$ (2.0 eq) were dissolved in dimethyl sulfoxide (0.1M) and stirred at a temperature of 160° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD20-6 (yield: 80%).

6) Synthesis of Intermediate Compound BD20-7

Intermediate compound BD20-6 (1.0 eq) and iodomethane (3.0 eq) were dissolved in THF (1.0 M) and stirred at a temperature of 70° C. for 12 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD20-7 (yield: 71%).

8) Synthesis of Compound BD20

Intermediate compound BD14-7 (1.0 eq), dichloro(1,2-dicyclooctadiene)platinum (Pt(COD)Cl$_2$) (1.1 eq), and sodium acetate (2.0 eq) were dissolved in dioxane (0.1 M) and stirred at a temperature of 120° C. for 72 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Compound BD20 (yield: 33%).

Synthesis Example 5: Synthesis of Compound BD31

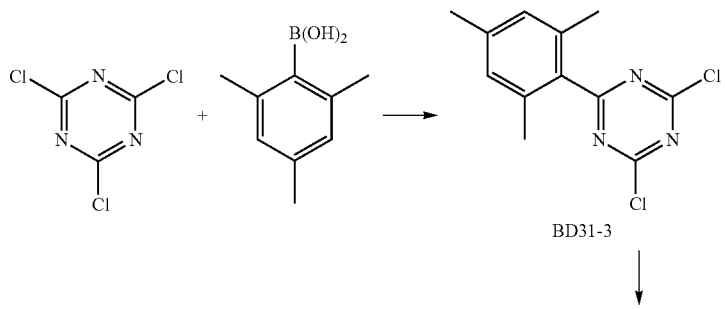

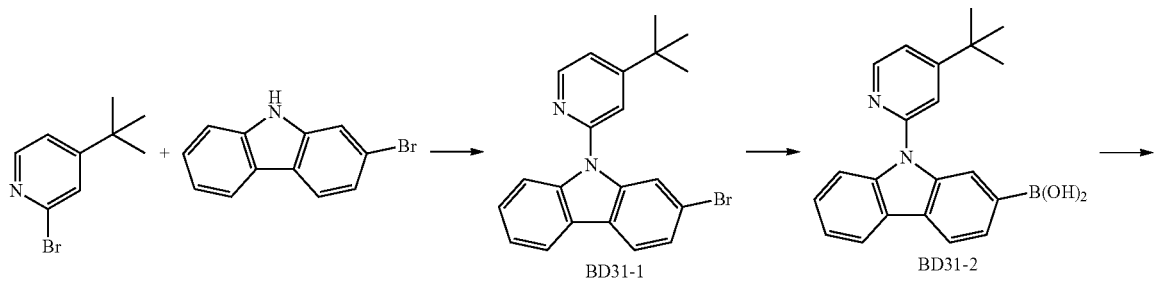

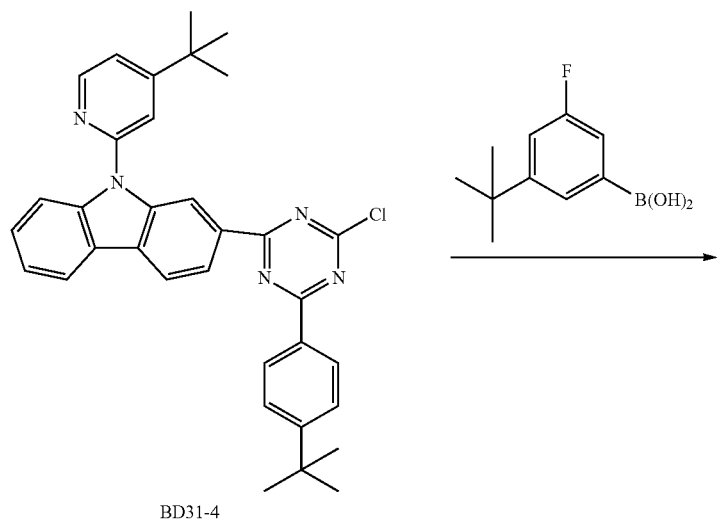

-continued
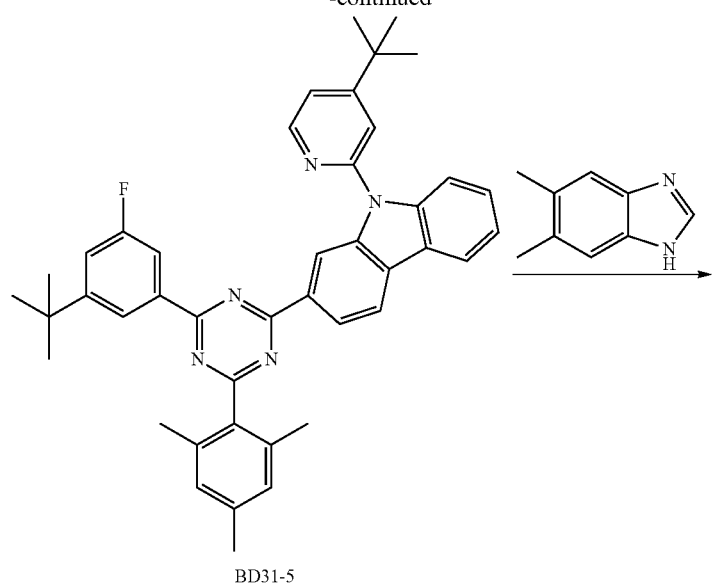
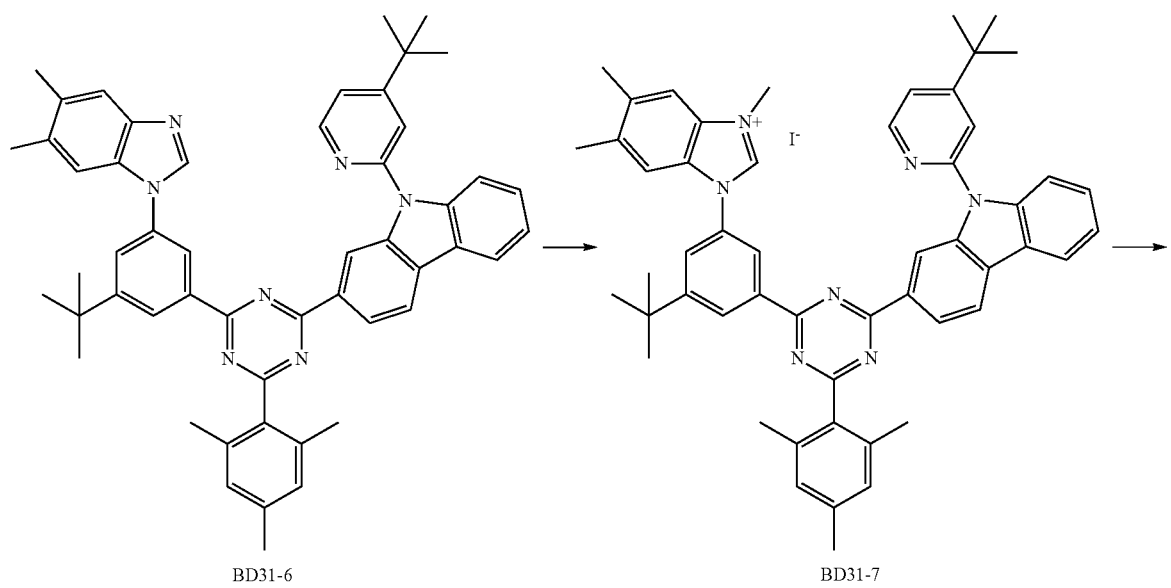

-continued

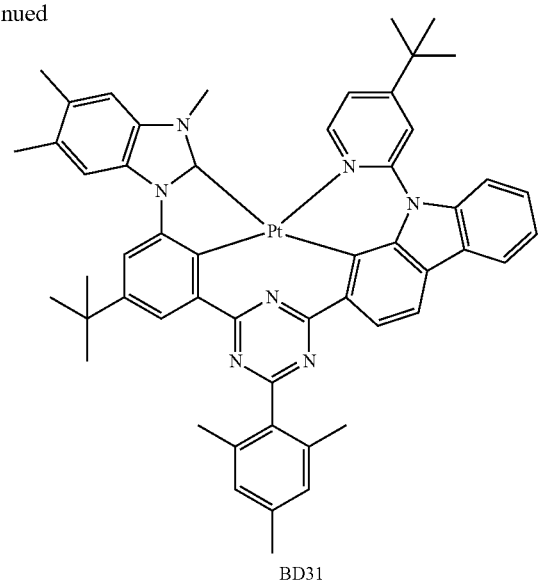

BD31

1) Synthesis of Intermediate Compound BD31-1

2-bromo-4-(tert-butyl)pyridine (1.0 eq), 2-bromo-9H-carbazole (1.2 eq), CuI (0.01 eq), $K_2CO_3$ (2.0 eq), and L-proline (0.02 eq) were dissolved in dimethyl sulfoxide (0.1M) and stirred at a temperature of 130° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate BD31-1 (yield: 72%).

2) Synthesis of Intermediate Compound BD31-2

Intermediate compound BD31-1 was dissolved in THF (0.1M), n-butyllithium (2.5M in Hexane, 1.2 eq) was slowly added dropwise thereto at a temperature of −78° C., and stirred for 1 hour. Trimethyl borate (1.2 eq) was added to the reaction mixture and stirred at room temperature for 24 hours. 2M HCl was added to the resultant and stirred for 30 minutes, and then subjected to an extraction process three times utilizing dichloromethane and water to obtain an organic layer. The obtained organic layer was dried utilizing magnesium sulfate, concentrated, and recrystallized utilizing hexane to synthesize Intermediate compound BD31-2 (yield: 80%).

3) Synthesis of Intermediate Compound BD31-3

2,4,6-trichloro-1,3,5-triazine (1.0 eq), mesitylboronic acid (1.2 eq), $Ph(PPh_3)_4$ (0.02 eq), and $K_2CO_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate BD31-3 (yield: 80%).

4) Synthesis of Intermediate Compound BD31-4

Intermediate compound BD31-2 (1.2 eq), Intermediate compound BD31-3 (1.0 eq), $Ph(PPh_3)_4$ (0.02 eq), and $K_2CO_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate BD31-4 (yield: 72%).

5) Synthesis of Intermediate Compound BD31-5

Intermediate compound BD31-4 (1.0 eq), 3-fluorophenylboronic acid (1.2 eq), $Ph(PPh_3)_4$ (0.02 eq), and $K_2CO_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD31-5 (yield: 68%).

6) Synthesis of Intermediate Compound BD31-6

Intermediate compound BD31-5 (1.0 eq), 1H-benzo[d]imidazole (2.5 eq), and $K_3PO_4$ (2.0 eq) were dissolved in dimethyl sulfoxide (0.1M) and stirred at a temperature of 160° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate BD31-6 (yield: 82%).

7) Synthesis of Intermediate Compound BD31-7

Intermediate compound BD31-6 (1.0 eq) and iodomethane (3.0 eq) were dissolved in THF (1.0 M) and stirred at a temperature of 70° C. for 12 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate BD31-7 (yield: 76%).

8) Synthesis of Compound BD31

Intermediate compound BD31-7 (1.0 eq), dichloro(1,2-dicyclooctadiene)platinum (Pt(COD)Cl$_2$) (1.1 eq), and sodium acetate (2.0 eq) were dissolved in dioxane (0.1 M) and stirred at a temperature of 120° C. for 72 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Compound BD31 (yield: 21%).

Synthesis Example 6: Synthesis of Compound 50

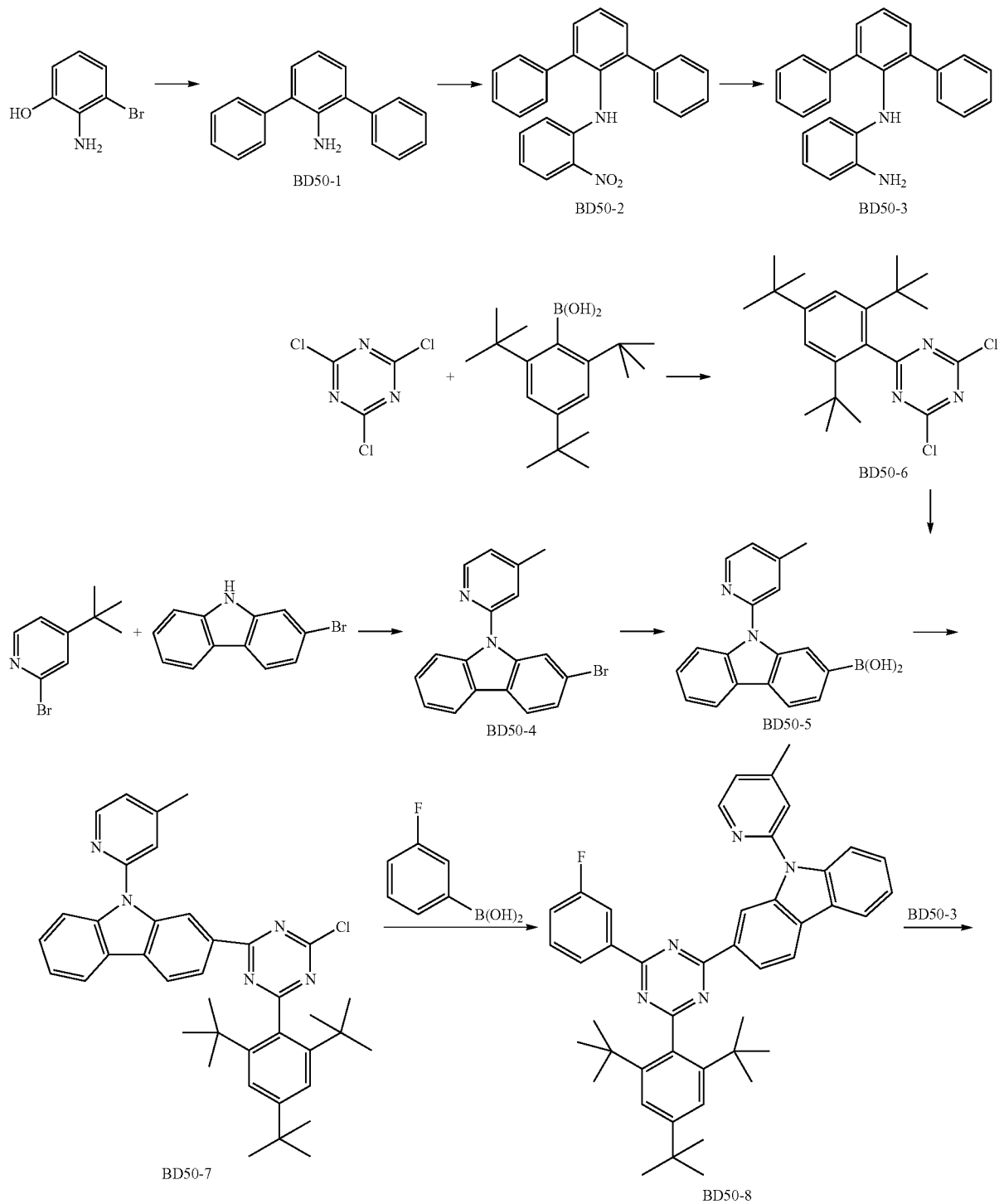

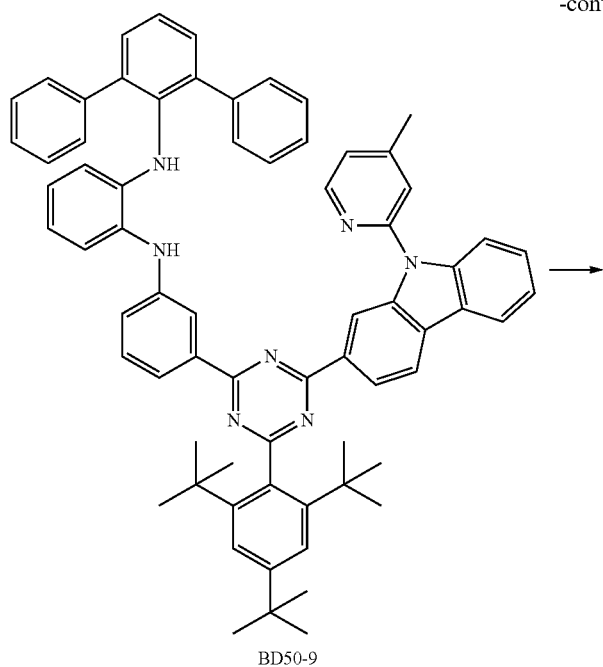

BD50-9

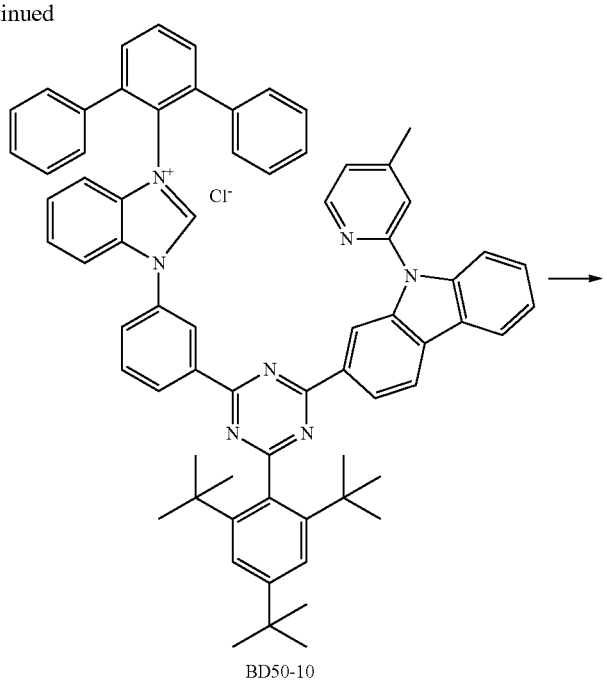

BD50-10

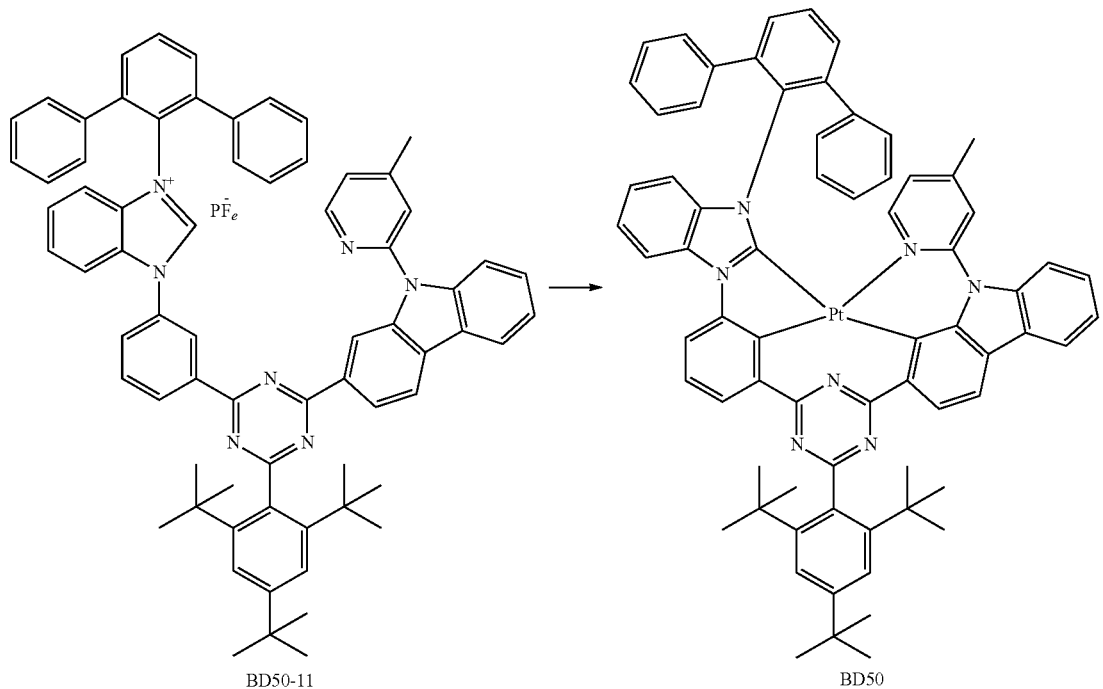

BD50-11

BD50

1) Synthesis of Intermediate Compound BD50-1

2,6-dibromoaniline (1.0 eq), phenyl boronic acid (3.0 eq), Ph(PPh$_3$)$_4$ (0.02 eq), and K$_2$CO$_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD50-1 (yield: 91%).

2) Synthesis of Intermediate Compound BD50-2

Intermediate compound BD50-1 (1.0 eq), 1-iodo-2-nitrobenzene (1.2 eq), Pd$_2$(dba)$_3$ (0.05 eq), Sphos (0.05 eq), and sodium tert-butoxide (2.0 eq) were dissolved in toluene (0.05 M) and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD50-2 (yield: 80%).

3) Synthesis of Intermediate Compound BD50-3

Intermediate compound BD50-2, Sn (2.5 eq), and HCl (2.0 eq) were dissolved in EtOH and stirred at a temperature of 80° C. for 12 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD50-3 (yield: 88%).

4) Synthesis of Intermediate Compound BD50-4

2-bromo-4-(tert-butyl)pyridine (1.0 eq), 2-bromo-9H-carbazole (1.2 eq), CuI (0.01 eq), $K_2CO_3$ (2.0 eq), and L-proline (0.02 eq) were dissolved in dimethyl sulfoxide (0.1M) and stirred at a temperature of 130° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD50-4 (yield: 68

5) Synthesis of Intermediate Compound BD50-5

Intermediate compound BD50-4 was dissolved in THF (0.1M), n-butyllithium (2.5M in hexane, 1.2 eq) was slowly added dropwise thereto at a temperature of −78° C. and stirred for 1 hour. Trimethyl borate (1.2 eq) was added to the reaction mixture and stirred at room temperature for 24 hours. 2M HCl was added to the resultant and stirred for 30 minutes, and then subjected to an extraction process three times utilizing dichloromethane and water to obtain an organic layer. The obtained organic layer was dried utilizing magnesium sulfate, concentrated, and recrystallized utilizing hexane to synthesize Intermediate compound BD50-2 (yield: 85%).

6) Synthesis of Intermediate Compound BD50-6

2,4,6-trichloro-1,3,5-triazine (1.0 eq), (2,4,6-tri-tert-butylphenyl)boronic acid (1.2 eq), $Ph(PPh_3)_4$ (0.02 eq), and $K_2CO_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD50-6 (yield: 22%).

7) Synthesis of Intermediate Compound BD50-7

Intermediate compound BD50-6 (1.2 eq), Intermediate compound BD50-5 (1.0 eq), $Ph(PPh_3)_4$ (0.02 eq), and $K_2CO_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD50-7 (yield: 72%).

8) Synthesis of Intermediate Compound BD50-8

Intermediate compound BD50-7 (1.0 eq), 3-fluorophenylboronic acid (1.2 eq), $Ph(PPh_3)_4$ (0.02 eq), and $K_2CO_3$ (2.0 eq) were dissolved in toluene and stirred at a temperature of 120° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD50-8 (yield: 70%).

9) Synthesis of Intermediate Compound BD50-9

Intermediate compound BD50-8 (1.0 eq), Intermediate compound BD60-3 (1.2 eq), and $K_3PO_4$ (2.0 eq) were dissolved in dimethyl sulfoxide (0.1M) and stirred at a temperature of 160° C. for 24 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Intermediate compound BD50-9 (yield: 70%).

10) Synthesis of Intermediate Compound BD50-10

Intermediate compound BD50-9 (1.0 eq), triethylorthoformate (50 eq), and HCl (25 eq) were dissolved and stirred at a temperature of 80° C. for 12 hours. The reaction mixture was cooled at room temperature, triethylorthoformate was removed, and then the reaction mixture was subjected to an extraction process three times utilizing ethyl acetate and water to obtain an organic layer. The obtained organic layer was dried by utilizing magnesium sulfate and concentrated, and column chromatography was utilized to synthesize Intermediate compound BD50-10 (yield: 88%).

11) Synthesis of Intermediate Compound BD50-11

Intermediate compound BD50-10 was dissolved in methanol (0.1M), distilled water was slowly added thereto and stirred, and then $NH_4PF_6$ (1.2 eq) was added thereto and stirred at room temperature for 12 hours. The resultant solid was filtered, washed three times with diethyl ether, and dried to synthesize Intermediate compound BD50-11 (yield: 96%).

12) Synthesis of Compound BD50

Intermediate compound BD50-11 (1.0 eq), dichloro(1,2-dicyclooctadiene)platinum ($Pt(COD)Cl_2$) (1.1 eq), and sodium acetate (2.0 eq) were dissolved in dioxane (0.1 M) and stirred at a temperature of 120° C. for 72 hours. The reaction mixture was cooled at room temperature, and then subjected to an extraction process three times utilizing dichloromethane and water to obtain an organic layer. The obtained organic layer was dried by utilizing magnesium sulfate and concentrated, and column chromatography was utilized to synthesize Compound BD50 (yield: 22%).

$^1$H NMR and MS/FAB of the compounds synthesized according to Synthesis Examples 1 to 6 are shown in Table 1. Synthesis methods for other compounds than the compounds shown in Table 1 may be easily recognized by those skilled in the technical field by referring to the synthesis paths and source material materials described above.

Example 1

As an anode, a 15 $\Omega/cm^2$ (1,200 Å) ITO glass substrate (a product of Corning Inc.) was cut to a size of 50 mm×50 mm×0.7 mm, sonicated with isopropyl alcohol and pure water each for 5 minutes, and then cleaned by exposure to ultraviolet rays and ozone for 30 minutes. The resultant glass substrate was loaded onto a vacuum deposition apparatus.

2-TNATA was vacuum-deposited on the anode to form a hole injection layer having a thickness of 600 Å, and 4,4'-bis[N-(1-naphthyl)-N-phenylamino] biphenyl (hereinafter referred to as NPB) was vacuum-deposited on the hole injection layer to form a hole transport layer having a thickness of 300 Å.

Compound BD1 (first compound), compound DFD2 (fourth compound), compound ETH66 (second compound), and compound HTH29 (third compound) were vacuum-deposited on the hole transport layer at a weight ratio of 1:0.5:3:6 to form an emission layer having a thickness of 400 Å.

Compound ETH2 was vacuum-deposited on the emission layer to form a hole blocking layer having a thickness of 50 Å, $Alq_3$ was vacuum-deposited on the hole blocking layer to form an electron transport layer having a thickness of 300 Å, LiF was vacuum-deposited on the electron transport layer to form an electron injection layer having a thickness of 10 Å, and then, Al was vacuum-deposited thereon to form a cathode having a thickness of 3,000 Å, thereby completing the manufacture of an organic light-emitting device.

TABLE 1

| Compound | H NMR(δ) | MS/FAB Calc | found |
|---|---|---|---|
| BD1 | 8.55 (d, 2H), 8.36 (d, 2H), 8.31 (d, 1H), 7.94-7.91 (m, 3H), 7.50-7.40 (m, 8H), 7.16 (t, 1H), 7.00 (d, 1H), 6.90 (t, 1H), 6.63 (t, 1H), 6.53 (d, 1H), 3.02 (s, 3H), 1.32 (s, 9H) | 855.89 | 855.25 |
| BD10 | 8.52 (d, 2H), 8.37 (d, 2H), 8.30 (d, 1H), 7.99 (s, 2H), 7.94 (m, 3H), 7.50-7.35 (m, 14H), 7.14-7.08 (m, 7H), 6.95 (d, 2H), 1.35 (s, 9H), 1.30 (s, 9H) | 1126.26 | 1125.39 |
| BD14 | 8.54 (d, 2H), 8.35 (d, 2H), 8.32 (d, 1H), 7.98-7.90 (m, 3H), 7.52-7.41 (m,7H), 7.20 (t, 1H), 7.01 (d, 1H), 6.94 (t, 1H), 6.64 (t, 1H), 6.51 (d, 1H), 3.02 (s, 3H), 1.32 (s, 9H), 1.28 (s, 9H) | 912.00 | 911.31 |
| BD20 | 8.54 (d, 2H), 8.35 (d, 2H), 8.32 (d, 1H), 7.98-7.90 (m, 3H), 7.52-7.41 (m, 6H), 7.20 (t, 1H), 7.14-7.08 (m, 10H) 7.01 (d, 1H), 6.94 (t, 1H), 6.64 (t, 1H), 6.51 (d, 1H), 3.02 (s, 3H), 1.32 (s, 9H) | 1008.09 | 1007.31 |
| BD31 | 8.55 (d, 2H), 8.36 (d, 2H), 8.31 (d, 1H), 7.94-7.91 (m, 3H), 7.50-7.40 (m, 4H), 6.90 (t, 1H), 6.63 (t, 1H), 6.53 (d, 1H), 3.02 (s, 3H), 2.94 (s, 9H), 2.04 (s, 6H), 1.37 (s, 9H) 1.32 (s, 9H) | 982.13 | 981.39 |
| BD50 | 8.52 (d, 2H), 8.37 (d, 2H), 8.30 (d, 1H), 7.99 (s, 2H), 7.94 (m, 3H), 7.50-7.35 (m, 12H), 7.14-7.08 (m, 7H), 6.95 (d, 2H), 1.35 (s, 3H), 1.30 (s, 27H) | 1196.40 | 1195.47 |

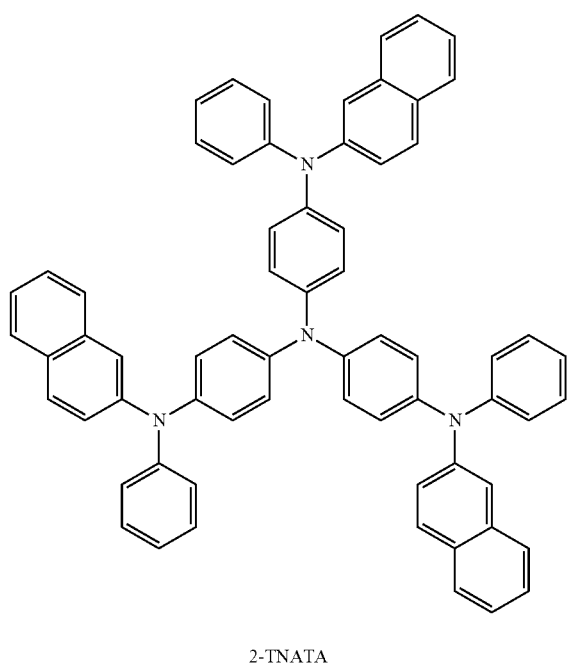
2-TNATA
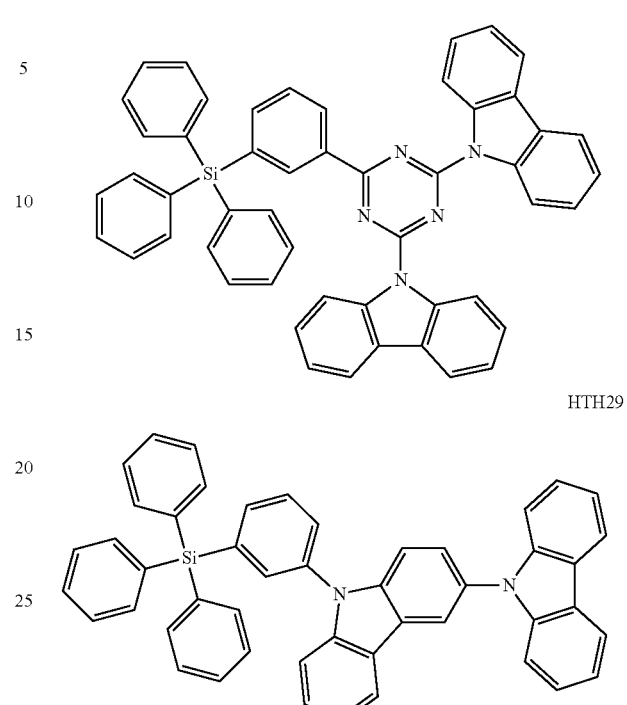
ETH66
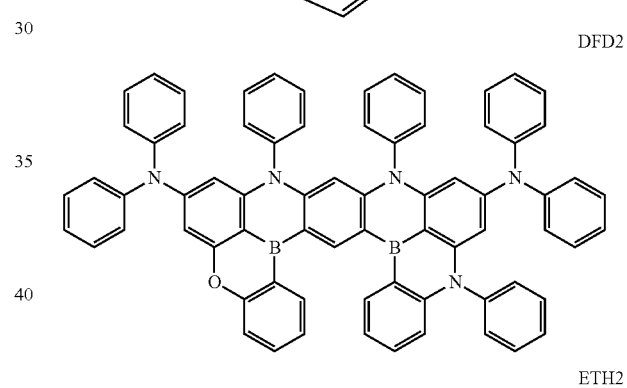
HTH29
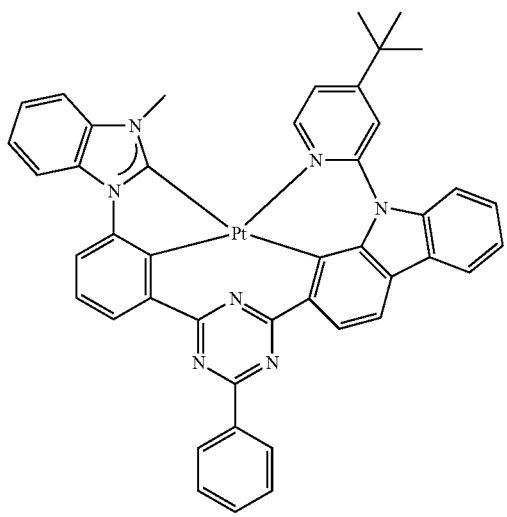
NPB
BD1
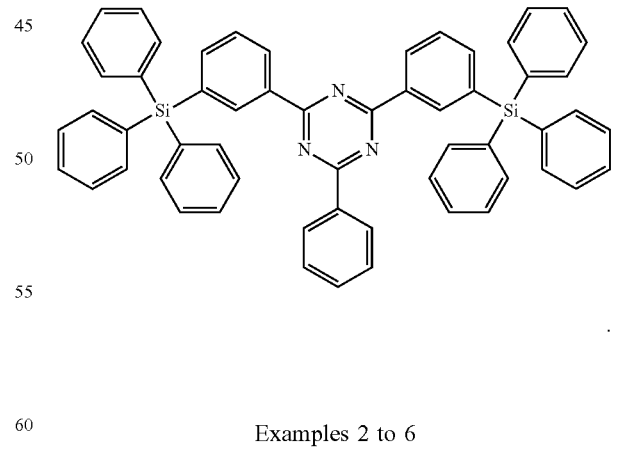
DFD2
ETH2
Examples 2 to 6
Organic light-emitting devices were manufactured in substantially the same manner as in Example 1, except that, in forming an emission layer, compounds shown in Table 2 were utilized as a first compound, a fourth compound, a second compound, and a third compound.

Evaluation Example 1

The driving voltage (V) at a brightness of 1,000 cd/m$^2$, color purity (CIE$_{x,y}$), emission efficiency (cd/A), color conversion efficiency (cd/A/y), maximum emission wavelength (nm), and lifespan (T$_{95}$) of the light-emitting devices manufactured according to Examples 1 to 6 were measured by utilizing a Keithley MU 236 and a luminance meter PR650, and results thereof are each shown in Tables 2 and 3. In Table 3, the lifespan (T$_{95}$) is a measure of the time (hours) elapsed when the brightness reaches 95% of the initial brightness.

TABLE 2

| No. | Dopant | | Host | | Luminance (cd/m$^2$) | Driving Voltage (V) | Color purity (CIE$_{x,y}$) |
| --- | --- | --- | --- | --- | --- | --- | --- |
| | First compound | Fourth compound | Second compound | Third compound | | | |
| Example 1 | BD1 | DFD2 | ETH66 | HTH29 | 1000 | 3.9 | (0.137, 0.159) |
| Example 2 | BD10 | DFD2 | ETH66 | HTH29 | 1000 | 4.1 | (0.136, 0.158) |
| Example 3 | BD14 | DFD2 | ETH66 | HTH29 | 1000 | 3.8 | (0.136, 0.156) |
| Example 4 | BD20 | DFD2 | ETH66 | HTH29 | 1000 | 4.0 | (0.135, 0.155) |
| Example 5 | BD31 | DFD2 | ETH66 | HTH29 | 1000 | 4.2 | (0.135, 0.149) |
| Example 6 | BD50 | DFD2 | ETH66 | HTH29 | 1000 | 3.7 | (0.138, 0.168) |

TABLE 3

| No. | Dopant | | Host | | Emission efficiency (cd/A) | Maximum emission wavelength (nm) | Lifespan (LT$_{95}$) (hr) |
| --- | --- | --- | --- | --- | --- | --- | --- |
| | First compound | Fourth compound | Second compound | Third compound | | | |
| Example 1 | BD1 | DFD2 | ETH66 | HTH29 | 20 | 461 | 55 |
| Example 2 | BD10 | DFD2 | ETH66 | HTH29 | 21 | 461 | 51 |
| Example 3 | BD14 | DFD2 | ETH66 | HTH29 | 22 | 461 | 52 |
| Example 4 | BD20 | DFD2 | ETH66 | HTH29 | 19 | 461 | 47 |
| Example 5 | BD31 | DFD2 | ETH66 | HTH29 | 21 | 461 | 49 |
| Example 6 | BD50 | DFD2 | ETH66 | HTH29 | 24 | 461 | 41 |

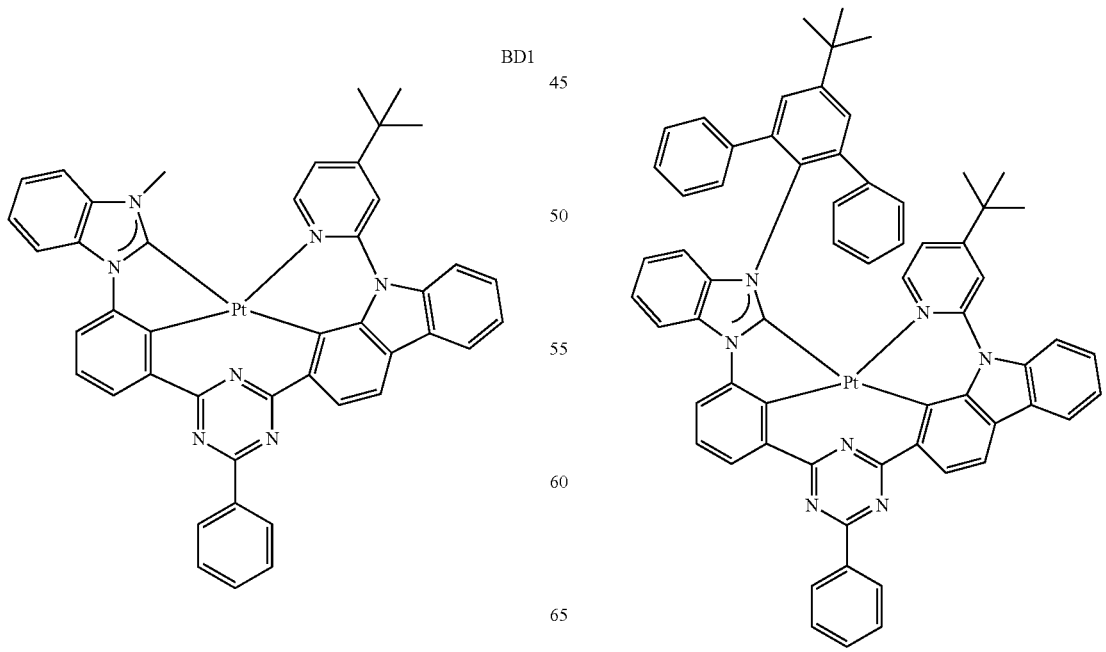

BD1

-continued

BD10

BD14
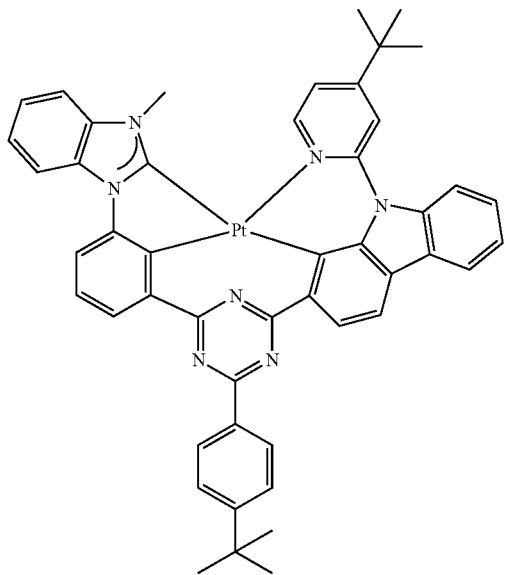
BD20
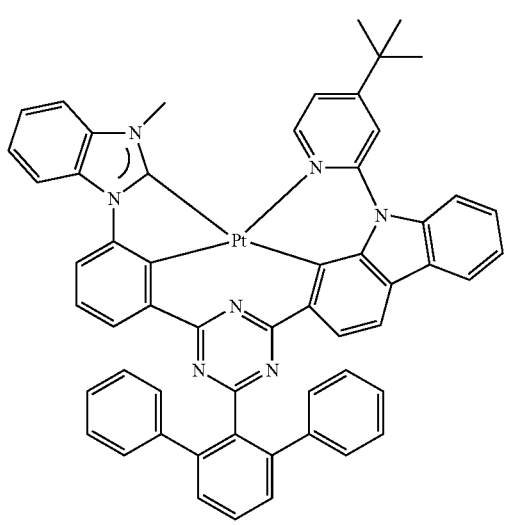
BD31
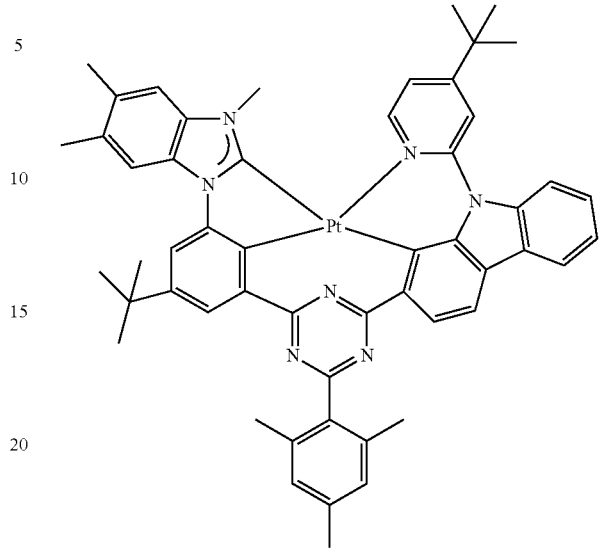
BD50
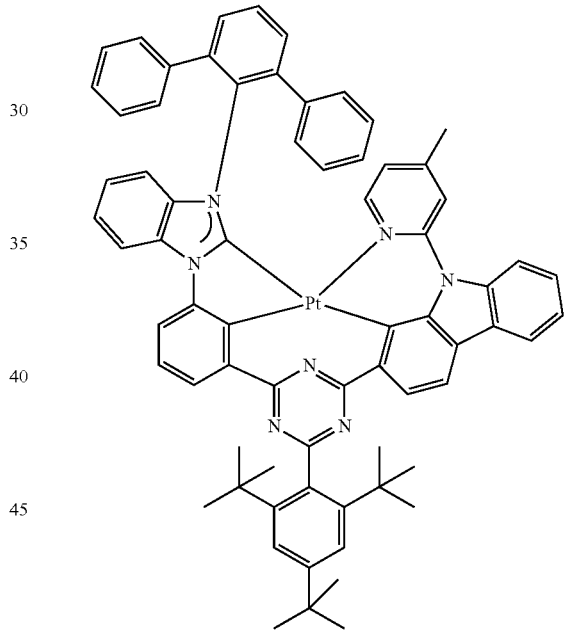
ETH66
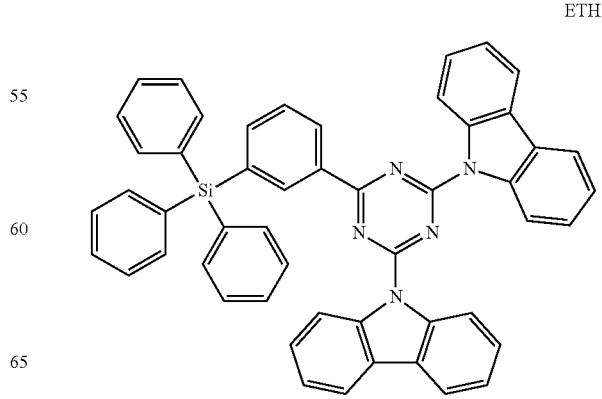

HTH29

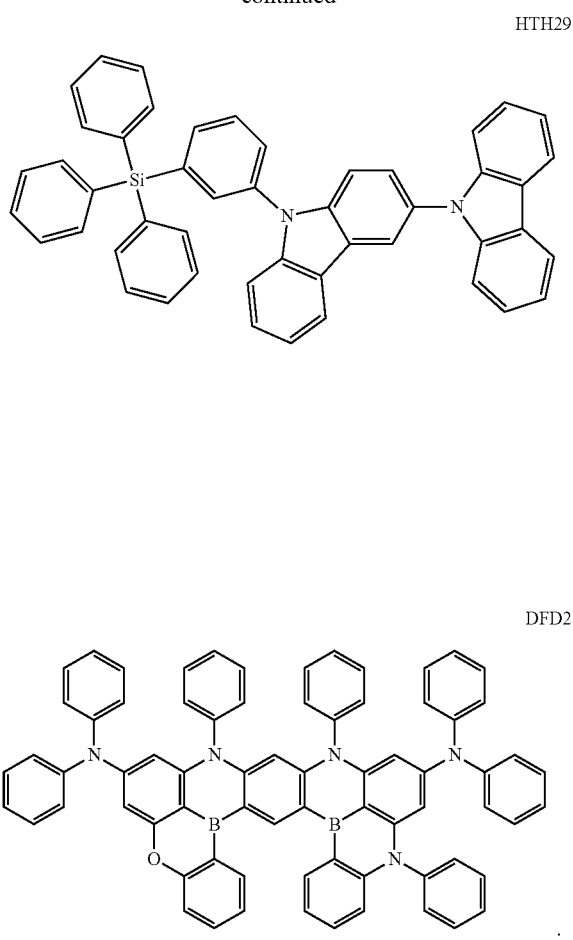

DFD2

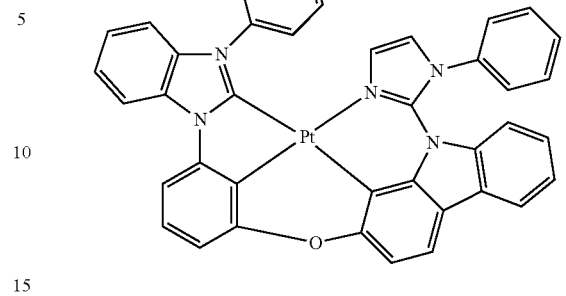

A

Tables 2 and 3 show that the organic light-emitting devices of Examples 1 to 6 emit deep blue light and have excellent or suitable driving voltage, color purity, emission efficiency, color conversion efficiency, and/or lifespan characteristics.

Example 7

Organic light-emitting devices were manufactured in substantially the same manner as in Example 1, except that, in forming an emission layer, instead of vacuum-depositing Compound BD1 (first compound), Compound DFD2 (fourth compound), Compound ETH66 (second compound), and Compound HTH29 (third compound) on the hole transport layer at a weight ratio of 1:0.5:3:6 to form an emission layer having a thickness of 400 Å, Compound BD1 (first compound) and Compound HTH29 (third compound) were vacuum-deposited at a weight ratio of 10:90 to form an emission layer having a thickness of 300 Å.

Comparative Example 1

Organic light-emitting devices were manufactured in substantially the same manner as in Example 7, except that, in forming an emission layer, Compound A was utilized instead of Compound BD1.

Evaluation Example 2

The driving voltage (V) at a brightness of 1000 cd/m², color purity ($CIE_{x,y}$), emission efficiency (cd/A), color conversion efficiency (cd/A/y), maximum emission wavelength (nm), and lifespan ($T_{95}$ at room temperature) of the organic light-emitting devices manufactured according to Example 7 and Comparative Example 1 were each measured utilizing the same method as in Evaluation Example 1, and the results thereof are each shown in Tables 4 and 5.

TABLE 4

| No. | Dopant | Host | Brightness (cd/m²) | Driving voltage (V) | Color purity ($CIE_{x,y}$) |
|---|---|---|---|---|---|
| Example 7 | BD10 | HTH29 | 1000 | 4.0 | (0.132, 0.178) |
| Comparative Example 1 | Compound A | HTH29 | 1000 | 4.7 | (0.20, 0.212) |

TABLE 5

| No. | Dopant | Host | Emission efficiency (cd/A) | Maximum emission wavelength (nm) | Lifespan ($T_{95}$) (hr) |
|---|---|---|---|---|---|
| Example 7 | BD10 | HTH29 | 24 | 464 | 50 |
| Comparative Example 1 | Compound A | HTH29 | 15 | 468 | 25 |

Tables 4 and 5 show that the organic light-emitting devices of Example 7 emit deep blue light and have excellent or suitable driving voltage, color purity, emission efficiency, color conversion efficiency, and lifespan characteristics compared to the organic light-emitting device of Comparative Example 1.

The organometallic compound can be utilized to manufacture a light-emitting device having high emission efficiency and/or long lifespan, and the light-emitting device may have excellent or suitable driving voltage and current density, as well as high emission efficiency and long lifespan, and thus may be utilized in manufacturing high-quality electronic apparatuses.

It should be understood that the embodiments described herein should be considered in a descriptive sense only and not for purposes of limitation. Descriptions of features or aspects within each embodiment should typically be considered as being available for other similar features or aspects in other embodiments. While one or more embodiments have been described with reference to the drawings, it will be understood by those of ordinary skill in the art that various suitable changes in form and details may be made therein without departing from the spirit and scope as defined by claims and equivalents thereof.

What is claimed is:

1. An organometallic compound represented by Formula 1:

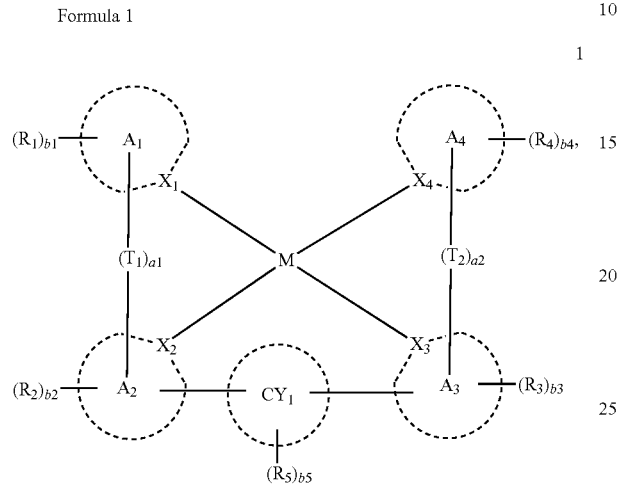

Formula 1 wherein, in Formula 1,

M is platinum (Pt), palladium (Pd), gold (Au), nickel (Ni), silver (Ag), or copper (Cu), $X_1$ to $X_4$ are each independently C or N, $A_1$ to $A_4$ are each independently a $C_3$-$C_{60}$ carbocyclic group or a $C_1$-$C_{60}$ heterocyclic group, $CY_1$ is a triazine group, $T_1$ and $T_2$ are each independently a single bond, a double bond, *—N[(L$_1$)$_{c1}$-(Z$_{11}$)]—*', *—B(Z$_{11}$)—*', *—P(Z$_{11}$)—*', *—C(Z$_{11}$)(Z$_{12}$)—*', *—Si(Z$_{11}$)(Z$_{12}$)—*', *—Ge(Z$_{11}$)(Z$_{12}$)—*', *—S—*', *—Se—*', *—O—*', *—C(=O)—*', *—S(=O)—*', *—S(=O)$_2$—*', *—C(Z$_{11}$)=*, *=C(Z$_{11}$)—*', *—C(Z$_{11}$)=C(Z$_{12}$)—*', *—C(=S)—*', or *—C≡C—*', where * and *' each indicate a binding site to a neighboring atom, $L_1$ is a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, c1 is an integer from 0 to 5, a1 and a2 are each independently an integer from 0 to 3, $R_1$ to $R_4$, $Z_{11}$, and $Z_{12}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), or —P(=O)(Q$_1$)(Q$_2$), $R_5$ is a substituted or unsubstituted phenyl group, b1 to b4 are each independently an integer from 0 to 10, b5 is 1, two or more of $R_1$ to $R_4$, $Z_{11}$ and $Z_{12}$ are optionally linked to form a $C_5$-$C_{30}$ carbocyclic group unsubstituted or substituted with at least one $R_{10a}$ or a $C_2$-$C_{30}$ heterocyclic group unsubstituted or substituted with at least one $R_{10a}$, $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), —P(=O)(Q$_{11}$)(Q$_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-Coo arylthio group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), —P(=O)(Q$_{21}$)(Q$_{22}$), or any combination thereof; or —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), or —P(=O)(Q$_{31}$)(Q$_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The organometallic compound of claim 1, wherein a bond between $X_1$ and M and a bond between $X_4$ and M are each a coordinate bond, and a bond between $X_2$ and M and a bond between $X_3$ and M are each a covalent bond.

3. The organometallic compound of claim 1, wherein $A_1$ is i) an $X_1$-containing 5-membered ring, ii) the $X_1$-containing 5-membered ring, to which at least one 6-membered ring is condensed, or iii) an $X_1$-containing 6-membered ring, and $A_4$ is an $X_4$-containing 6-membered ring.

4. The organometallic compound of claim 3, wherein the $X_1$-containing 5-membered ring is a pyrrole group, a pyrazole group, an imidazole group, a triazole group, an oxazole group, an isoxazole group, a thiazole group, an isothiazole group, an oxadiazole group, or a thiadiazole group, and the $X_1$-containing 6-membered ring, the 6-membered ring condensed to the $X_1$-containing 5-membered ring, and/or the $X_4$-containing 6-membered ring are each independently a benzene group, a pyridine group, or a pyrimidine group.

5. The organometallic compound of claim 1, wherein the group represented by

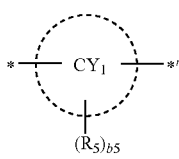

in Formula 1 is represented by Formula 1a:

Formula 1a

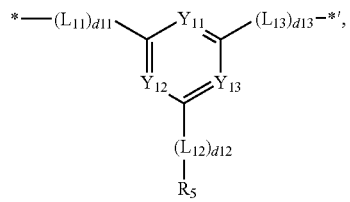

wherein, in Formula 1a,
$R_5$ is the same as described above,
$Y_{11}$ is N, $Y_{12}$ is N, $Y_{13}$ is N,
$L_{11}$ to $L_{13}$ are each independently a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$,
d11 to d13 are each independently an integer from 1 to 5,
* indicates a binding site to $A_2$ in Formula 1, and
*' indicates a binding site to $A_3$ in Formula 1.

6. The organometallic compound of claim 1, wherein Formula 1 is represented by Formula 1-1:

Formula 1-1

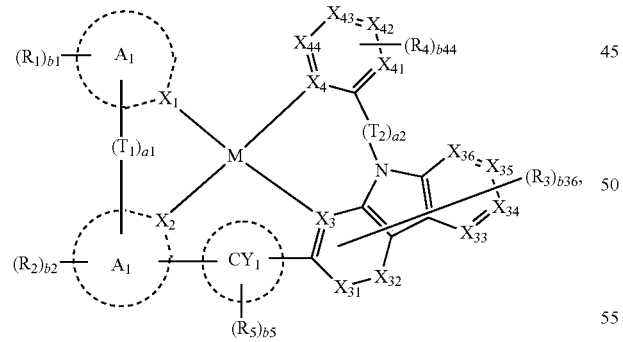

wherein, in Formula 1-1,
M, $X_1$ to $X_4$, $A_1$, $A_2$, $CY_1$, $T_1$, $T_2$, a1, a2, $R_1$ to $R_5$, b1, b2, and b5 are each independently the same as described above,
$X_{31}$ to $X_{36}$ are each independently the same as described in connection with $X_3$ above,
$X_{41}$ to $X_{44}$ are each independently the same as described in connection with $X_4$ above,
b36 is an integer from 0 to 6, and
b44 is an integer from 0 to 4.

7. A light-emitting device comprising:
a first electrode;
a second electrode facing the first electrode;
an interlayer located between the first electrode and the second electrode and comprising an emission layer,
wherein the interlayer comprises:
 i) a first compound, which is the organometallic compound of claim 1; and
 ii) a second compound comprising at least one TT electron-deficient nitrogen-containing $C_1$-$C_{60}$ cyclic group, a third compound comprising a group represented by Formula 3, a fourth compound capable of emitting delayed fluorescence, or any combination thereof, and
the first compound and second compound, and the third compound and fourth compound are different from each other:

Formula 3

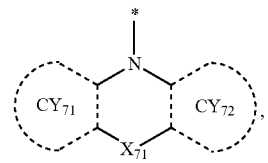

wherein, in Formula 3, ring $CY_{71}$ and ring $CY_{72}$ are each independently a TT electron-rich $C_3$-$C_{60}$ cyclic group or a pyridine group,
in Formula 3, $X_{71}$ is a linking group comprising a single bond, O, S, N, B, C, Si, or any combination thereof,
in Formula 3, * indicates a binding site to a neighboring atom in the third compound, and
in the third compound, the compounds below are excluded:

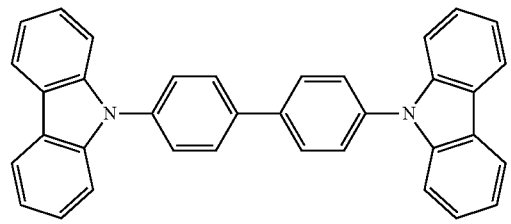

CBP

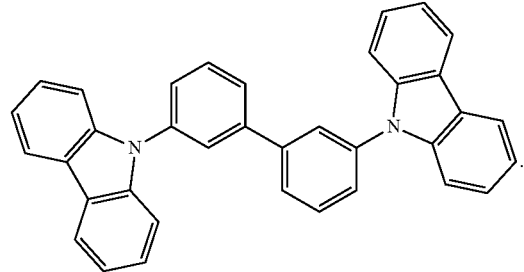

mCBP

8. The light-emitting device of claim 7, wherein the second compound comprises a pyridine group, a pyrimidine group, a pyrazine group, a pyridazine group, a triazine group, or any combination thereof.

9. The light-emitting device of claim 7, wherein the interlayer comprises the second compound.

10. The light-emitting device of claim 9, wherein the interlayer further comprises the third compound, the fourth compound, or a combination thereof.

11. The light-emitting device of claim 7, wherein the fourth compound comprises at least one cyclic group comprising both B (boron) and N (nitrogen) as ring-forming atoms.

12. The light-emitting device of claim 7, wherein the fourth compound comprises a condensed cyclic group in which at least one third ring and at least one fourth ring are condensed with each other,
the third ring is a cyclopentane group, a cyclohexane group, a cycloheptane group, a cyclooctane group, a cyclopentene group, a cyclohexene group, a cycloheptene group, a cyclooctene group, an adamantane group, norbornene group, a norbornane group, a bicyclo[1.1.1]pentane group, a bicyclo[2.1.1] hexane group, a bicyclo[2.2.2] octane group, a benzene group, a pyridine group, a pyrimidine group, a pyridazine group, a pyrazine group, or a triazine group, and
the fourth ring is a 1,2-azaborinine group, a 1,3-azaborinine group, a 1,4-azaborinine group, a 1,2-dihydro-1,2-azaborinine group, a 1,4-oxaborinine group, a 1,4-oxaborinine group, a 1,4-thiaborinine group, or a 1,4-dihydroborinine group.

13. The light-emitting device of claim 7, wherein i) the first compound; and ii) the second compound, the third compound, the fourth compound, or any combination thereof are comprised in the emission layer, and
the first compound is to emit phosphorescence or fluorescence.

14. The light-emitting device of claim 7, wherein the second compound comprises a compound represented by Formula 2:

Formula 2

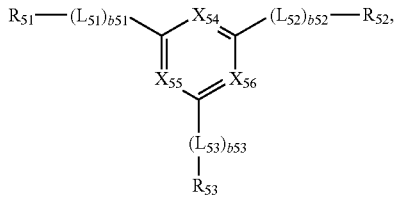

wherein, in Formula 2,
$L_{51}$ to $L_{53}$ are each independently a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$,
b51 to b53 are each independently an integer from 1 to 5,
$X_{54}$ is N or C($R_{54}$), $X_{55}$ is N or C($R_{55}$), $X_{56}$ is N or C($R_{56}$), and at least one of $X_{54}$ to $X_{56}$ is N,
$R_{51}$ to $R_{56}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and $R_{10a}$ and $Q_1$ to $Q_3$ are each independently the same as described above.

15. The light-emitting device of claim 7, wherein the third compound comprises a compound represented by Formula 3-1, a compound represented by Formula 3-2, a compound represented by Formula 3-3, a compound represented by Formula 3-4, a compound represented by Formula 3-5, or any combination thereof:

Formula 3-1

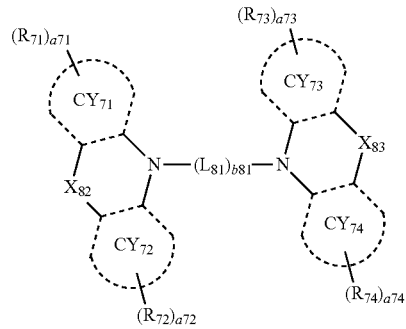

Formula 3-2

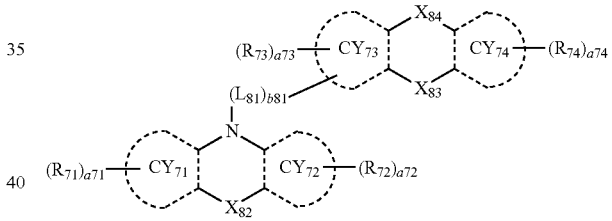

Formula 3-3

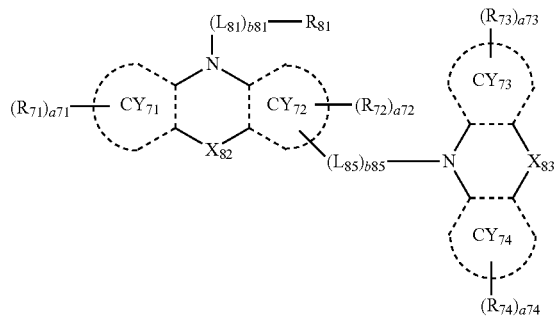

Formula 3-4

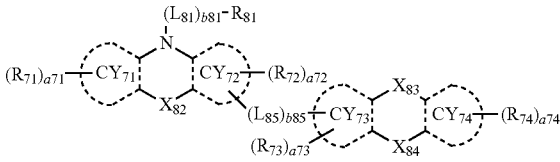

Formula 3-5

[Chemical structure diagram of Formula 3-5]

wherein, in Formulae 3-1 to 3-5, ring $CY_{71}$ and ring $CY_{74}$ are each independently a π electron-rich $C_3$-$C_{60}$ cyclic group or a pyridine group, $X_{82}$ is a single bond, O, S, N-[$(L_{82})_{b82}$-$R_{82}$], $C(R_{82a})(R_{82b})$, or $Si(R_{82a})(R_{82b})$, $X_{83}$ is a single bond, O, S, N-[$(L_{83})_{b83}$-$R_{83}$], $C(R_{83a})(R_{83b})$, or $Si(R_{83a})(R_{83b})$, $X_{84}$ is O, S, N-[$(L_{84})_{b84}$-$R_{84}$], $C(R_{84a})(R_{84b})$, or $Si(R_{84a})(R_{84b})$ $X_{85}$ is C or Si, $L_{81}$ to $L_{85}$ are each independently a single bond, *—C$(Q_4)(Q_5)$—*', *—Si$(Q_4)(Q_5)$—*', a $C_3$-$C_{60}$ cyclic group unsubstituted or substituted with at least one $R_{10a}$, or a pyridine group unsubstituted or substituted with at least one $R_{10a}$, and $Q_4$ and $Q_5$ are each independently the same as described in connection with $Q_1$, b81 to b85 are each independently an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C$(Q_1)(Q_2)(Q_3)$, —Si$(Q_1)(Q_2)(Q_3)$, —N$(Q_1)(Q_2)$, —B$(Q_1)(Q_2)$, —C(=O)$(Q_1)$, —S(=O)$_2(Q_1)$, or —P(=O)$(Q_1)(Q_2)$, a71 to a74 are each independently an integer from 0 to 20, and $R_{10a}$ and $Q_1$ to $Q_3$ are each independently the same as described above.

16. The light-emitting device of claim 7, wherein the fourth compound comprises a compound represented by Compound 502, a compound represented by Compound 503, or any combination thereof:

Formula 502

[Chemical structure diagram of Formula 502]

Formula 503

[Chemical structure diagram of Formula 503]

wherein, in Formulae 502 and 503, ring $A_{501}$ to ring $A_{504}$ are each independently a $C_3$-$C_{60}$ carbocyclic group or a $C_1$-$C_{60}$ heterocyclic group, $Y_{505}$ is O, S, N($R_{505}$), B($R_{505}$), C($R_{505a}$) ($R_{505b}$), or Si($R_{505a}$) ($R_{505b}$), $Y_{506}$ is O, S, N($R_{506}$), B($R_{506}$), C($R_{506a}$) ($R_{506b}$), or Si($R_{506a}$) ($R_{506b}$), $Y_{507}$ is O, S, N($R_{507}$), B($R_{507}$), C($R_{507a}$) ($R_{507b}$), or Si($R_{507a}$) ($R_{507b}$), $Y_{508}$ is O, S, N($R_{508}$), B($R_{508}$), C($R_{508a}$) ($R_{508b}$), or Si($R_{508a}$) ($R_{508b}$), $Y_{51}$ and $Y_{52}$ are each independently B, P(=O), or S(=O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C$(Q_1)(Q_2)(Q_3)$, —Si$(Q_1)(Q_2)(Q_3)$, —N$(Q_1)(Q_2)$, —B$(Q_1)(Q_2)$, —C(=O)$(Q_1)$, —S(=O)$_2(Q_1)$, or —P(=O)$(Q_1)(Q_2)$, a501 to a504 are each independently an integer from 0 to 20, and $R_{10a}$ and $Q_1$ to $Q_3$ are each independently the same as described above.

17. An electronic apparatus comprising the light-emitting device of claim 7.

18. The electronic apparatus of claim 17, further comprising a thin-film transistor, wherein:
the thin-film transistor comprises a source electrode and a drain electrode, and
the first electrode of the light-emitting device is electrically connected to at least one of the source electrode or the drain electrode of the thin-film transistor.

19. The electronic apparatus of claim 17, further comprising a color filter, a color conversion layer, a touch screen layer, a polarizing layer, or any combination thereof.

\* \* \* \* \*